US012765258B2

(12) United States Patent
Wang et al.

(10) Patent No.: US 12,765,258 B2
(45) Date of Patent: Oct. 13, 2026

(54) ORGANIC ELECTROLUMINESCENT DEVICE

(71) Applicant: BEIJING SUMMER SPROUT TECHNOLOGY CO., LTD., Beijing (CN)

(72) Inventors: Le Wang, Beijing (CN); Qiang Wang, Beijing (CN); Han Zhang, Beijing (CN); Ziyan Zhang, Beijing (CN); Meiying Wang, Beijing (CN); Junfei Wang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 1041 days.

(21) Appl. No.: 17/955,792

(22) Filed: Sep. 29, 2022

(65) Prior Publication Data

US 2023/0136831 A1 May 4, 2023

(30) Foreign Application Priority Data

Sep. 30, 2021 (CN) .......................... 202111140544.4
Aug. 19, 2022 (CN) .......................... 202210990712.7

(51) Int. Cl.
*H10K 85/60* (2023.01)
*H10K 50/11* (2023.01)
*H10K 101/10* (2023.01)

(52) U.S. Cl.
CPC ....... *H10K 85/6572* (2023.02); *H10K 85/654* (2023.02); *H10K 50/11* (2023.02); *H10K 2101/10* (2023.02)

(58) Field of Classification Search
CPC ............ H10K 85/654; H10K 85/6572; H10K 2101/10
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 112876489 A 6/2021
CN 114249738 A 3/2022
(Continued)

OTHER PUBLICATIONS

Machine-generated English-language translation of KR-20150077220-A.*
(Continued)

*Primary Examiner* — Vu A Nguyen
(74) *Attorney, Agent, or Firm* — KDW FIRM PLLC

(57) ABSTRACT

Provided is an organic electroluminescent device. The organic electroluminescent device includes an anode, a cathode and an organic layer disposed between the anode and the cathode, wherein the organic layer at least comprises a first compound having a structure of H-L-E and a second compound having a structure of Formula 2. The first compound and the second compound can be used as the host material in organic electroluminescent devices. The electroluminescent device has a long device lifetime and can provide better device performance. Further provided is a compound composition.

28 Claims, 2 Drawing Sheets

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2008/0261076 | A1* | 10/2008 | Kwong | H10K 85/381 546/4 |
| 2015/0349273 | A1 | 12/2015 | Hung et al. | |
| 2016/0359122 | A1 | 12/2016 | Boudreault et al. | |
| 2018/0337340 | A1* | 11/2018 | Moon | C09K 11/06 |
| 2021/0167297 | A1 | 6/2021 | Wang et al. | |
| 2021/0184135 | A1 | 6/2021 | Kim et al. | |
| 2022/0289681 | A1 | 9/2022 | Wang et al. | |

FOREIGN PATENT DOCUMENTS

| | | | | |
|---|---|---|---|---|
| EP | 2991128 | A1 * | 3/2016 | H10K 85/6574 |
| JP | 2020043182 | A | 3/2020 | |
| KR | 20150077220 | A * | 7/2015 | H10K 85/6572 |
| KR | 2017-0066241 | A1 | 6/2017 | |
| KR | 20210093180 | A | 7/2021 | |
| TW | 201739898 | A | 11/2017 | |

OTHER PUBLICATIONS

Office Action received for Korean Patent Application No. 10-2022-0124833, mailed on Sep. 20, 2024, 20 pages.

Second Office Action received for Korean Patent Application No. 10-2022-0124833, mailed on May 26, 2025, 8 pages.

Tang et al., "Organic Electroluminescent Diodes", Applied Physics Letters, vol. 51, No. 12, 1987, pp. 913-915.

Uoyama et al., "Highly efficient organic light-emitting diodes from delayed fluorescence", Letter, Nature, vol. 492, Dec. 13, 2012, 7 pages.

Chinese First Office Action in CN Application No. 202210990712.7 dated Apr. 28, 2026, 8 pages.

* cited by examiner

ORGANIC ELECTROLUMINESCENT DEVICE

CROSS-REFERENCE TO RELATED APPLICATION(S)

This application claims priority to Chinese Patent Application No. 202111140544.4 filed on Sep. 30, 2021 and Chinese Patent Application No. 202210990712.7 filed on Aug. 19, 2022, the disclosure of which are incorporated herein by reference in their entireties.

TECHNICAL FIELD

The present disclosure relates to organic electronic devices, for example, an organic electroluminescent device. More particularly, the present disclosure relates to an organic electroluminescent device including a first compound and a second compound in an organic layer.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which includes an arylamine hole transporting layer and a tris-8-hydroxy-quinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may include multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may include one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

KR1020150077220A discloses an organic electroluminescent compound of the following structure:

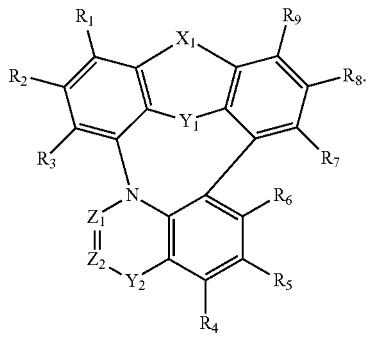

It does not disclose or teach that the compound of this general formula and a second host compound (a bicarbazole compound) are used together as host materials.

US20180337340A1 has disclosed an organic electroluminescent compound and an organic electroluminescent device containing the same. The organic electroluminescent device includes an organic layer containing one host compound, wherein the host compound has the following structure:

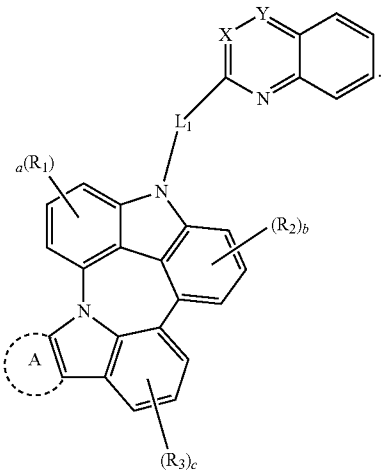

The host compound disclosed therein must include a structural unit of quinazoline or quinoxaline. In addition, this application does not disclose or teach that a compound that is formed by linking a carbazole-fused aza seven-membered ring structural unit to triazine (or a similar structure thereof) is collocated with another second host compound to produce a compound combination.

However, various host materials reported so far still need to be improved. In order to meet the increasing demands of the industry, especially demands for higher device efficiency, longer device lifetime, lower drive voltage and other performance, new material combinations still need to be further researched and developed.

SUMMARY

The present disclosure aims to provide a new electroluminescent device including a first compound and a second compound in an organic layer to solve at least part of the above-mentioned problems. The first compound has a structure of H-L-E, and the second compound has a structure represented by Formula 2. The first compound and the second compound can be used as the host material in organic electroluminescent devices. The electroluminescent device has a long device lifetime and can provide better device performance.

According to an embodiment of the present disclosure, an electroluminescent device is provided, which includes an anode, a cathode and an organic layer disposed between the anode and the cathode, wherein the organic layer at least comprises a first compound and a second compound, wherein the first compound has a structure of H-L-E, wherein H has a structure represented by Formula 1:

Formula 1

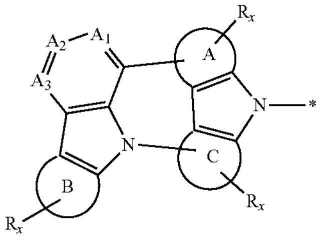

wherein in Formula 1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 18 carbon atoms or a heterocyclic ring having 3 to 18 carbon atoms;

$R_x$ represents, at each occurrence identically or differently, mono-substitution, multiple substitutions or non-substitution;

E has a structure represented by Formula 1-a:

Formula 1-a

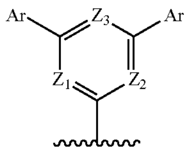

wherein in Formula 1-a, Ar is, at each occurrence identically or differently, selected from substituted or unsubstituted aryl having 6 to 30 carbon atoms or substituted or unsubstituted heteroaryl having 3 to 30 carbon atoms;

$Z_1$ to $Z_3$ are each independently selected from N or $CR_z$, and at least one of $Z_1$ to $Z_3$ is N;

L is selected from a single bond, substituted or unsubstituted arylene having 6 to 30 carbon atoms, substituted or unsubstituted heteroarylene having 3 to 30 carbon atoms or combinations thereof;

R, $R_x$ and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring;

the second compound has a structure represented by Formula 2:

Formula 2

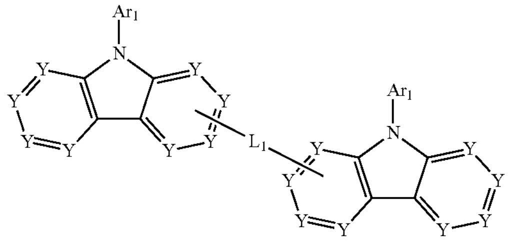

wherein,

Y is, at each occurrence identically or differently, selected from C, $CR_Y$ or N;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms or combinations thereof;

$R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino group having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_Y$ can be optionally joined to form a ring.

According to another embodiment of the present disclosure, a compound composition is further disclosed, which includes a first compound and a second compound, wherein the first compound has a structure of H-L-E, wherein H has a structure represented by Formula 1:

Formula 1

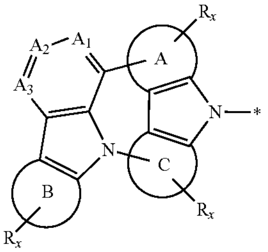

wherein in Formula 1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 18 carbon atoms or a heterocyclic ring having 3 to 18 carbon atoms;

$R_x$ represents, at each occurrence identically or differently, mono-substitution, multiple substitutions or non-substitution;

E has a structure represented by Formula 1-a:

Formula 1-a

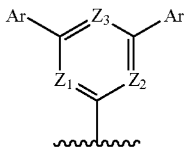

wherein in Formula 1-a, Ar is, at each occurrence identically or differently, selected from substituted or unsubstituted aryl having 6 to 30 carbon atoms or substituted or unsubstituted heteroaryl having 3 to 30 carbon atoms;

$Z_1$ to $Z_3$ are each independently selected from N or $CR_z$, and at least one of $Z_1$ to $Z_3$ is N;

L is selected from a single bond, substituted or unsubstituted arylene having 6 to 30 carbon atoms, substituted or unsubstituted heteroarylene having 3 to 30 carbon atoms or combinations thereof;

R, $R_x$ and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring;

"*" represents a position wherein H is joined to L;

the second compound has a structure represented by Formula 2:

Formula 2

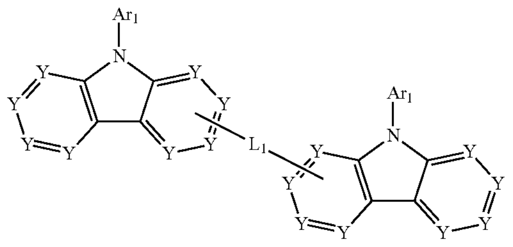

wherein,

Y is, at each occurrence identically or differently, selected from C, $CR_Y$ or N;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms or combinations thereof;

$R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino group having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_Y$ can be optionally joined to form a ring.

In the new electroluminescent device provided by the present disclosure, the organic layer of the emissive device includes a first compound and a second compound. The first compound and the second compound can be used as the host material in organic electroluminescent devices. When the first compound and the second compound are used in combination, the electroluminescent device can obtain a long device lifetime and can provide better device performance.

DETAILED DESCRIPTION

Figure 1:
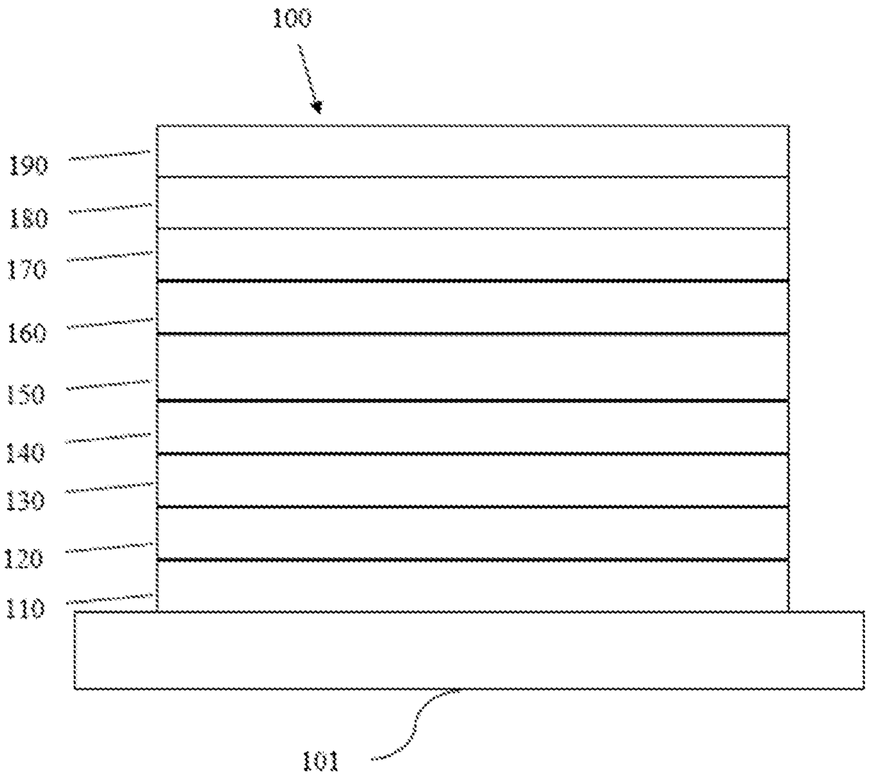
FIG. 1 is a schematic diagram of an organic light-emitting device that may include an electroluminescent device disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
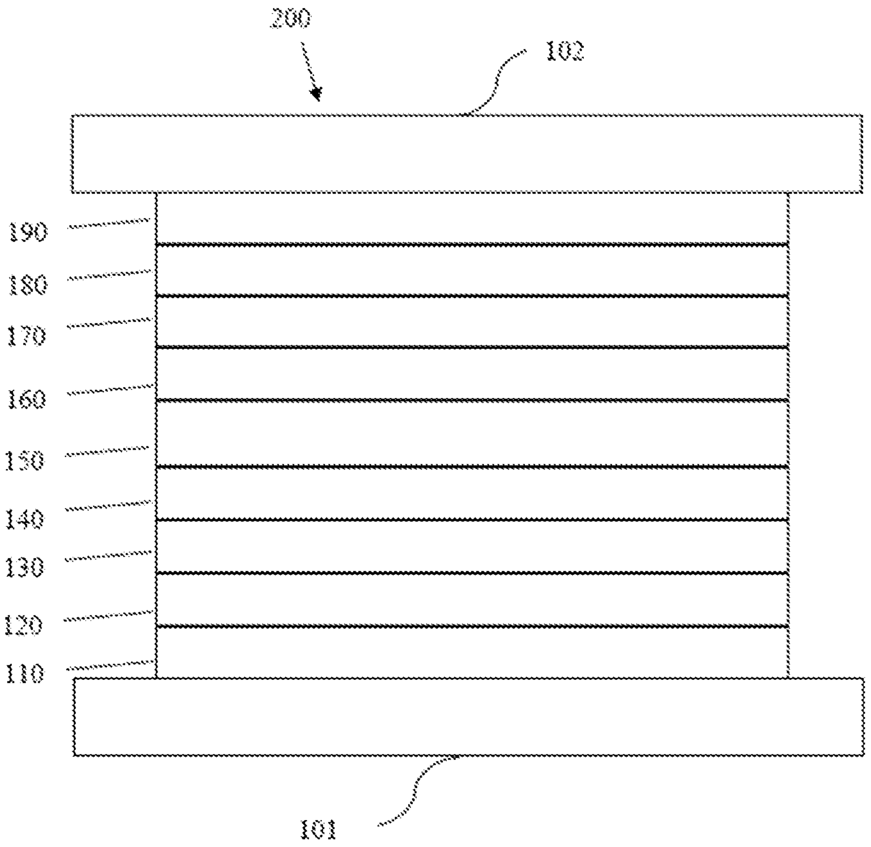
FIG. 2 is a schematic diagram of another organic light-emitting device that may include an electroluminescent device disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Wherein a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta_{ES-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta_{ES-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

DEFINITION OF TERMS OF SUBSTITUENTS

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butylmethylgermanylmethyl, triethylgermanylmethyl, triethylgermanylethyl, triisopropylgermanylmethyl, triisopropylgermanylethyl, trimethylsilylmethyl, trimethylsilylethyl, and trimethylsilylisopropyl, triisopropylsilylmethyl, triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, wherein at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, wherein at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl having 3 to 20 carbon atoms, unsubstituted arylgermanyl having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring.

In the compounds mentioned in the present disclosure, the expression that adjacent substituents can be optionally joined to form a ring includes a case wherein adjacent substituents may be joined to form a ring and a case wherein adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

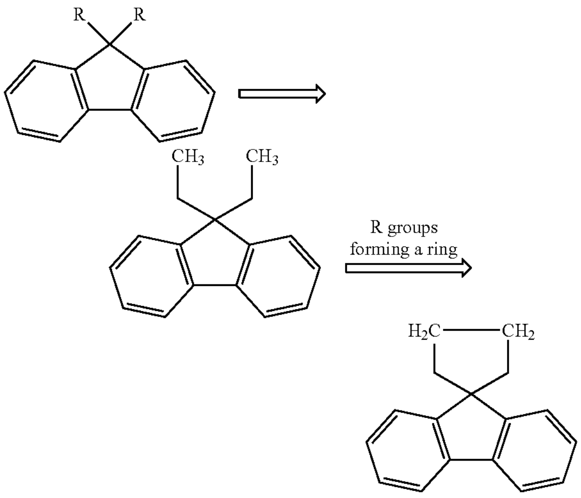

The expression that adjacent substituents can be optionally joined to form a ring is also intended to mean that two substituents bonded to carbon atoms which are directly bonded to each other are joined to each other via a chemical bond to form a ring, which can be exemplified by the following formula:

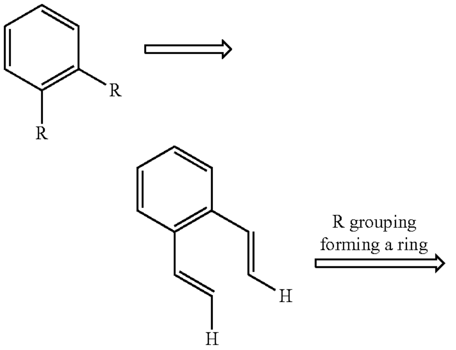

-continued

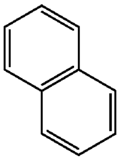

The expression that adjacent substituents can be optionally joined to form a ring is also intended to mean that two substituents bonded to a further distant carbon atom are joined to each other via a chemical bond to form a ring, which can be exemplified by the following formula:

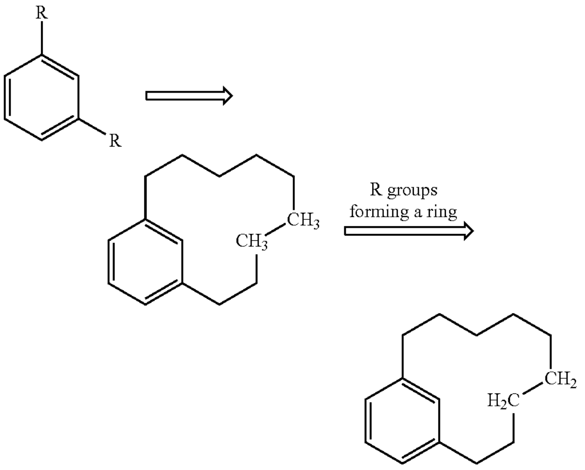

Furthermore, the expression that adjacent substituents can be optionally joined to form a ring is also intended to mean that, in the case wherein one of the two substituents bonded to carbon atoms which are directly bonded to each other represents hydrogen, the second substituent is bonded at a position at which the hydrogen atom is bonded, thereby forming a ring. This is exemplified by the following formula:

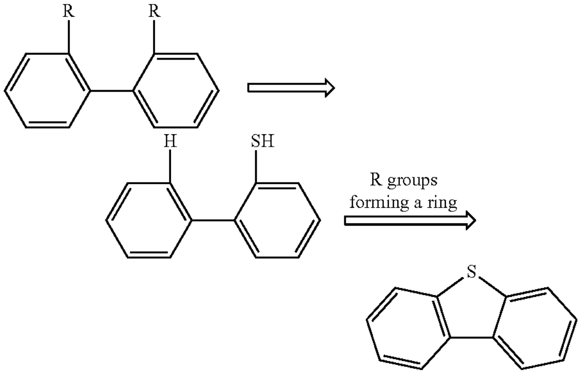

According to an embodiment of the present disclosure, an electroluminescent device is disclosed, which includes:

an anode, a cathode, and an organic layer disposed between the anode and the cathode, wherein the organic layer at least comprises a first compound and a second compound;

wherein the first compound has a structure of H-L-E, wherein H has a structure represented by Formula 1:

Formula 1

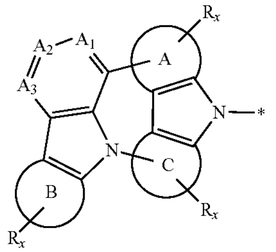

wherein in Formula 1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 18 carbon atoms or a heterocyclic ring having 3 to 18 carbon atoms;

$R_x$ represents, at each occurrence identically or differently, mono-substitution, multiple substitutions or non-substitution;

E has a structure represented by Formula 1-a:

Formula 1-a

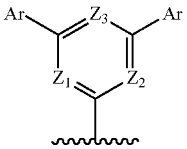

wherein in Formula 1-a, Ar is, at each occurrence identically or differently, selected from substituted or unsubstituted aryl having 6 to 30 carbon atoms or substituted or unsubstituted heteroaryl having 3 to 30 carbon atoms;

$Z_1$ to $Z_3$ are each independently selected from N or $CR_z$, and at least one of $Z_1$ to $Z_3$ is N;

L is selected from a single bond, substituted or unsubstituted arylene having 6 to 30 carbon atoms, substituted or unsubstituted heteroarylene having 3 to 30 carbon atoms or combinations thereof;

R, $R_x$ and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring;

the second compound has a structure represented by Formula 2:

Formula 2

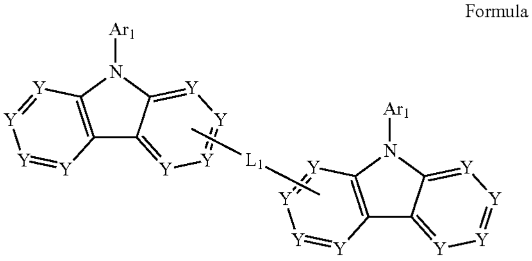

wherein,

Y is, at each occurrence identically or differently, selected from C, $CR_Y$ or N;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms or combinations thereof;

$R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino group having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_Y$ can be optionally joined to form a ring.

In this embodiment, the expression that "adjacent substituents R, $R_x$ can be optionally joined to form a ring" is intended to mean that any one or more of groups of adjacent substituents, such as adjacent substituents R, adjacent substituents $R_x$, and adjacent substituents R and $R_x$, can be joined to form a ring. Obviously, for the persons skilled in the art, it is also possible that none of these adjacent substituents are joined to form a ring.

In the present disclosure, the expression that "adjacent substituents $R_Y$ can be optionally joined to form a ring" is intended to mean that any adjacent substituents $R_Y$ can be joined to form a ring. Obviously, it is also possible that none adjacent $R_Y$ is joined to form a ring.

According to an embodiment of the present disclosure, wherein H has a structure represented by Formula 1A:

Formula 1A

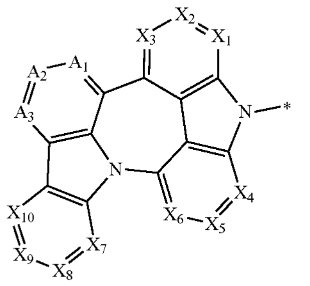

wherein $A_1$ to $A_3$ are, at each occurrence identically or differently, selected from N or CR, and $X_1$ to $X_{10}$ are, at each occurrence identically or differently, selected from N or $CR_x$;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring.

In the present disclosure, the expression that "adjacent substituents R, $R_x$ can be optionally joined to form a ring" is intended to mean that adjacent substituents R can be optionally joined to form a ring, is also intended to mean that adjacent substituents $R_x$ in $X_1$ to $X_3$ can be optionally joined to form a ring, is also intended to mean that that adjacent substituents $R_x$ in $X_4$ to $X_6$ can be optionally joined to form a ring, is also intended to mean that that adjacent substituents $R_x$ in $X_7$ to $X_{10}$ can be optionally joined to form a ring, and is also intended to mean that that adjacent substituents R and $R_x$ can be optionally joined to form a ring, for example, adjacent substituents in $A_1$ and $X_3$, and/or adjacent substituents in $A_3$ and $X_{10}$, and/or adjacent substituents in $X_6$ and $X_7$ can be optionally joined to form a ring. Obviously, for the persons skilled in the art, it is also possible that none adjacent substituents R and $R_x$ are joined to form a ring, and in this case, adjacent substituents R are not joined to form a ring, and/or adjacent substituents $R_x$ are not joined to form a ring, and/or adjacent substituents R and $R_x$ are not joined to form a ring.

According to an embodiment of the present disclosure, wherein R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, a cyano group, an isocyano group, a hydroxyl group, a sulfanyl group and combinations thereof.

According to an embodiment of the present disclosure, wherein at least one of R and $R_x$ is selected from deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms or combinations thereof;

adjacent substituents R and $R_x$ can be optionally joined to form a ring.

According to an embodiment of the present disclosure, at least one of R and $R_x$ is selected from deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylenyl, carbazolyl, 9-phenylcarbazolyl, 9,9-dimethylfluorenyl, pyridyl, phenylpyridyl or combinations thereof.

According to an embodiment of the present disclosure, wherein H is selected from the group consisting of H-1 to H-139, wherein for the specific structures of H-1 to H-139, reference is made to claim 4.

According to an embodiment of the present disclosure, wherein hydrogens in the structures of H-1 to H-139 can be partially or fully substituted with deuterium.

According to an embodiment of the present disclosure, wherein E has a structure represented by Formula 1-a:

Formula 1-a

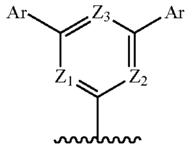

wherein $Z_1$ to $Z_3$ are each independently selected from N or $CR_z$, and at least two of $Z_1$ to $Z_3$ are N;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atom, substituted or unsubstituted amino having 0 to 20 carbon atoms, a cyano group, an isocyano group, a hydroxyl group, a sulfanyl group and combinations thereof;

Ar is, at each occurrence identically or differently, selected from substituted or unsubstituted aryl having 6 to 18 carbon atoms or substituted or unsubstituted heteroaryl having 3 to 18 carbon atoms.

According to an embodiment of the present disclosure, wherein $Z_1$ to $Z_3$ are N.

According to an embodiment of the present disclosure, wherein Ar is, at each occurrence identically or differently, selected from the group consisting of: phenyl, deuterated phenyl, methylphenyl, fluorophenyl, tert-butylphenyl, trideuterated methylphenyl, biphenyl, naphthyl, deuterated naphthyl, dibenzofuranyl, dibenzothienyl, 9,9-dimethylfluorenyl, carbazolyl, pyridyl, pyrimidinyl, 4-cyanophenyl, 3-cyanophenyl, triphenylenyl, silyl, germanyl, alkoxy and combinations thereof.

According to an embodiment of the present disclosure, wherein E is selected from the group consisting of E-1 to E-95, wherein for the specific structures of E-1 to E-95, reference is made to claim 6.

According to an embodiment of the present disclosure, wherein hydrogens in the structures E-1 to E-95 can be partially or fully substituted with deuterium.

According to an embodiment of the present disclosure, wherein L is selected from a single bond, substituted or unsubstituted arylene having 6 to 20 carbon atoms, substituted or unsubstituted heteroarylene having 3 to 20 carbon atoms or combinations thereof.

According to an embodiment of the present disclosure, wherein L has a structure represented by Formula 4:

Formula 4

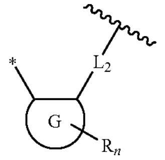

wherein the ring G is, at each occurrence identically or differently, selected from an aromatic ring having 6 to 18 carbon atoms or a heteroaromatic ring having 3 to 18 carbon atoms; $L_2$ is selected from a single bond, substituted or unsubstituted arylene having 6 to 30 carbon atoms, substituted or unsubstituted heteroarylene having 3 to 30 carbon atoms or combinations thereof; when $L_2$ is selected from substituted arylene having 6 to 30 carbon atoms or substituted heteroarylene having 3 to 30 carbon atoms, $L_2$ has a substituent $R_m$; $R_m$ represents, at each occurrence identically or differently, mono-substitution or multiple substitutions;

$R_n$ and $R_m$ are, at each occurrence identically or differently, selected from the group consisting of: hydrogen, deuterium, halogen, substituted or unsubstituted alkyl having 1 to 20 carbon atoms, substituted or unsubstituted arylalkyl having 7 to 30 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, a cyano group, an isocyano group, a hydroxyl group, a sulfanyl group and combinations thereof; adjacent substituents $R_n$, $R_m$ can be optionally joined to form a ring.

According to an embodiment of the present disclosure, wherein in Formula 4, the ring G is, at each occurrence identically or differently, selected from an aromatic ring having 6 to 12 carbon atoms or a heteroaromatic ring having 3 to 12 carbon atoms.

According to an embodiment of the present disclosure, wherein in Formula 4, $L_2$ is selected from a single bond, substituted or unsubstituted arylene having 6 to 12 carbon atoms, substituted or unsubstituted heteroarylene having 3 to 12 carbon atoms or combinations thereof.

According to an embodiment of the present disclosure, wherein in Formula 4, the ring G is, at each occurrence identically or differently, selected from a benzene ring, a naphthalene ring, a phenanthrene ring, a fluorene ring, a triphenylene ring, a carbazole ring, a dibenzofuran ring, a dibenzothiophene ring, a pyridine ring and combinations thereof;

$L_2$ is selected from a single bond, substituted or unsubstituted phenylene or substituted or unsubstituted naphthylene;

$R_n$ and $R_m$ are, at each occurrence identically or differently, selected from the group consisting of: hydrogen, deuterium, halogen, substituted or unsubstituted alkyl having 1 to 20 carbon atoms, substituted or unsubstituted arylalkyl having 7 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, a cyano group, a hydroxyl group, a sulfanyl group and combinations thereof.
According to an embodiment of the present disclosure, wherein L is selected from the group consisting of the following structures:
L-0
a single bond,
L-1
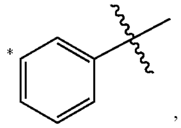,
L-2
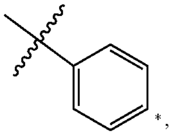,
L-3
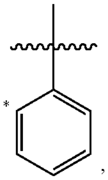,
L-4
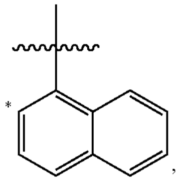,
L-5
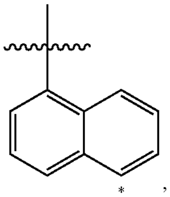,
L-6
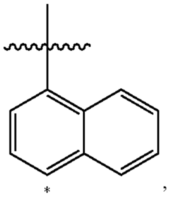,
L-7
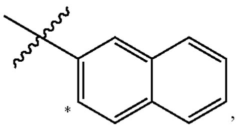,
L-8
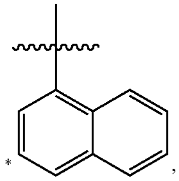,
-continued
L-9
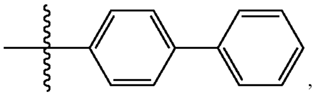,
L-10
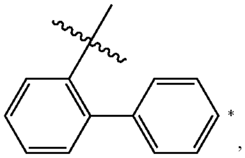,
L-11
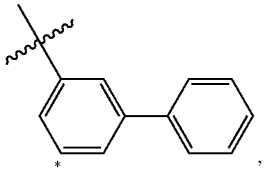,
L-12
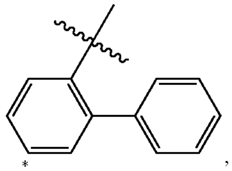,
L-13
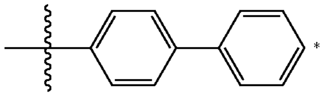,
L-14
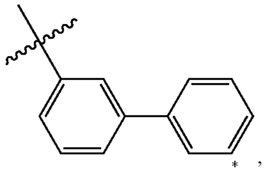,
L-15
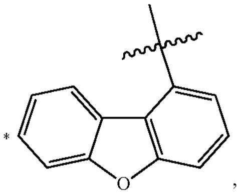,
L-16
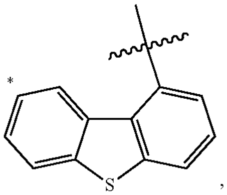,
L-17
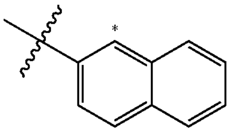, -continued

L-18

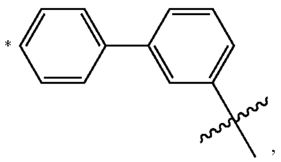

L-19

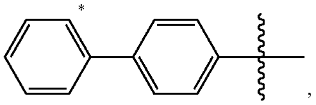

L-20

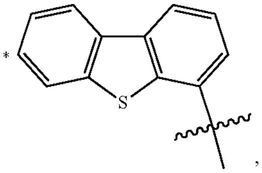

L-21

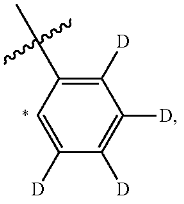

L-22

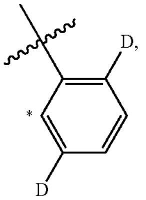

L-23

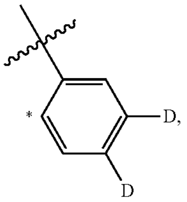

L-24

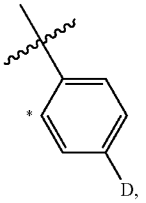

L-25

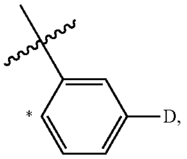

-continued

L-26

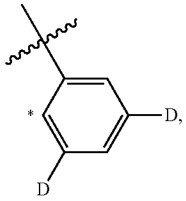

L-27

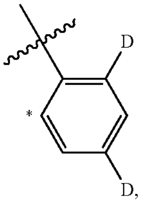

and

L-28

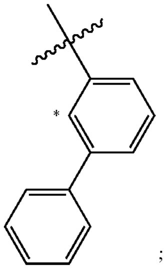

;

wherein

represents a position wherein a structure of L-1 to L-28 is joined to E, and "*" represents a position wherein a structure of L-1 to L-28 is joined to H.

According to an embodiment of the present disclosure, wherein hydrogens in the structures of L-1 to L-28 can be partially or fully substituted with deuterium.

According to an embodiment of the present disclosure, wherein the first compound has the structure of H-L-E, wherein H is selected from any one of the group consisting of H-1 to H-139, L is selected from any one of the group consisting of L-0 to L-28, and E is selected from any one of the group consisting of E-1 to E-95; optionally, hydrogens in the first compound can be partially or fully substituted with deuterium.

According to an embodiment of the present disclosure, wherein the first compound is selected from the group consisting of Compound 1-1 to Compound 1-551, wherein Compound 1-1 to Compound 1-551 have the structure of H-L-E, and H, L and E correspond to structures shown in the following table, respectively:

| Compound No. | H | L | E | Compound No. | H | L | E |
|---|---|---|---|---|---|---|---|
| 1-1 | H-1 | L-0 | E-1 | 1-2 | H-1 | L-23 | E-1 |
| 1-3 | H-1 | L-0 | E-2 | 1-4 | H-1 | L-24 | E-1 |
| 1-5 | H-1 | L-0 | E-3 | 1-6 | H-1 | L-25 | E-1 |
| 1-7 | H-1 | L-0 | E-4 | 1-8 | H-1 | L-26 | E-1 |

-continued

| Compound No. | H | L | E | Compound No. | H | L | E |
|---|---|---|---|---|---|---|---|
| 1-9 | H-1 | L-0 | E-5 | 1-10 | H-1 | L-27 | E-1 |
| 1-11 | H-1 | L-0 | E-6 | 1-12 | H-1 | L-2 | E-2 |
| 1-13 | H-1 | L-0 | E-7 | 1-14 | H-1 | L-4 | E-2 |
| 1-15 | H-1 | L-0 | E-8 | 1-16 | H-1 | L-5 | E-2 |
| 1-17 | H-1 | L-0 | E-9 | 1-18 | H-1 | L-6 | E-2 |
| 1-19 | H-1 | L-0 | E-10 | 1-20 | H-1 | L-7 | E-2 |
| 1-21 | H-1 | L-0 | E-11 | 1-22 | H-1 | L-8 | E-2 |
| 1-23 | H-1 | L-0 | E-12 | 1-24 | H-1 | L-9 | E-2 |
| 1-25 | H-1 | L-0 | E-13 | 1-26 | H-1 | L-10 | E-2 |
| 1-27 | H-1 | L-0 | E-14 | 1-28 | H-1 | L-11 | E-2 |
| 1-29 | H-1 | L-0 | E-15 | 1-30 | H-1 | L-12 | E-2 |
| 1-31 | H-1 | L-0 | E-16 | 1-32 | H-1 | L-13 | E-2 |
| 1-33 | H-1 | L-0 | E-17 | 1-34 | H-1 | L-14 | E-2 |
| 1-35 | H-1 | L-0 | E-18 | 1-36 | H-1 | L-15 | E-2 |
| 1-37 | H-1 | L-0 | E-19 | 1-38 | H-1 | L-16 | E-2 |
| 1-39 | H-1 | L-0 | E-20 | 1-40 | H-1 | L-17 | E-2 |
| 1-41 | H-1 | L-0 | E-21 | 1-42 | H-1 | L-18 | E-2 |
| 1-43 | H-1 | L-0 | E-22 | 1-44 | H-1 | L-19 | E-2 |
| 1-45 | H-1 | L-0 | E-23 | 1-46 | H-1 | L-20 | E-2 |
| 1-47 | H-1 | L-0 | E-24 | 1-48 | H-1 | L-21 | E-2 |
| 1-49 | H-1 | L-0 | E-25 | 1-50 | H-1 | L-22 | E-2 |
| 1-51 | H-1 | L-0 | E-26 | 1-52 | H-1 | L-23 | E-2 |
| 1-53 | H-1 | L-0 | E-27 | 1-54 | H-1 | L-24 | E-2 |
| 1-55 | H-1 | L-0 | E-28 | 1-56 | H-1 | L-25 | E-2 |
| 1-57 | H-1 | L-0 | E-29 | 1-58 | H-1 | L-26 | E-2 |
| 1-59 | H-1 | L-0 | E-30 | 1-60 | H-1 | L-27 | E-2 |
| 1-61 | H-1 | L-0 | E-31 | 1-62 | H-1 | L-2 | E-3 |
| 1-63 | H-1 | L-0 | E-32 | 1-64 | H-1 | L-4 | E-3 |
| 1-65 | H-1 | L-0 | E-33 | 1-66 | H-1 | L-5 | E-3 |
| 1-67 | H-1 | L-0 | E-34 | 1-68 | H-1 | L-6 | E-3 |
| 1-69 | H-1 | L-0 | E-35 | 1-70 | H-1 | L-7 | E-3 |
| 1-71 | H-1 | L-0 | E-36 | 1-72 | H-1 | L-8 | E-3 |
| 1-73 | H-1 | L-0 | E-37 | 1-74 | H-1 | L-9 | E-3 |
| 1-75 | H-1 | L-0 | E-38 | 1-76 | H-1 | L-10 | E-3 |
| 1-77 | H-1 | L-0 | E-39 | 1-78 | H-1 | L-11 | E-3 |
| 1-79 | H-1 | L-0 | E-40 | 1-80 | H-1 | L-12 | E-3 |
| 1-81 | H-1 | L-0 | E-41 | 1-82 | H-1 | L-13 | E-3 |
| 1-83 | H-1 | L-0 | E-42 | 1-84 | H-1 | L-14 | E-3 |
| 1-85 | H-1 | L-0 | E-43 | 1-86 | H-1 | L-15 | E-3 |
| 1-87 | H-1 | L-0 | E-44 | 1-88 | H-1 | L-16 | E-3 |
| 1-89 | H-1 | L-0 | E-45 | 1-90 | H-1 | L-17 | E-3 |
| 1-91 | H-1 | L-0 | E-46 | 1-92 | H-1 | L-18 | E-3 |
| 1-93 | H-1 | L-0 | E-47 | 1-94 | H-1 | L-19 | E-3 |
| 1-95 | H-1 | L-0 | E-48 | 1-96 | H-1 | L-20 | E-3 |
| 1-97 | H-1 | L-0 | E-49 | 1-98 | H-1 | L-21 | E-3 |
| 1-99 | H-1 | L-0 | E-50 | 1-100 | H-1 | L-22 | E-3 |
| 1-101 | H-1 | L-0 | E-51 | 1-102 | H-1 | L-23 | E-3 |
| 1-103 | H-1 | L-0 | E-52 | 1-104 | H-1 | L-24 | E-3 |
| 1-105 | H-1 | L-0 | E-53 | 1-106 | H-1 | L-25 | E-3 |
| 1-107 | H-1 | L-0 | E-54 | 1-108 | H-1 | L-26 | E-3 |
| 1-109 | H-1 | L-0 | E-55 | 1-110 | H-1 | L-27 | E-3 |
| 1-111 | H-1 | L-0 | E-56 | 1-112 | H-2 | L-2 | E-4 |
| 1-113 | H-1 | L-0 | E-57 | 1-114 | H-3 | L-4 | E-5 |
| 1-115 | H-1 | L-0 | E-58 | 1-116 | H-4 | L-5 | E-6 |
| 1-117 | H-1 | L-0 | E-59 | 1-118 | H-5 | L-6 | E-7 |
| 1-119 | H-1 | L-0 | E-60 | 1-120 | H-6 | L-7 | E-8 |
| 1-121 | H-1 | L-0 | E-61 | 1-122 | H-7 | L-8 | E-9 |
| 1-123 | H-1 | L-0 | E-62 | 1-124 | H-8 | L-9 | E-10 |
| 1-125 | H-1 | L-0 | E-63 | 1-126 | H-9 | L-10 | E-11 |
| 1-127 | H-1 | L-0 | E-64 | 1-128 | H-10 | L-11 | E-12 |
| 1-129 | H-1 | L-0 | E-65 | 1-130 | H-11 | L-12 | E-13 |
| 1-131 | H-1 | L-0 | E-66 | 1-132 | H-12 | L-13 | E-14 |
| 1-133 | H-1 | L-0 | E-67 | 1-134 | H-13 | L-14 | E-15 |
| 1-135 | H-1 | L-0 | E-68 | 1-136 | H-14 | L-15 | E-16 |
| 1-137 | H-1 | L-0 | E-69 | 1-138 | H-15 | L-16 | E-17 |
| 1-139 | H-1 | L-0 | E-70 | 1-140 | H-16 | L-17 | E-18 |
| 1-141 | H-1 | L-0 | E-71 | 1-142 | H-17 | L-18 | E-19 |
| 1-143 | H-1 | L-0 | E-72 | 1-144 | H-18 | L-19 | E-20 |
| 1-145 | H-1 | L-0 | E-73 | 1-146 | H-19 | L-20 | E-21 |
| 1-147 | H-1 | L-0 | E-74 | 1-148 | H-20 | L-21 | E-22 |
| 1-149 | H-1 | L-0 | E-75 | 1-150 | H-21 | L-22 | E-23 |
| 1-151 | H-1 | L-0 | E-76 | 1-152 | H-22 | L-23 | E-24 |
| 1-153 | H-1 | L-0 | E-77 | 1-154 | H-23 | L-24 | E-25 |
| 1-155 | H-1 | L-0 | E-78 | 1-156 | H-24 | L-25 | E-26 |
| 1-157 | H-1 | L-0 | E-79 | 1-158 | H-25 | L-26 | E-27 |
| 1-159 | H-1 | L-0 | E-80 | 1-160 | H-26 | L-27 | E-28 |

-continued

| Compound No. | H | L | E | Compound No. | H | L | E |
|---|---|---|---|---|---|---|---|
| 1-161 | H-1 | L-0 | E-81 | 1-162 | H-27 | L-2 | E-29 |
| 1-163 | H-1 | L-0 | E-82 | 1-164 | H-28 | L-4 | E-30 |
| 1-165 | H-1 | L-0 | E-83 | 1-166 | H-29 | L-5 | E-31 |
| 1-167 | H-1 | L-1 | E-1 | 1-168 | H-30 | L-6 | E-32 |
| 1-169 | H-1 | L-1 | E-2 | 1-170 | H-31 | L-7 | E-33 |
| 1-171 | H-1 | L-1 | E-3 | 1-172 | H-32 | L-8 | E-34 |
| 1-173 | H-1 | L-1 | E-4 | 1-174 | H-33 | L-9 | E-35 |
| 1-175 | H-1 | L-1 | E-5 | 1-176 | H-34 | L-10 | E-36 |
| 1-177 | H-1 | L-1 | E-6 | 1-178 | H-35 | L-11 | E-37 |
| 1-179 | H-1 | L-1 | E-7 | 1-180 | H-36 | L-12 | E-38 |
| 1-181 | H-1 | L-1 | E-8 | 1-182 | H-37 | L-13 | E-39 |
| 1-183 | H-1 | L-1 | E-9 | 1-184 | H-38 | L-14 | E-40 |
| 1-185 | H-1 | L-1 | E-10 | 1-186 | H-39 | L-15 | E-41 |
| 1-187 | H-1 | L-1 | E-11 | 1-188 | H-40 | L-16 | E-42 |
| 1-189 | H-1 | L-1 | E-12 | 1-190 | H-41 | L-17 | E-43 |
| 1-191 | H-1 | L-1 | E-13 | 1-192 | H-42 | L-18 | E-44 |
| 1-193 | H-1 | L-1 | E-14 | 1-194 | H-43 | L-19 | E-45 |
| 1-195 | H-1 | L-1 | E-15 | 1-196 | H-44 | L-20 | E-46 |
| 1-197 | H-1 | L-1 | E-16 | 1-198 | H-45 | L-21 | E-47 |
| 1-199 | H-1 | L-1 | E-17 | 1-200 | H-46 | L-22 | E-48 |
| 1-201 | H-1 | L-1 | E-18 | 1-202 | H-47 | L-23 | E-49 |
| 1-203 | H-1 | L-1 | E-19 | 1-204 | H-48 | L-24 | E-50 |
| 1-205 | H-1 | L-1 | E-20 | 1-206 | H-49 | L-25 | E-51 |
| 1-207 | H-1 | L-1 | E-21 | 1-208 | H-50 | L-26 | E-52 |
| 1-209 | H-1 | L-1 | E-22 | 1-210 | H-51 | L-27 | E-53 |
| 1-211 | H-1 | L-1 | E-23 | 1-212 | H-52 | L-2 | E-54 |
| 1-213 | H-1 | L-1 | E-24 | 1-214 | H-53 | L-4 | E-55 |
| 1-215 | H-1 | L-1 | E-25 | 1-216 | H-54 | L-5 | E-56 |
| 1-217 | H-1 | L-1 | E-26 | 1-218 | H-55 | L-6 | E-57 |
| 1-219 | H-1 | L-1 | E-27 | 1-220 | H-56 | L-7 | E-58 |
| 1-221 | H-1 | L-1 | E-28 | 1-222 | H-57 | L-8 | E-59 |
| 1-223 | H-1 | L-1 | E-29 | 1-224 | H-58 | L-9 | E-60 |
| 1-225 | H-1 | L-1 | E-30 | 1-226 | H-59 | L-10 | E-61 |
| 1-227 | H-1 | L-1 | E-31 | 1-228 | H-60 | L-11 | E-62 |
| 1-229 | H-1 | L-1 | E-32 | 1-230 | H-61 | L-12 | E-63 |
| 1-231 | H-1 | L-1 | E-33 | 1-232 | H-62 | L-13 | E-64 |
| 1-233 | H-1 | L-1 | E-34 | 1-234 | H-63 | L-14 | E-65 |
| 1-235 | H-1 | L-1 | E-35 | 1-236 | H-64 | L-15 | E-66 |
| 1-237 | H-1 | L-1 | E-36 | 1-238 | H-65 | L-16 | E-67 |
| 1-239 | H-1 | L-1 | E-37 | 1-240 | H-66 | L-17 | E-68 |
| 1-241 | H-1 | L-1 | E-38 | 1-242 | H-67 | L-18 | E-69 |
| 1-243 | H-1 | L-1 | E-39 | 1-244 | H-68 | L-19 | E-70 |
| 1-245 | H-1 | L-1 | E-40 | 1-246 | H-69 | L-20 | E-71 |
| 1-247 | H-1 | L-1 | E-41 | 1-248 | H-70 | L-21 | E-72 |
| 1-249 | H-1 | L-1 | E-42 | 1-250 | H-71 | L-22 | E-73 |
| 1-251 | H-1 | L-1 | E-43 | 1-252 | H-72 | L-23 | E-74 |
| 1-253 | H-1 | L-1 | E-44 | 1-254 | H-73 | L-24 | E-75 |
| 1-255 | H-1 | L-1 | E-45 | 1-256 | H-74 | L-25 | E-76 |
| 1-257 | H-1 | L-1 | E-46 | 1-258 | H-75 | L-26 | E-77 |
| 1-259 | H-1 | L-1 | E-47 | 1-260 | H-76 | L-27 | E-78 |
| 1-261 | H-1 | L-1 | E-48 | 1-262 | H-2 | L-3 | E-79 |
| 1-263 | H-1 | L-1 | E-49 | 1-264 | H-3 | L-3 | E-80 |
| 1-265 | H-1 | L-1 | E-50 | 1-266 | H-4 | L-3 | E-81 |
| 1-267 | H-1 | L-1 | E-51 | 1-268 | H-5 | L-3 | E-82 |
| 1-269 | H-1 | L-1 | E-52 | 1-270 | H-6 | L-3 | E-83 |
| 1-271 | H-1 | L-1 | E-53 | 1-272 | H-7 | L-3 | E-1 |
| 1-273 | H-1 | L-1 | E-54 | 1-274 | H-8 | L-3 | E-1 |
| 1-275 | H-1 | L-1 | E-55 | 1-276 | H-9 | L-3 | E-1 |
| 1-277 | H-1 | L-1 | E-56 | 1-278 | H-10 | L-3 | E-1 |
| 1-279 | H-1 | L-1 | E-57 | 1-280 | H-11 | L-3 | E-1 |
| 1-281 | H-1 | L-1 | E-58 | 1-282 | H-12 | L-3 | E-1 |
| 1-283 | H-1 | L-1 | E-59 | 1-284 | H-13 | L-3 | E-1 |
| 1-285 | H-1 | L-1 | E-60 | 1-286 | H-14 | L-3 | E-1 |
| 1-287 | H-1 | L-1 | E-61 | 1-288 | H-15 | L-3 | E-1 |
| 1-289 | H-1 | L-1 | E-62 | 1-290 | H-16 | L-3 | E-1 |
| 1-291 | H-1 | L-1 | E-63 | 1-292 | H-17 | L-3 | E-1 |
| 1-293 | H-1 | L-1 | E-64 | 1-294 | H-18 | L-3 | E-1 |
| 1-295 | H-1 | L-1 | E-65 | 1-296 | H-19 | L-3 | E-1 |
| 1-297 | H-1 | L-1 | E-66 | 1-298 | H-20 | L-3 | E-1 |
| 1-299 | H-1 | L-1 | E-67 | 1-300 | H-21 | L-3 | E-1 |
| 1-301 | H-1 | L-1 | E-68 | 1-302 | H-22 | L-3 | E-1 |
| 1-303 | H-1 | L-1 | E-69 | 1-304 | H-23 | L-3 | E-1 |
| 1-305 | H-1 | L-1 | E-70 | 1-306 | H-24 | L-3 | E-1 |
| 1-307 | H-1 | L-1 | E-71 | 1-308 | H-25 | L-3 | E-1 |
| 1-309 | H-1 | L-1 | E-72 | 1-310 | H-26 | L-3 | E-1 |
| 1-311 | H-1 | L-1 | E-73 | 1-312 | H-27 | L-3 | E-1 |

-continued

| Compound No. | H | L | E | Compound No. | H | L | E |
|---|---|---|---|---|---|---|---|
| 1-313 | H-1 | L-1 | E-74 | 1-314 | H-28 | L-3 | E-1 |
| 1-315 | H-1 | L-1 | E-75 | 1-316 | H-29 | L-3 | E-1 |
| 1-317 | H-1 | L-1 | E-76 | 1-318 | H-30 | L-3 | E-1 |
| 1-319 | H-1 | L-1 | E-77 | 1-320 | H-31 | L-3 | E-1 |
| 1-321 | H-1 | L-1 | E-78 | 1-322 | H-32 | L-3 | E-1 |
| 1-323 | H-1 | L-1 | E-79 | 1-324 | H-33 | L-3 | E-1 |
| 1-325 | H-1 | L-1 | E-80 | 1-326 | H-34 | L-3 | E-1 |
| 1-327 | H-1 | L-1 | E-81 | 1-328 | H-35 | L-3 | E-1 |
| 1-329 | H-1 | L-1 | E-82 | 1-330 | H-36 | L-3 | E-1 |
| 1-331 | H-1 | L-1 | E-83 | 1-332 | H-37 | L-3 | E-1 |
| 1-333 | H-1 | L-3 | E-1 | 1-334 | H-38 | L-3 | E-1 |
| 1-335 | H-1 | L-3 | E-2 | 1-336 | H-39 | L-3 | E-1 |
| 1-337 | H-1 | L-3 | E-3 | 1-338 | H-40 | L-3 | E-1 |
| 1-339 | H-1 | L-3 | E-4 | 1-340 | H-41 | L-3 | E-1 |
| 1-341 | H-1 | L-3 | E-5 | 1-342 | H-42 | L-3 | E-1 |
| 1-343 | H-1 | L-3 | E-6 | 1-344 | H-43 | L-3 | E-1 |
| 1-345 | H-1 | L-3 | E-7 | 1-346 | H-44 | L-3 | E-1 |
| 1-347 | H-1 | L-3 | E-8 | 1-348 | H-45 | L-3 | E-1 |
| 1-349 | H-1 | L-3 | E-9 | 1-350 | H-46 | L-3 | E-1 |
| 1-351 | H-1 | L-3 | E-10 | 1-352 | H-47 | L-3 | E-1 |
| 1-353 | H-1 | L-3 | E-11 | 1-354 | H-48 | L-3 | E-1 |
| 1-355 | H-1 | L-3 | E-12 | 1-356 | H-49 | L-3 | E-1 |
| 1-357 | H-1 | L-3 | E-13 | 1-358 | H-50 | L-3 | E-1 |
| 1-359 | H-1 | L-3 | E-14 | 1-360 | H-51 | L-3 | E-1 |
| 1-361 | H-1 | L-3 | E-15 | 1-362 | H-52 | L-3 | E-1 |
| 1-363 | H-1 | L-3 | E-16 | 1-364 | H-53 | L-3 | E-1 |
| 1-365 | H-1 | L-3 | E-17 | 1-366 | H-54 | L-3 | E-1 |
| 1-367 | H-1 | L-3 | E-18 | 1-368 | H-55 | L-3 | E-1 |
| 1-369 | H-1 | L-3 | E-19 | 1-370 | H-56 | L-3 | E-1 |
| 1-371 | H-1 | L-3 | E-20 | 1-372 | H-57 | L-3 | E-1 |
| 1-373 | H-1 | L-3 | E-21 | 1-374 | H-58 | L-3 | E-1 |
| 1-375 | H-1 | L-3 | E-22 | 1-376 | H-59 | L-3 | E-1 |
| 1-377 | H-1 | L-3 | E-23 | 1-378 | H-60 | L-3 | E-1 |
| 1-379 | H-1 | L-3 | E-24 | 1-380 | H-61 | L-3 | E-1 |
| 1-381 | H-1 | L-3 | E-25 | 1-382 | H-62 | L-3 | E-1 |
| 1-383 | H-1 | L-3 | E-26 | 1-384 | H-63 | L-3 | E-1 |
| 1-385 | H-1 | L-3 | E-27 | 1-386 | H-64 | L-3 | E-1 |
| 1-387 | H-1 | L-3 | E-28 | 1-388 | H-65 | L-3 | E-1 |
| 1-389 | H-1 | L-3 | E-29 | 1-390 | H-66 | L-3 | E-1 |
| 1-391 | H-1 | L-3 | E-30 | 1-392 | H-67 | L-3 | E-1 |
| 1-393 | H-1 | L-3 | E-31 | 1-394 | H-68 | L-3 | E-1 |
| 1-395 | H-1 | L-3 | E-32 | 1-396 | H-69 | L-3 | E-1 |
| 1-397 | H-1 | L-3 | E-33 | 1-398 | H-70 | L-3 | E-1 |
| 1-399 | H-1 | L-3 | E-34 | 1-400 | H-71 | L-3 | E-1 |
| 1-401 | H-1 | L-3 | E-35 | 1-402 | H-72 | L-3 | E-1 |
| 1-403 | H-1 | L-3 | E-36 | 1-404 | H-73 | L-3 | E-1 |
| 1-405 | H-1 | L-3 | E-37 | 1-406 | H-74 | L-3 | E-1 |
| 1-407 | H-1 | L-3 | E-38 | 1-408 | H-75 | L-3 | E-1 |
| 1-409 | H-1 | L-3 | E-39 | 1-410 | H-76 | L-3 | E-1 |
| 1-411 | H-1 | L-3 | E-40 | 1-412 | H-77 | L-3 | E-1 |
| 1-413 | H-1 | L-3 | E-41 | 1-414 | H-78 | L-3 | E-1 |
| 1-415 | H-1 | L-3 | E-42 | 1-416 | H-79 | L-3 | E-1 |
| 1-417 | H-1 | L-3 | E-43 | 1-418 | H-80 | L-3 | E-1 |
| 1-419 | H-1 | L-3 | E-44 | 1-420 | H-81 | L-3 | E-1 |
| 1-421 | H-1 | L-3 | E-45 | 1-422 | H-82 | L-3 | E-1 |
| 1-423 | H-1 | L-3 | E-46 | 1-424 | H-83 | L-3 | E-1 |
| 1-425 | H-1 | L-3 | E-47 | 1-426 | H-84 | L-3 | E-1 |
| 1-427 | H-1 | L-3 | E-48 | 1-428 | H-85 | L-3 | E-1 |
| 1-429 | H-1 | L-3 | E-49 | 1-430 | H-86 | L-3 | E-1 |
| 1-431 | H-1 | L-3 | E-50 | 1-432 | H-87 | L-3 | E-1 |
| 1-433 | H-1 | L-3 | E-51 | 1-434 | H-88 | L-3 | E-1 |
| 1-435 | H-1 | L-3 | E-52 | 1-436 | H-89 | L-3 | E-1 |
| 1-437 | H-1 | L-3 | E-53 | 1-438 | H-90 | L-3 | E-1 |
| 1-439 | H-1 | L-3 | E-54 | 1-440 | H-91 | L-3 | E-1 |
| 1-441 | H-1 | L-3 | E-55 | 1-442 | H-92 | L-3 | E-1 |
| 1-443 | H-1 | L-3 | E-56 | 1-444 | H-93 | L-3 | E-1 |
| 1-445 | H-1 | L-3 | E-57 | 1-446 | H-94 | L-3 | E-1 |
| 1-447 | H-1 | L-3 | E-58 | 1-448 | H-95 | L-3 | E-1 |
| 1-449 | H-1 | L-3 | E-59 | 1-450 | H-96 | L-3 | E-1 |
| 1-451 | H-1 | L-3 | E-60 | 1-452 | H-97 | L-3 | E-1 |
| 1-453 | H-1 | L-3 | E-61 | 1-454 | H-98 | L-3 | E-1 |
| 1-455 | H-1 | L-3 | E-62 | 1-456 | H-99 | L-3 | E-1 |
| 1-457 | H-1 | L-3 | E-63 | 1-458 | H-100 | L-3 | E-1 |
| 1-459 | H-1 | L-3 | E-64 | 1-460 | H-101 | L-3 | E-1 |
| 1-461 | H-1 | L-3 | E-65 | 1-462 | H-102 | L-3 | E-1 |
| 1-463 | H-1 | L-3 | E-66 | 1-464 | H-103 | L-3 | E-1 |

-continued

| Compound No. | H | L | E | Compound No. | H | L | E |
|---|---|---|---|---|---|---|---|
| 1-465 | H-1 | L-3 | E-67 | 1-466 | H-104 | L-3 | E-1 |
| 1-467 | H-1 | L-3 | E-68 | 1-468 | H-105 | L-3 | E-1 |
| 1-469 | H-1 | L-3 | E-69 | 1-470 | H-106 | L-3 | E-1 |
| 1-471 | H-1 | L-3 | E-70 | 1-472 | H-107 | L-3 | E-1 |
| 1-473 | H-1 | L-3 | E-71 | 1-474 | H-108 | L-3 | E-1 |
| 1-475 | H-1 | L-3 | E-72 | 1-476 | H-109 | L-3 | E-1 |
| 1-477 | H-1 | L-3 | E-73 | 1-478 | H-110 | L-3 | E-1 |
| 1-479 | H-1 | L-3 | E-74 | 1-480 | H-111 | L-3 | E-1 |
| 1-481 | H-1 | L-3 | E-75 | 1-482 | H-112 | L-3 | E-1 |
| 1-483 | H-1 | L-3 | E-76 | 1-484 | H-113 | L-3 | E-1 |
| 1-485 | H-1 | L-3 | E-77 | 1-486 | H-114 | L-3 | E-1 |
| 1-487 | H-1 | L-3 | E-78 | 1-488 | H-115 | L-3 | E-1 |
| 1-489 | H-1 | L-3 | E-79 | 1-490 | H-116 | L-3 | E-1 |
| 1-491 | H-1 | L-3 | E-80 | 1-492 | H-117 | L-3 | E-1 |
| 1-493 | H-1 | L-3 | E-81 | 1-494 | H-118 | L-3 | E-1 |
| 1-495 | H-1 | L-3 | E-82 | 1-496 | H-119 | L-3 | E-1 |
| 1-497 | H-1 | L-3 | E-83 | 1-498 | H-120 | L-3 | E-1 |
| 1-499 | H-1 | L-2 | E-1 | 1-500 | H-121 | L-3 | E-1 |
| 1-501 | H-1 | L-4 | E-1 | 1-502 | H-122 | L-3 | E-1 |
| 1-503 | H-1 | L-5 | E-1 | 1-504 | H-123 | L-3 | E-1 |
| 1-505 | H-1 | L-6 | E-1 | 1-506 | H-124 | L-3 | E-1 |
| 1-507 | H-1 | L-7 | E-1 | 1-508 | H-125 | L-3 | E-1 |
| 1-509 | H-1 | L-8 | E-1 | 1-510 | H-126 | L-3 | E-1 |
| 1-511 | H-1 | L-9 | E-1 | 1-512 | H-127 | L-3 | E-1 |
| 1-513 | H-1 | L-10 | E-1 | 1-514 | H-128 | L-3 | E-1 |
| 1-515 | H-1 | L-11 | E-1 | 1-516 | H-129 | L-3 | E-1 |
| 1-517 | H-1 | L-12 | E-1 | 1-518 | H-130 | L-3 | E-1 |
| 1-519 | H-1 | L-13 | E-1 | 1-520 | H-131 | L-3 | E-1 |
| 1-521 | H-1 | L-14 | E-1 | 1-522 | H-132 | L-3 | E-1 |
| 1-523 | H-1 | L-15 | E-1 | 1-524 | H-133 | L-3 | E-1 |
| 1-525 | H-1 | L-16 | E-1 | 1-526 | H-134 | L-3 | E-1 |
| 1-527 | H-1 | L-17 | E-1 | 1-528 | H-135 | L-3 | E-1 |
| 1-529 | H-1 | L-18 | E-1 | 1-530 | H-136 | L-3 | E-1 |
| 1-531 | H-1 | L-19 | E-1 | 1-532 | H-137 | L-3 | E-1 |
| 1-533 | H-1 | L-20 | E-1 | 1-534 | H-138 | L-3 | E-1 |
| 1-535 | H-1 | L-21 | E-1 | 1-536 | H-139 | L-3 | E-1 |
| 1-537 | H-1 | L-22 | E-1 | 1-538 | H-139 | L-4 | E-7 |
| 1-539 | H-1 | L-0 | E-84 | 1-540 | H-1 | L-0 | E-85 |
| 1-541 | H-1 | L-0 | E-86 | 1-542 | H-1 | L-0 | E-87 |
| 1-543 | H-1 | L-0 | E-88 | 1-544 | H-1 | L-0 | E-89 |
| 1-545 | H-1 | L-0 | E-90 | 1-546 | H-1 | L-0 | E-91 |
| 1-547 | H-1 | L-0 | E-92 | 1-548 | H-1 | L-0 | E-93 |
| 1-549 | H-1 | L-0 | E-94 | 1-550 | H-1 | L-0 | E-95 |
| 1-551 | H-1 | L-28 | E-1 | | | | |

According to an embodiment of the present disclosure, wherein hydrogen in Compound 1-1 to Compound 1-551 can be partially or completely substituted with deuterium.

According to an embodiment of the present disclosure, wherein the second compound has a structure represented by one of Formula 2-a to Formula 2-d:

Formula 2-a

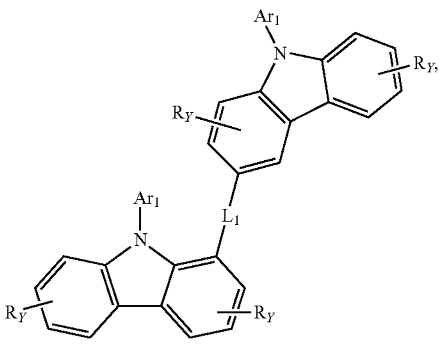

-continued

Formula 2-b

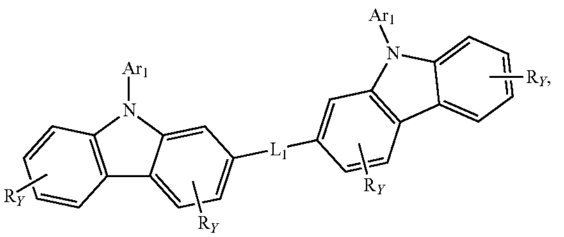

Formula 2-c

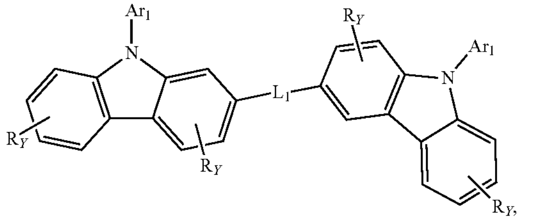

Formula 2-d

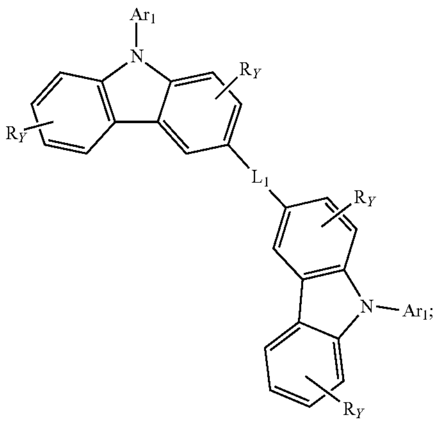

wherein $R_Y$ represents, at each occurrence identically or differently, mono-substitution, multiple substitutions or non-substitution; $R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof.

According to an embodiment of the present disclosure, $R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heterocyclyl having 3 to 20 carbon atoms, substituted or unsubstituted aryl having 6 to 20 carbon atoms, substituted or unsubstituted heteroaryl having 3 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a cyano group, an isocyano group, a hydroxyl group, a sulfanyl group, a sulfinyl group, a sulfonyl group, a phosphino group and combinations thereof;

adjacent substituents $R_Y$ can be optionally joined to form a ring.

According to an embodiment of the present disclosure, wherein $Ar_1$ is, at each occurrence identically or differently, selected from substituted or unsubstituted aryl having 6 to 25 carbon atoms, substituted or unsubstituted heteroaryl having 3 to 25 carbon atoms or combinations thereof.

According to an embodiment of the present disclosure, wherein $Ar_1$ is, at each occurrence identically or differently, selected from phenyl, fluorophenyl, naphthyl, biphenyl, benzothienyl, dibenzothienyl, benzofuryl, dibenzofuryl, dibenzoselenophenyl, carbazolyl, 9,9-dimethylfluorenyl, 9,9-spirobifluorenyl, cyanophenyl or combinations thereof.

According to an embodiment of the present disclosure, wherein $Ar_1$ is selected from the group consisting of Ar-1 to Ar-132, wherein for the specific structures of Ar-1 to Ar-132, reference is made to claim 10.

According to an embodiment of the present disclosure, wherein hydrogen in structures of Ar-1 to Ar-132 can be partially or completely substituted with deuterium.

According to an embodiment of the present disclosure, wherein $L_1$ is selected from a single bond, substituted or unsubstituted arylene having 6 to 30 carbon atoms, substituted or unsubstituted heteroarylene having 3 to 30 carbon atoms or combinations thereof.

According to an embodiment of the present disclosure, wherein $L_1$ is selected from a single bond, substituted or unsubstituted arylene having 6 to 20 carbon atoms, substituted or unsubstituted heteroarylene having 3 to 20 carbon atoms or combinations thereof.

According to an embodiment of the present disclosure, wherein $L_1$ is selected from the group consisting of the following structures:

L-0 a single bond

-continued
L-1
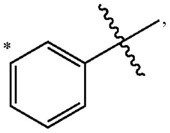
L-2
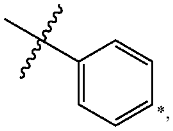
L-3
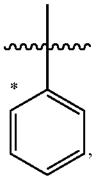
L-4
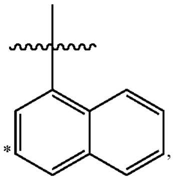
L-5
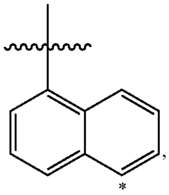
L-6
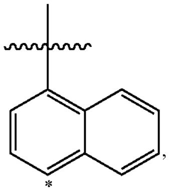
L-7
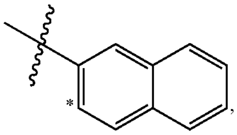
L-8
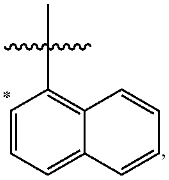
L-9
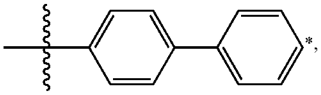
-continued
L-10
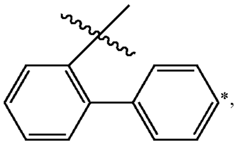
L-11
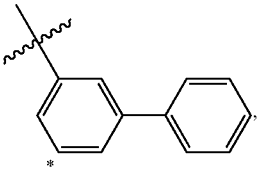
L-12
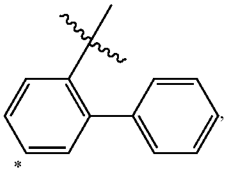
L-13
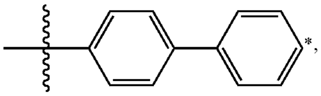
L-14
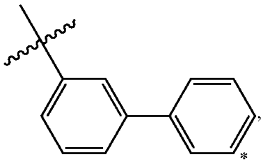
L-15
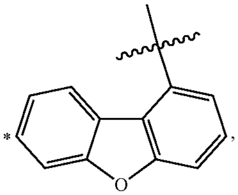
L-16
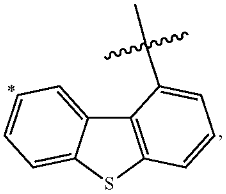
L-17
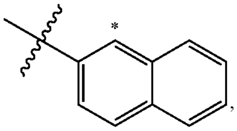
L-18
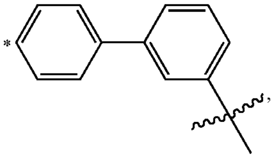

-continued
L-19
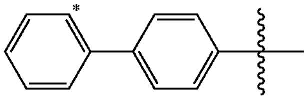
L-20
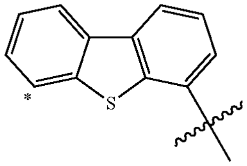
,
L-21
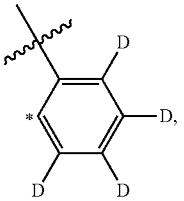
L-22
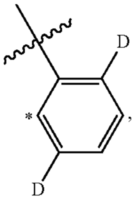
L-23
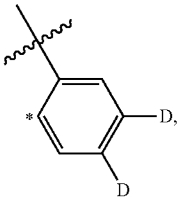
L-24
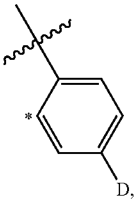
L-25
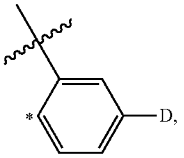
L-26
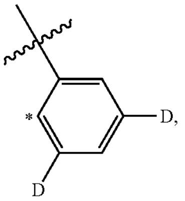
and
-continued
L-27
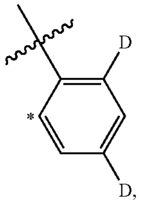
According to an embodiment of the present disclosure, wherein hydrogens in the structures of L-1 to L-27 can be partially or fully substituted with deuterium.
According to an embodiment of the present disclosure, wherein the second compound is selected from the group consisting of Compound 2-1 to Compound 2-172:
2-1
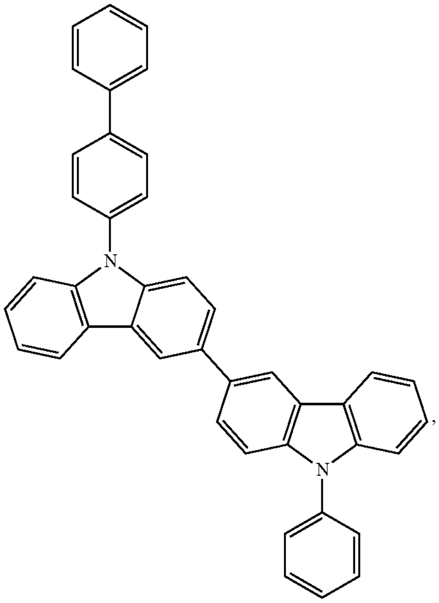
,
2-2
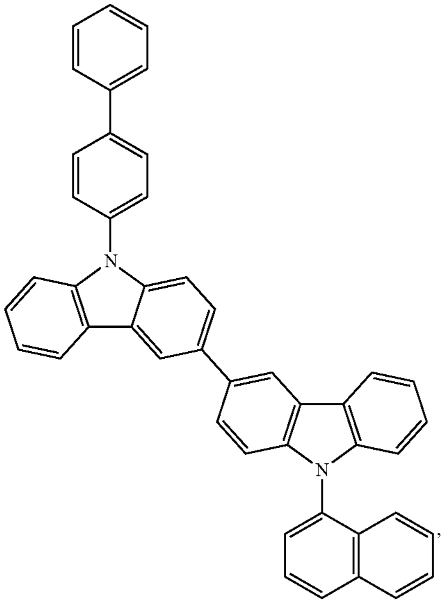
, -continued
2-3
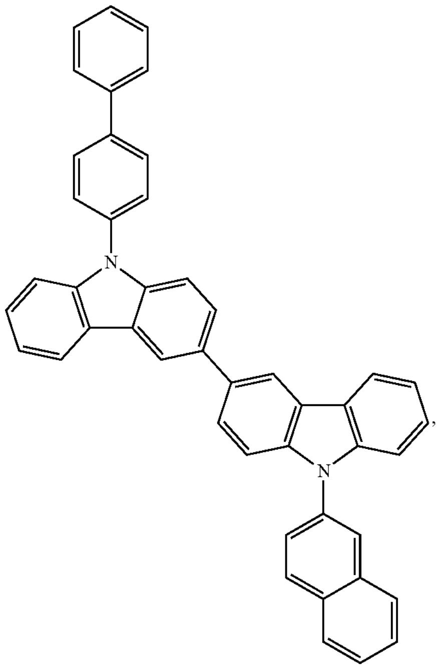,
2-4
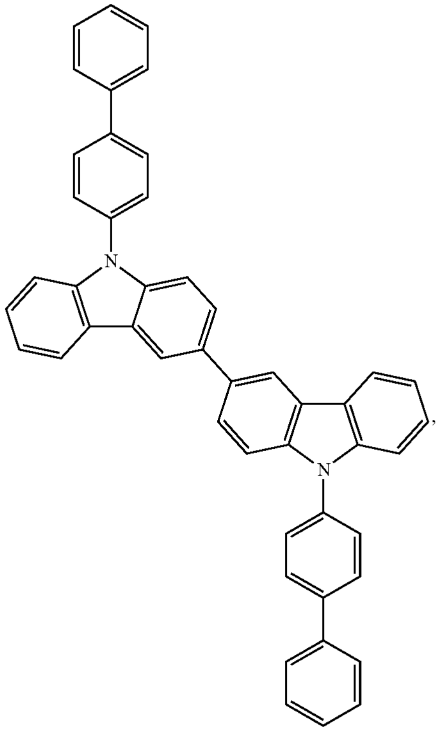,
-continued
2-5
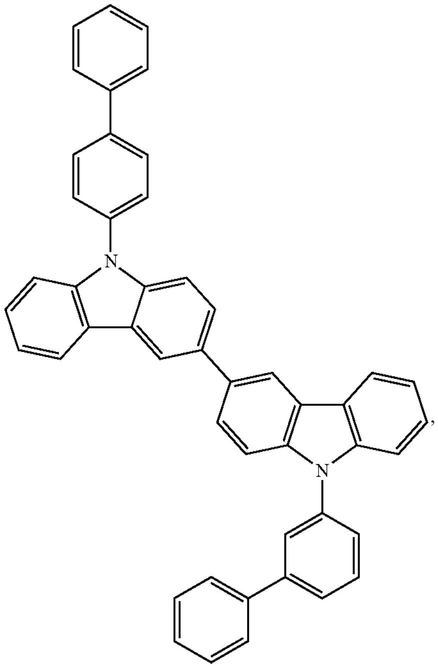,
2-6
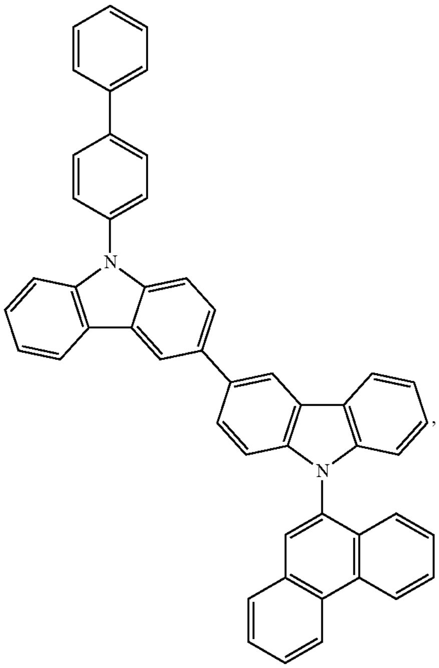, -continued
2-7
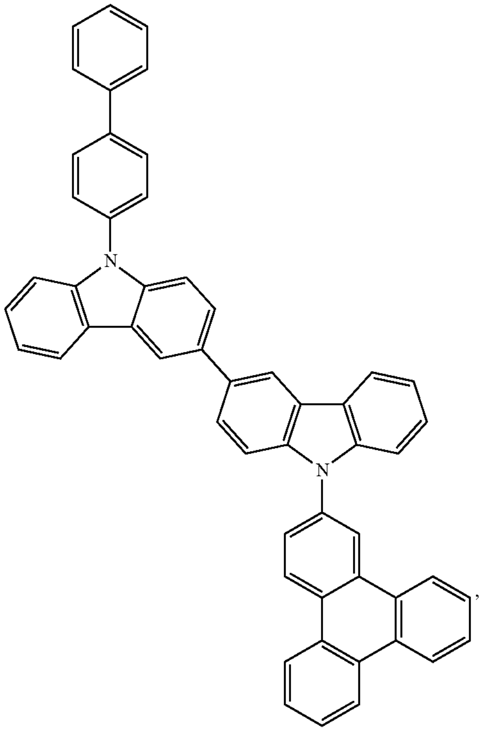
,
2-8
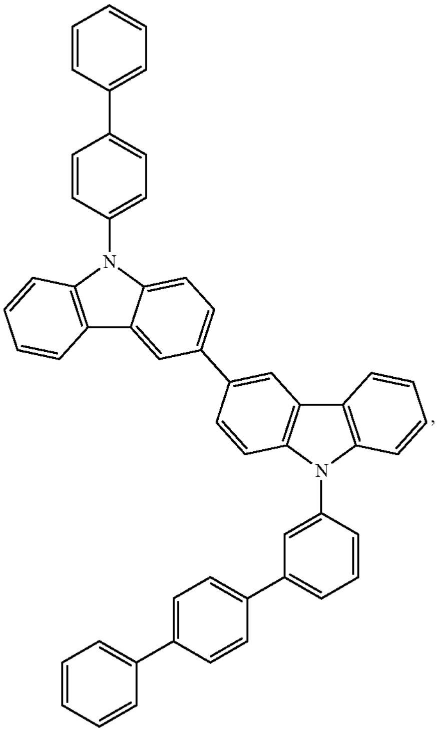
,
-continued
2-9
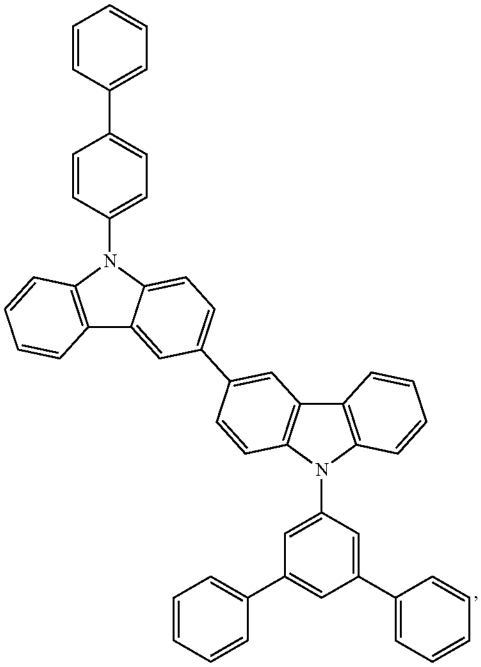
,
2-10
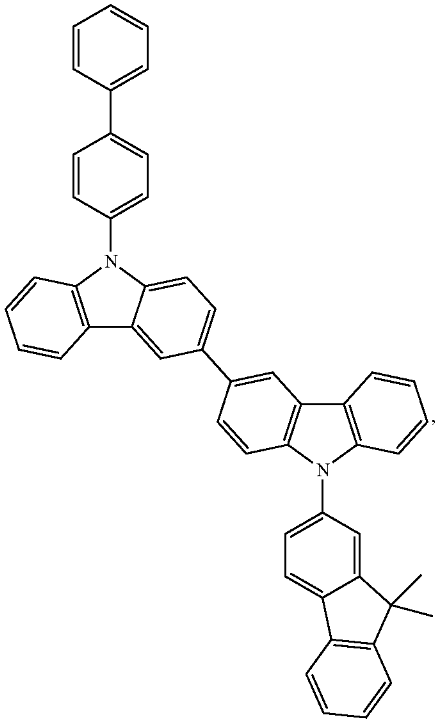
, -continued
2-11
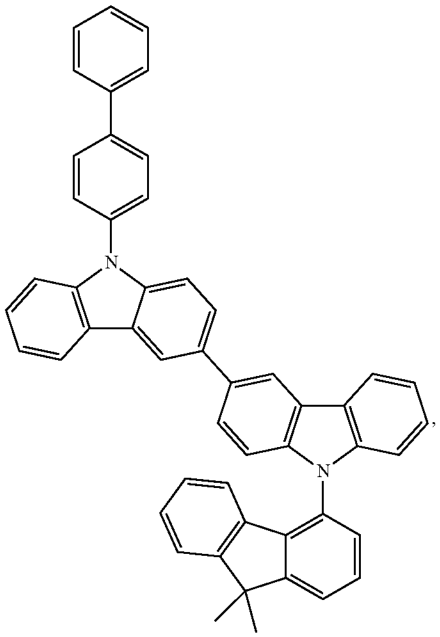
2-12
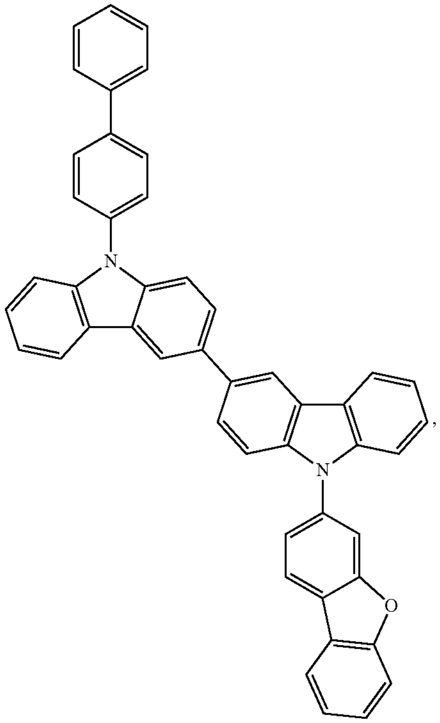
-continued
2-13
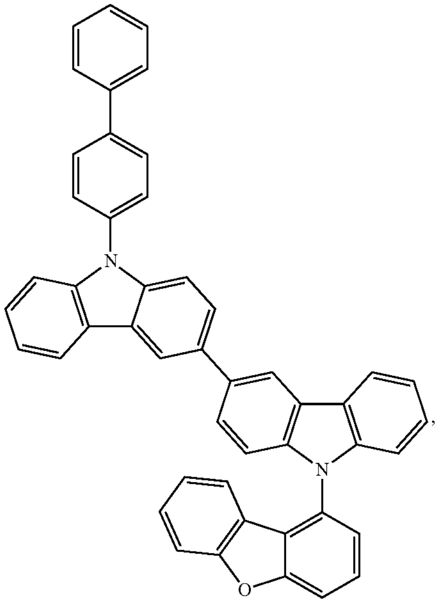
2-14
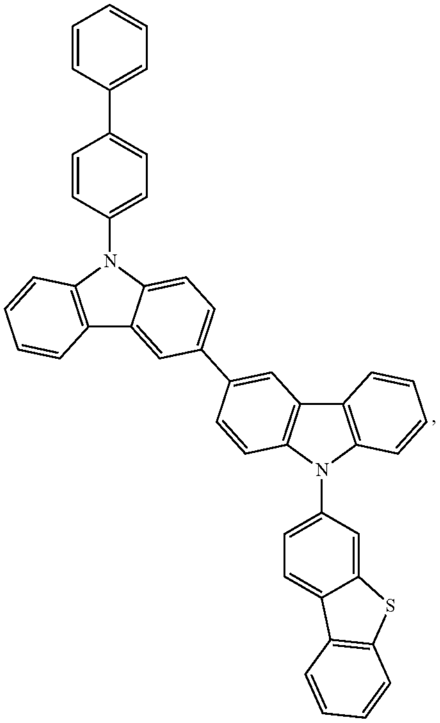

-continued
2-15
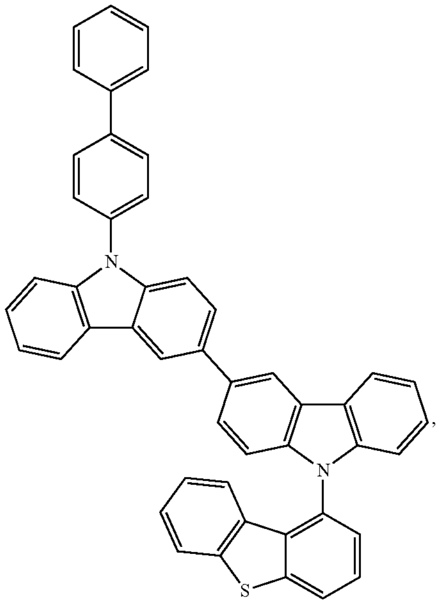
2-16
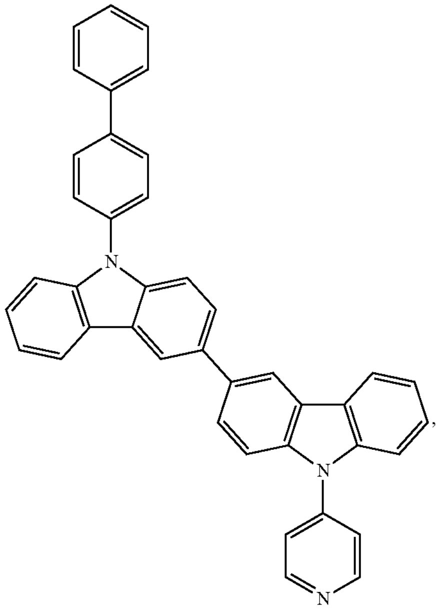
-continued
2-17
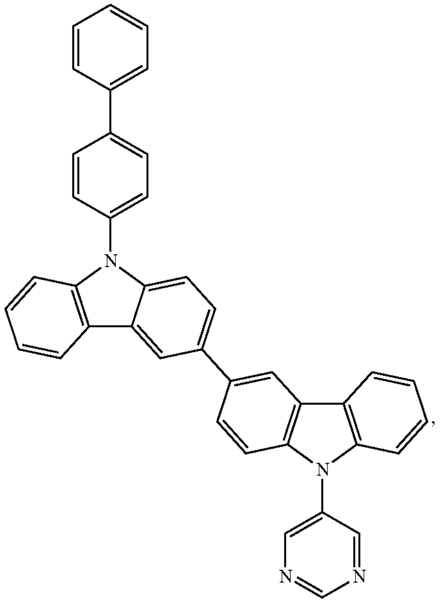
2-18
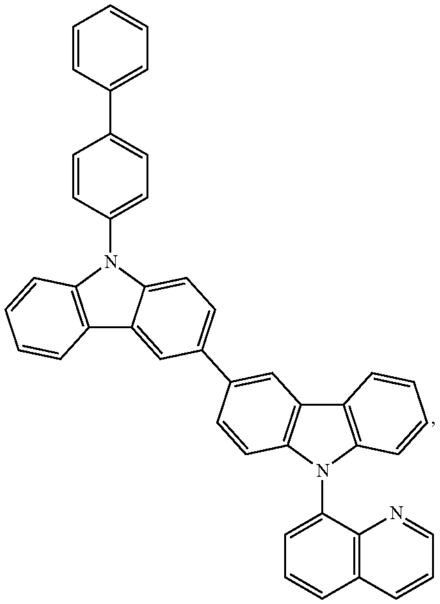

-continued
2-19
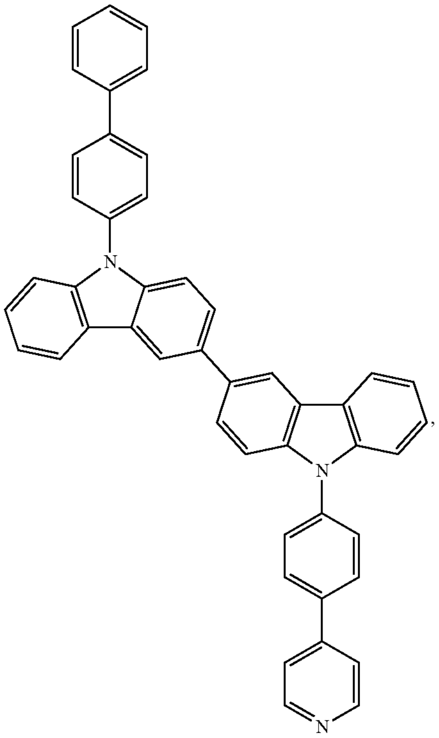
2-20
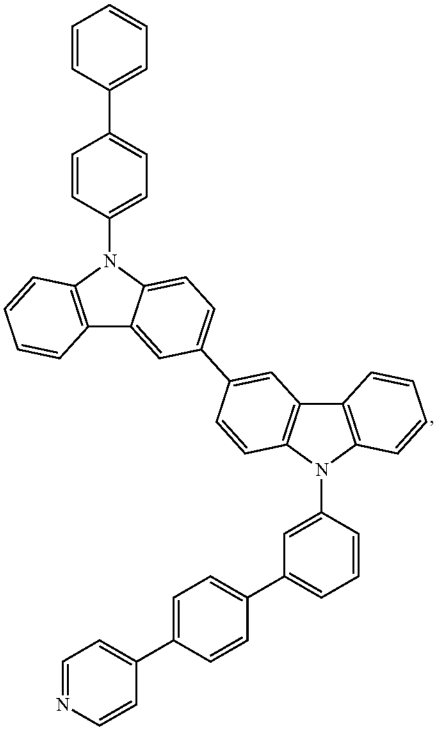
-continued
2-21
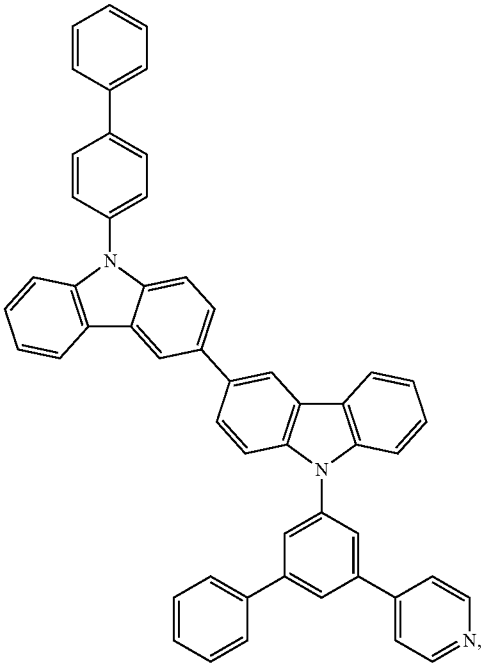
2-22
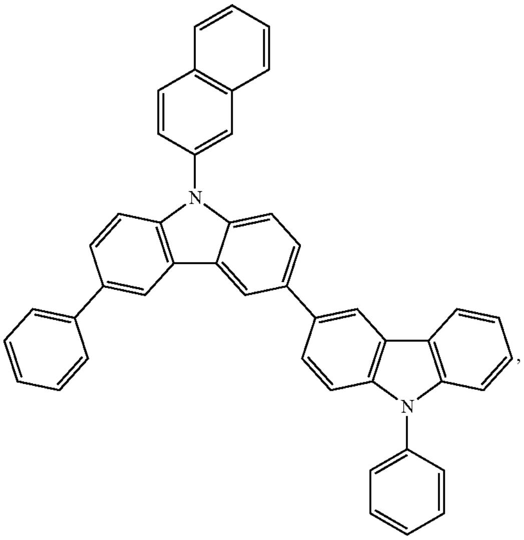

-continued
2-23
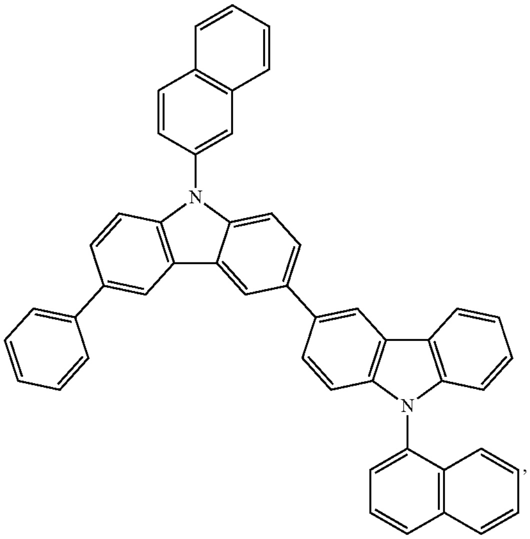
,
2-24
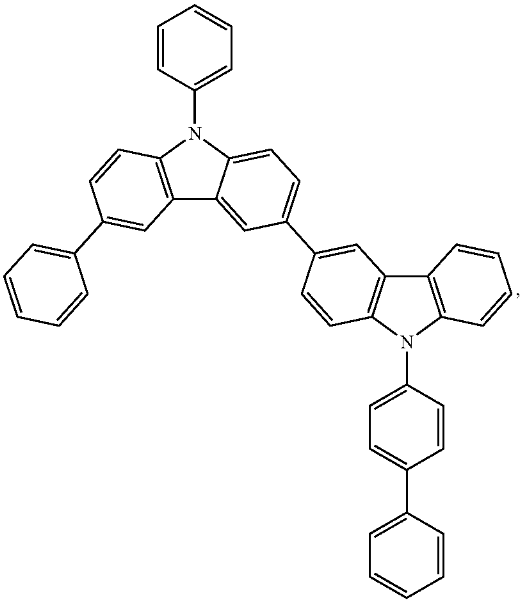
,
-continued
2-25
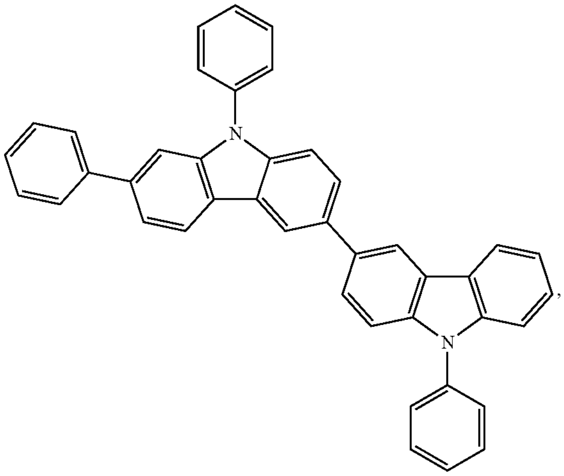
,
2-26
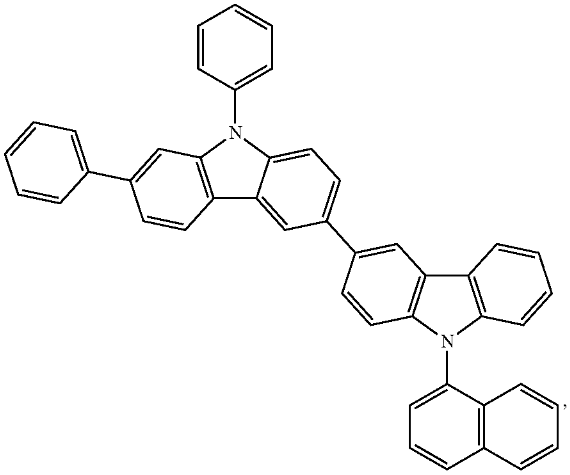
,
2-27
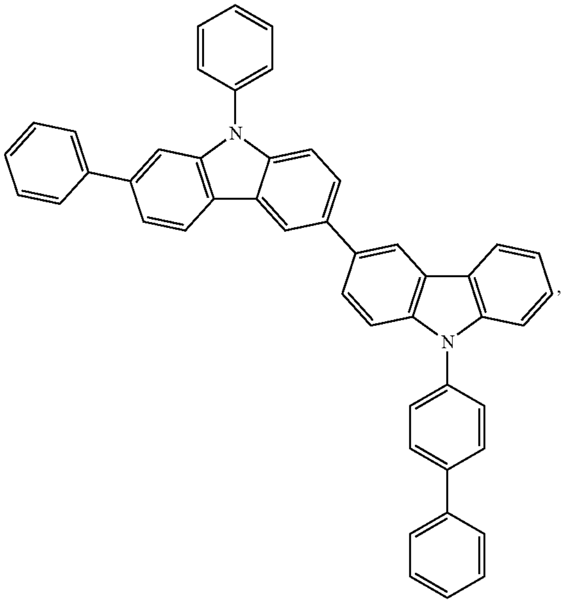
, -continued
2-28
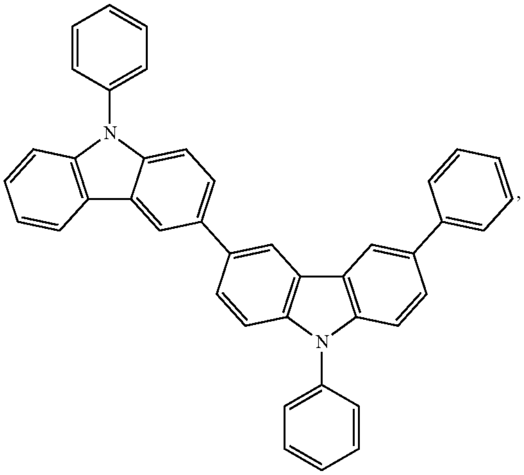
2-29
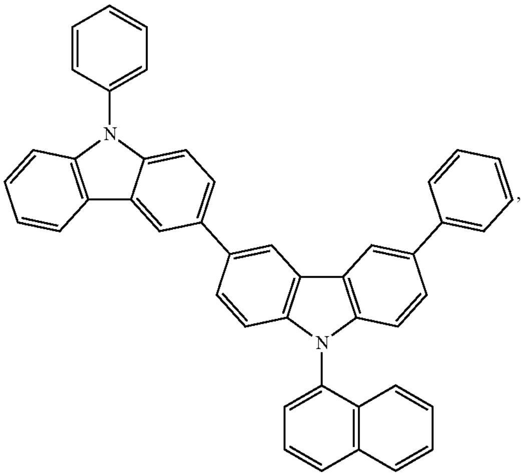
2-30
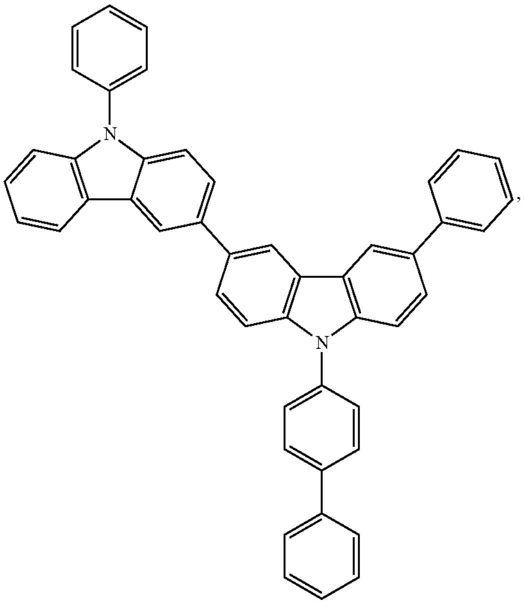
-continued
2-31
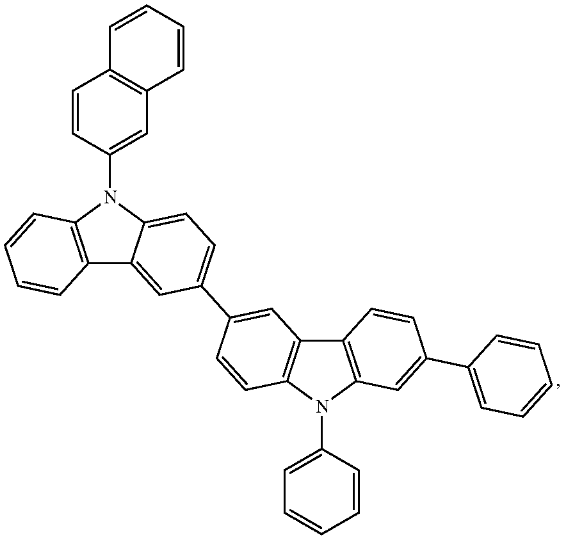
2-32
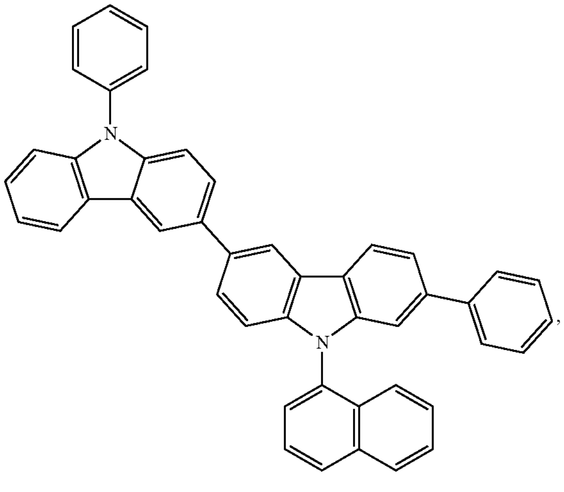

-continued
2-33
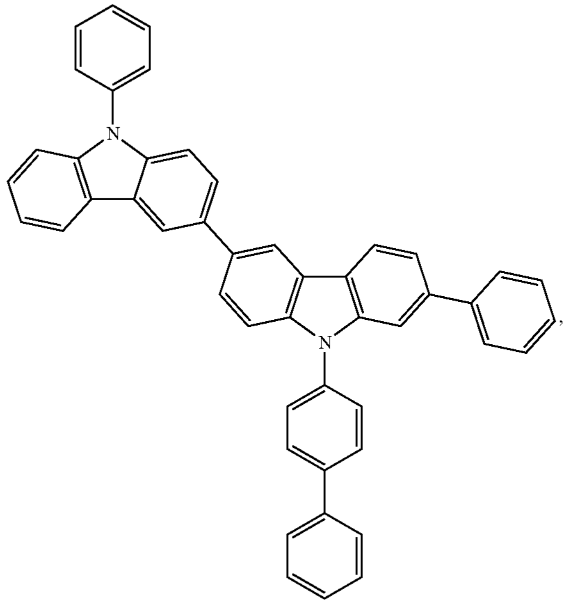
2-34
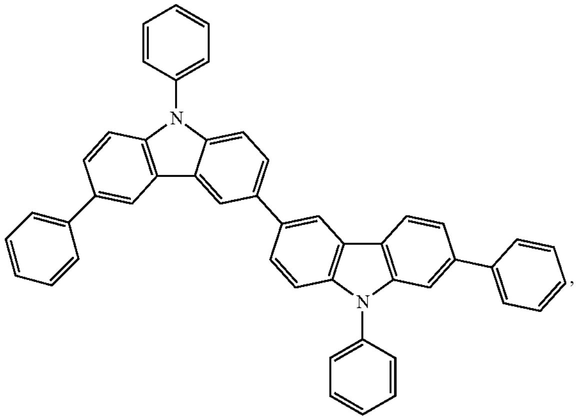
2-35
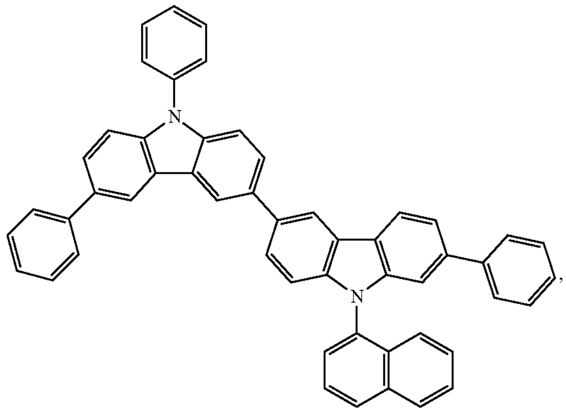
-continued
2-36
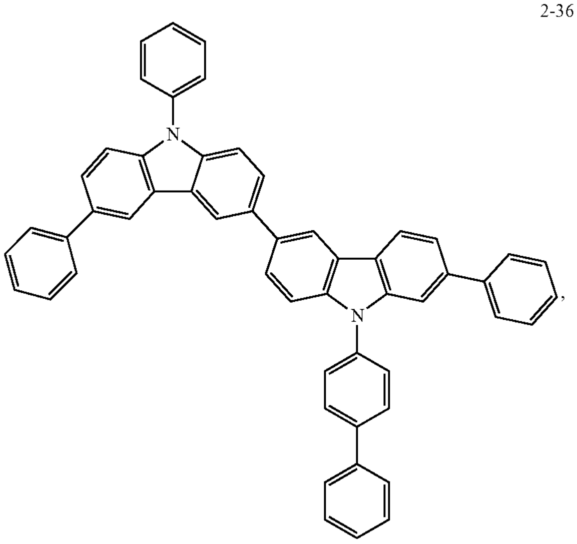
2-37
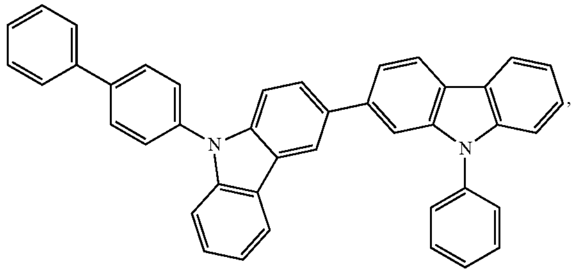
2-38
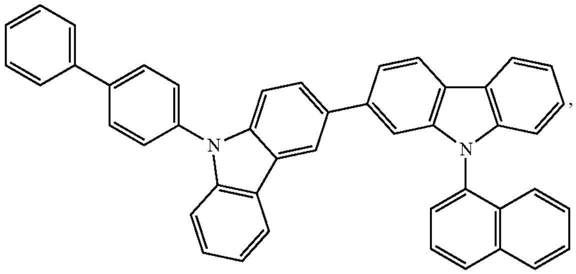
2-39
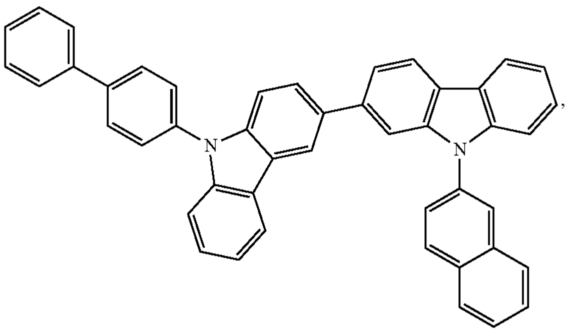

-continued
2-40
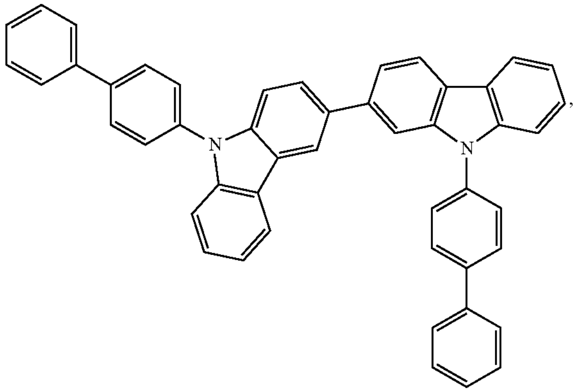
2-41
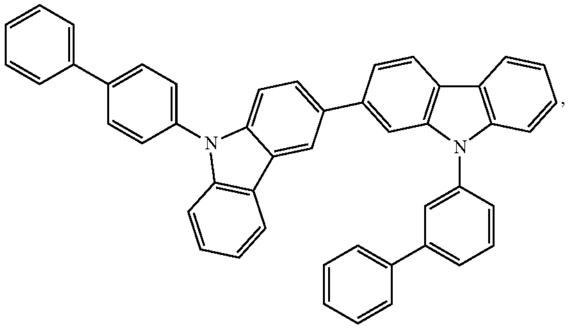
2-42
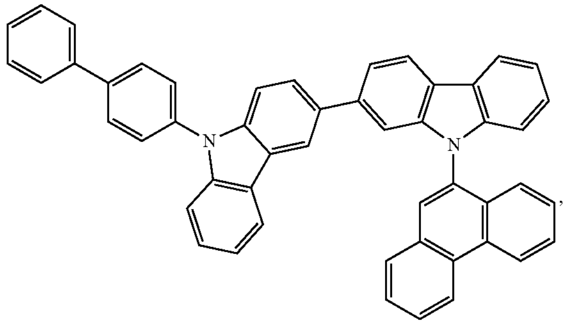
2-43
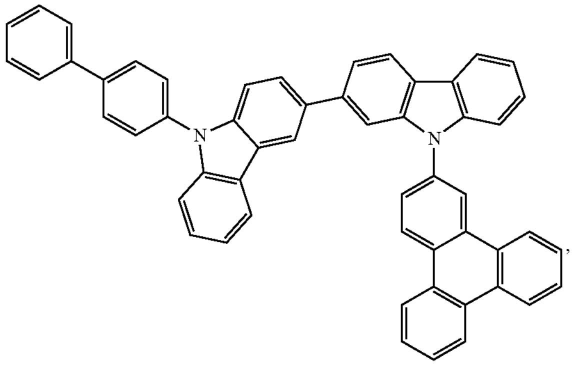
-continued
2-44
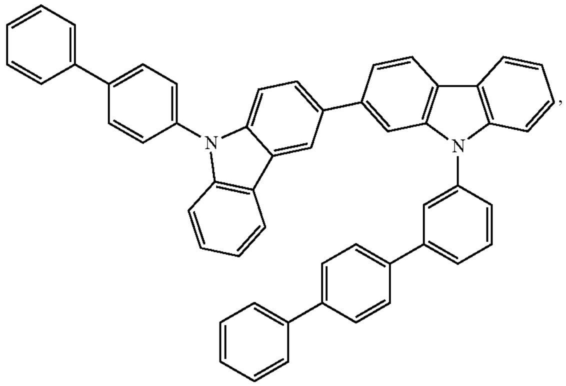
2-45
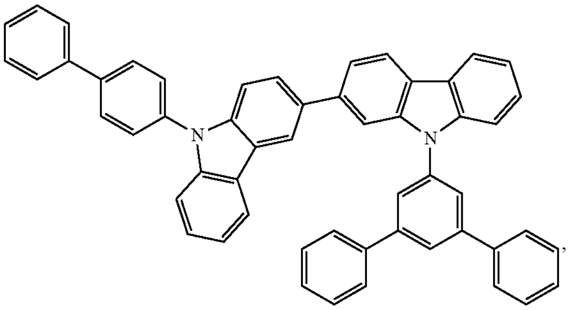
2-46
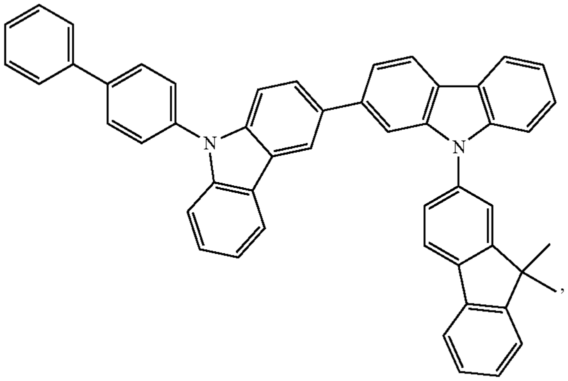
2-47
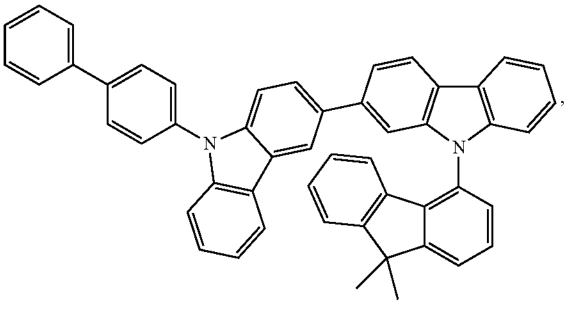

-continued
2-48
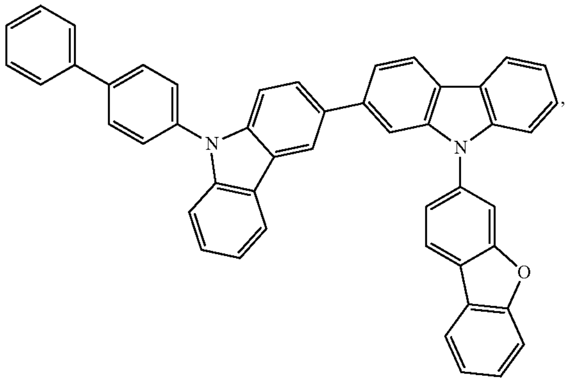
2-49
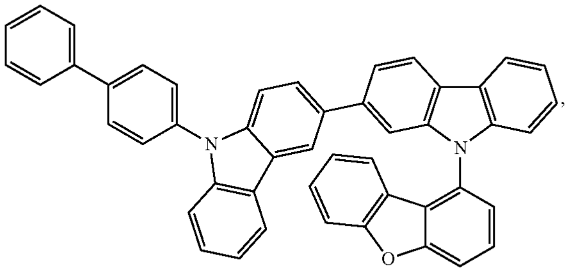
2-50
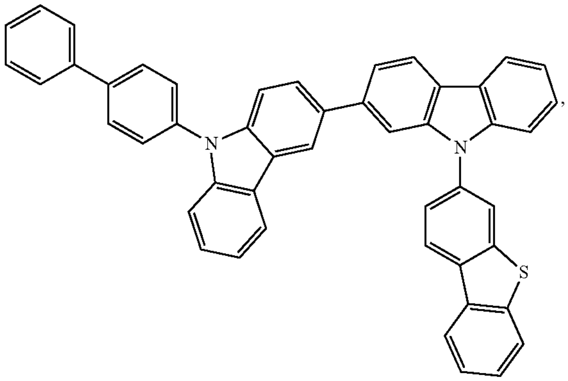
2-51
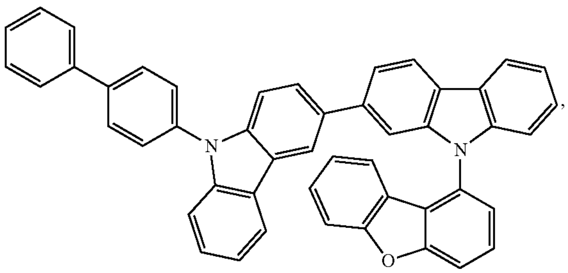
-continued
2-52
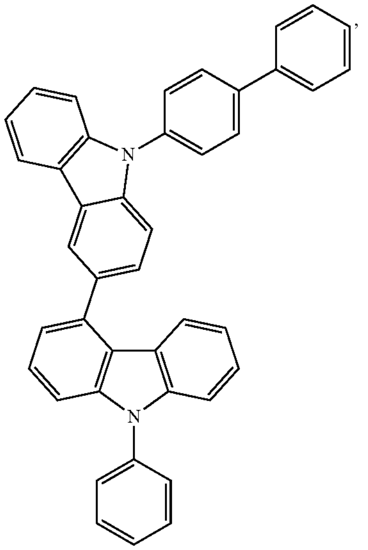
2-53
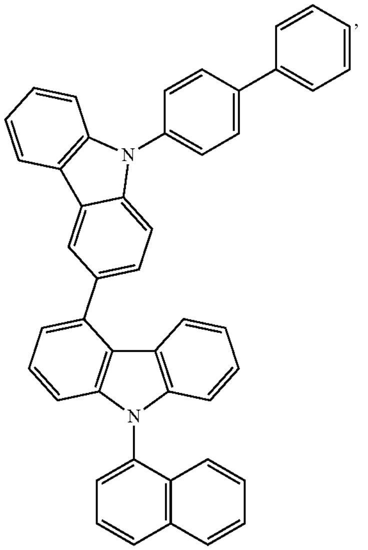

-continued
2-54
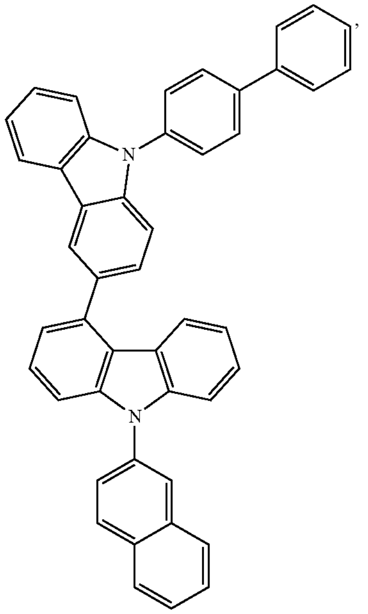
2-55
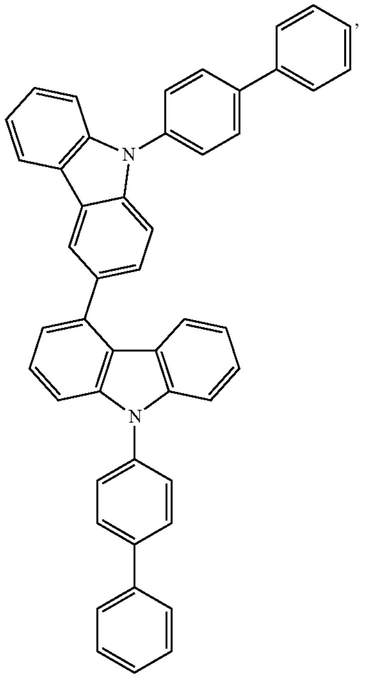
-continued
2-56
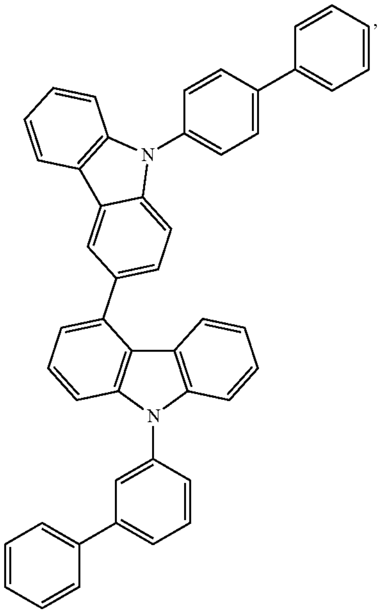
2-57
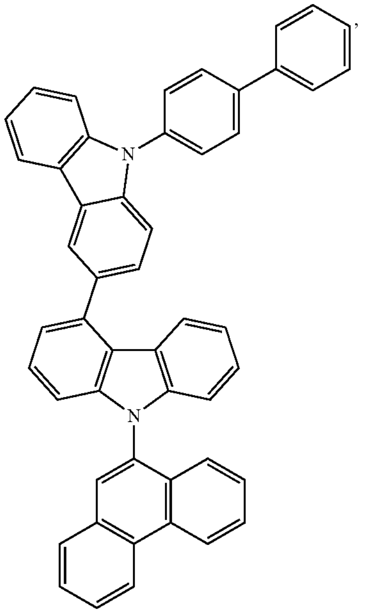

-continued
2-58
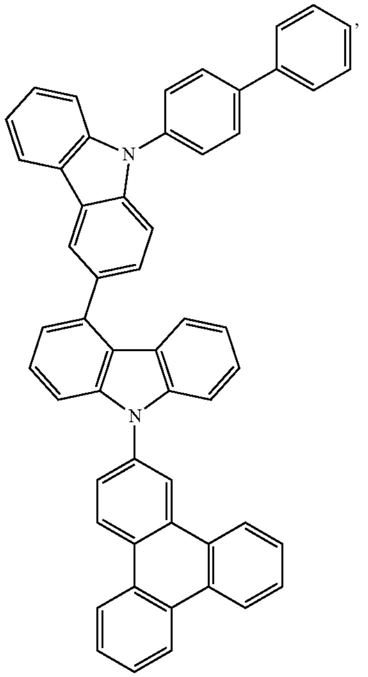
2-59
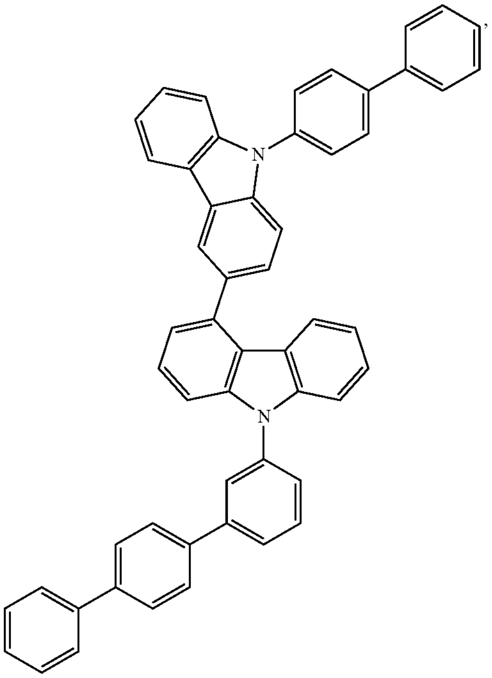
-continued
2-60
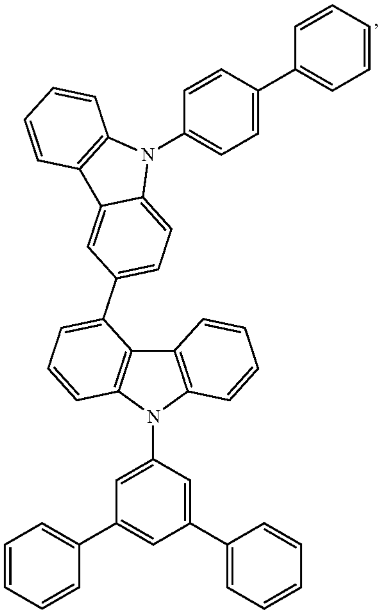
2-61
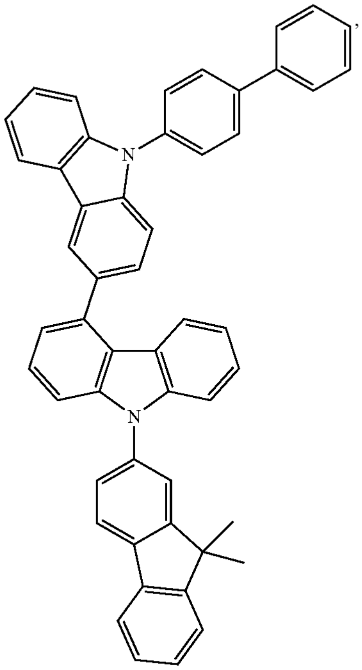

-continued
2-62
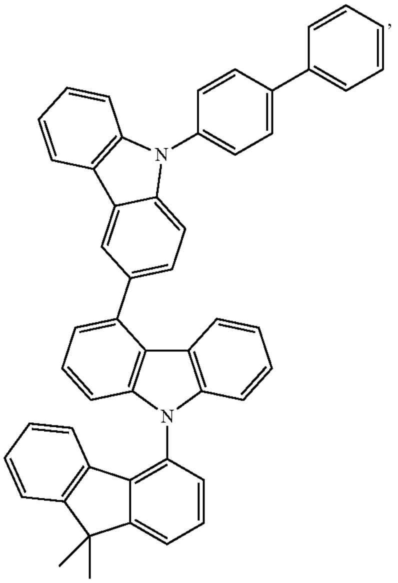
2-63
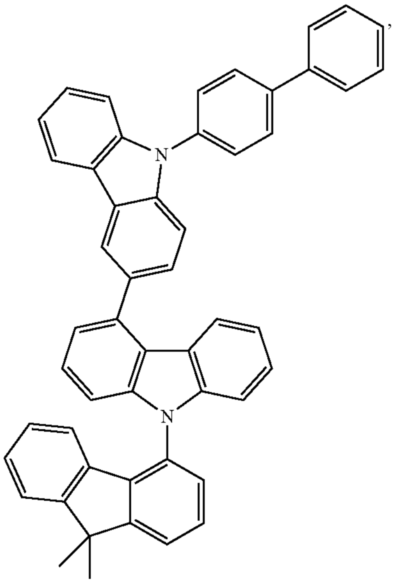
-continued
2-64
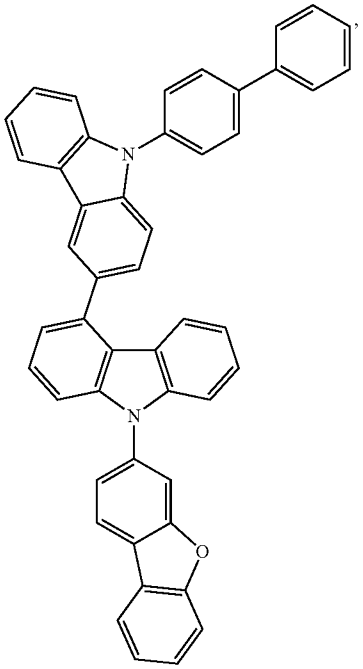
2-65
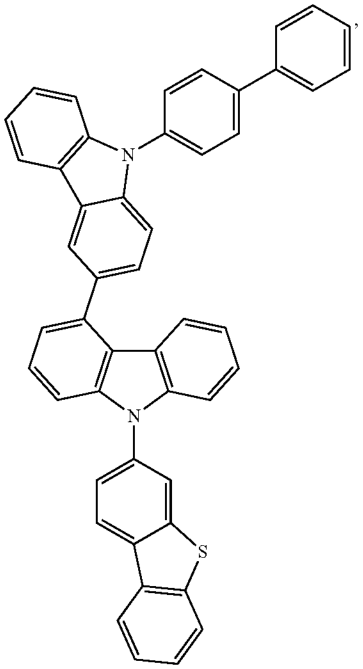

-continued
2-66
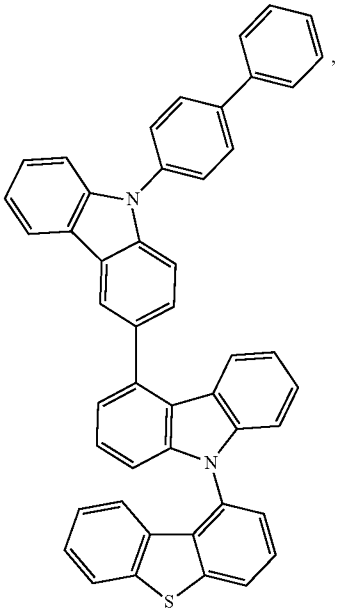
2-67
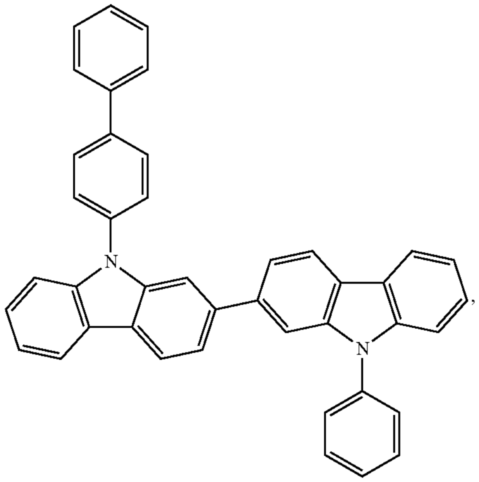
2-68
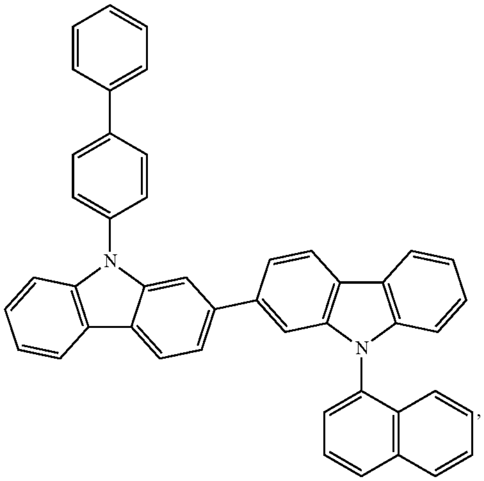
-continued
2-69
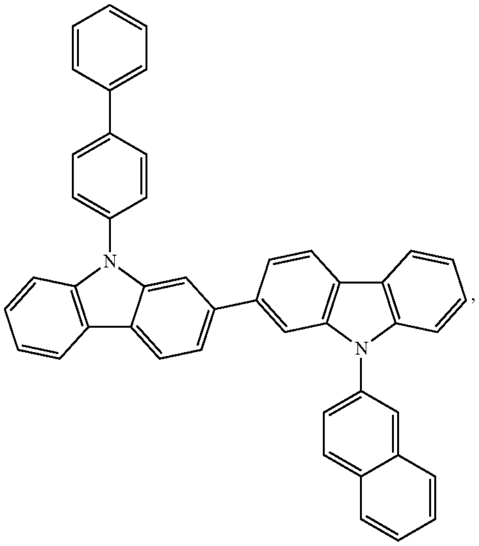
2-70
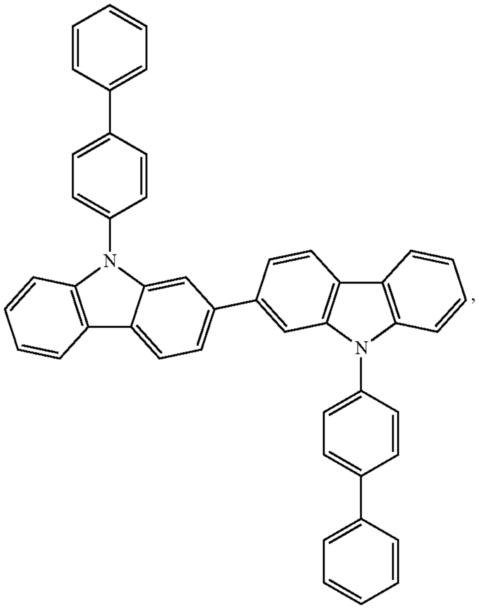

-continued
2-71
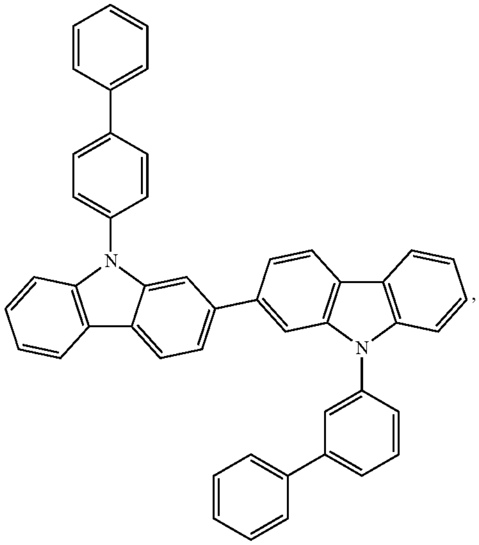
,
2-72
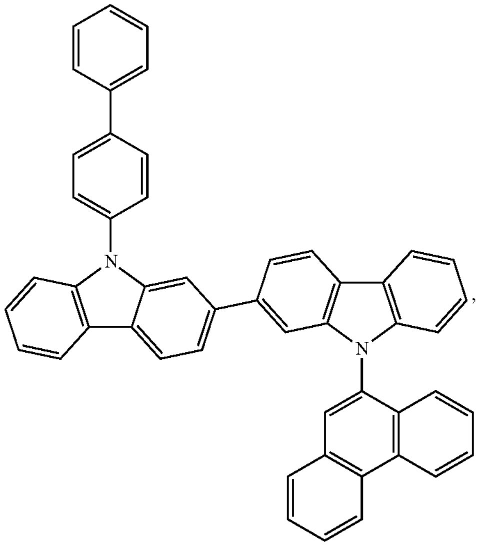
,
-continued
2-73
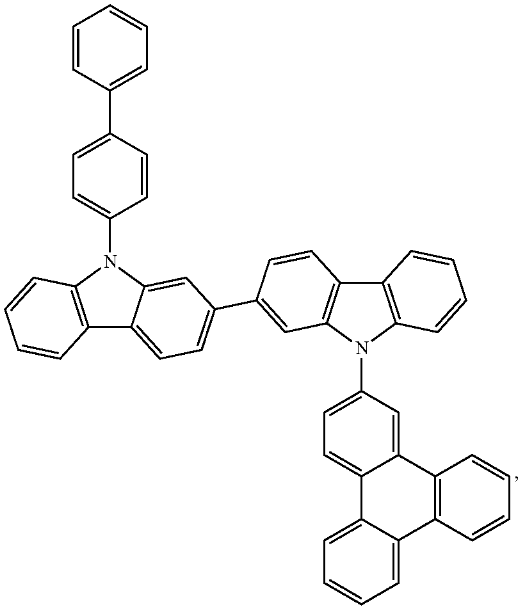
,
2-74
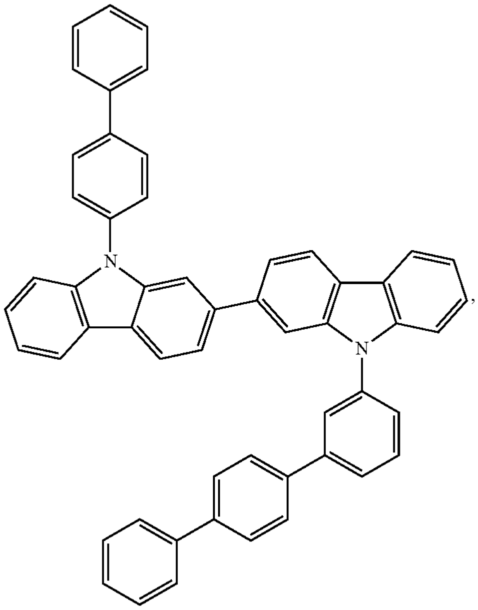
, -continued
2-75
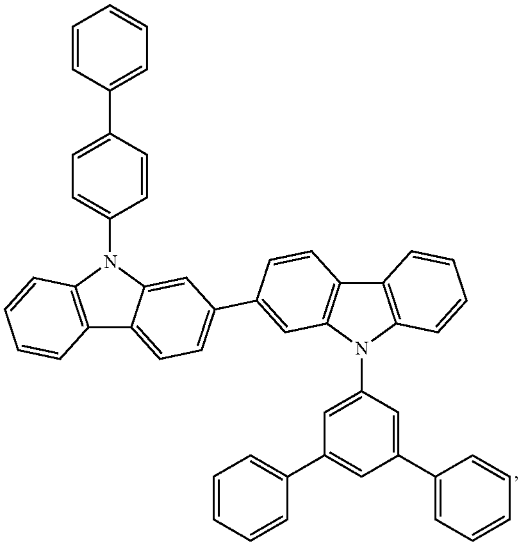
2-76
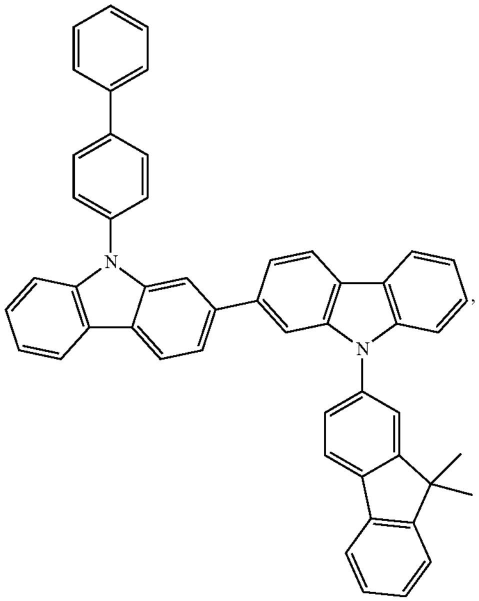
-continued
2-77
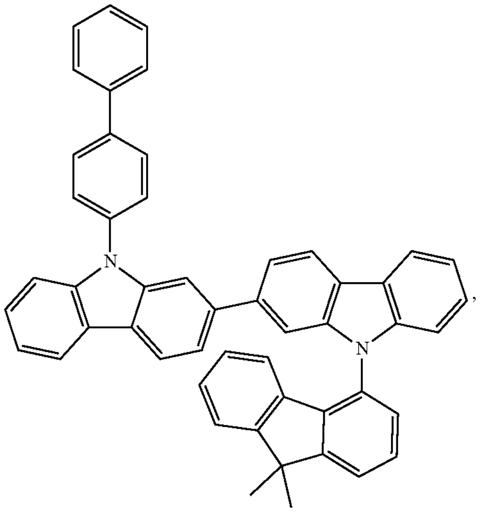
2-78
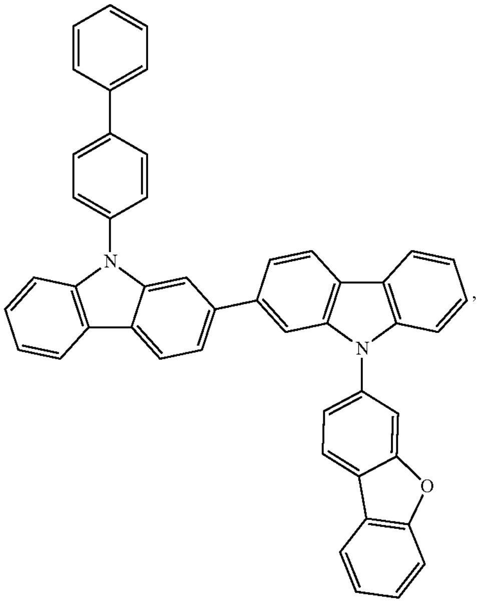
2-79
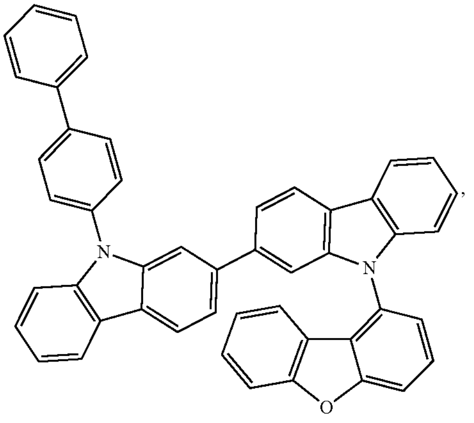

-continued
2-80
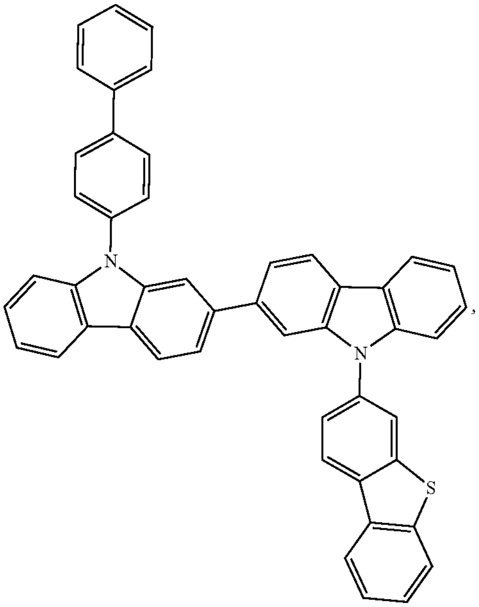
,
2-81
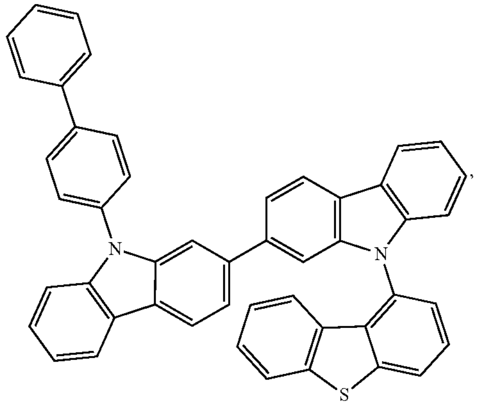
,
2-82
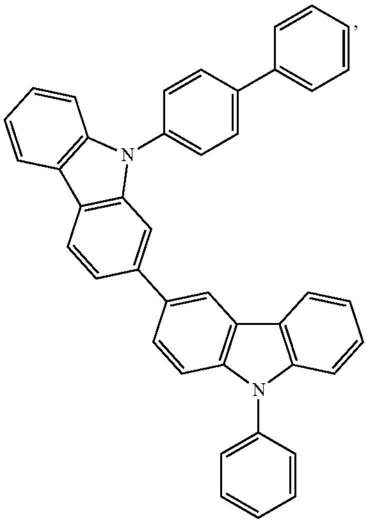
,
-continued
2-83
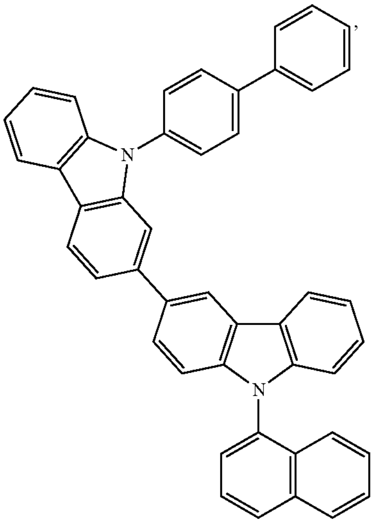
,
2-84
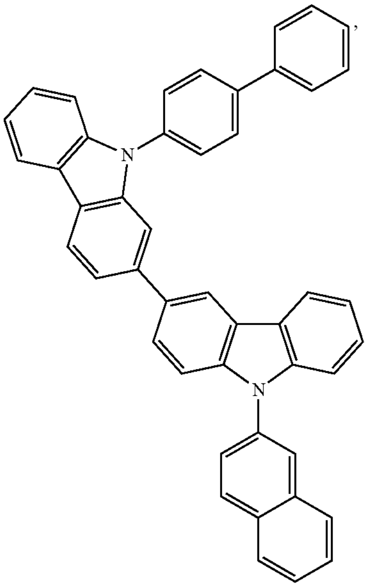
, -continued
2-85
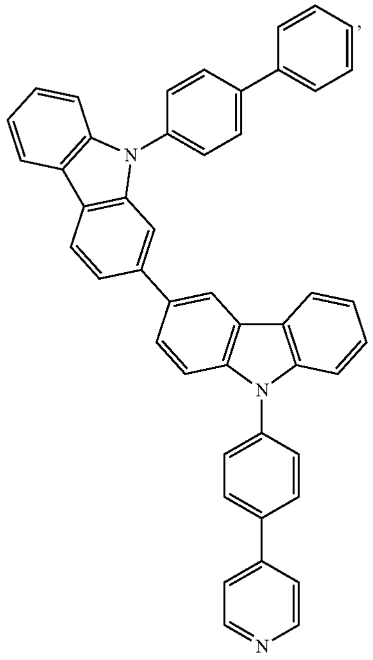
2-86
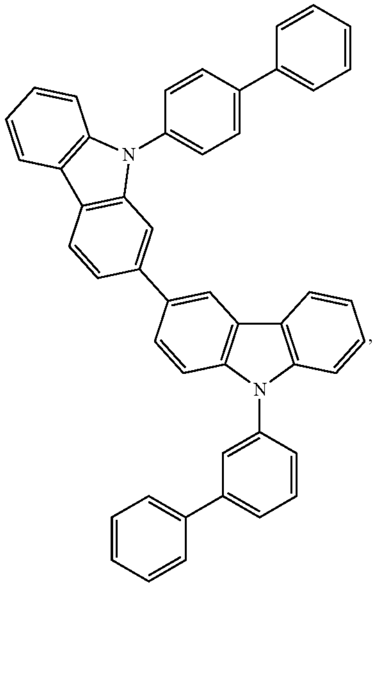
-continued
2-87
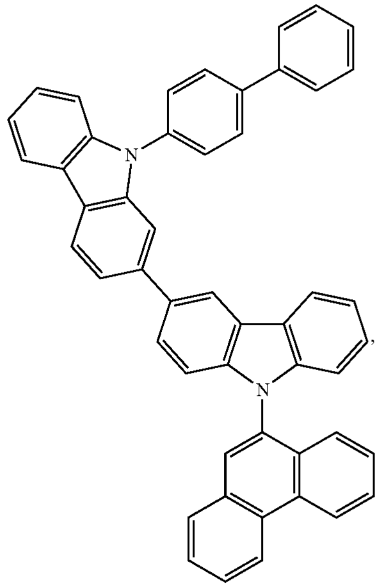
2-88
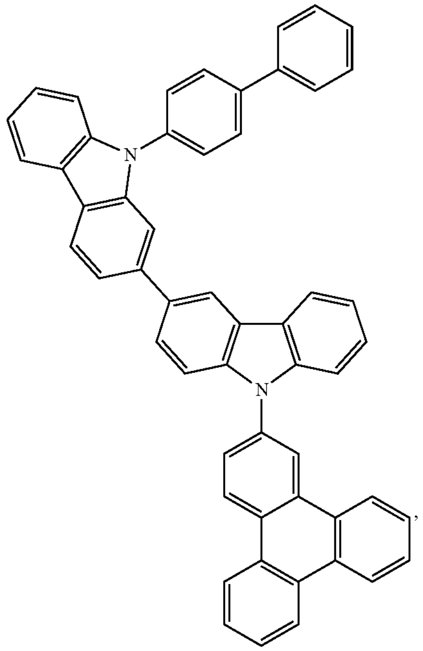

-continued
2-89
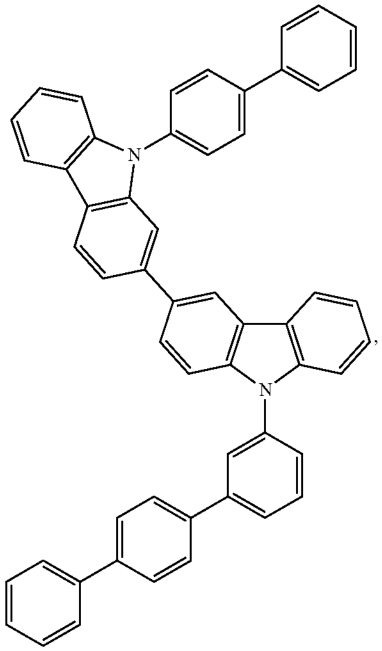
2-90
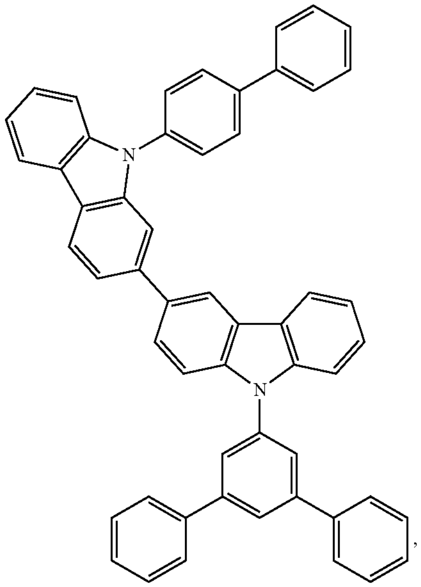
-continued
2-91
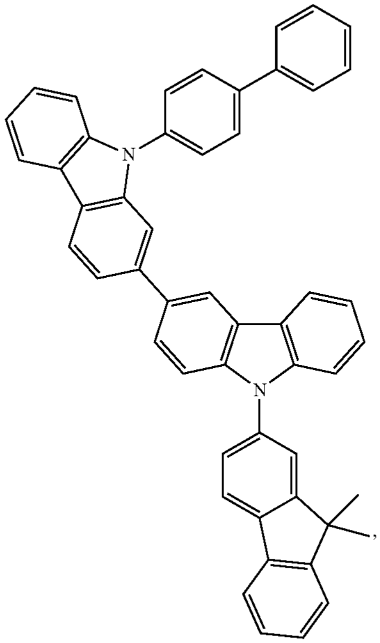
2-92
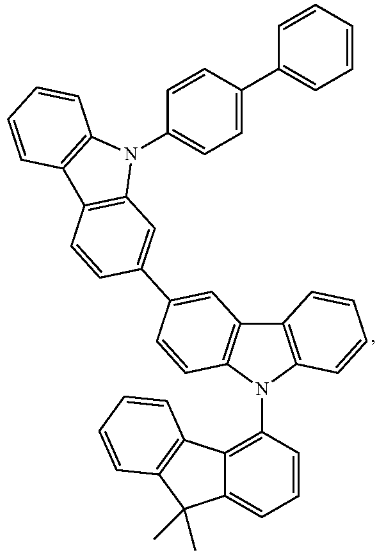

-continued
2-93
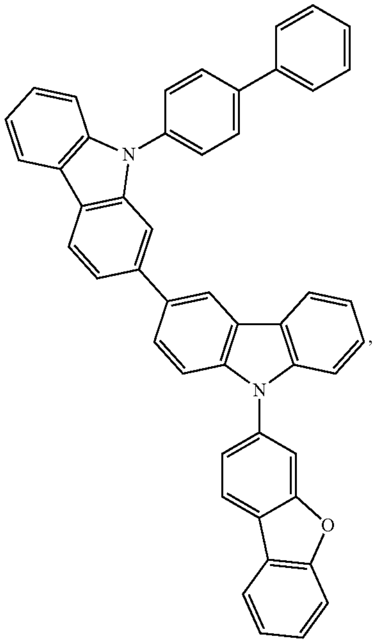
2-94
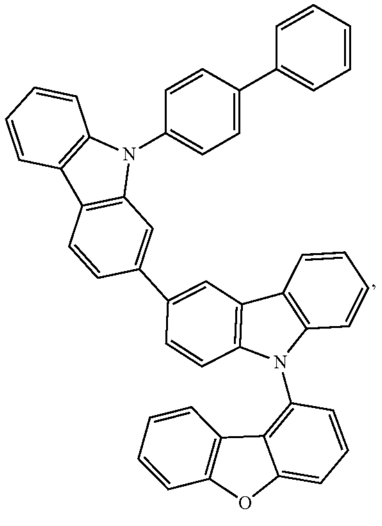
-continued
2-95
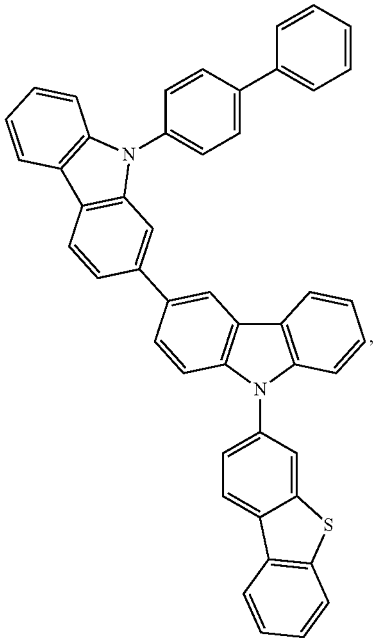
2-96
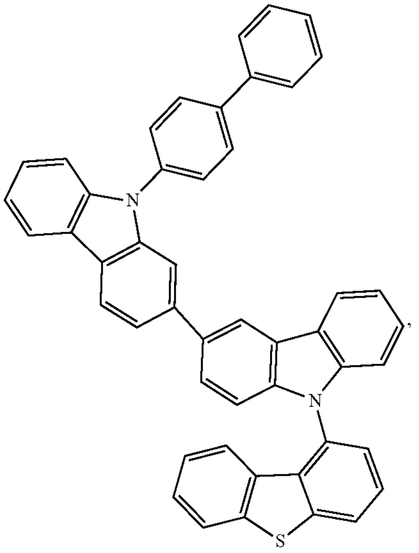
2-97
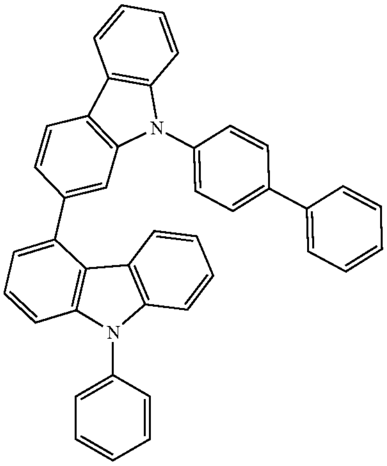

-continued
2-98
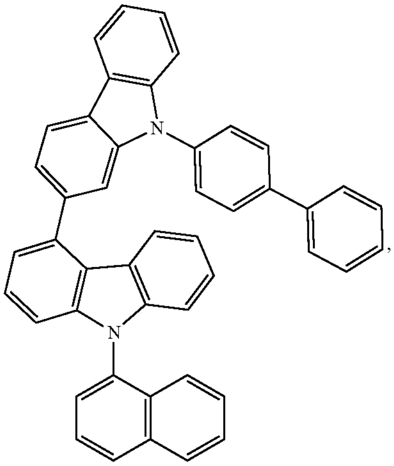
2-99
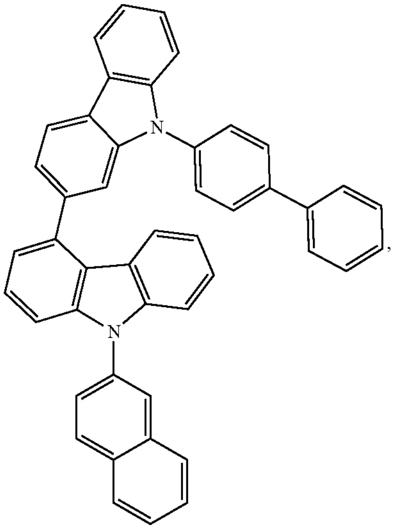
2-100
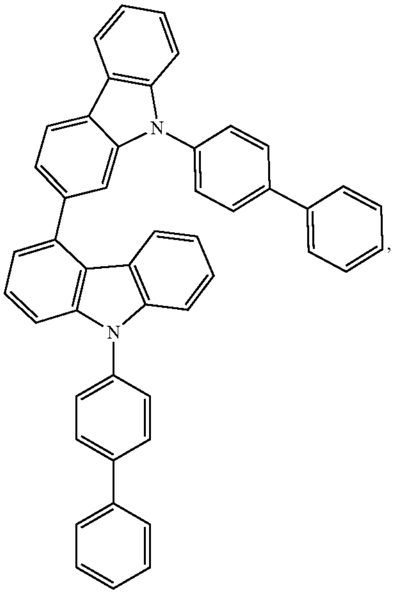
-continued
2-101
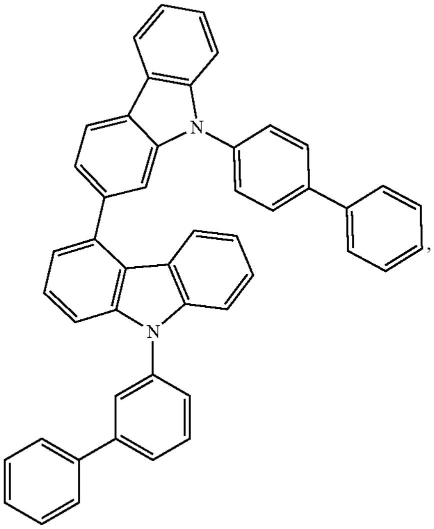
2-102
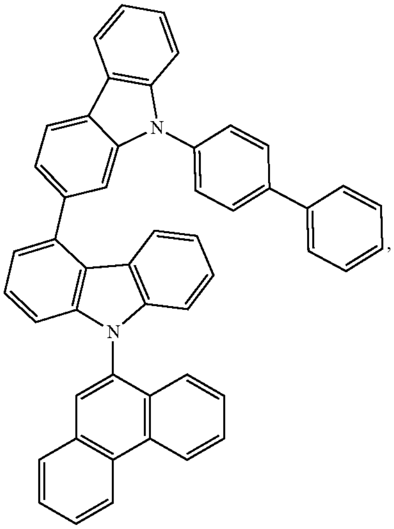

-continued
2-103
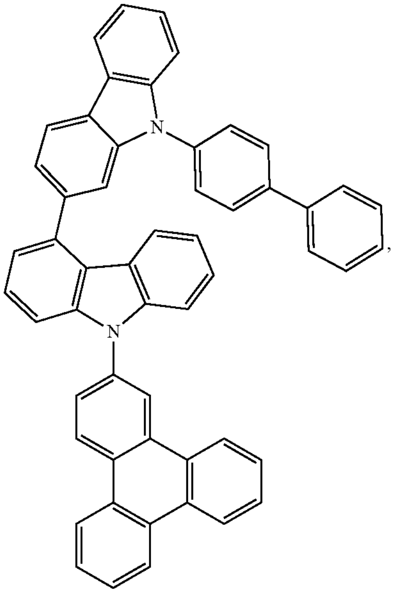
,
2-104
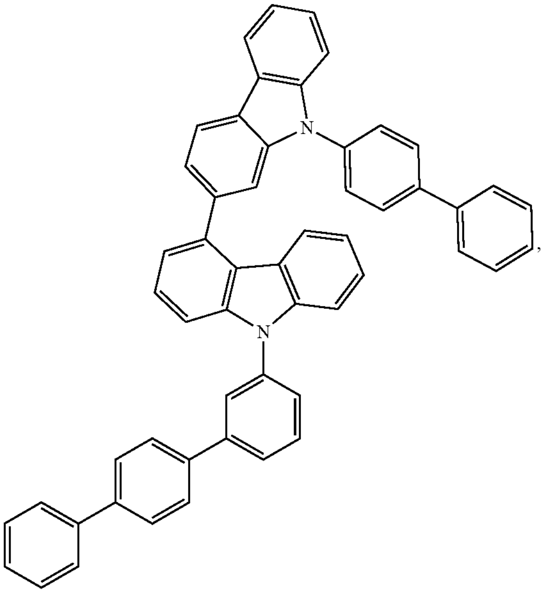
,
-continued
2-105
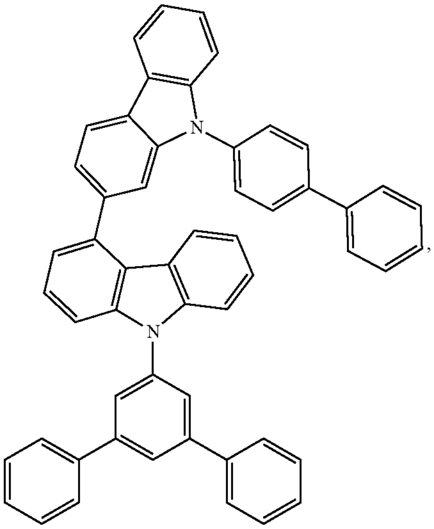
,
2-106
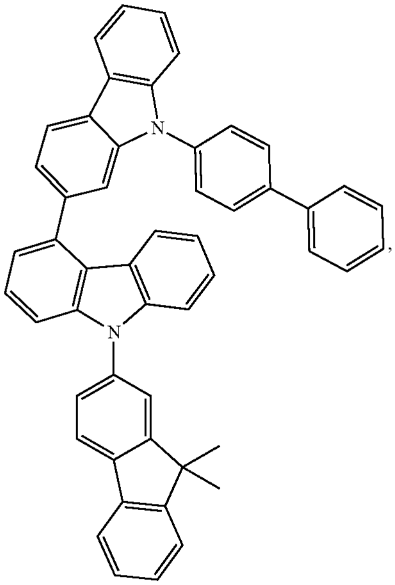
,
2-107
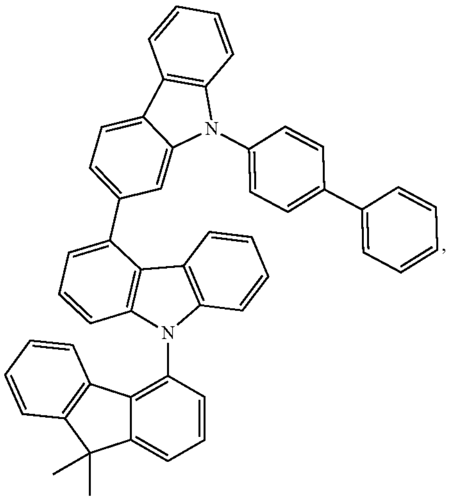
, -continued
2-108
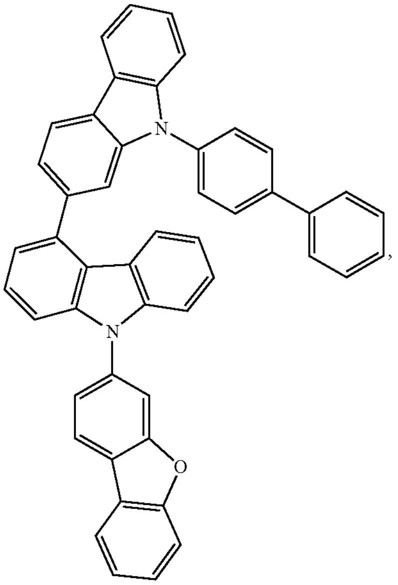
2-109
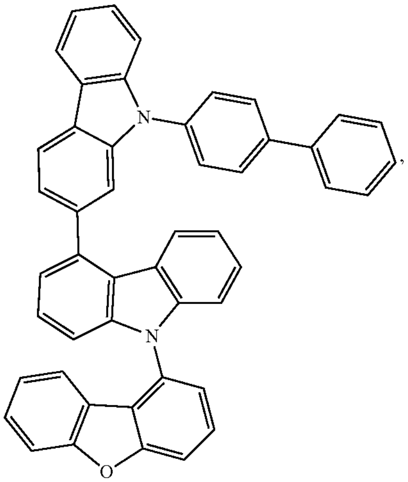
2-110
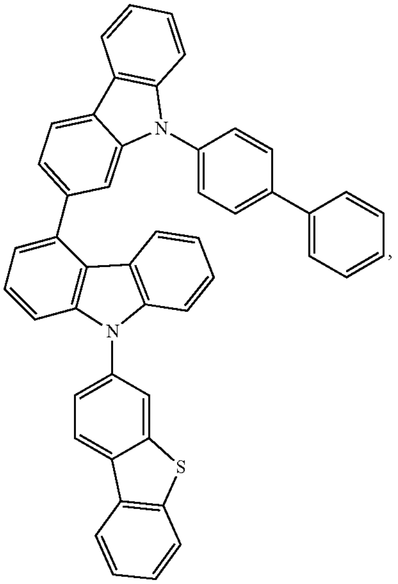
-continued
2-111
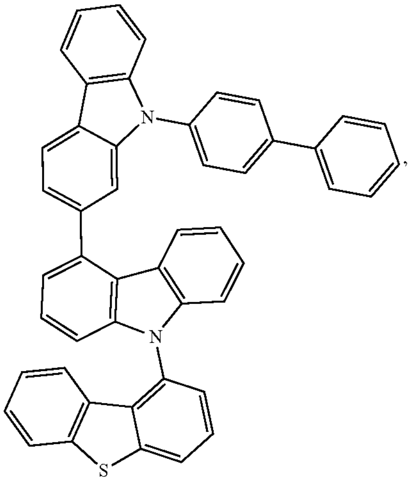
2-112
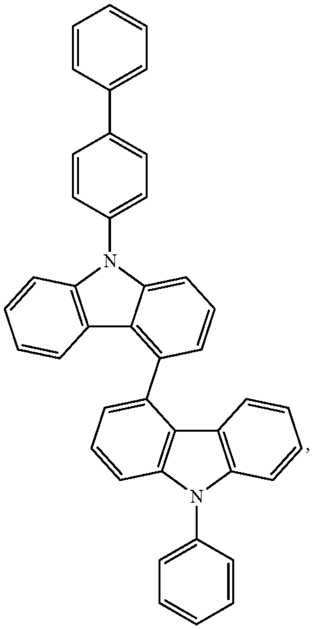

-continued
2-113
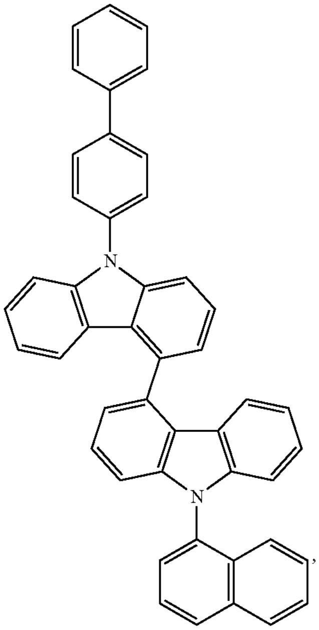
,
2-114
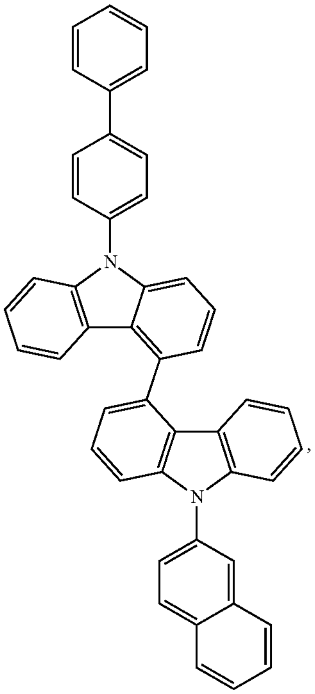
,
-continued
2-115
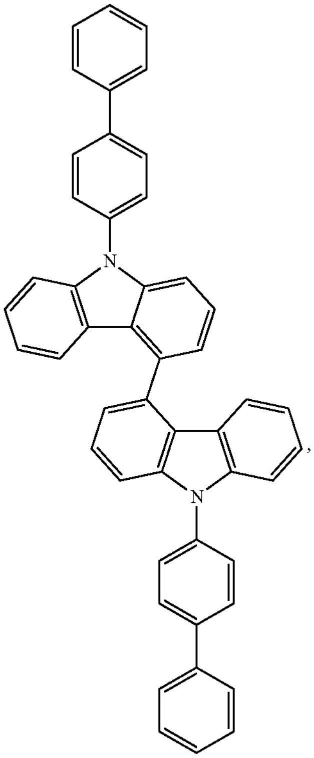
,
2-116
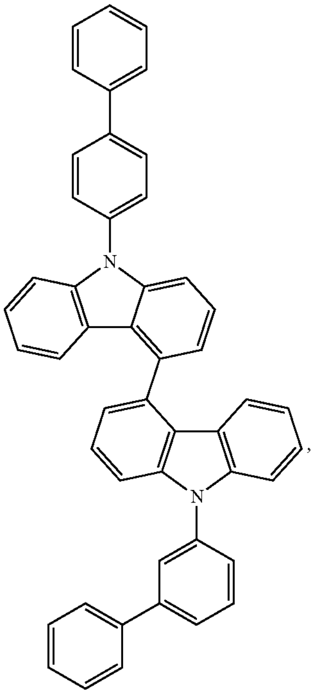
, -continued
2-117
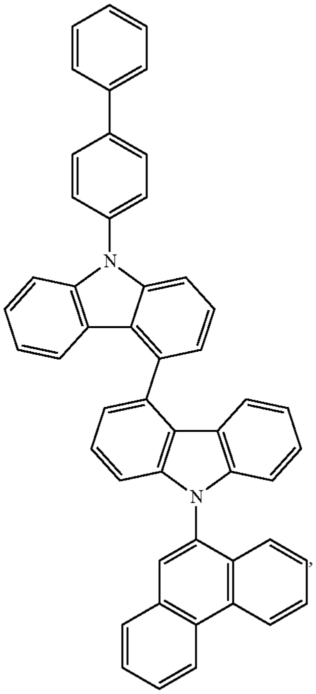
,
2-118
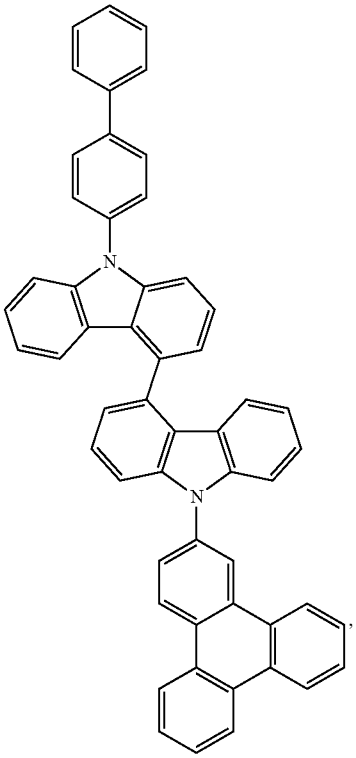
,
-continued
2-119
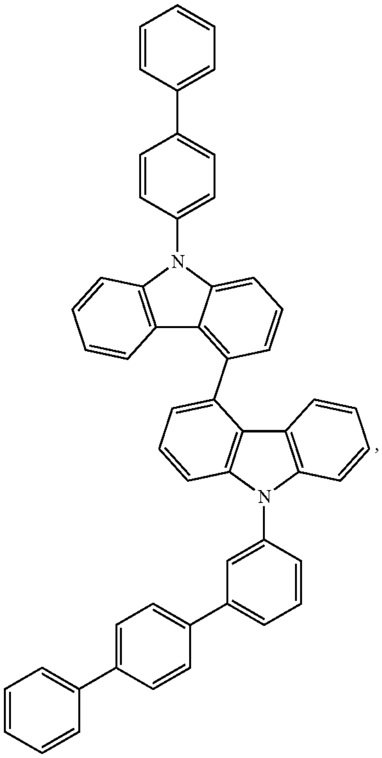
,
2-120
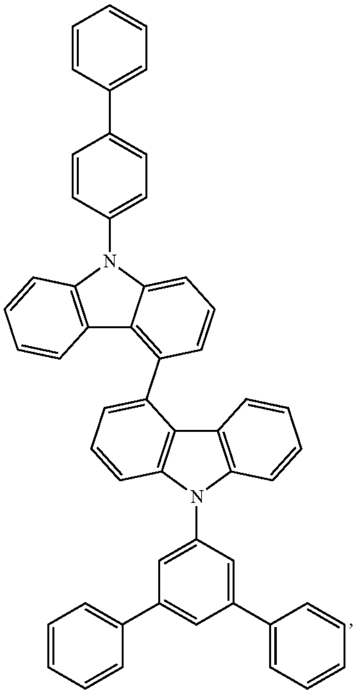
, -continued
2-121
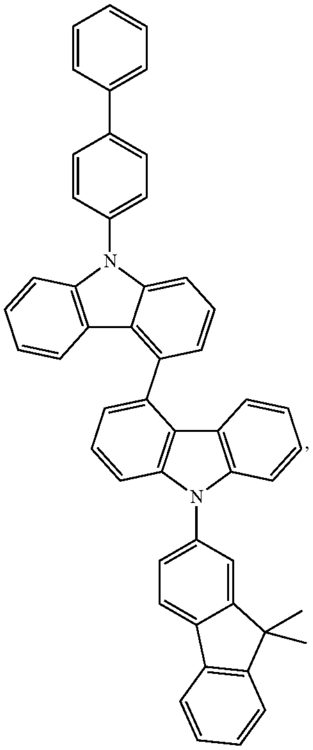
2-122
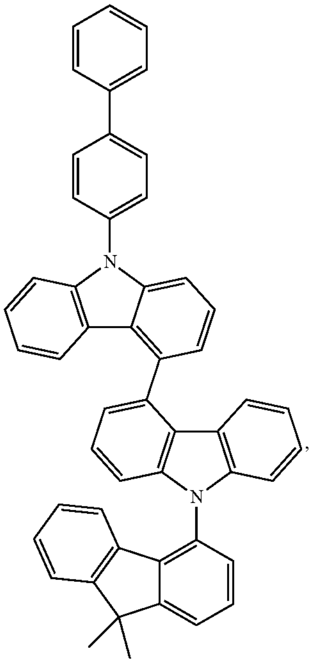
-continued
2-123
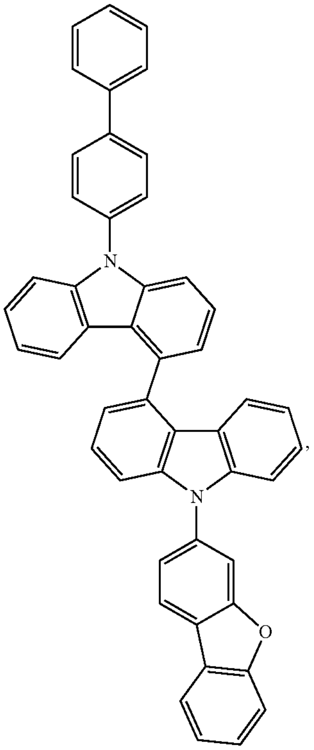
2-124
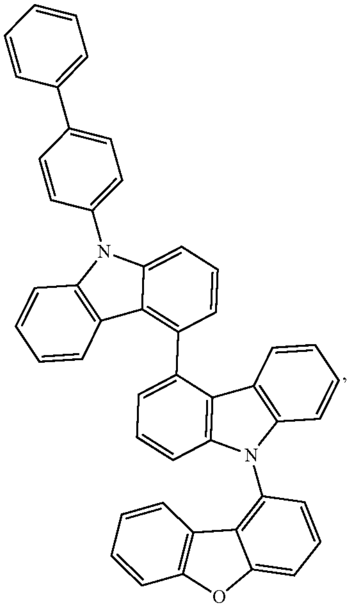

-continued
2-125
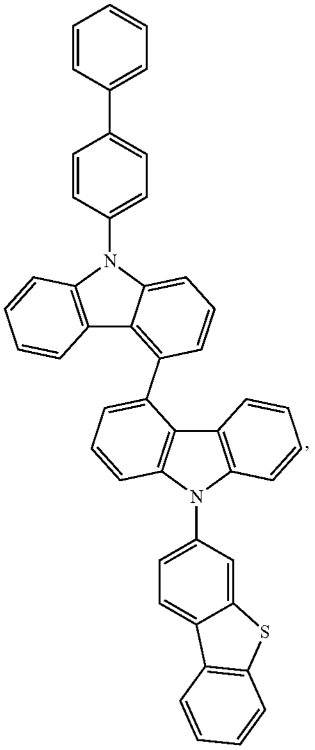
2-126
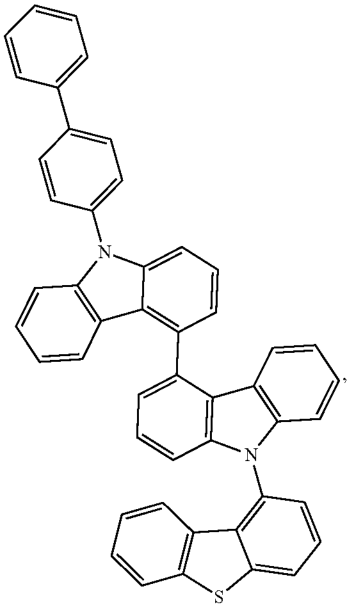
-continued
2-127
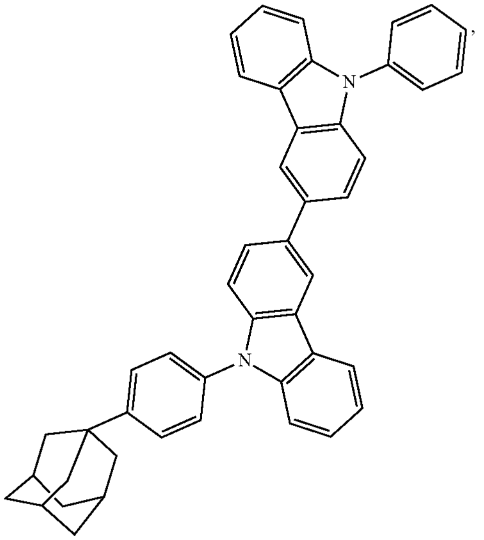
2-128
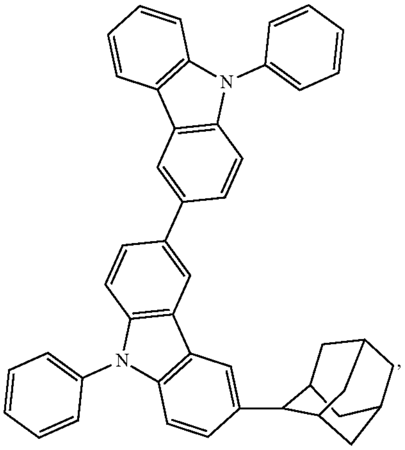
2-129
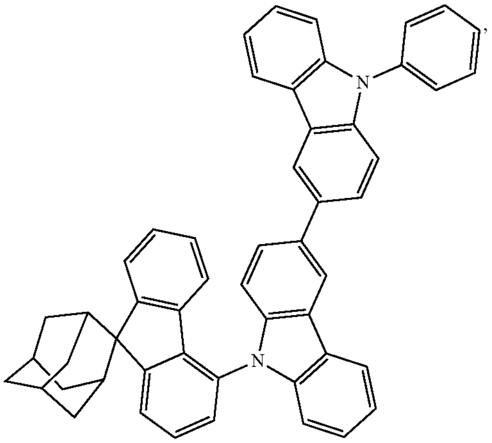

-continued
2-130
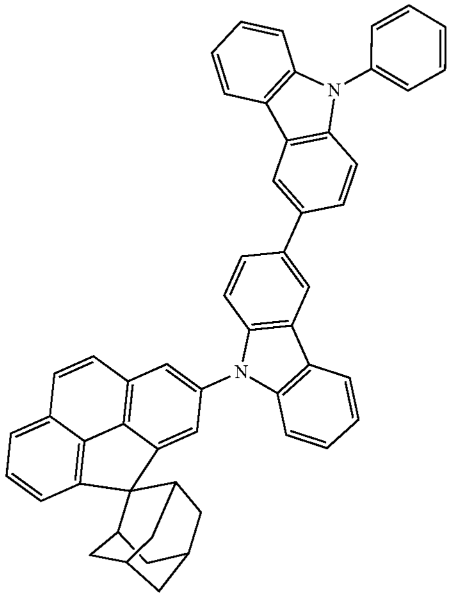
,
2-131
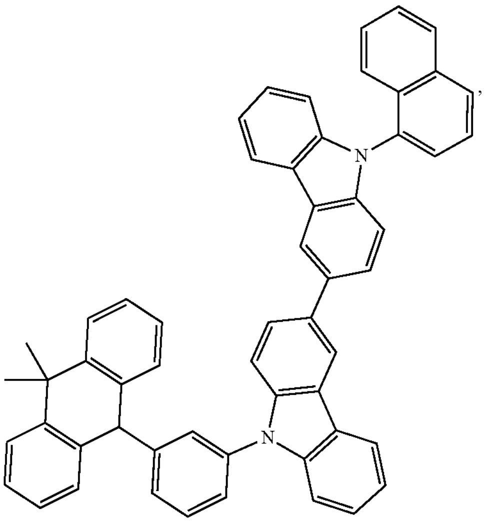
,
2-132
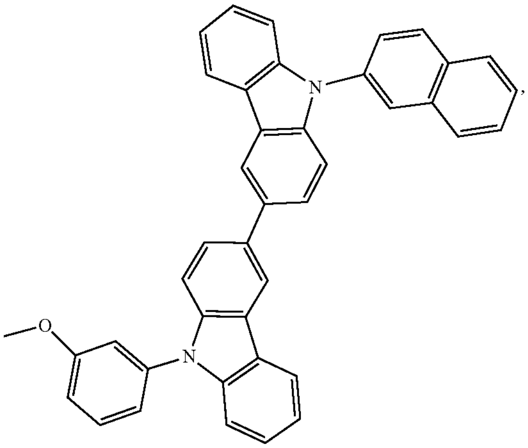
,
-continued
2-133
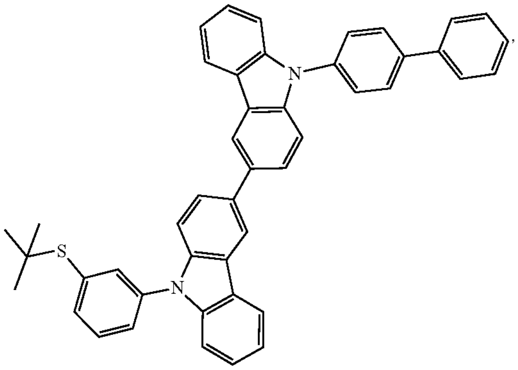
,
2-134
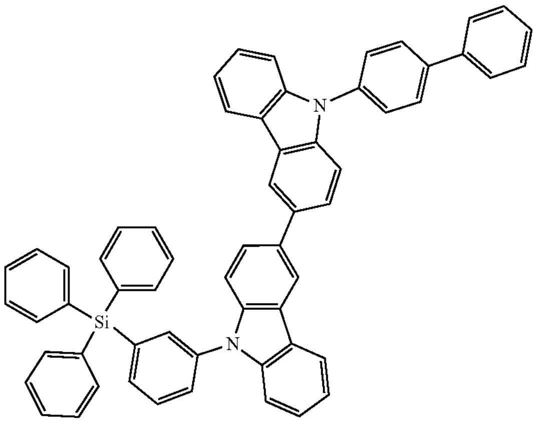
,
2-135
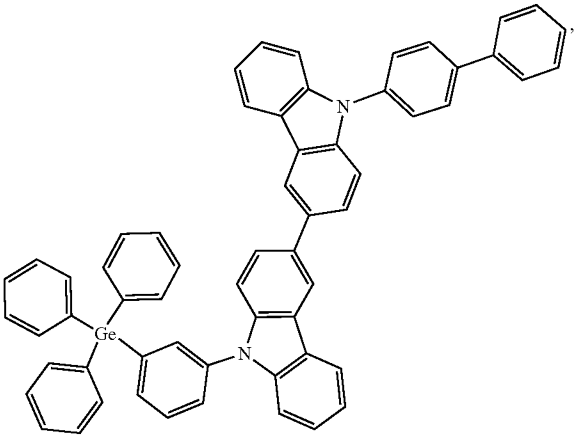
, -continued
2-136
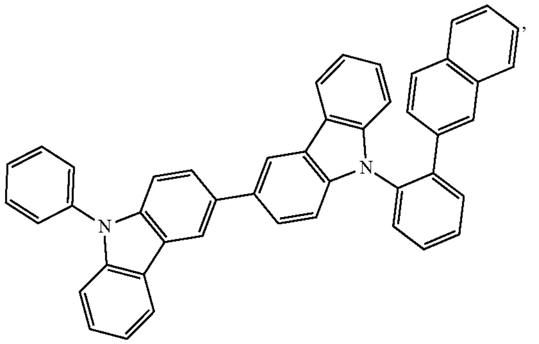
2-137
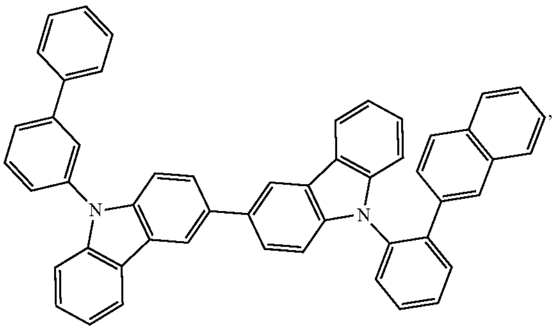
2-138
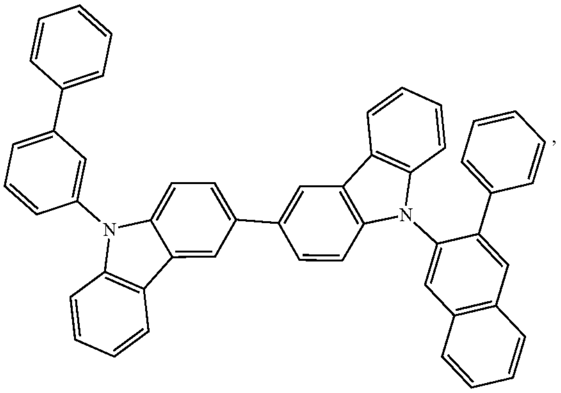
2-139
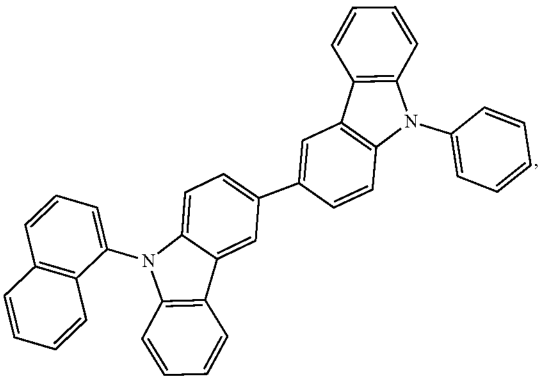
-continued
2-140
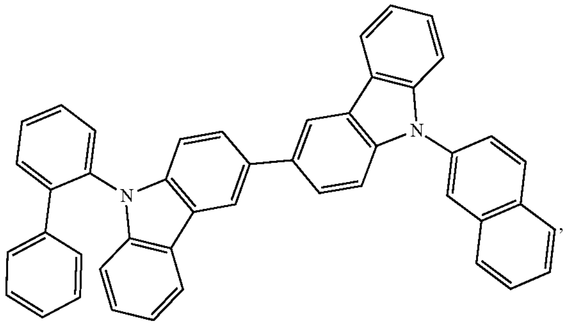
2-141
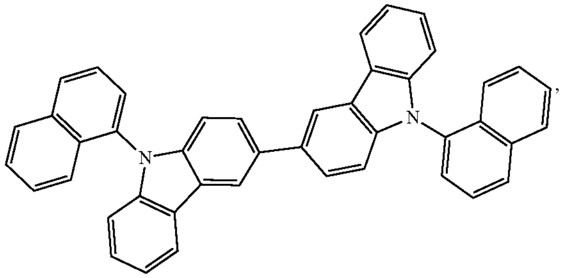
2-142
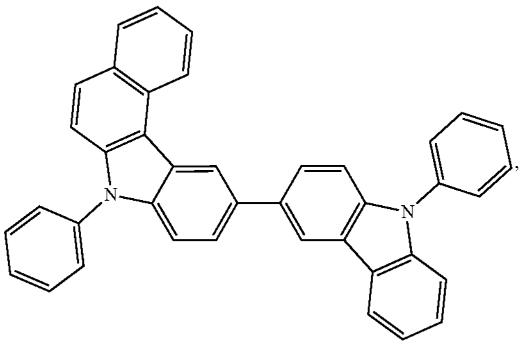
2-143
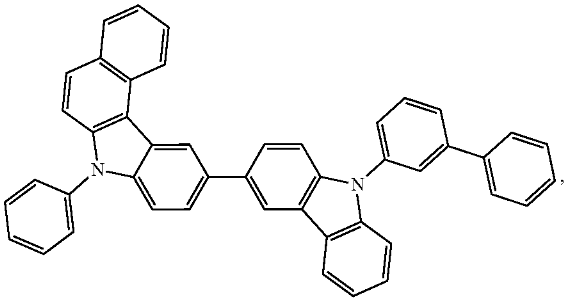

-continued
2-144
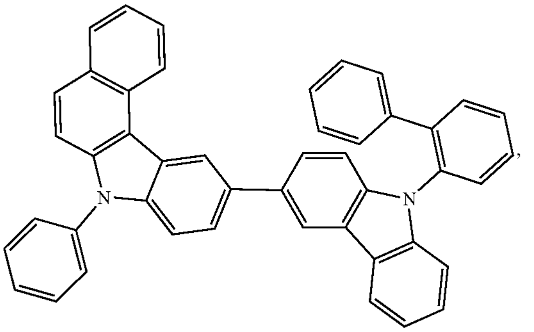
2-145
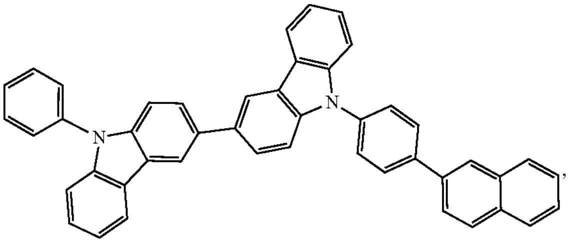
2-146
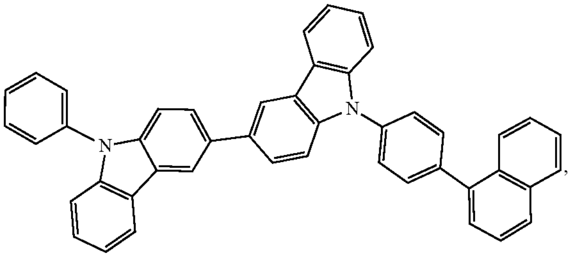
2-147
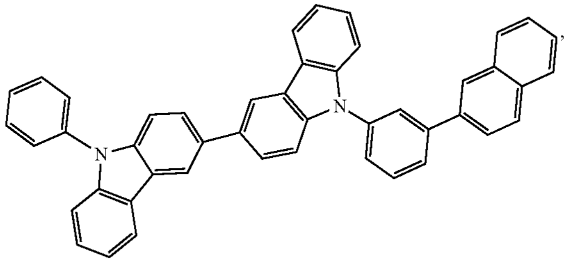
2-148
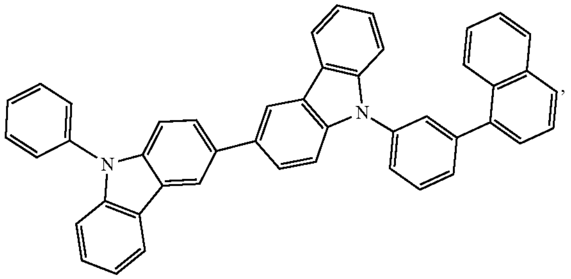
-continued
2-149
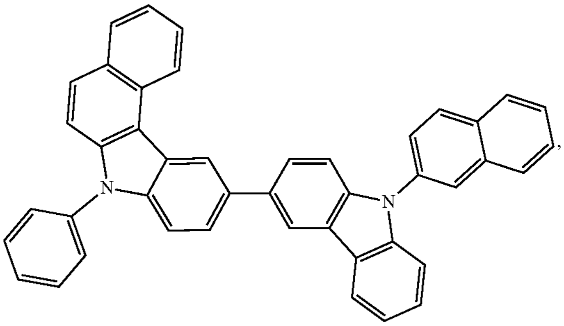
2-150
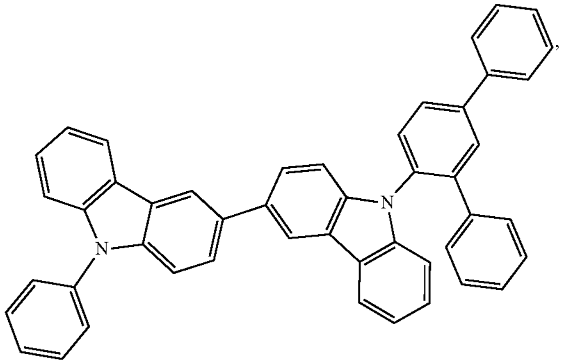
2-151
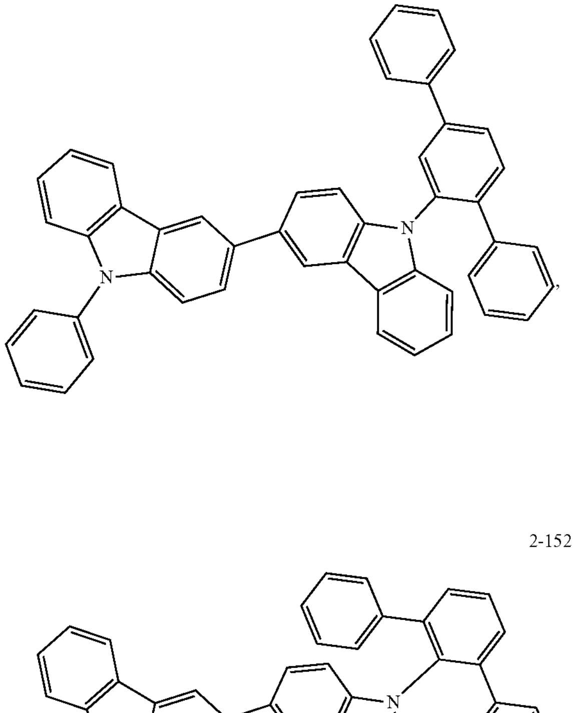
2-152
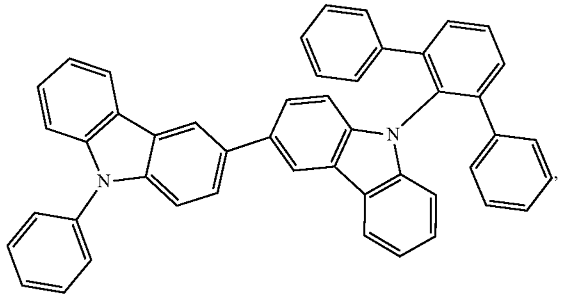

-continued
2-153
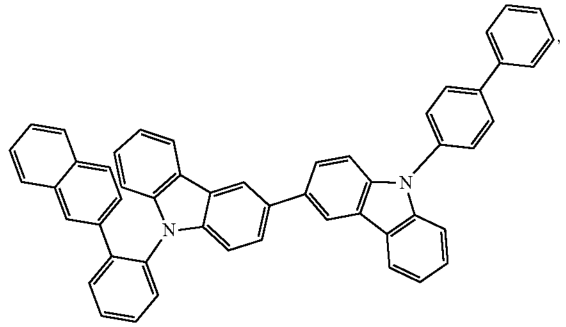
2-154
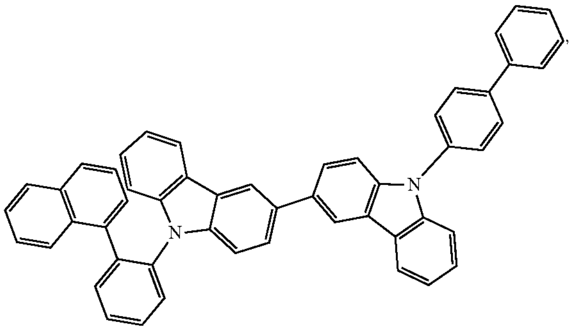
2-155
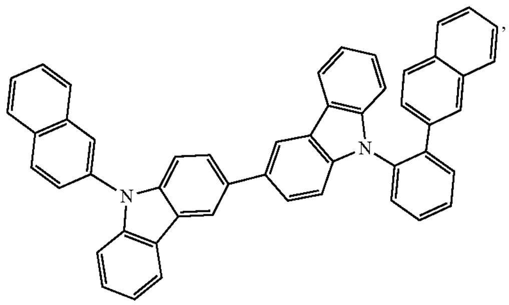
2-156
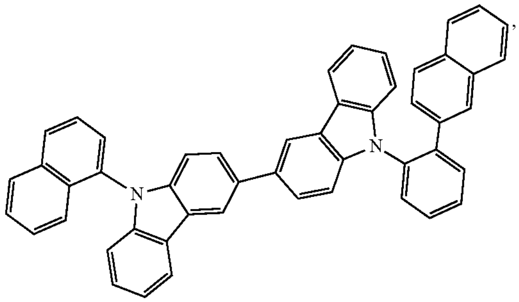
-continued
2-157
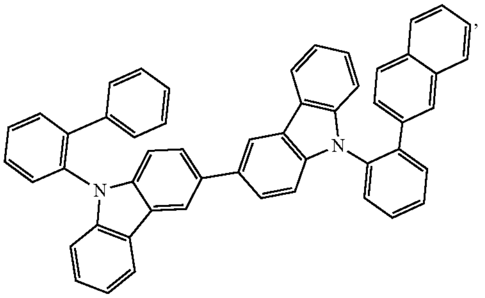
2-158
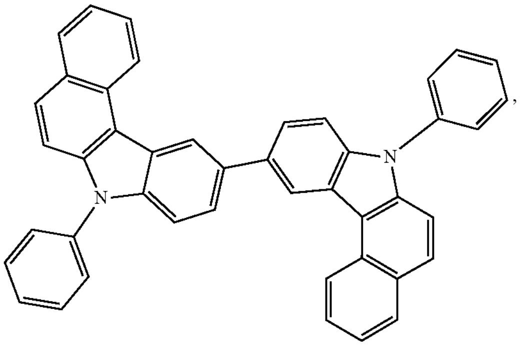
2-159
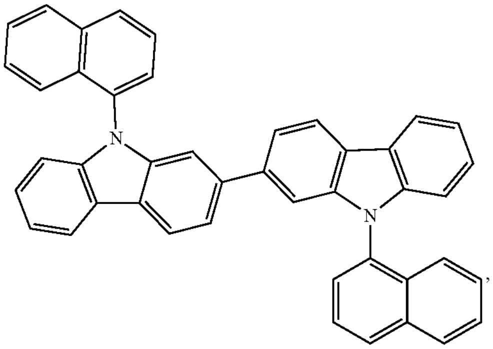
2-160
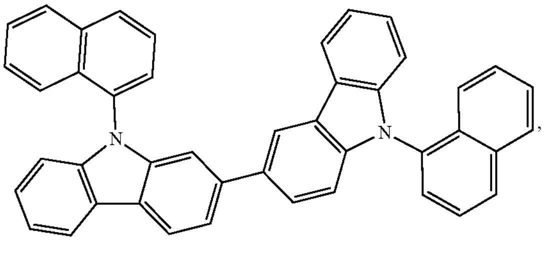

-continued
2-161
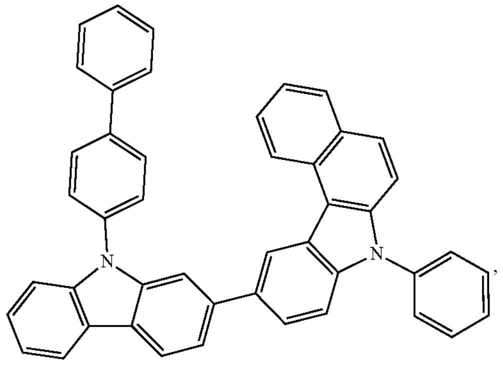
1-162
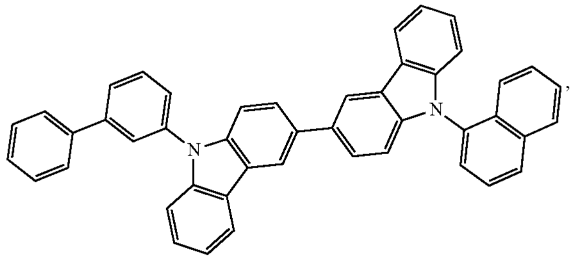
2-163
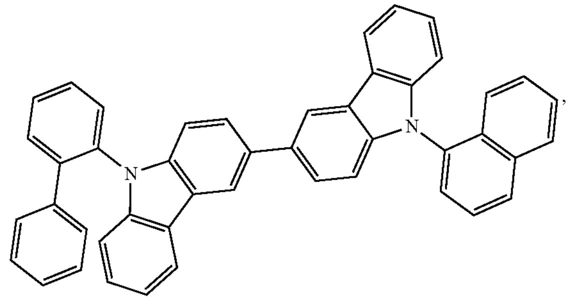
2-164
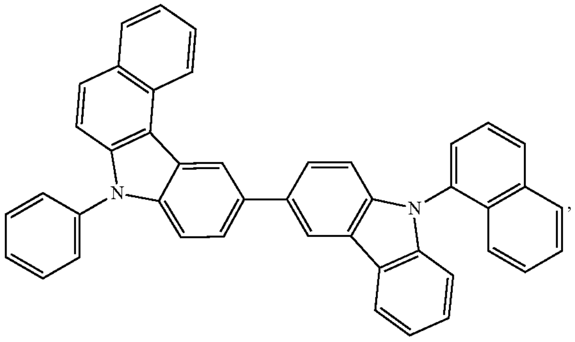
2-165
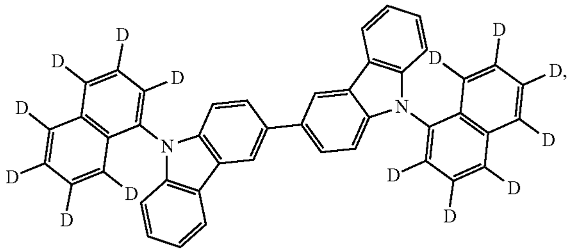
-continued
2-165
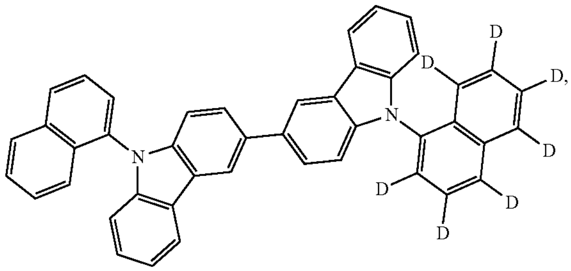
2-167
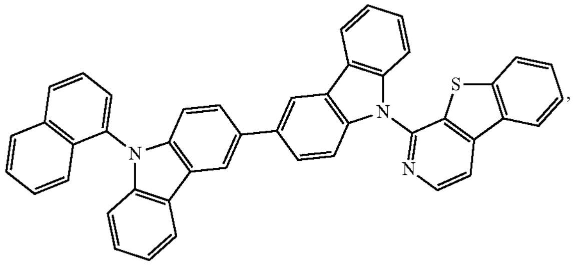
2-168
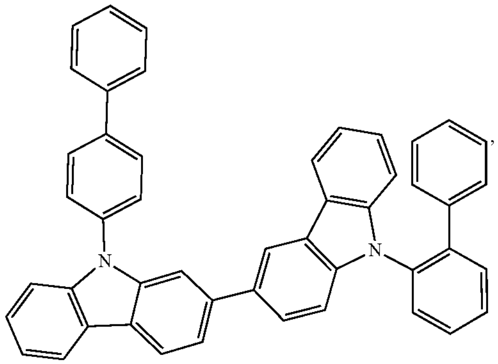
2-169
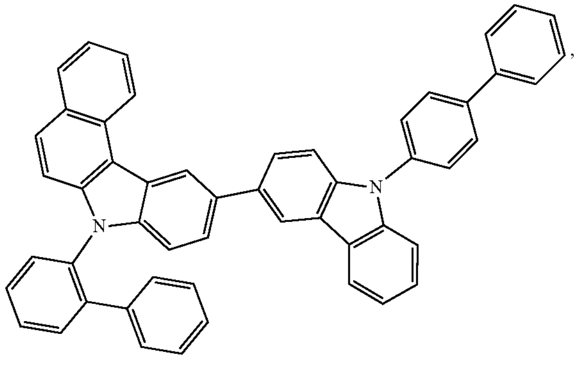
2-170
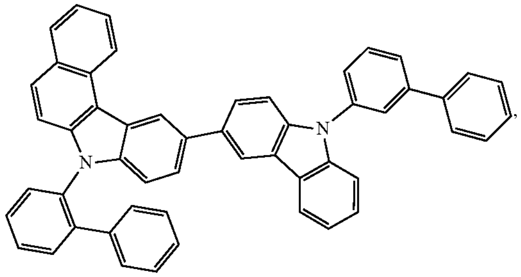
and -continued 2-171

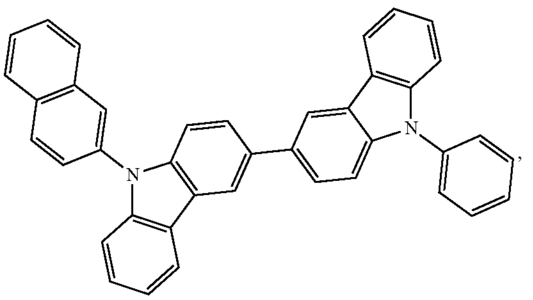

2-172

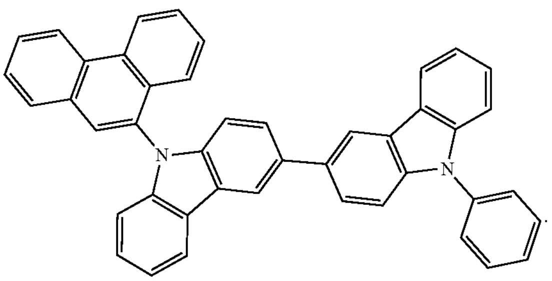

According to an embodiment of the present disclosure, wherein hydrogen in Compound 2-1 to Compound 2-172 can be partially or fully substituted with deuterium.

According to an embodiment of the present disclosure, wherein the organic layer is an emissive layer, and the first compound and the second compound are host materials.

According to an embodiment of the present disclosure, wherein the emissive layer further includes at least one phosphorescent material.

According to an embodiment of the present disclosure, wherein the phosphorescent material is a metal complex, and the metal complex has a general formula of $M(L_a)_m(L_b)_n(L_c)_q$;

M is selected from a metal with a relative atomic mass greater than 40;

$L_a$, $L_b$ and $L_c$ are a first ligand, a second ligand and a third ligand coordinated to M, respectively; $L_a$, $L_b$ and $L_c$ can be optionally joined to form a multidentate ligand; $L_a$, $L_b$ and $L_c$ can be identical or different; m is 1, 2 or 3; n is 0, 1 or 2; q is 0, 1 or 2; the sum of m, n and q is equal to the oxidation state of M; when m is greater than or equal to 2, multiple $L_a$ may be identical or different; when n is 2, two $L_b$ may be identical or different; when q is 2, two $L_c$ may be identical or different;

$L_a$ has a structure represented by Formula 3:

Formula 3

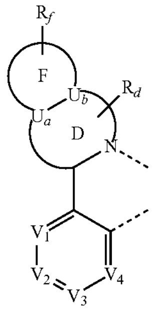

wherein, the ring D is selected from a five-membered heteroaromatic ring or a six-membered heteroaromatic ring;

the ring F is selected from a five-membered unsaturated carbocyclic ring, a benzene ring, a five-membered heteroaromatic ring or a six-membered heteroaromatic ring;

the ring D and the ring F are fused via $U_a$ and $U_b$;

$U_a$ and $U_b$ are, at each occurrence identically or differently, selected from C or N;

$R_d$ and $R_f$ represent, at each occurrence identically or differently, mono-substitution, multiple substitutions or non-substitution;

$V_1$ to $V_4$ are, at each occurrence identically or differently, selected from $CR_v$ or N;

$R_d$, $R_f$ and $R_v$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_d$, $R_f$, $R_v$ can be optionally joined to form a ring;

$L_b$ and $L_c$ are, at each occurrence identically or differently, selected from any one of the following structures:

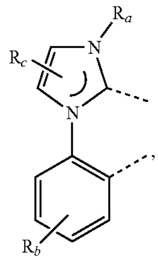
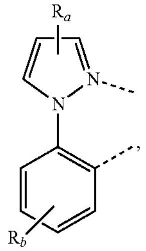
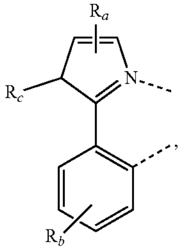
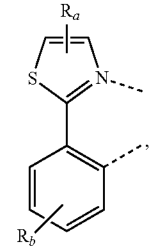
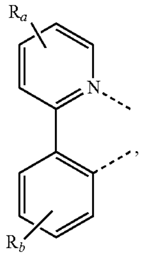
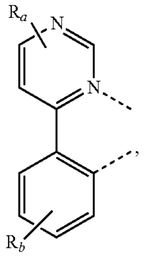
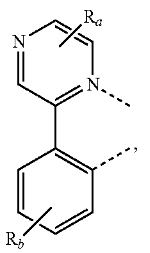
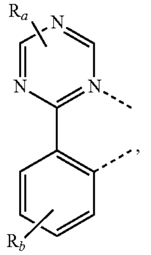
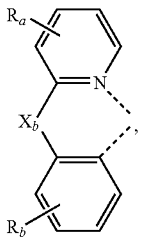
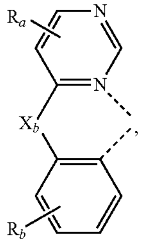
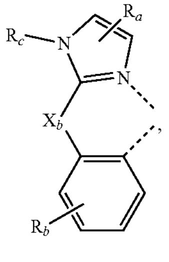
and
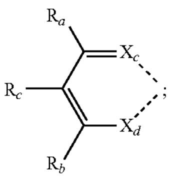

wherein, $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

in structures of the ligand $L_b$ and the ligand $L_c$, adjacent substituents $R_a$, $R_b$, $R_c$, $R_{N1}$, $R_{N2}$, $R_{C1}$ and $R_{C2}$ can be optionally joined to form a ring.

In the present disclosure, the expression that "adjacent substituents $R_d$, $R_f$, $R_v$ can be optionally joined to form a ring" is intended to mean that any one or more of groups of adjacent substituents, such as adjacent substituents $R_d$, adjacent substituents $R_f$, adjacent substituents $R_v$, adjacent substituents $R_d$ and $R_v$, adjacent substituents $R_f$ and $R_v$, and adjacent substituents $R_d$ and $R_f$, can be joined to form a ring. Obviously, for the persons skilled in the art, it is also possible that none of these adjacent substituents are joined to form a ring.

In this embodiment, the expression that "adjacent substituents $R_a$, $R_b$, $R_c$, $R_{N1}$, $R_{N2}$, $R_{C1}$ and $R_{C2}$ can be optionally joined to form a ring" is intended to mean that any one or more of groups of adjacent substituents, such as adjacent substituents $R_a$, adjacent substituents $R_b$, adjacent substituents $R_c$, adjacent substituents $R_a$ and $R_b$, adjacent substituents $R_a$ and $R_c$, adjacent substituents $R_b$ and $R_c$, adjacent substituents $R_a$ and $R_{N1}$, adjacent substituents $R_b$ and adjacent substituents $R_a$ and $R_{C1}$, adjacent substituents $R_a$ and $R_{C2}$, adjacent substituents $R_b$ and $R_{C1}$, adjacent substituents $R_b$ and $R_{C2}$, adjacent substituents $R_a$ and $R_{N2}$, and adjacent substituents $R_b$ and $R_{N2}$, can be joined to form a ring. Obviously, it is also possible that none of these adjacent substituents are joined to form a ring.

According to an embodiment of the present disclosure, wherein the phosphorescent material is a metal complex, and the metal complex has a general formula of $M(L_a)_m(L_b)_n$;

M is selected from a metal with a relative atomic mass greater than 40;

$L_a$ and $L_b$ are a first ligand and a second ligand coordinated to M, respectively; $L_a$ and $L_b$ can be optionally joined to form a multidentate ligand;

m is 1, 2 or 3; n is 0, 1 or 2; the sum of m and n is equal to the oxidation state of M; when m is greater than or equal to 2, multiple $L_a$ may be identical or different; when n is 2, two $L_b$ may be identical or different;

$L_a$ has a structure represented by Formula 3:

Formula 3

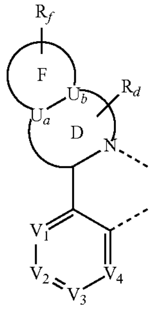

wherein, the ring D is selected from a five-membered heteroaromatic ring or a six-membered heteroaromatic ring;

the ring F is selected from a five-membered unsaturated carbocyclic ring, a benzene ring, a five-membered heteroaromatic ring or a six-membered heteroaromatic ring;

the ring D and the ring F are fused via $U_a$ and $U_b$;

$U_a$ and $U_b$ are, at each occurrence identically or differently, selected from C or N;

$R_d$ and $R_f$ represent, at each occurrence identically or differently, mono-substitution, multiple substitutions or non-substitution;

$V_1$ to $V_4$ are, at each occurrence identically or differently, selected from $CR_v$ or N;

$R_d$, $R_f$ and $R_v$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_d$, $R_f$, $R_v$ can be optionally joined to form a ring;

the ligand $L_b$ has the following structure:

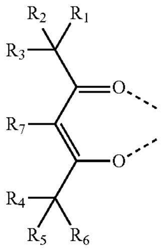

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein at least one or two of $R_1$ to $R_3$ is(are) selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof; and/or at least one or two of $R_4$ to $R_6$ is(are) selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof.

According to an embodiment of the present disclosure, wherein at least two of $R_1$ to $R_3$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof; and/or at least two of $R_4$ to $R_6$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof.

According to an embodiment of the present disclosure, in the device, the phosphorescent material is an Ir complex, a Pt complex or an Os complex.

According to an embodiment of the present disclosure, in the device, the phosphorescent material is an Ir complex and has a structure represented by any one of: $Ir(L_a)(L_b)(L_c)$, $Ir(L_a)_2(L_b)$, $Ir(L_a)_2(L_c)$ or $Ir(L_a)(L_c)_2$.

According to an embodiment of the present disclosure, wherein in the electroluminescent device, the phosphorescent material is an Ir complex and includes a ligand $L_a$, and the ligand $L_a$ has a structure represented by Formula 3 and includes at least one structural unit selected from the group consisting of an aromatic ring formed by fusing a six-membered ring to a six-membered ring, a heteroaromatic ring formed by fusing a six-membered ring to a six-membered ring, an aromatic ring formed by fusing a six-membered ring to a five-membered ring and a heteroaromatic ring formed by fusing a six-membered ring to a five-membered ring.

According to an embodiment of the present disclosure, wherein in the electroluminescent device, the phosphorescent material is an Ir complex and includes a ligand $L_a$, and the ligand $L_a$ has a structure represented by Formula 3 and includes at least one structural unit selected from the group consisting of naphthalene, phenanthrene, quinoline, isoquinoline and azaphenanthrene.

According to an embodiment of the present disclosure, wherein in the electroluminescent device, the phosphorescent material is an Ir complex and includes a ligand $L_a$, and the ligand $L_a$ is, at each occurrence, any one selected from the group consisting of the following structures:

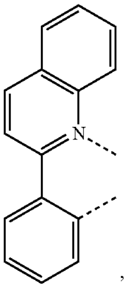,
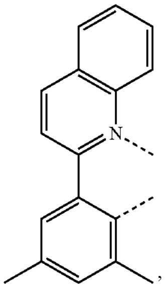,
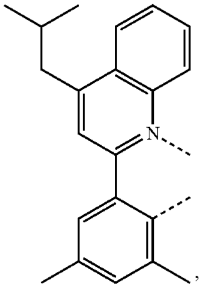,
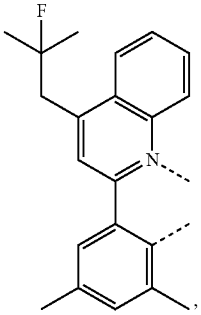,
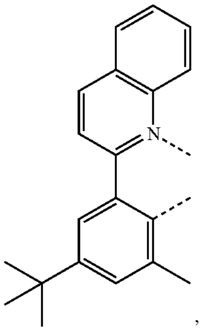,
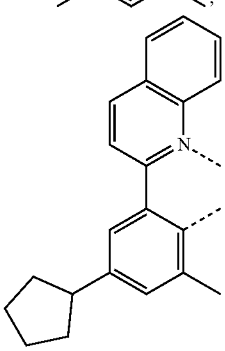,
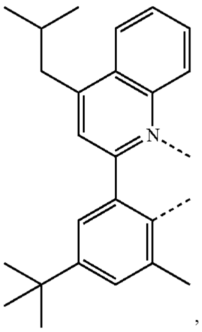, -continued

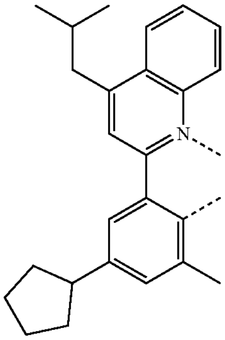,
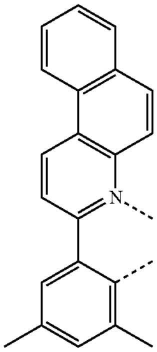,
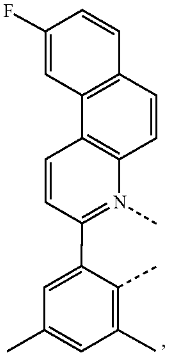,
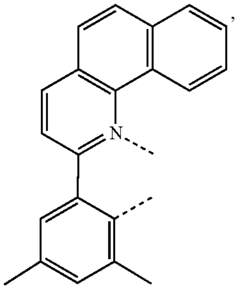,
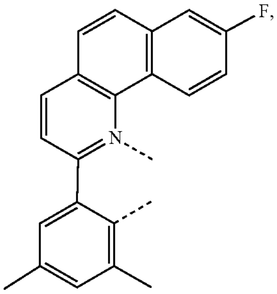,
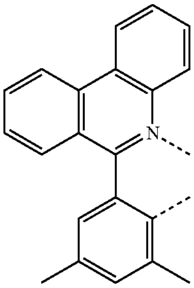,
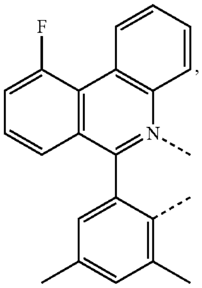,
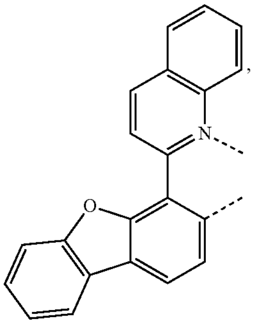,
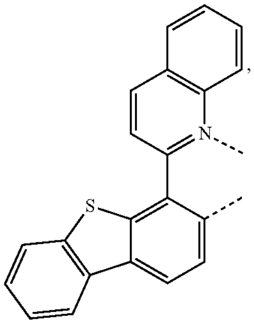,
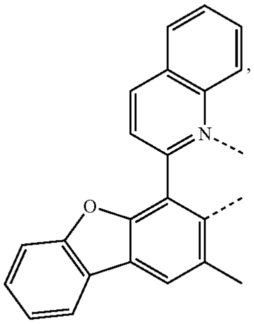,
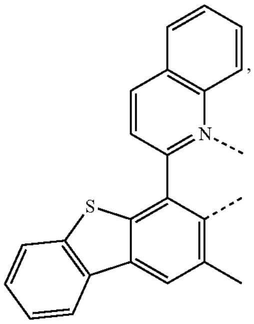, -continued
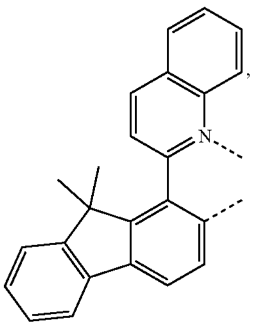
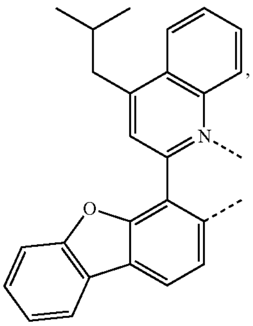
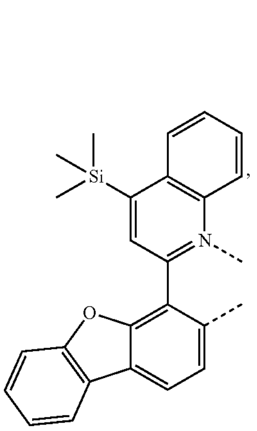
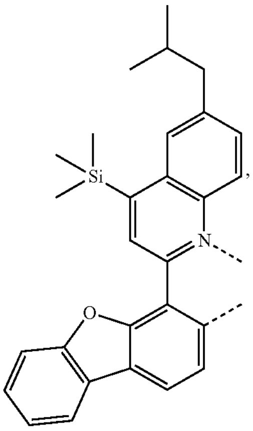
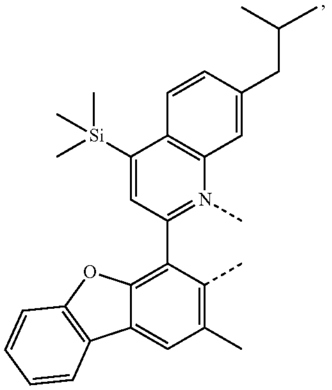
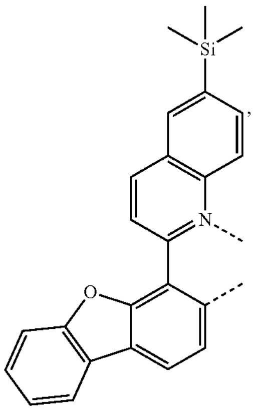
-continued
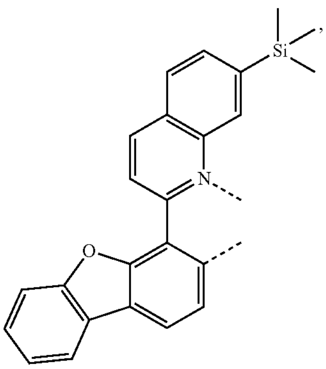
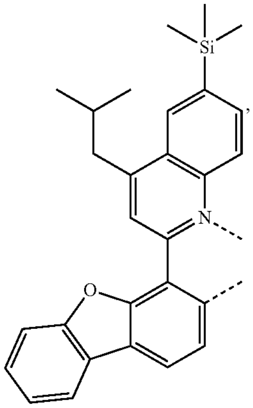
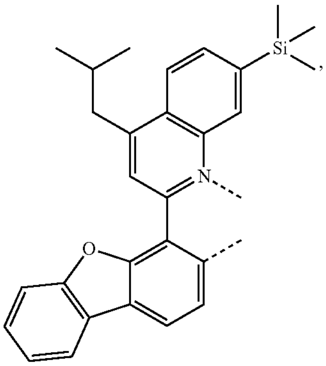
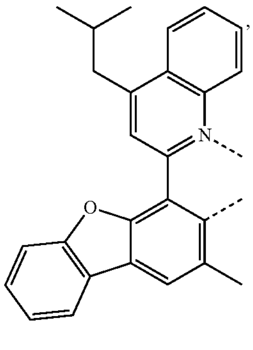
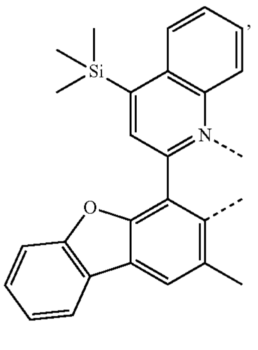

-continued
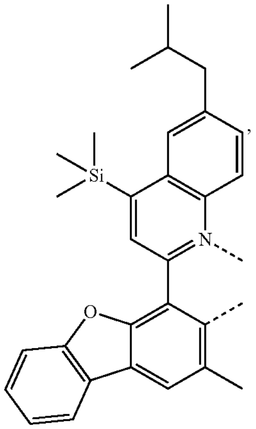
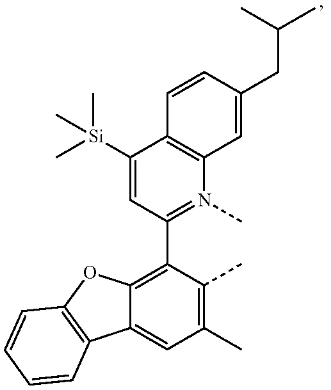
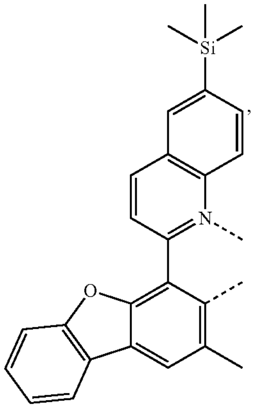
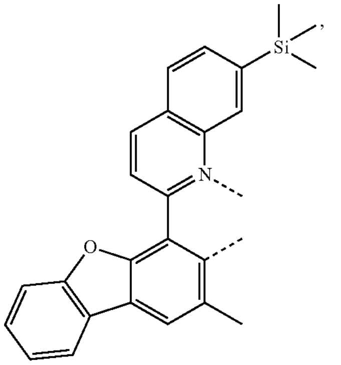
-continued
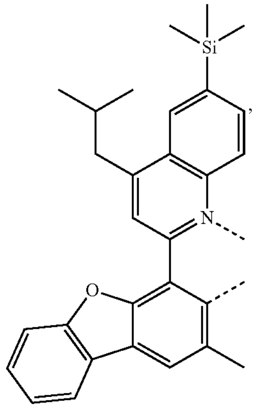
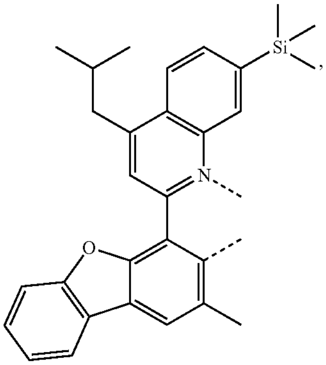
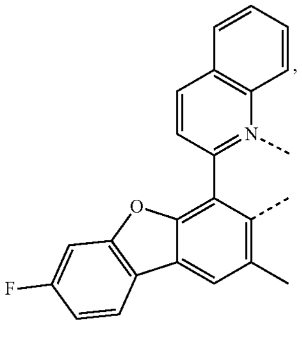
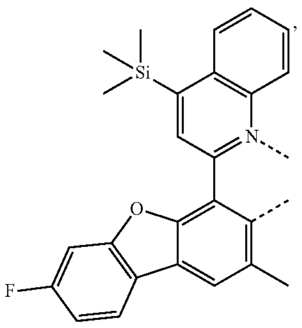

-continued
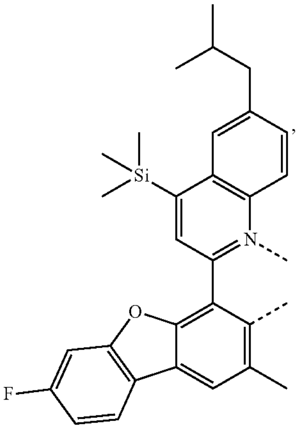
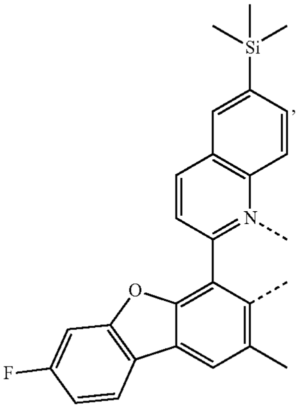
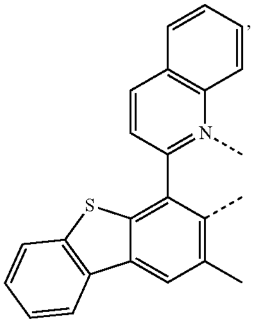
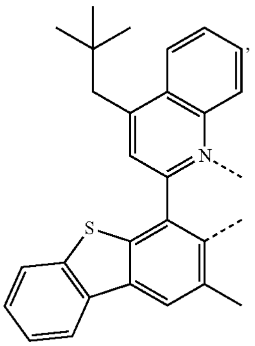
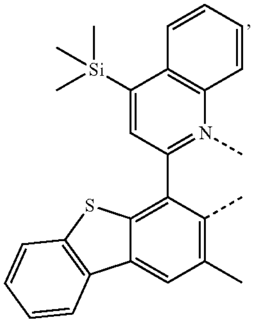
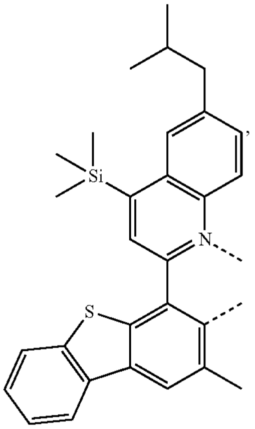
-continued
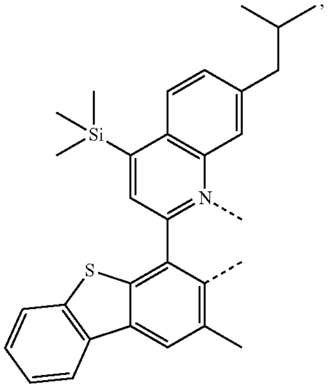
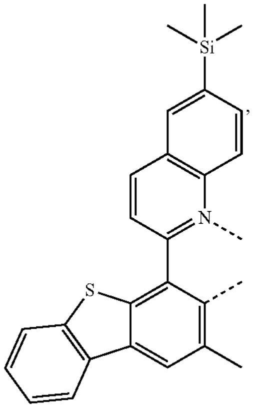
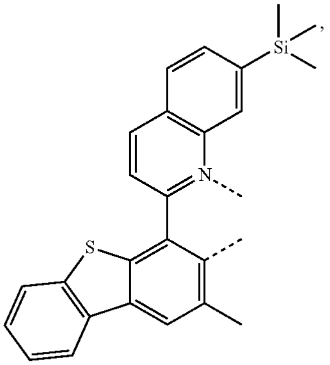
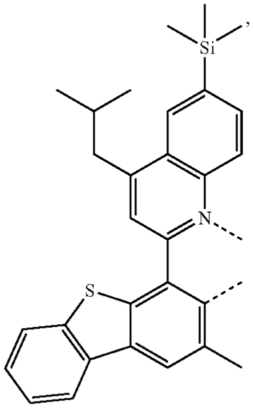

-continued
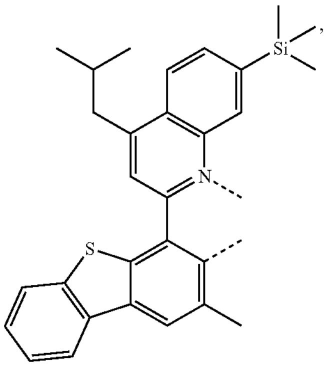
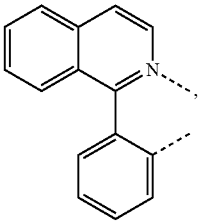
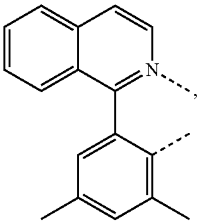
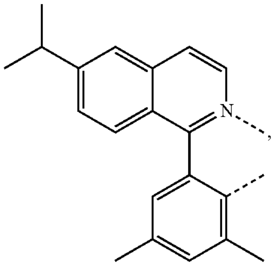
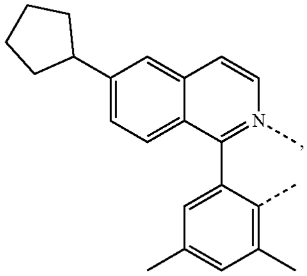
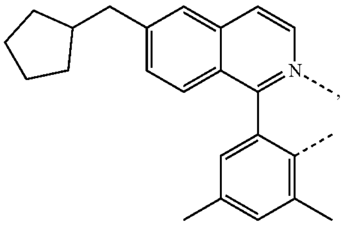
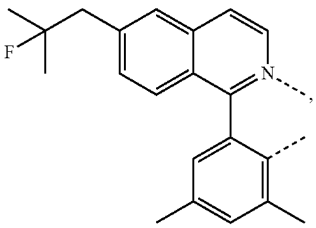
-continued
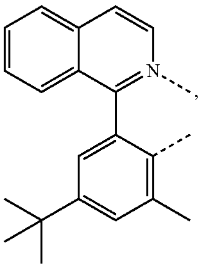
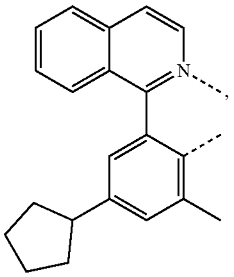
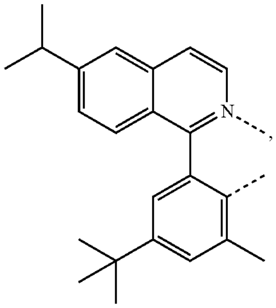
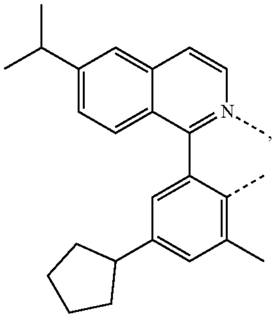
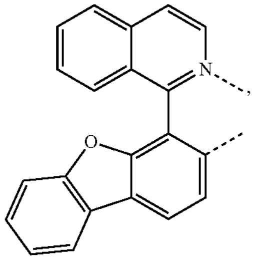
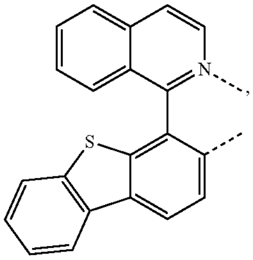
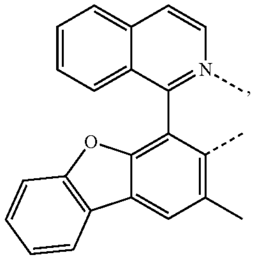
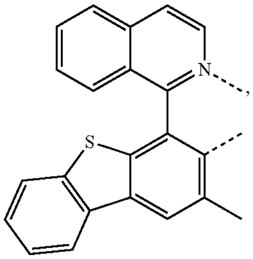
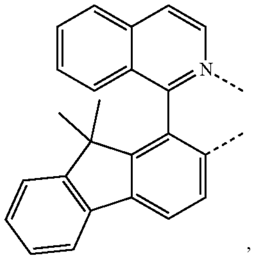
,
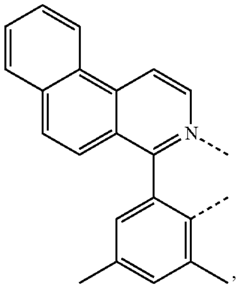
,
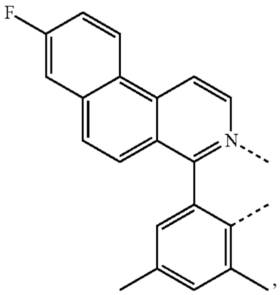
,
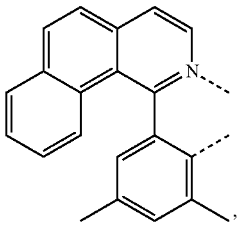
, -continued
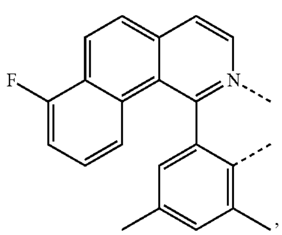,
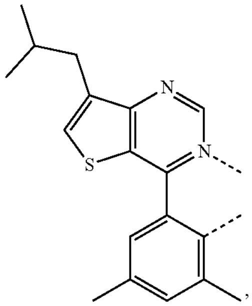,
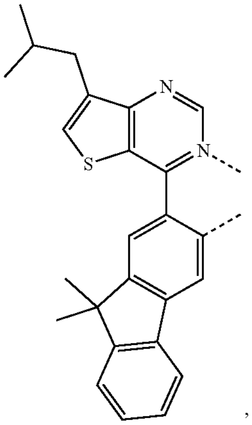,
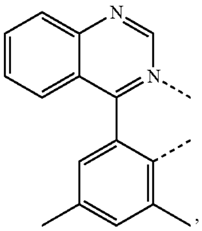,
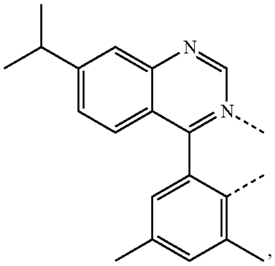,
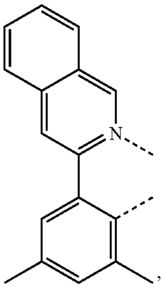,
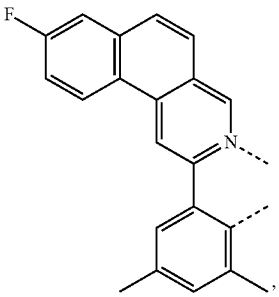,
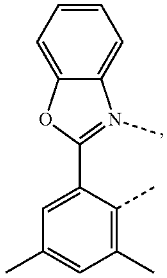,
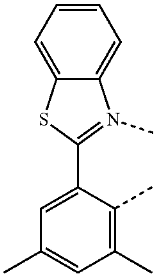,
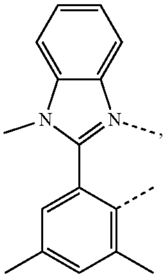,
-continued
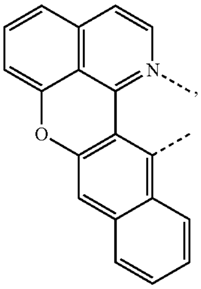,
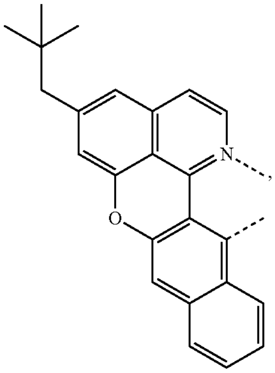,
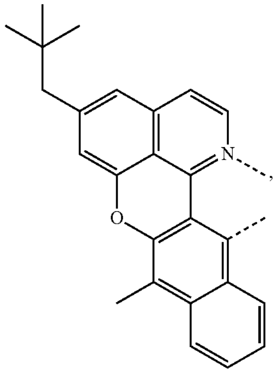,
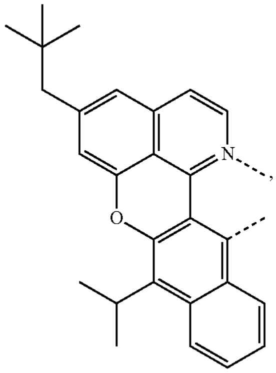,
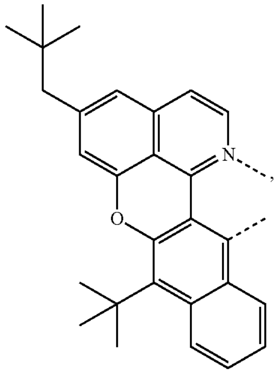,
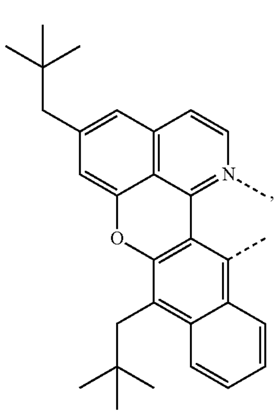, -continued
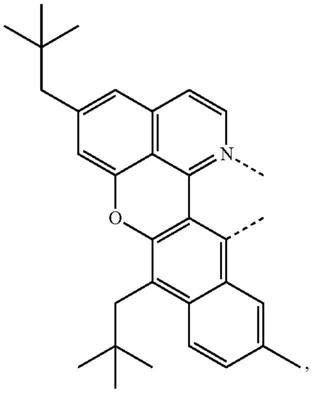
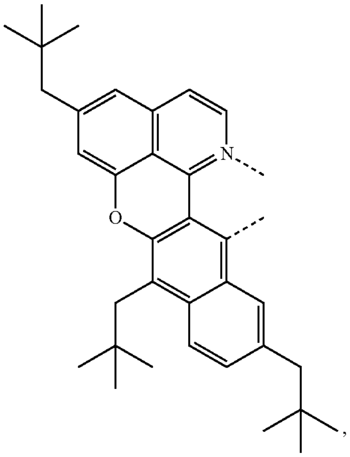
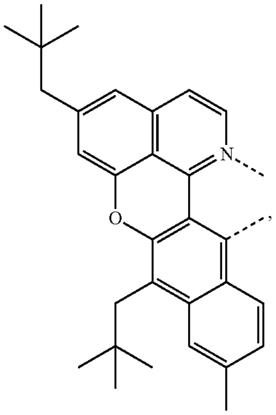
-continued
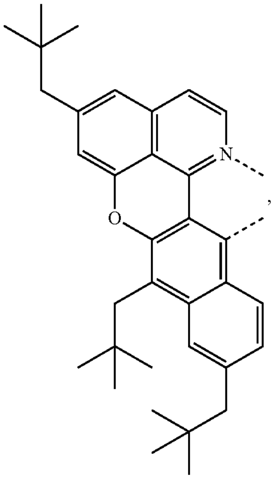
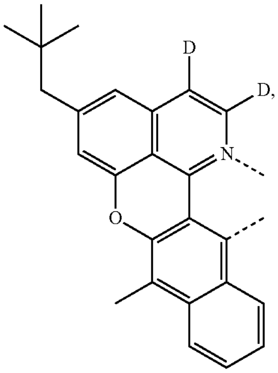
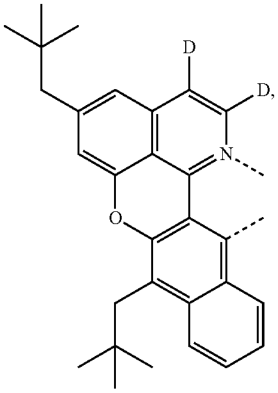
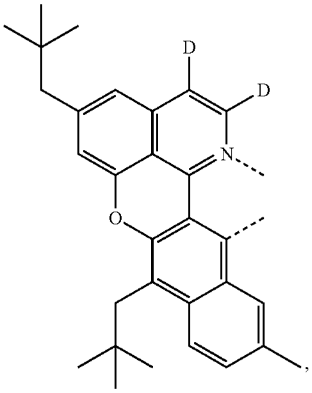
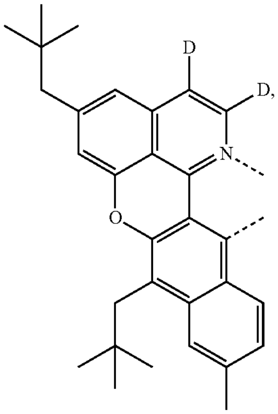

-continued
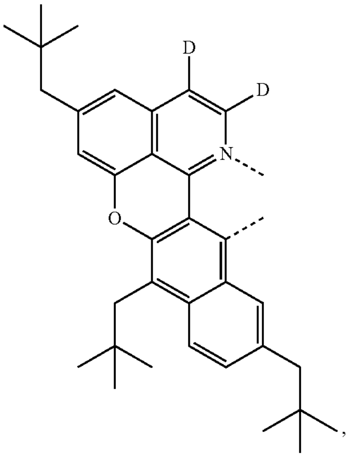
,
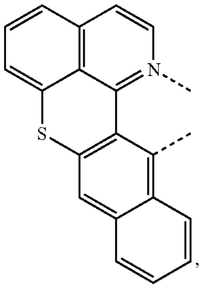
,
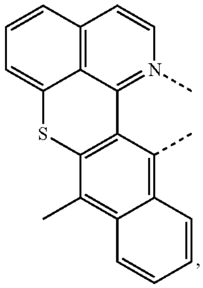
,
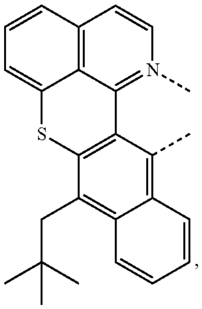
,
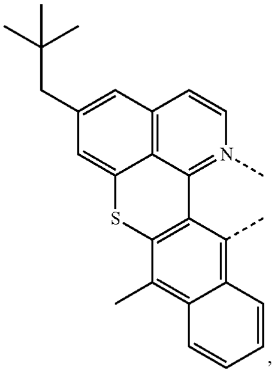
,
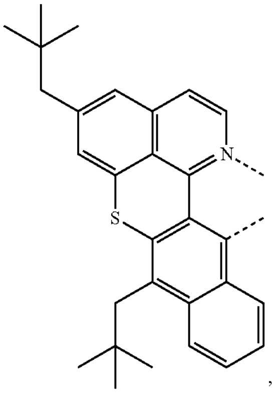
,
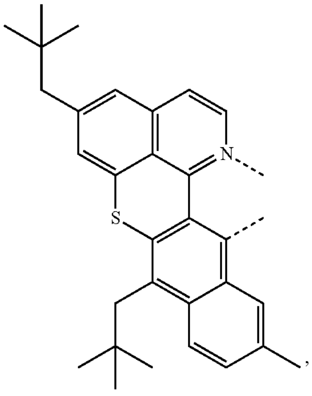
,
-continued
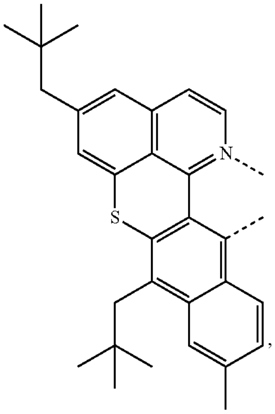
,
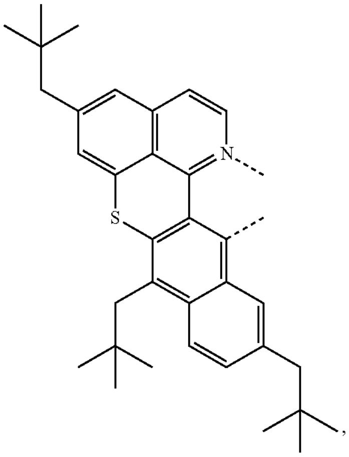
,
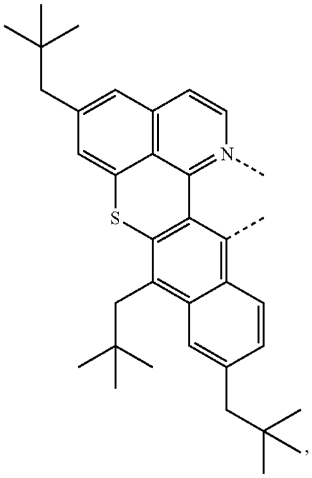
,
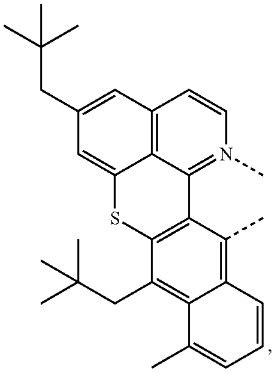
, -continued
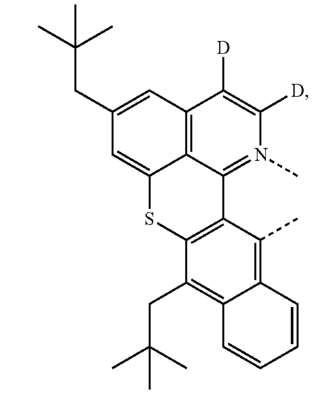
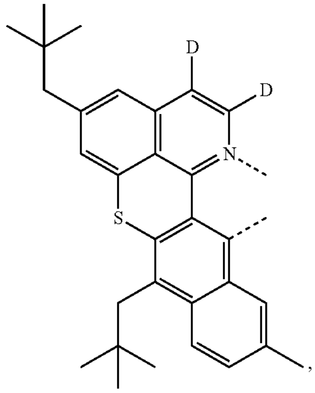
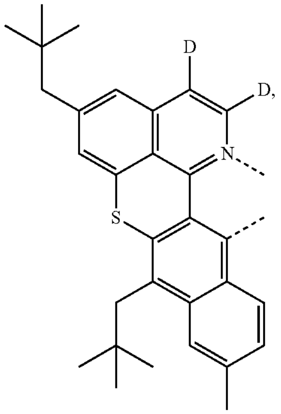
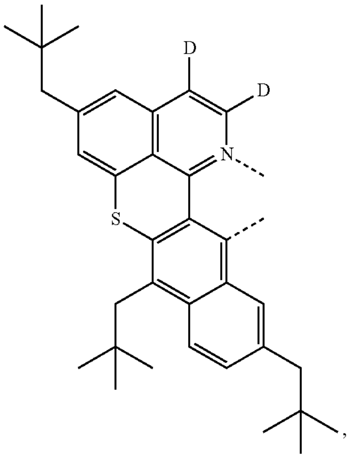
-continued
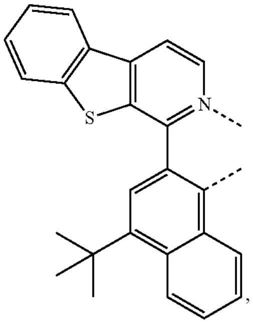
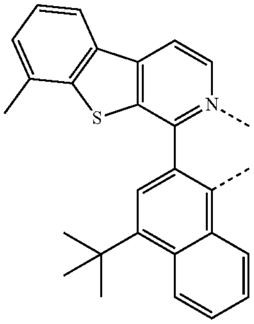
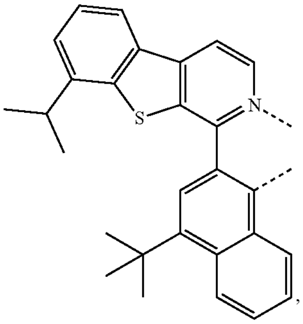
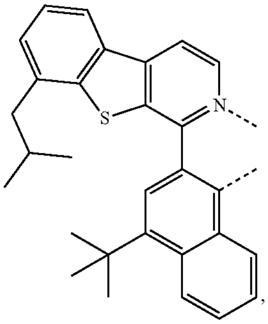
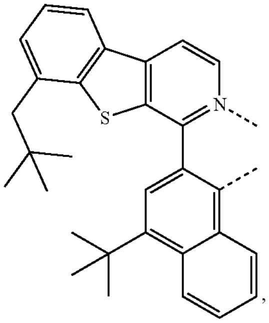
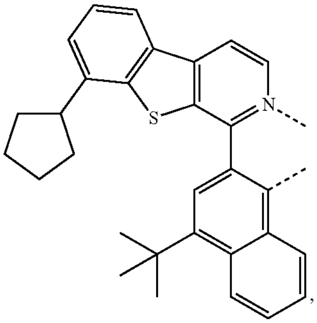
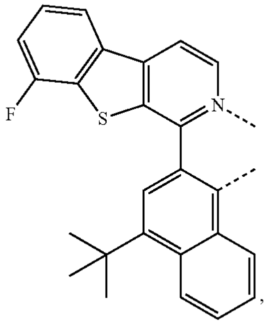

-continued
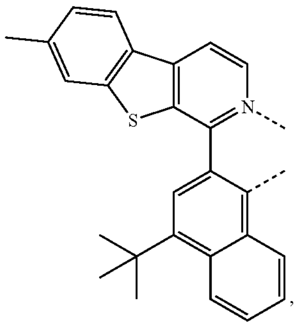
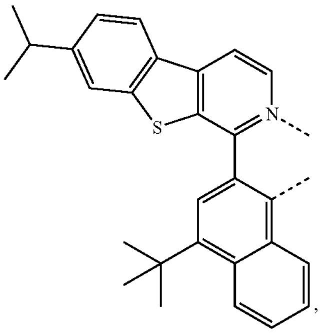
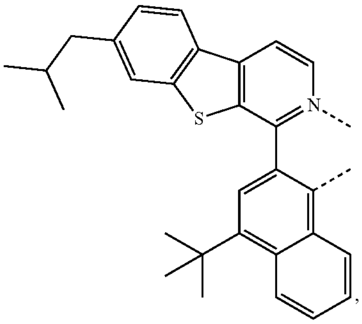
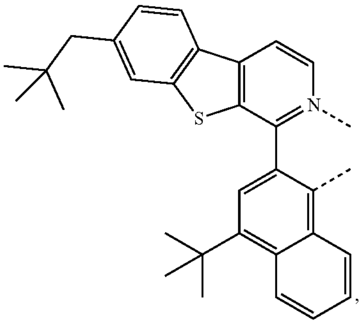
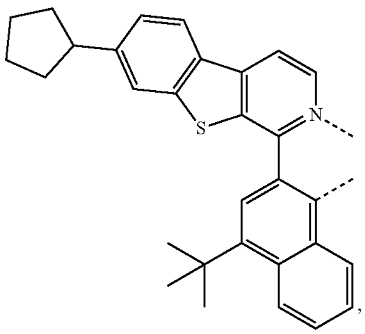
-continued
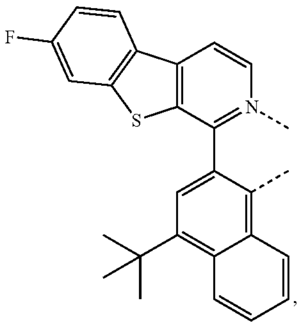
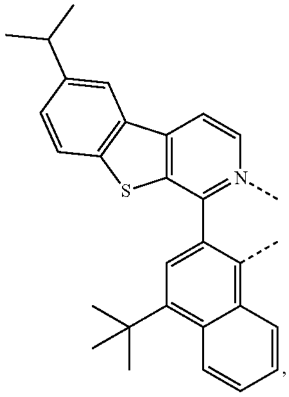
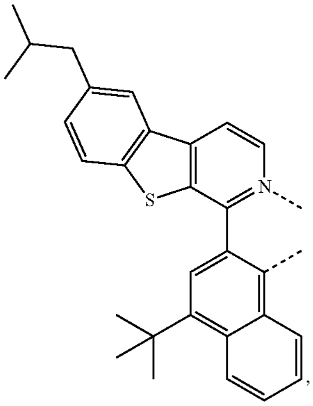
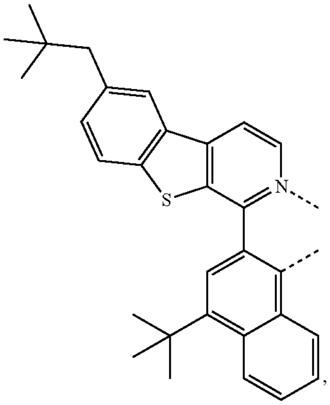

-continued
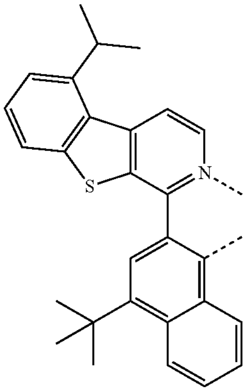,
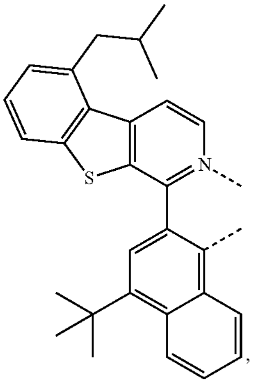,
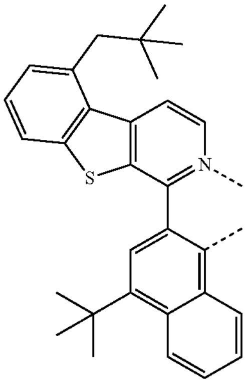,
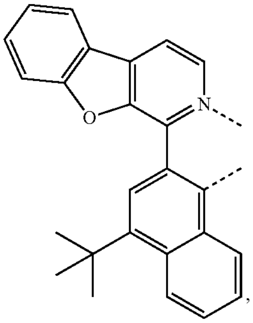,
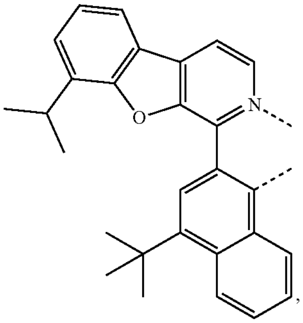,
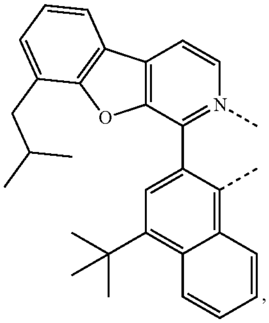,
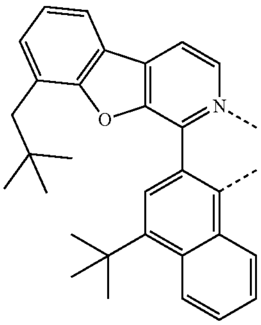,
-continued
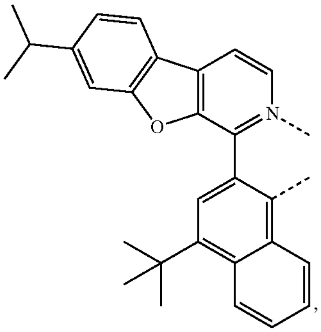,
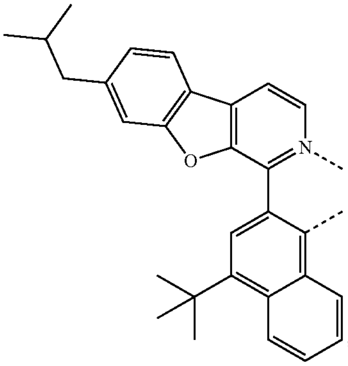,
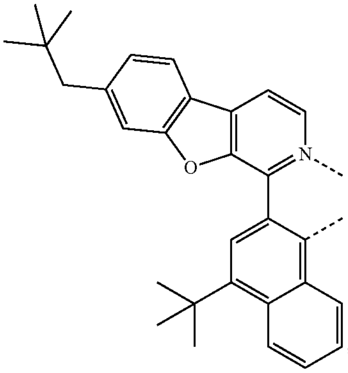,
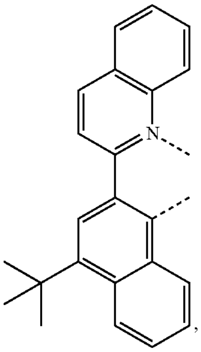,
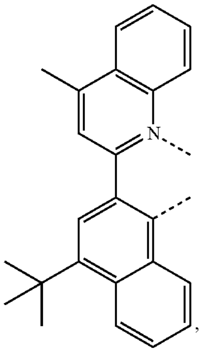, -continued
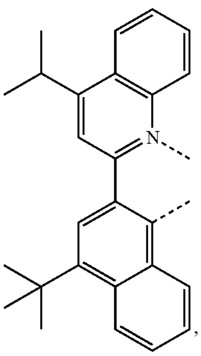
,
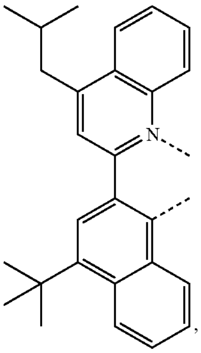
,
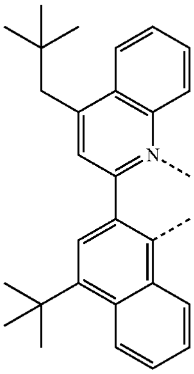
,
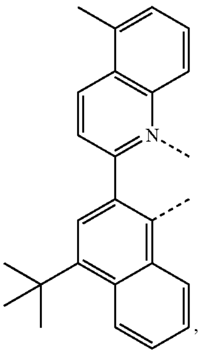
,
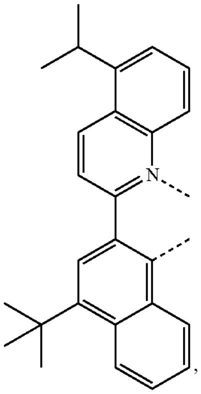
,
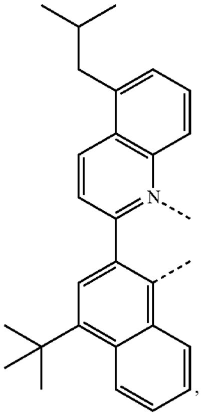
,
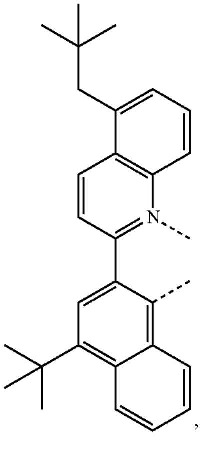
,
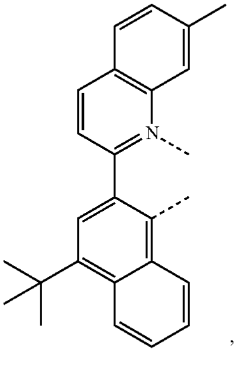
,
-continued
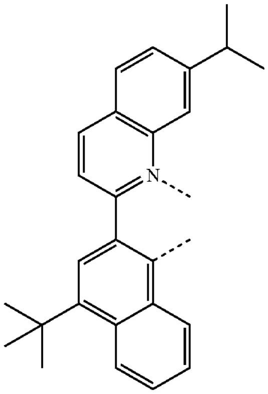
,
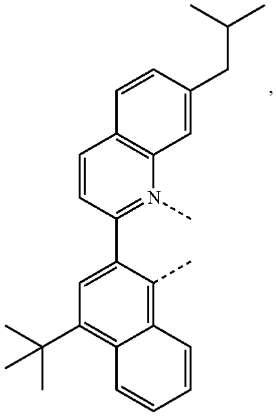
,
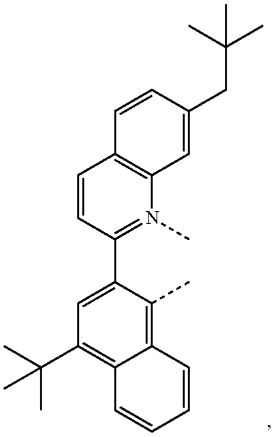
,
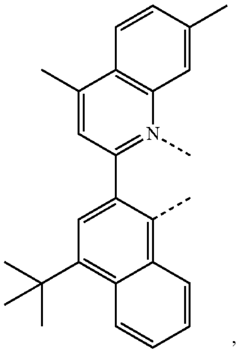
,
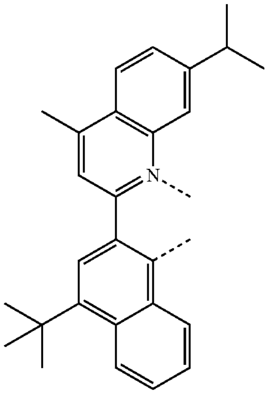
,
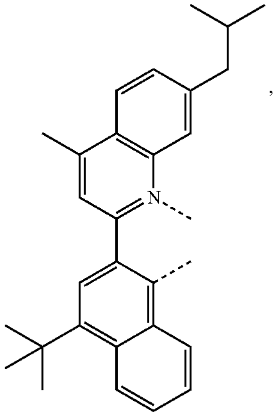
,
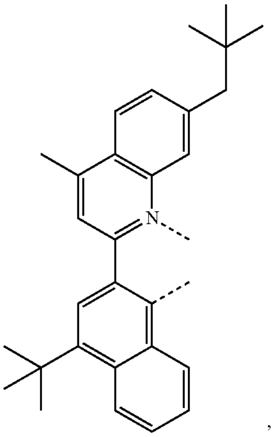
,
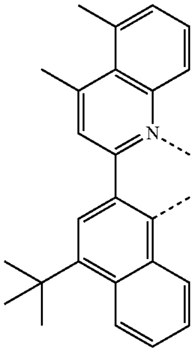
, -continued
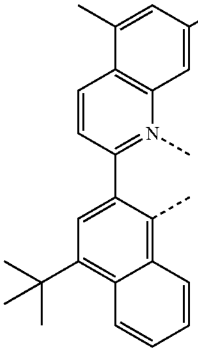
,
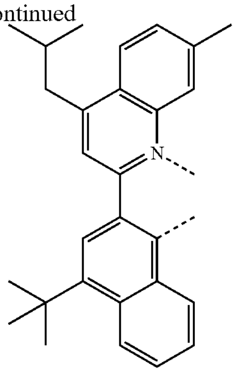
, and
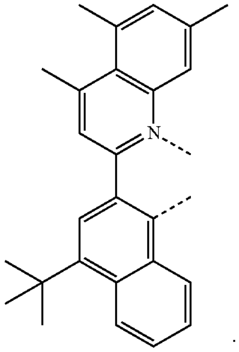
.
According to an embodiment of the present disclosure, wherein in the electroluminescent device, the phosphorescent material is an Ir complex and includes a ligand $L_b$, and the ligand $L_b$ is, at each occurrence identically or differently, selected from the group consisting of the following structures:
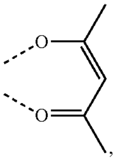
,
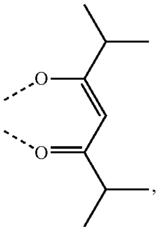
,
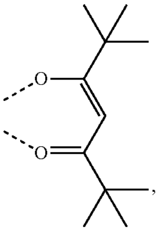
,
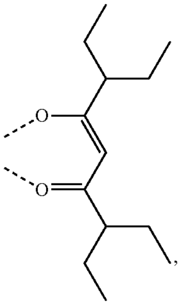
,
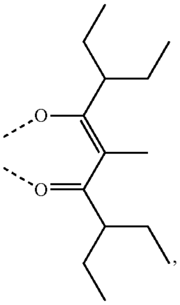
,
-continued
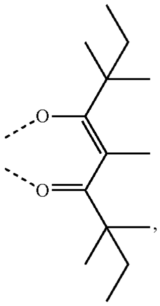
,
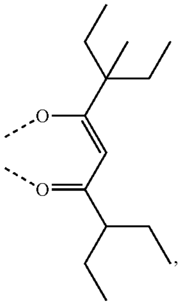
,
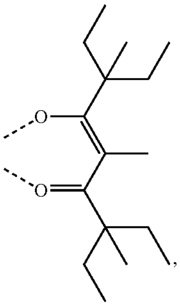
,
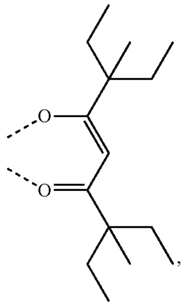
,
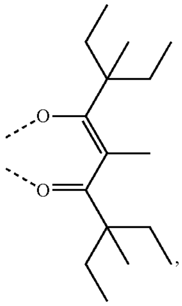
,
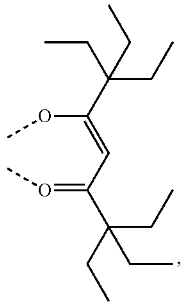
,
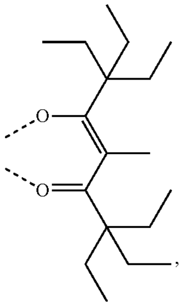
,
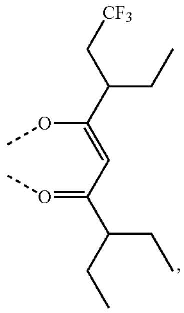
,
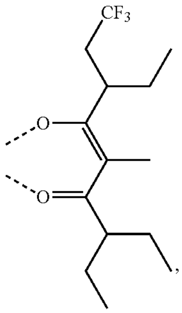
, -continued
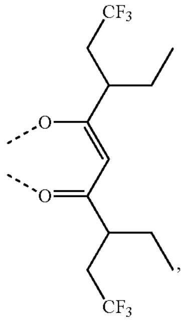,
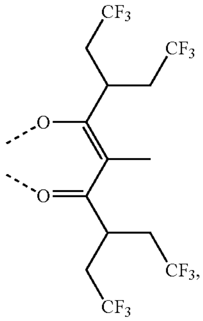,
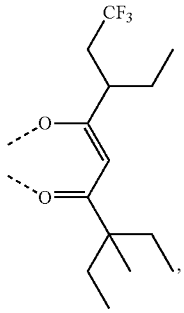,
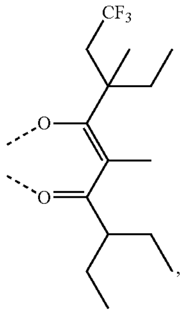,
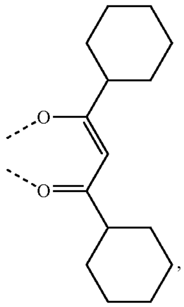,
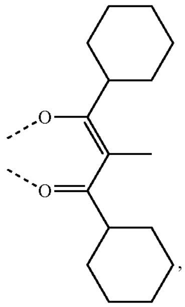,
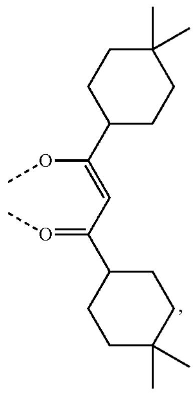,
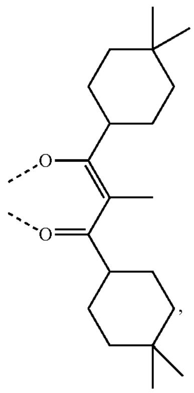,
-continued
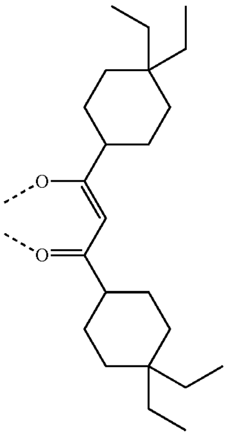
and
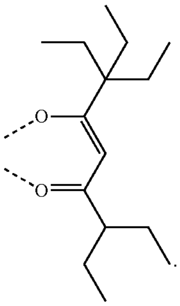.
According to an embodiment of the present disclosure, wherein in the electroluminescent device, the phosphorescent material is selected from the group consisting of the following structures:
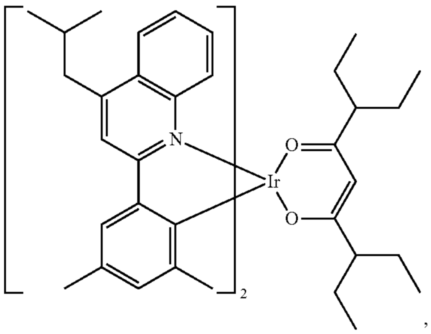,
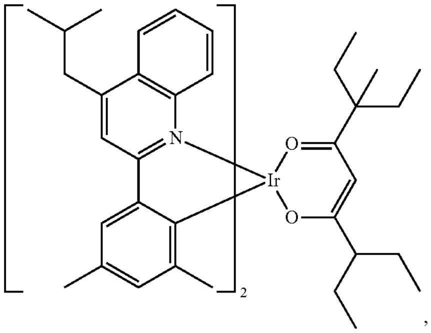,

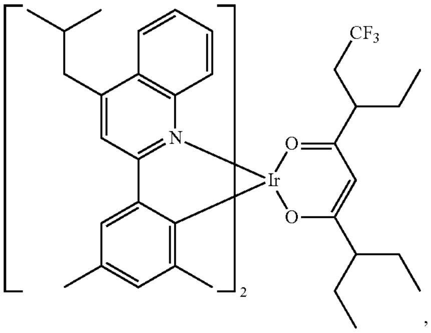
,
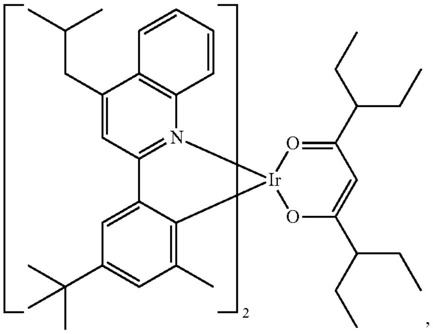
,
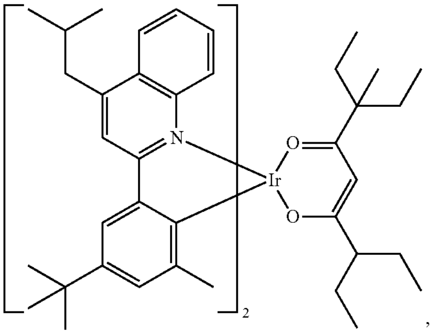
,
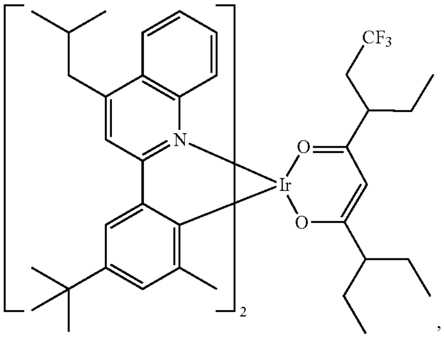
,
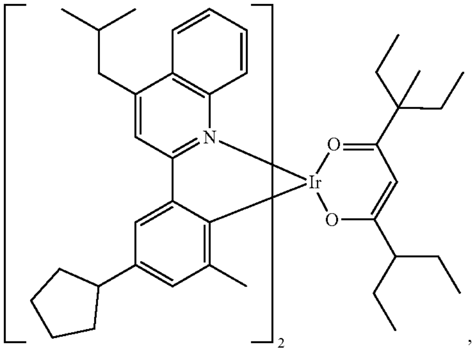
,
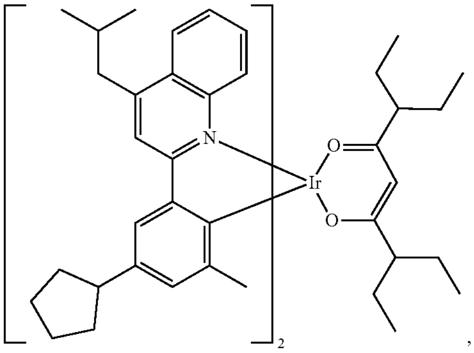
,
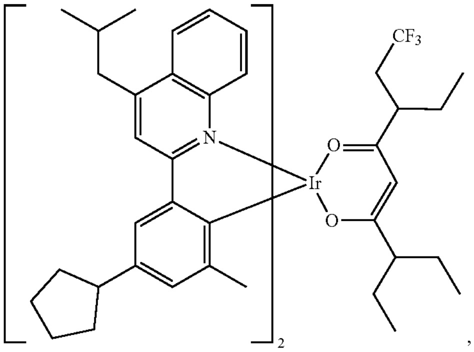
,
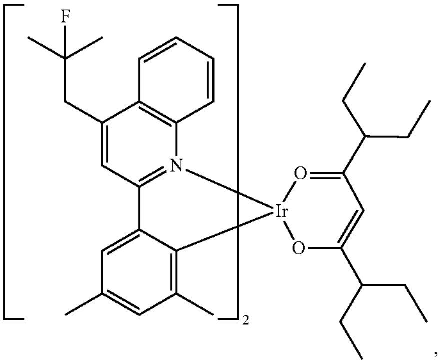
,
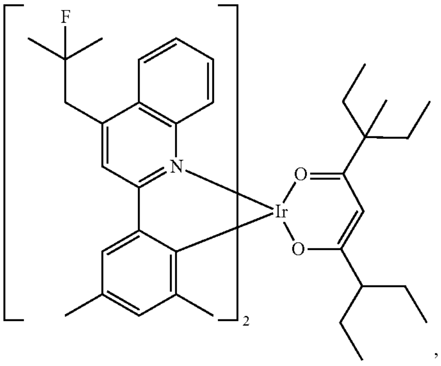
, -continued
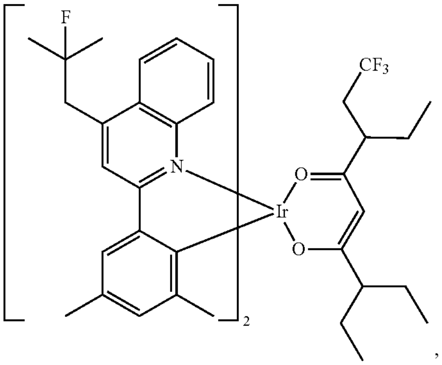
,
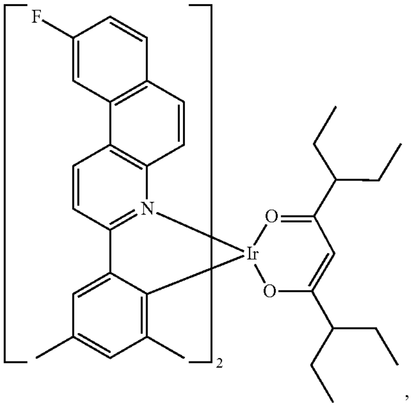
,
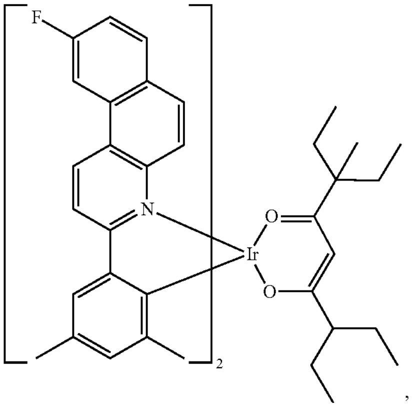
,
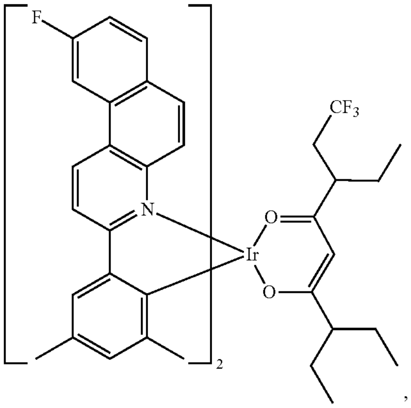
,
-continued
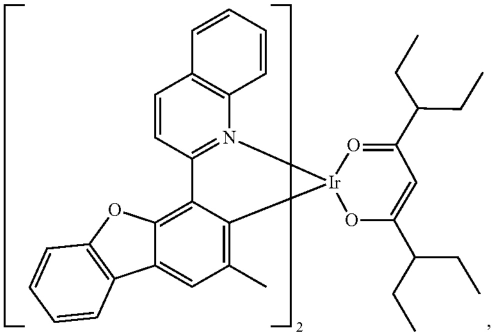
,
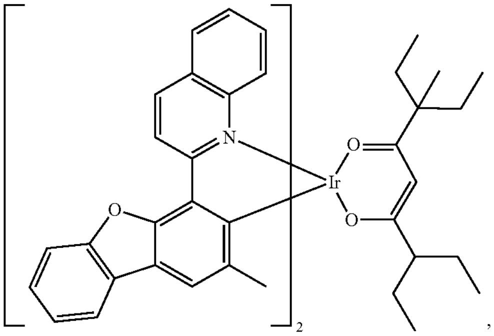
,
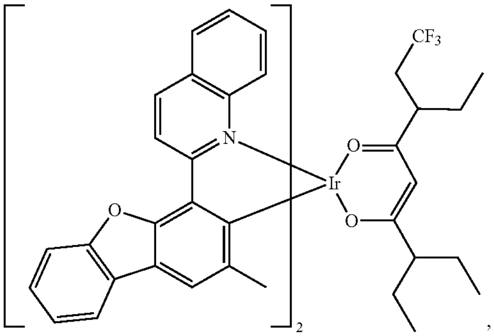
,
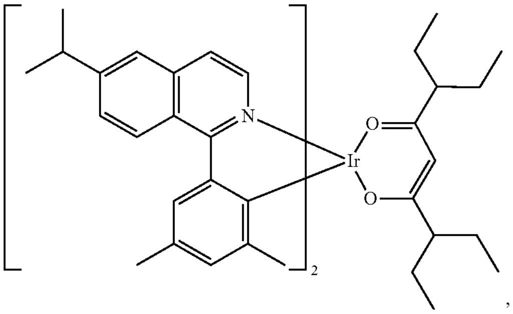
,
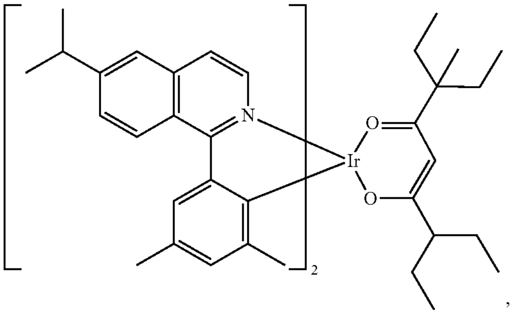
, -continued
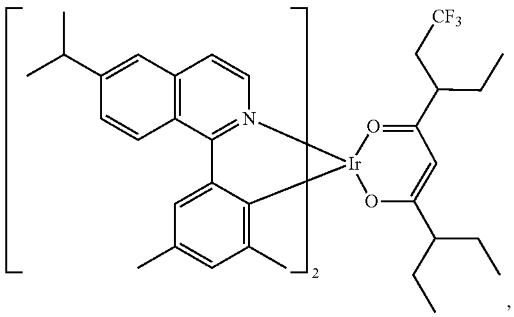
,
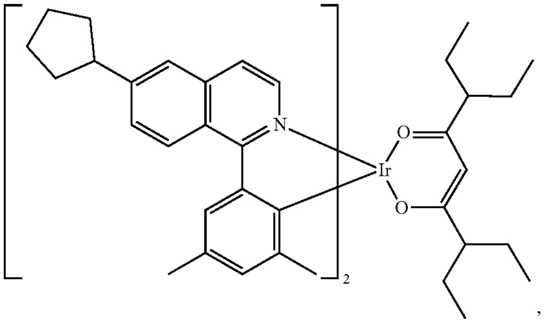
,
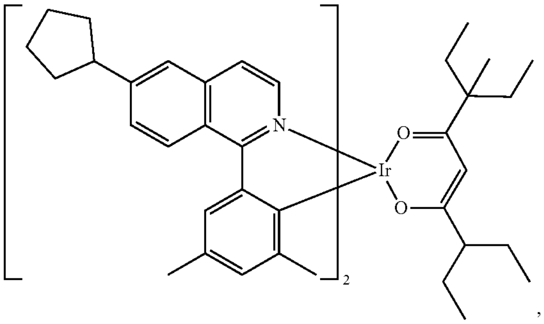
,
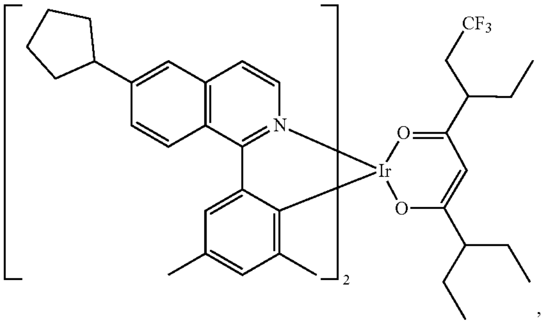
,
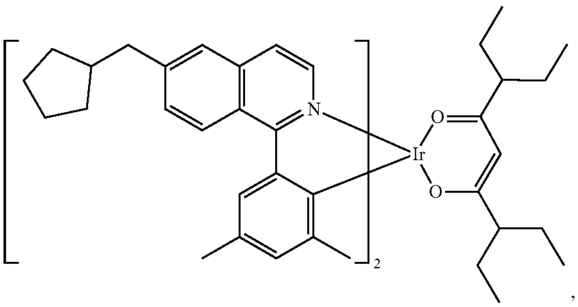
,
-continued
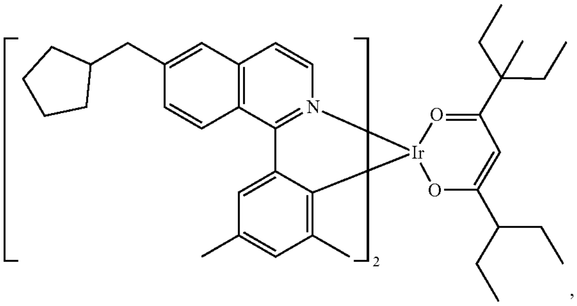
,
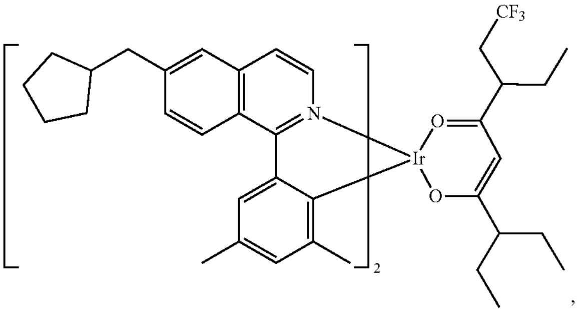
,
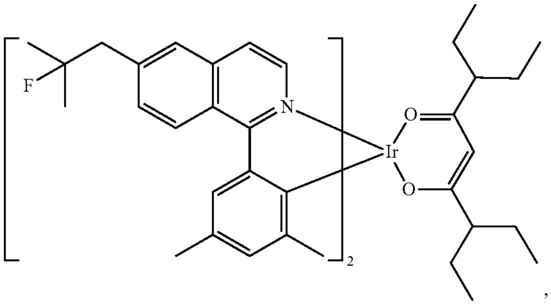
,
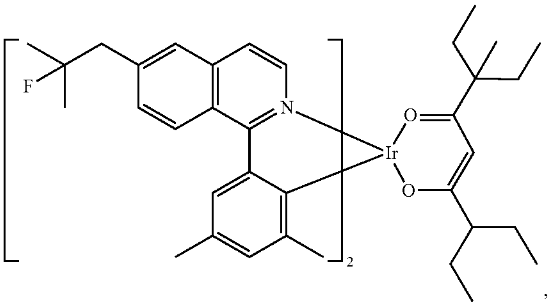
,
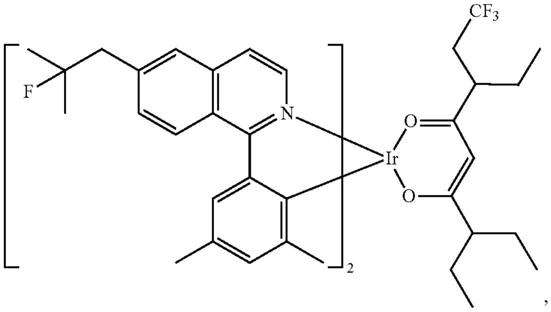
, -continued
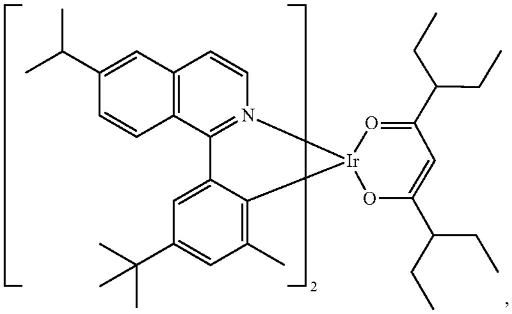
,
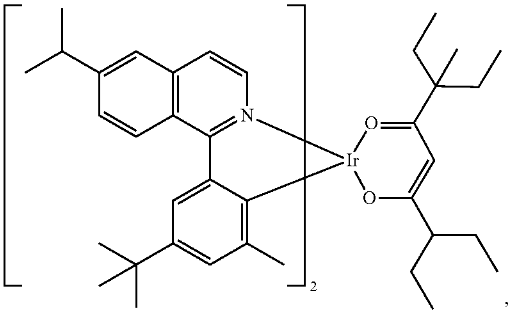
,
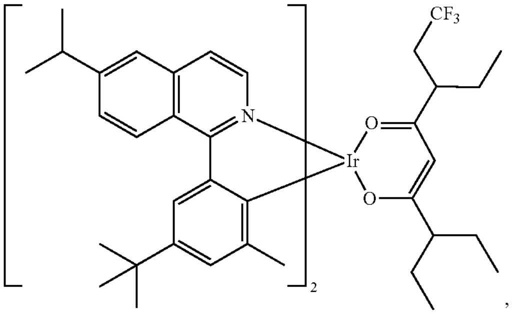
,
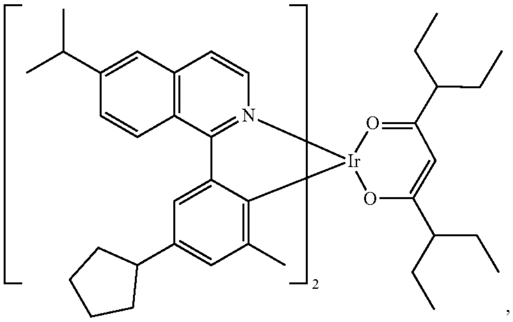
,
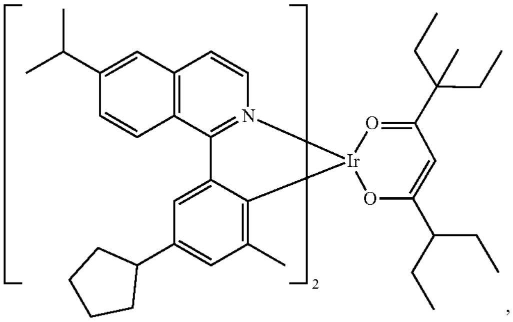
,
-continued
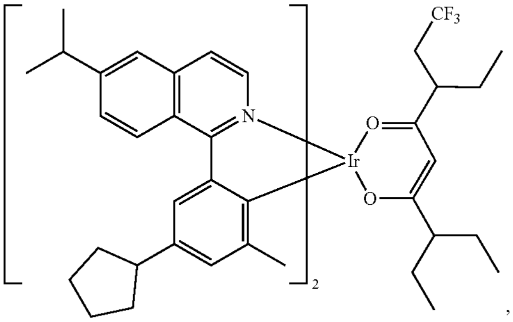
,
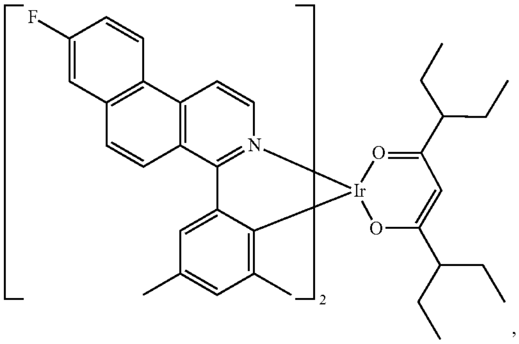
,
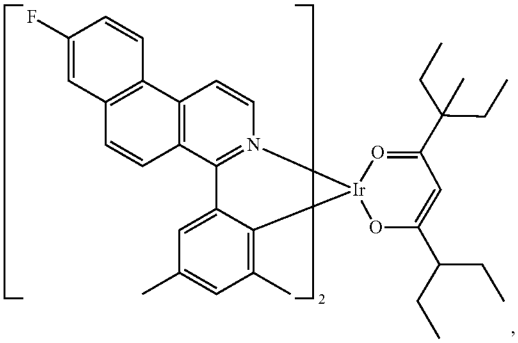
,
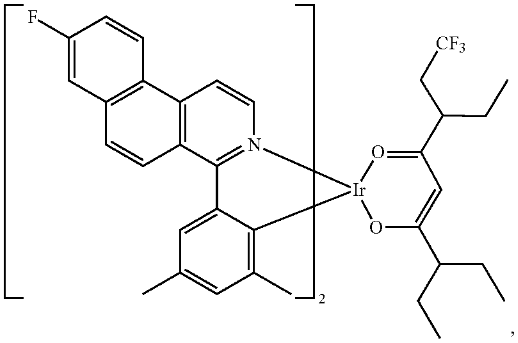
,
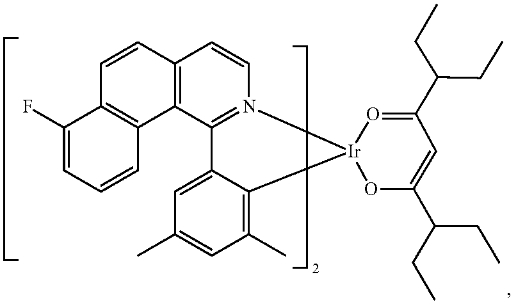
, -continued
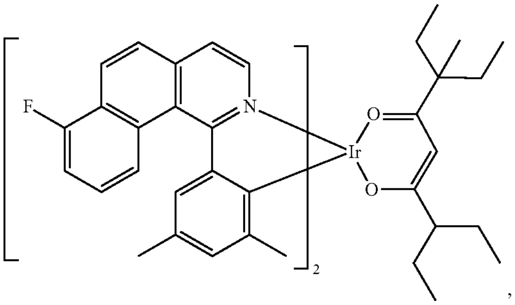
,
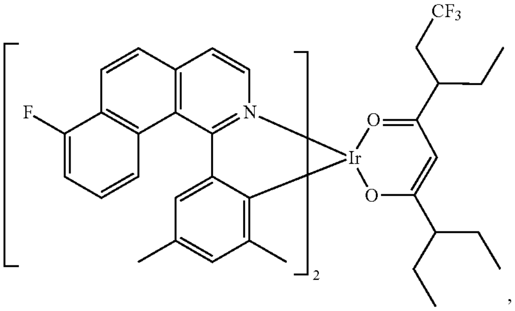
,
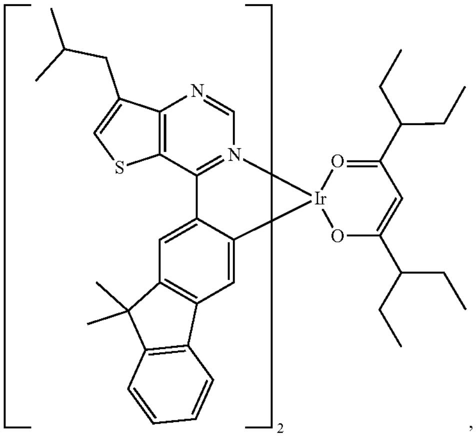
,
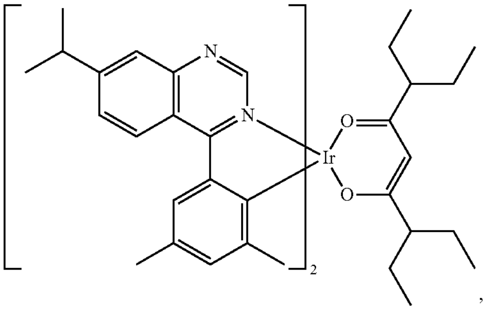
,
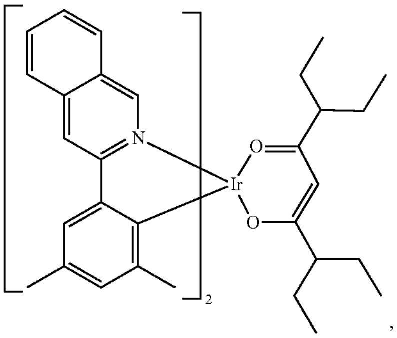
,
-continued
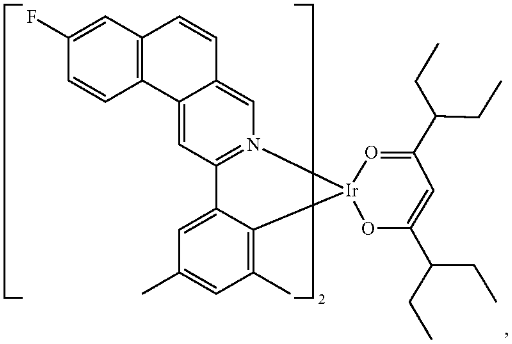
,
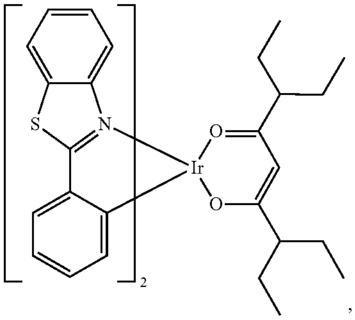
,
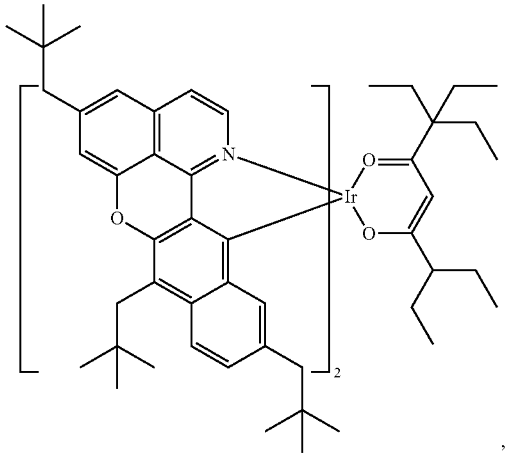
,
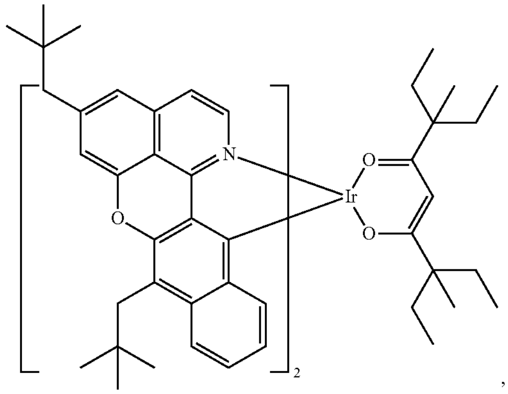
, -continued
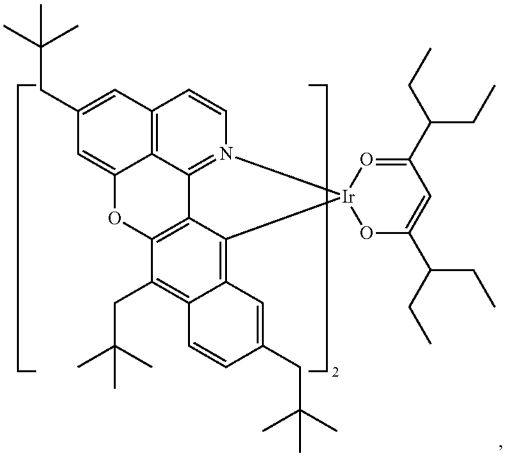
,
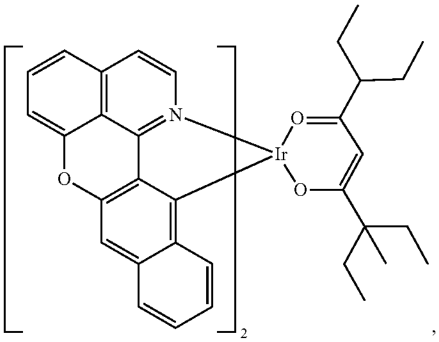
,
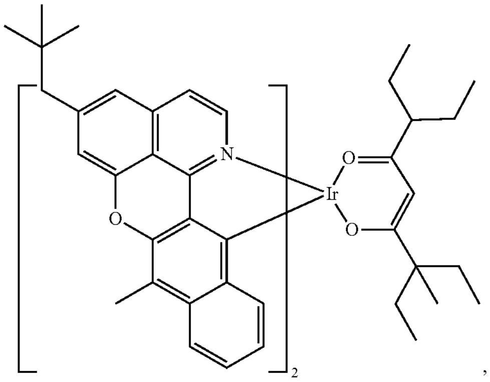
,
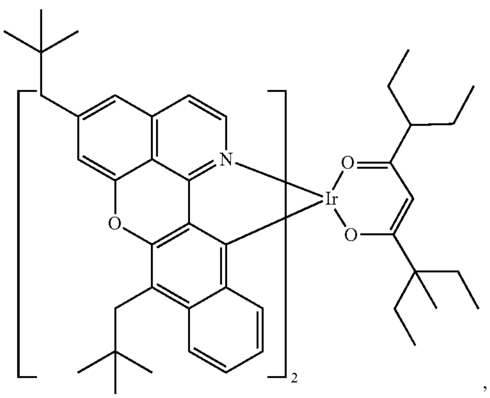
,
-continued
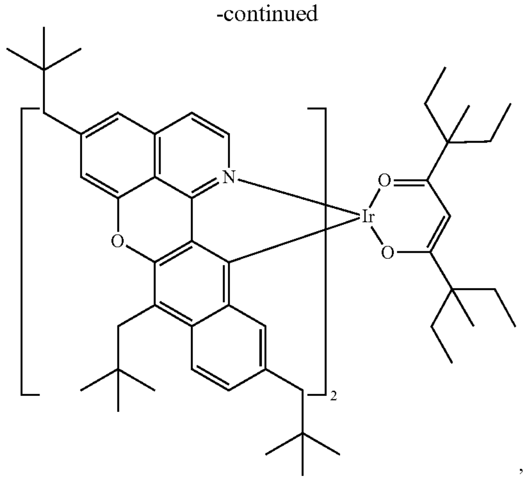
,
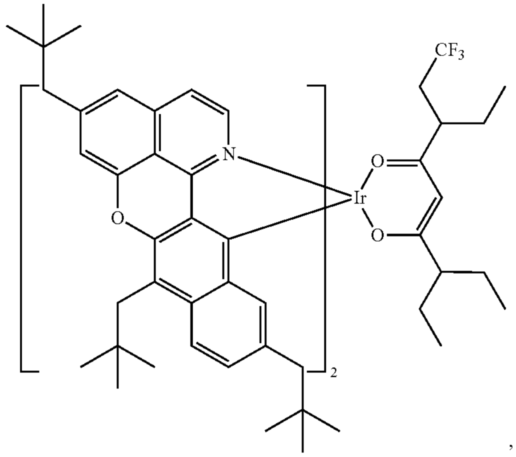
,
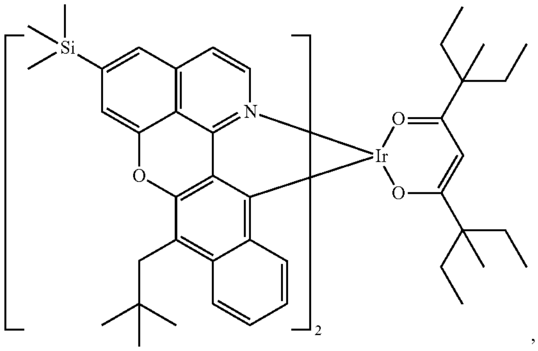
,
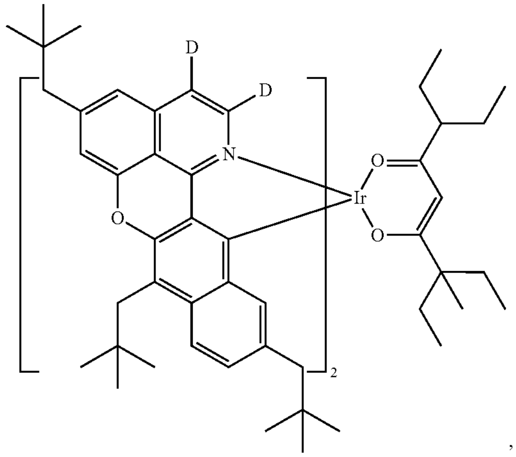
, -continued
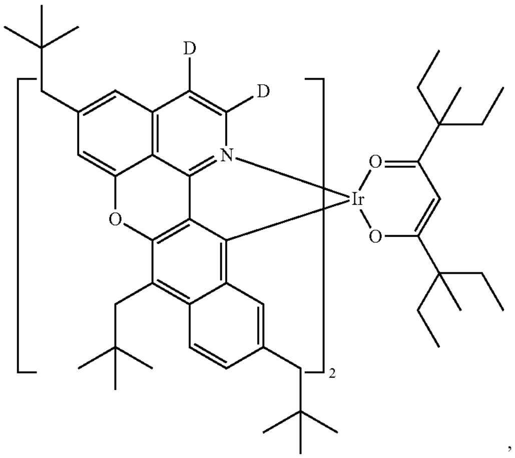
,
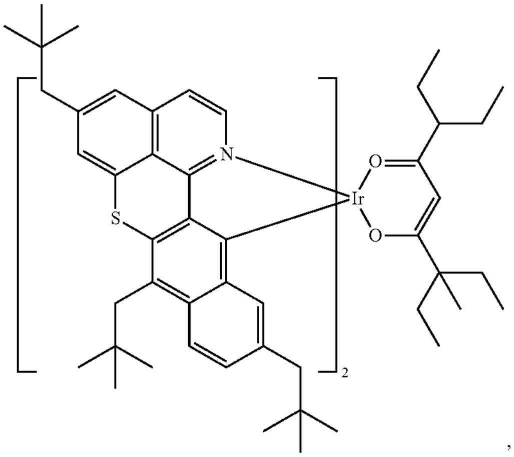
,
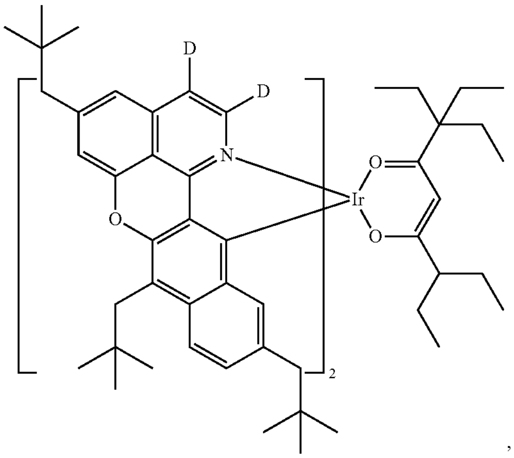
,
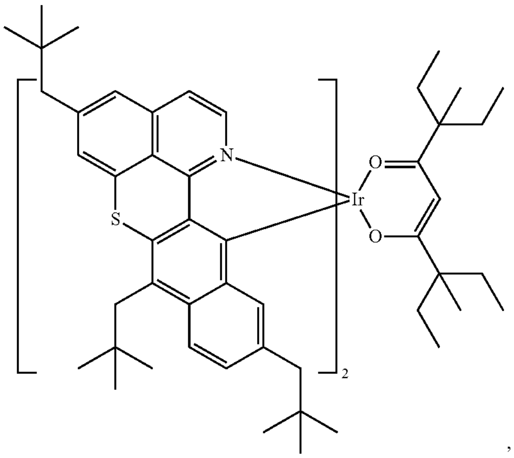
,
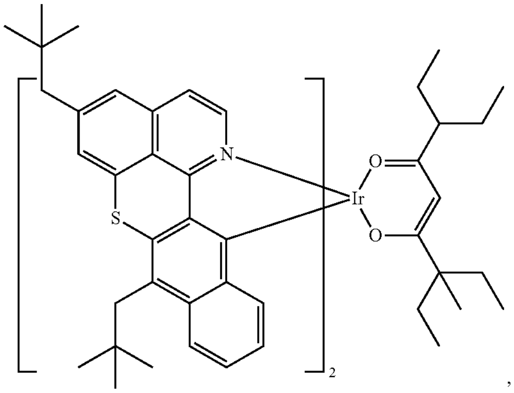
,
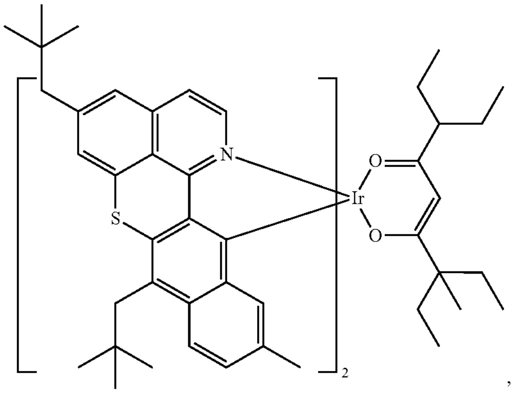
,
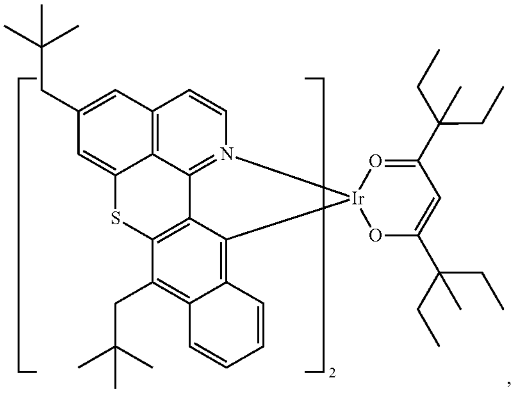
,
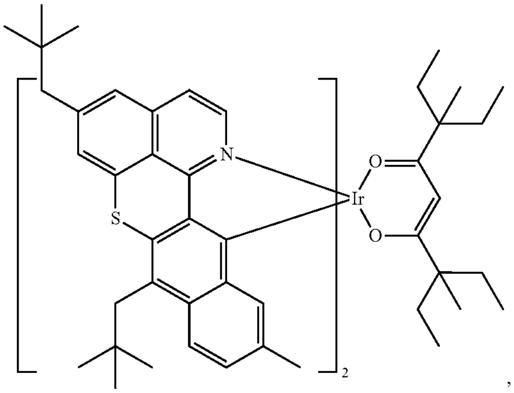
, -continued
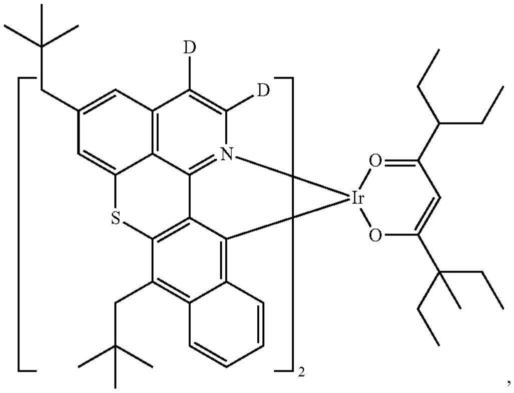
,
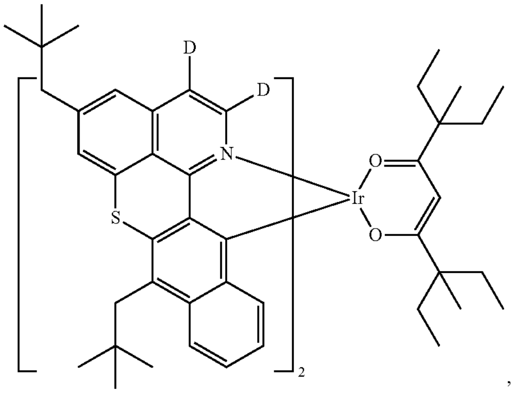
,
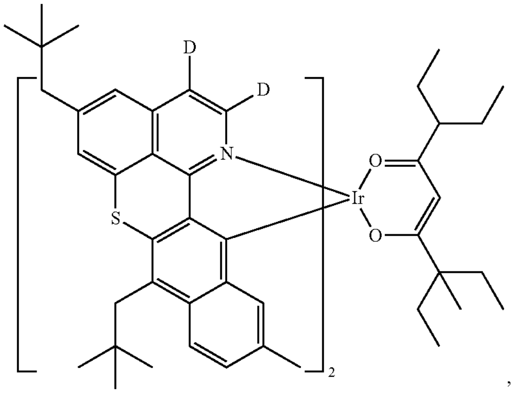
,
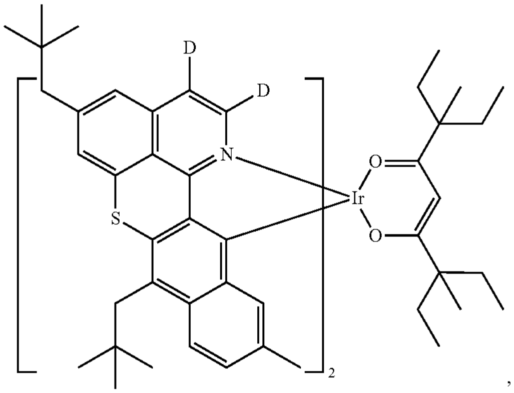
,
-continued
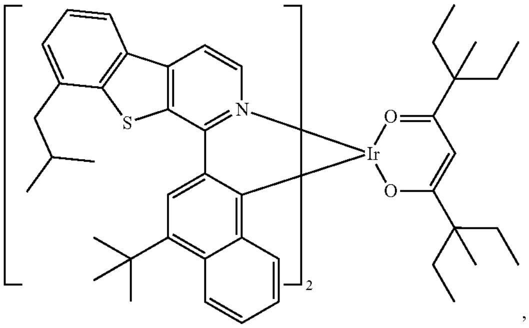
,
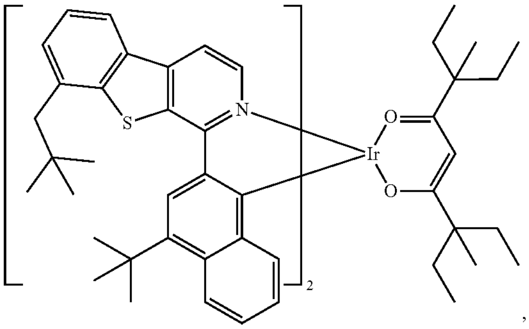
,
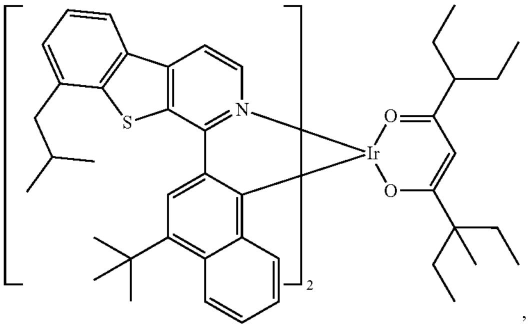
,
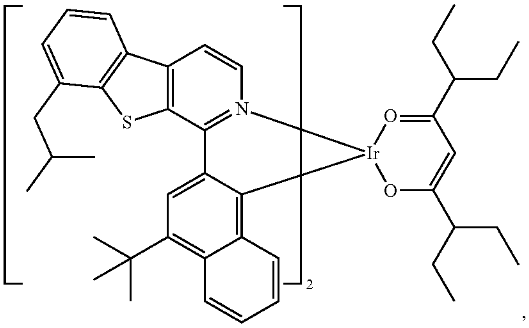
,
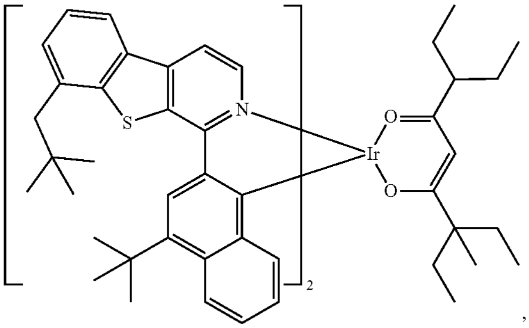
, -continued
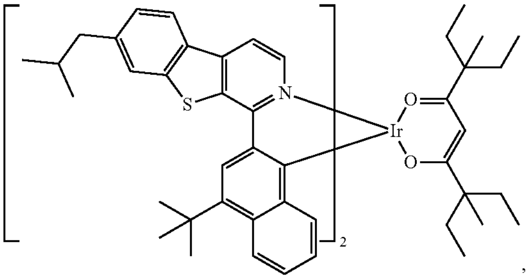
,
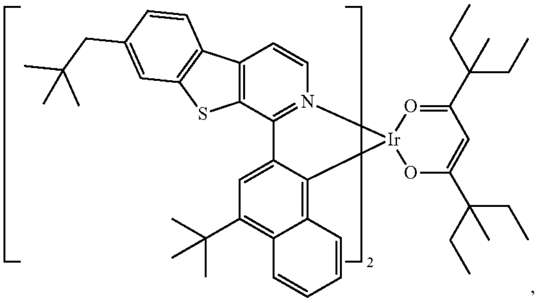
,
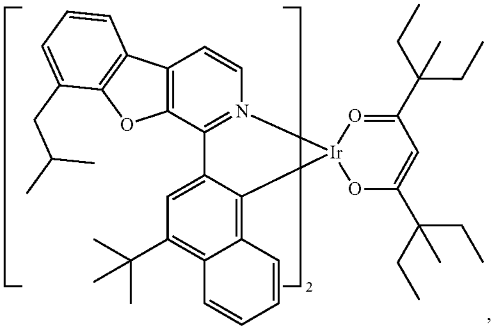
,
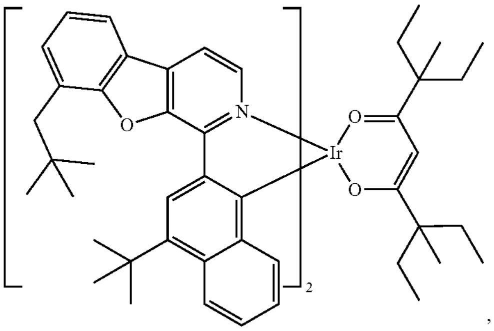
,
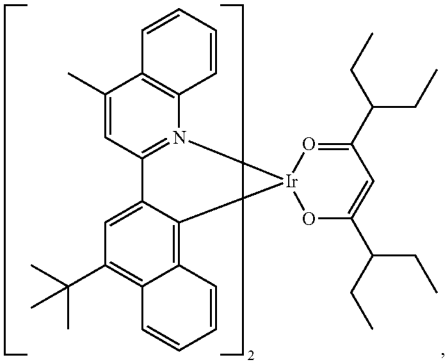
,
-continued
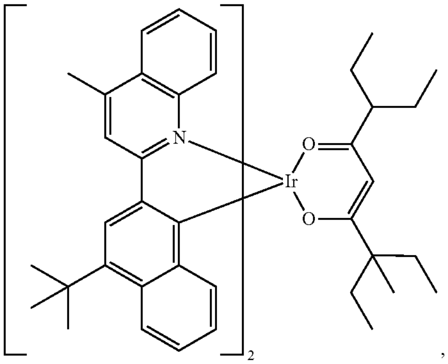
,
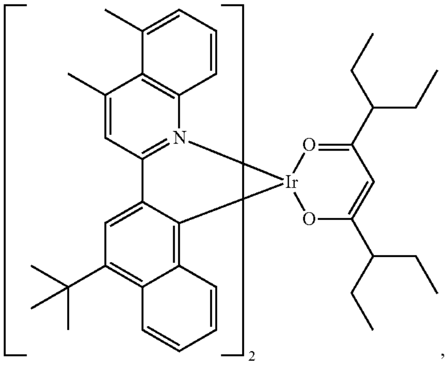
,
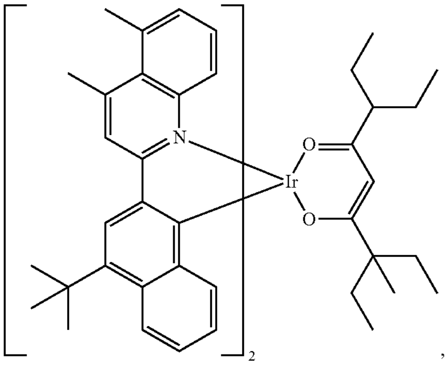
,
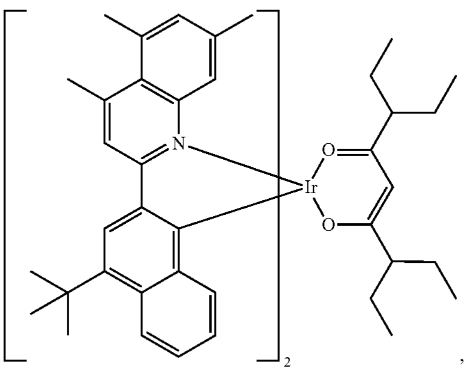
, -continued
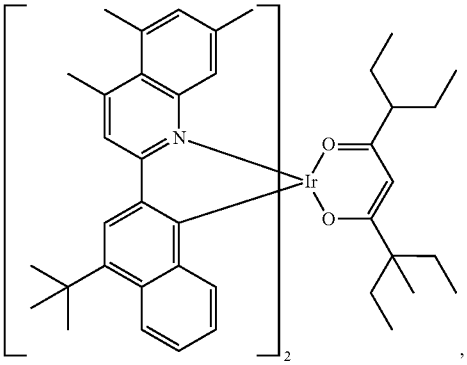
,
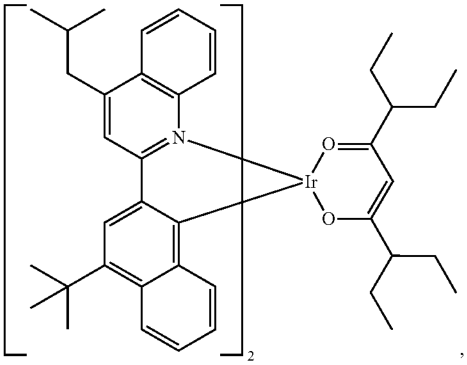
,
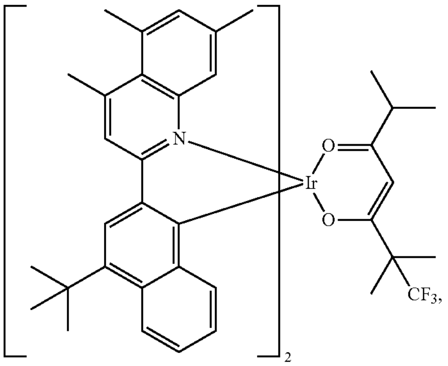
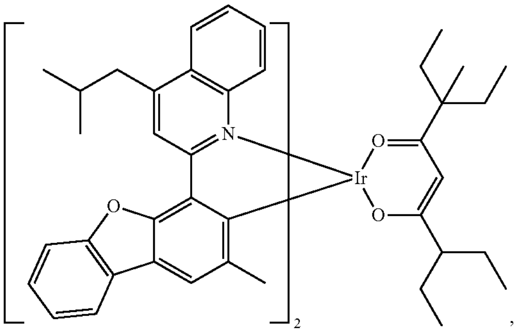
,
-continued
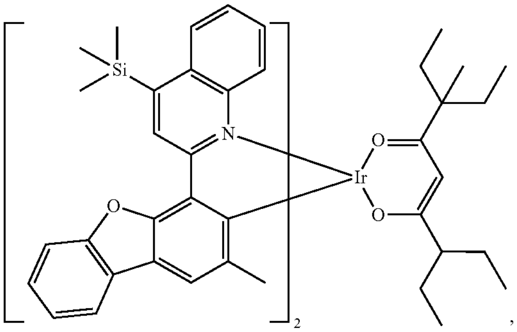
,
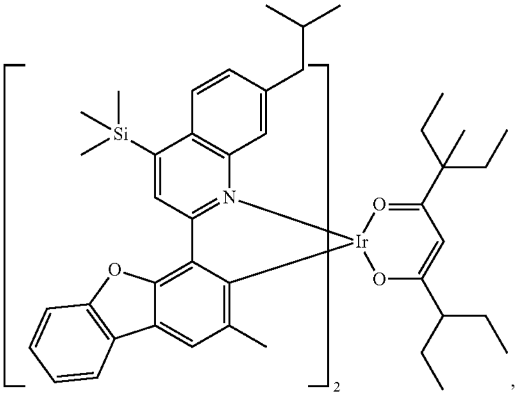
,
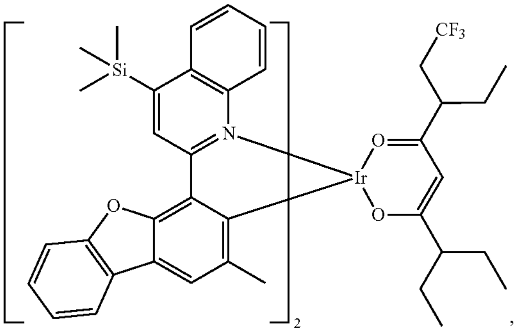
,
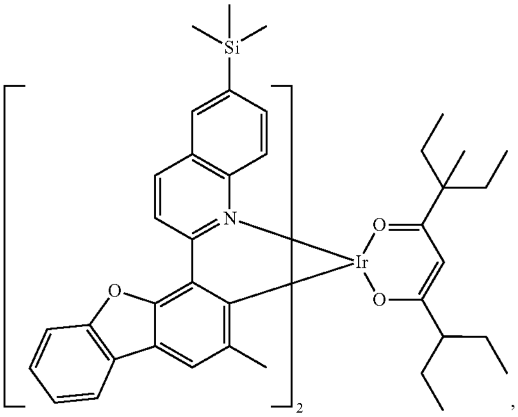
, -continued

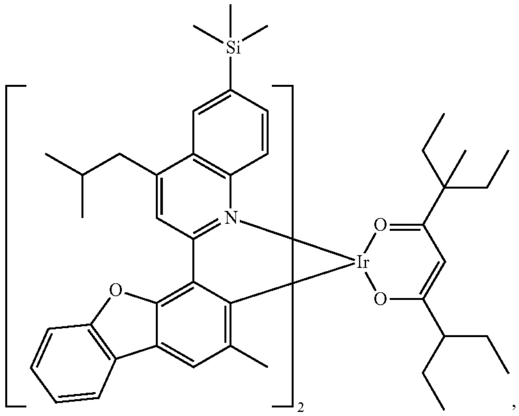

,

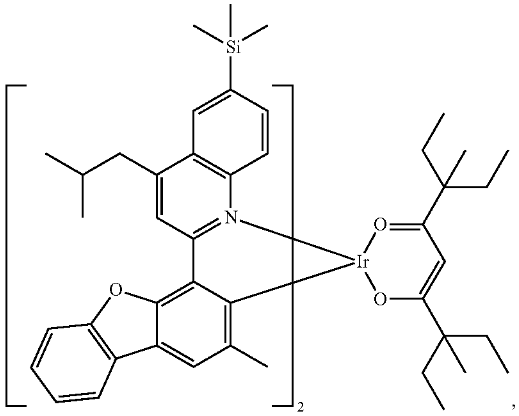

,

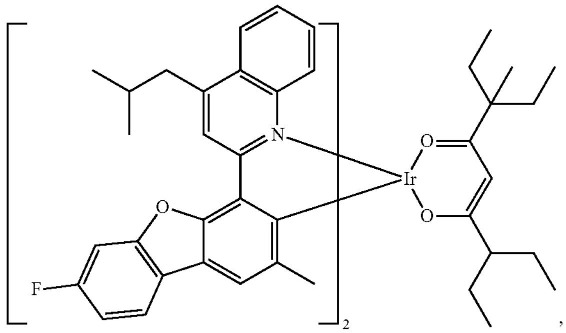

,

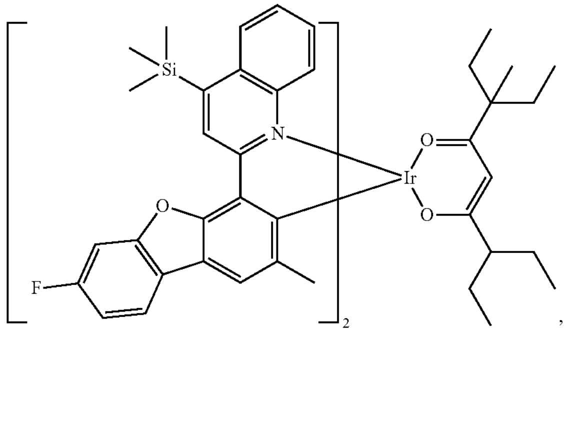

,

-continued

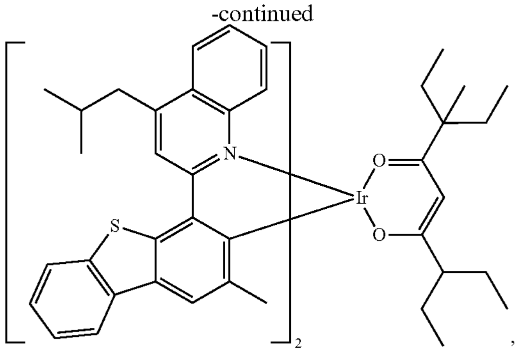

,

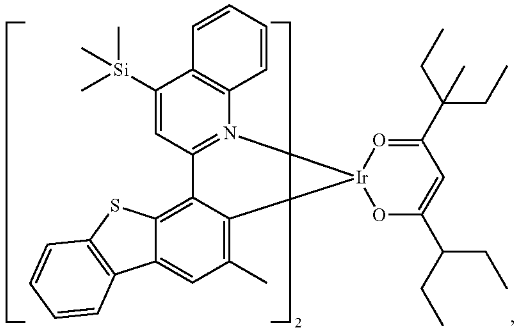

,

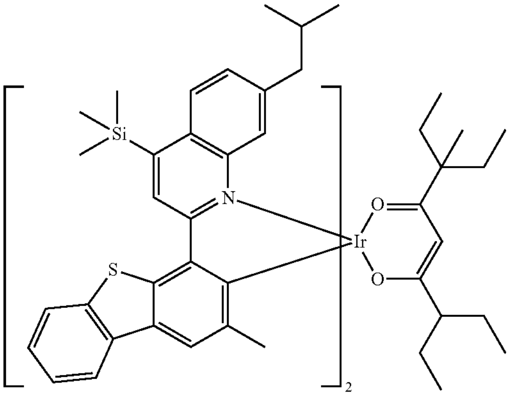

and

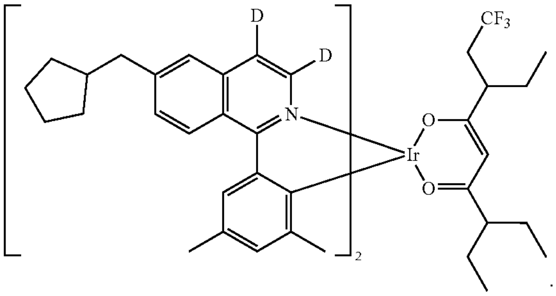

.

According to an embodiment of the present disclosure, a compound composition is further disclosed, which includes a first compound and a second compound, and the specific structures of the first compound and the second compound are shown in any of the preceding embodiments.

Combination with Other Materials

The materials described in the present disclosure for a particular layer in an organic light-emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light-emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

Methods for preparing the first compound and the second compound adopted herein are not limited to the present disclosure. The persons skilled in the art can prepare the first compound and the second compound by conventional synthesis methods or can easily prepare the first compound and the second compound with reference to Patent Application No. CN202010505906.4. The preparation methods are not repeated herein. The method for preparing the organic electroluminescent device is not limited herein, and the preparation methods in the following device examples are illustrative and should not be construed as limitations. The persons skilled in the art can make reasonable improvements on the preparation methods in the following device examples based on the related art. For example, the ratio of the first compound to the second compound is not particularly limited, and the persons skilled in the art can reasonably select the ratio of the first compound to the second compound within a certain range according to the related art. For example, based on the total weight of the emissive layer material, the total weight of the first compound and the second compound accounts for 99.5% to 80.0% of the total weight of the emissive layer, and the weight ratio of the first compound to the second compound is between 1:99 and 99:1; or the weight ratio of the first compound to the second compound is between 20:80 and 99:1; or the weight ratio of the first compound to the second compound is between 50:50 and 90:10. In the examples of the device, the characteristics of the device were tested using conventional equipment in the art (including, but not limited to, an evaporator produced by ANGSTROM ENGINEERING, an optical testing system produced by SUZHOU FATAR, a lifetime testing system produced by SUZHOU FATAR, an ellipsometer produced by BEIJING ELLITOP, etc.) by methods well-known to the persons skilled in the art. As the persons skilled in the art are aware of the use of the above-mentioned equipment, test methods and other related contents, the inherent data of the sample can be obtained with certainty and without influence, so the above related contents are not further described in this patent.

Device Example 1

First, a glass substrate having an indium tin oxide (ITO) anode with a thickness of 120 nm was cleaned and then treated with oxygen plasma and UV ozone. After the treatment, the substrate was dried in a nitrogen-filled glovebox to remove moisture and then mounted on a substrate holder and placed in a vacuum chamber. Organic layers specified below were sequentially deposited through vacuum thermal evaporation on the ITO anode at a rate of 0.01 to 5 Å/s and a vacuum degree of about $10^{-8}$ torr. Compound HI was used as a hole injection layer (HIL) with a thickness of 100 Å. Compound HT was used as a hole transport layer (HTL) with a thickness of 400 Å. Compound EB was used as an electron blocking layer (EBL) with a thickness of 50 Å. Then, Compound 1-333 as a first host, Compound 2-4 as a second host and Compound RD1 as a dopant were co-deposited as an emissive layer (EML) (Compound 1-333: Compound 2-4: Compound RD1=77.6:19.4:3, weight ratio) with a thickness of 400 Å. Compound HB was used as a hole blocking layer (HBL) with a thickness of 50 Å. On the hole blocking layer, Compound ET and 8-hydroxyquinolinolato-lithium (Liq) were co-deposited as an electron transport layer (ETL) with a thickness of 350 Å. Finally, 8-hydroxyquinolinolato-lithium (Liq) with a thickness of 10 Å was deposited as an electron injection layer (EIL), and aluminum with a thickness of 1200 Å was deposited as a cathode. The device was transferred back to the glovebox and encapsulated with a glass lid to complete the device.

Device Example 2

The implementation mode in Device Example 2 was the same as that in Device Example 1, except that Compound RD1 was replaced with Compound RD2 as the dopant in the emissive layer (EML) and the weight ratio of Compound 1-333, Compound 2-4 and Compound RD2 was adjusted to 88.2:9.8:2.

Device Example 3

The implementation mode in Device Example 3 was the same as that in Device Example 2, except that Compound 2-4 was replaced with Compound 2-1 as the second host in the emissive layer (EML).

Device Comparative Example 1

The implementation mode in Device Comparative Example 1 was the same as that in Device Example 1, except that Compound 1-333 and Compound 2-4 were replaced with Compound 1-333 as the host in the emissive layer (EML) and the weight ratio of Compound 1-333 and Compound RD1 was adjusted to 97:3.

Device Comparative Example 2

The implementation mode in Device Comparative Example 2 was the same as that in Device Comparative Example 1, except that Compound RD1 was replaced with Compound RD2 as the dopant in the emissive layer (EML) and the weight ratio of Compound 1-333 and Compound RD2 was adjusted to 98:2.

Detailed structures and thicknesses of layers of the devices are shown in Table 1. A layer using more than one material is obtained by doping different compounds at a weight ratio as recorded.

TABLE 1

Part of device structures in Device Examples 1 to 3 and Device Comparative Examples 1 to 2

| Device ID | HIL | HTL | EBL | EML | HBL | ETL |
|---|---|---|---|---|---|---|
| Example 1 | Compound HI (100 Å) | Compound HT (400 Å) | Compound EB (50 Å) | Compound 1-333:Compound 2-4:Compound RD1 (77.6:19.4:3) (400 Å) | Compound HB (50 Å) | Compound ET:Liq (40:60) (350 Å) |

TABLE 1-continued

Part of device structures in Device Examples 1 to 3 and Device Comparative Examples 1 to 2

| Device ID | HIL | HTL | EBL | EML | HBL | ETL |
|---|---|---|---|---|---|---|
| Example 2 | Compound HI (100 Å) | Compound HT (400 Å) | Compound EB (50 Å) | Compound 1-333:Compound 2-4:Compound RD2 (88.2:9.8:2) (400 Å) | Compound HB (50 Å) | Compound ET:Liq (40:60) (350 Å) |
| Example 3 | Compound HI (100 Å) | Compound HT (400 Å) | Compound EB (50 Å) | Compound 1-333:Compound 2-1:Compound RD2 (88.2:9.8:2) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound 1-333:Compound RD1 (97:3) (400 Å) | Compound HB (50 Å) | Compound ET:Liq (40:60) (350 Å) |
| Comparative Example 2 | Compound HI (100 Å) | Compound HT (400 Å) | Compound EB (50 Å) | Compound 1-333:Compound RD2 (98:2) (400 Å) | Compound HB (50 Å) | Compound ET:Liq (40:60) (350 Å) |

The structures of the materials used in the devices are shown as follows:

Compound HI

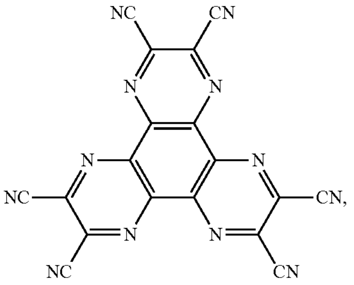

Compound HT

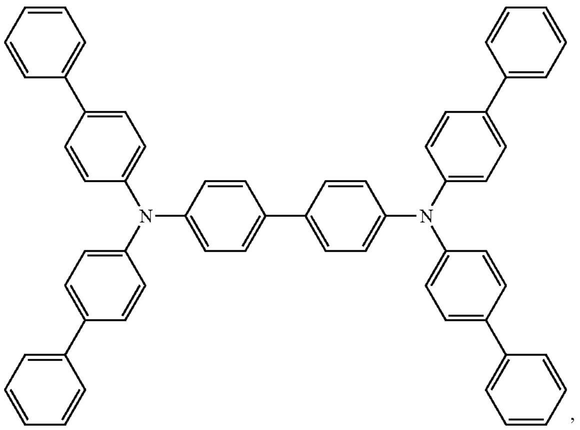

-continued

Compound EB

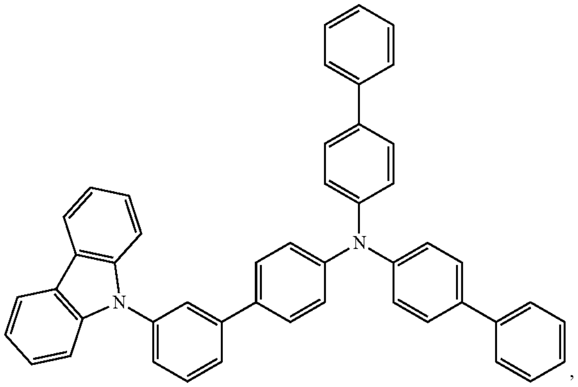

Compound RD1

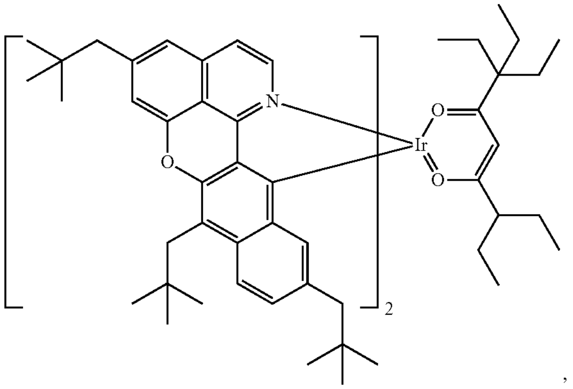

-continued

Compound RD2

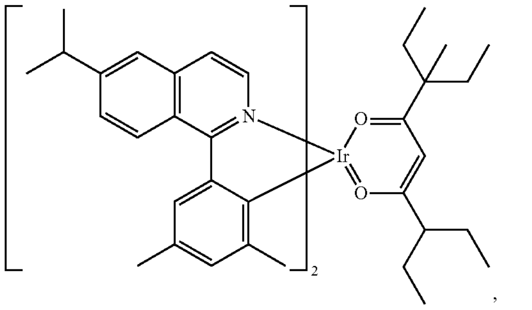

,

Compound HB

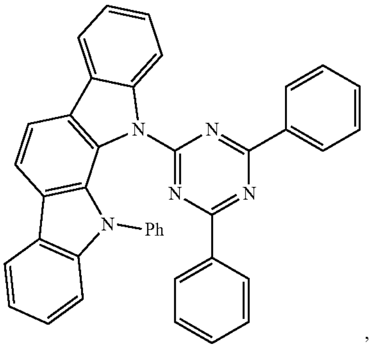

,

Compound ET

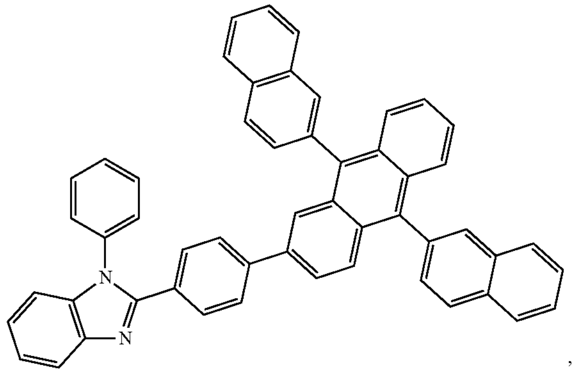

,

Liq

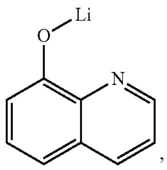

, 1-333

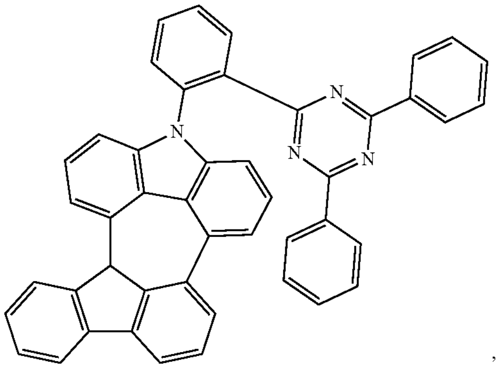

,

-continued 2-1

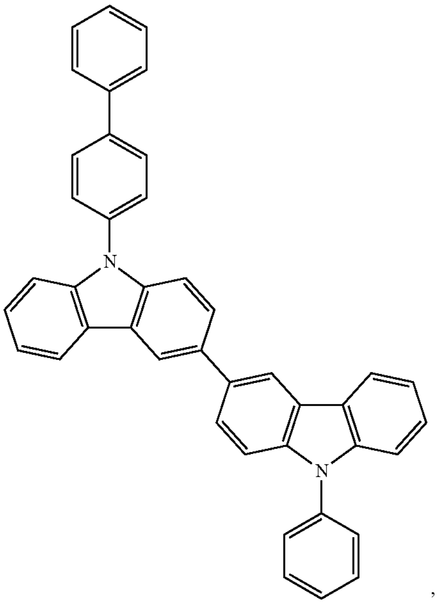

, and 2-4

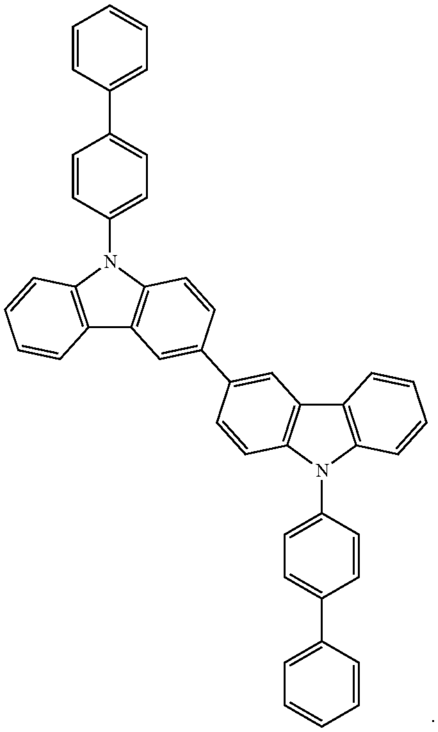

.

The maximum emissive wavelength ($\lambda_{max}$), drive voltage (Voltage), current efficiency (CE) and external quantum efficiency (EQE) of devices of Device Example 1 and Device Comparative Example 1 were measured at a constant current of 15 mA/cm$^2$; the device lifetime (LT97) data was measured at a constant current of 80 mA/cm$^2$, wherein the LT97 is the time for the brightness of the device to decay to 97% of the initial brightness. These data was recorded and shown in Table 2.

TABLE 2

| Device data of Example 1 and Comparative Example 1 | | | | | |
|---|---|---|---|---|---|
| Device ID | $\lambda_{max}$ (nm) | Voltage [V] | CE [cd/A] | EQE [%] | LT97 [h] |
| Example 1 | 621 | 3.6 | 24.6 | 22.9 | 246 |
| Comparative Example 1 | 621 | 3.6 | 23.9 | 21.7 | 217 |

Discussion:

As can be seen from the data in Table 2, the maximum emission wavelengths and the drive voltages of devices of Example 1 and Comparative Example 1 were consistent; the current efficiency of the device of Example 1 was 0.7 [cd/A] higher than that of Comparative Example 1; the external quantum efficiency of the device of Example 1 was 1.2% higher than that of Comparative Example 1; in terms of the lifetime, the lifetime of the device of Example 1 was 29 hours longer than that of Comparative Example 1, with an increase of 13.4%. In a case wherein the device data in Comparative Example 1 was already very high, when the electroluminescent device including the compound composition provided by the present disclosure was adopted, the device performance can be further improved, which was rare, and more importantly, the lifetime can be greatly improved. As can be seen from the above data, in a case wherein the drive voltage and the maximum emission wavelength are consistent, the electroluminescent device including the first compound and the second compound of the present disclosure significantly improves the device performance compared with the device using the first compound alone and obtains a longer device lifetime, higher current efficiency and higher external quantum efficiency. It shows that when the first compound and the second compound are used in combination, the comprehensive performance of the device can be significantly improved.

Under the same test conditions, the device of Example 2 had a maximum emission wavelength of 626 nm and a device lifetime LT97 of 90 hours at a constant current of 80 mA/cm$^2$, the device of Example 3 had a maximum emission wavelength of 624 nm and a device lifetime LT97 of 175 hours at a constant current of 80 mA/cm$^2$, and the device of Comparative Example 2 had a maximum emission wavelength of 626 nm and a device lifetime LT97 of 77 hours at a constant current of 80 mA/cm$^2$. It can be seen that the maximum emission wavelength in Examples and Comparative Examples was substantially consistent; in terms of the lifetime, the lifetime of the device of Example 2 was 13 hours longer than that of Comparative Example 2, with an increase of 17%; the lifetime of the device of Example 3 was 98 hours longer than that of Comparative Example 2, with an increase of 1.27 times. As can be seen from the above data, the electroluminescent device including the first compound and the second compound of the present disclosure has a longer device lifetime and significantly improves the device performance.

Device Example 4

First, a glass substrate having an indium tin oxide (ITO) anode having a thickness of 120 nm was cleaned and then treated with UV ozone and oxygen plasma. After the treatment, the substrate was dried in a nitrogen-filled glovebox to remove moisture and then mounted on a substrate holder and placed in a vacuum chamber. Organic layers specified below were sequentially deposited through vacuum thermal evaporation on the ITO anode at a rate of 0.01 to 5 Å/s and a vacuum degree of about $10^{-8}$ torr. Compound HT and Compound HI-2 were co-deposited as a hole injection layer (HIL) (Compound HT:Compound HI-2=97:3, weight ratio) with a thickness of 100 Å. Compound HT was used as a hole transport layer (HTL) with a thickness of 400 Å. Compound EB was used as an electron blocking layer (EBL) with a thickness of 50 Å. Then, Compound 1-333 as a first host, Compound 2-170 as a second host and Compound RD3 as a dopant were co-deposited as an emissive layer (EML) (Compound 1-333: Compound 2-170: Compound RD3=88.2:9.8:2, weight ratio) with a thickness of 400 Å. Compound HB was used as a hole blocking layer (HBL) with a thickness of 50 Å. On the hole blocking layer, Compound ET and 8-hydroxyquinolinolato-lithium (Liq) were co-deposited as an electron transport layer (ETL) (Compound ET:Liq=40:60, weight ratio) with a thickness of 350 Å. Finally, 8-hydroxyquinolinolato-lithium (Liq) with a thickness of 10 Å was deposited as an electron injection layer (EIL), and aluminum with a thickness of 1200 Å was deposited as a cathode. The device was transferred back to the glovebox and encapsulated with a glass lid to complete the device.

Device Example 5

The implementation mode in Device Example 5 was the same as that in Device Example 4, except that Compound 2-170 was replaced with Compound 2-171 as the second host in the emissive layer (EML) and the weight ratio of Compound 1-333, Compound 2-171 and Compound RD3 was adjusted to 78.4:19.6:2.

Device Example 6

The implementation mode in Device Example 6 was the same as that in Device Example 4, except that Compound 2-170 was replaced with Compound 2-143 as the second host in the emissive layer (EML).

Device Example 7

The implementation mode in Device Example 7 was the same as that in Device Example 4, except that Compound 2-170 was replaced with Compound 2-136 as the second host in the emissive layer (EML).

Device Comparative Example 3

The implementation mode in Device Comparative Example 3 was the same as that in Device Example 4, except that Compound 1-333 and Compound 2-170 were replaced with Compound 1-333 as the host in the emissive layer (EML) and the weight ratio of Compound 1-333 and Compound RD3 was adjusted to 98:2.

Detailed structures and thicknesses of layers of the devices are shown in Table 3. A layer using more than one material is obtained by doping different compounds at a weight ratio as recorded.

TABLE 3

| Part of device structures in Device Examples 4 to 7 and Device Comparative Example 3 | | | | | | |
|---|---|---|---|---|---|---|
| Device ID | HIL | HTL | EBL | EML | HBL | ETL |
| Example 4 | Compound HT:Compound HI-2 (97:3) (100 Å) | Compound HT (400 Å) | Compound EB (50 Å) | Compound 1-333:Compound 2-170:Compound RD3 (88.2:9.8:2) (400 Å) | Compound HB (50 Å) | Compound ET:Liq (40:60) (350 Å) |

TABLE 3-continued

Part of device structures in Device Examples 4 to 7 and Device Comparative Example 3

| Device ID | HIL | HTL | EBL | EML | HBL | ETL |
|---|---|---|---|---|---|---|
| Example 5 | Compound HT:Compound HI-2 (97:3) (100 Å) | Compound HT (400 Å) | Compound EB (50 Å) | Compound 1-333:Compound 2-171:Compound RD3 (78.4:19.6:2) (400 Å) | Compound HB (50 Å) | Compound ET:Liq (40:60) (350 Å) |
| Example 6 | Compound HT:Compound HI-2 (97:3) (100 Å) | Compound HT (400 Å) | Compound EB (50 Å) | Compound 1-333:Compound 2-143:Compound RD3 (88.2:9.8:2) (400 Å) | Compound HB (50 Å) | Compound ET:Liq (40:60) (350 Å) |
| Example 7 | Compound HT:Compound HI-2 (97:3) (100 Å) | Compound HT (400 Å) | Compound EB (50 Å) | Compound 1-333:Compound 2-136:Compound RD3 (88.2:9.8:2) (400 Å) | Compound HB (50 Å) | Compound ET:Liq (40:60) (350 Å) |
| Comparative Example 3 | Compound HT:Compound HI-2 (97:3) (100 Å) | Compound HT (400 Å) | Compound EB (50 Å) | Compound 1-333:Compound RD3 (98:2) (400 Å) | Compound HB (50 Å) | Compound ET:Liq (40:60) (350 Å) |

Structures of the new materials used in the device are as follows:

Compound HI-2

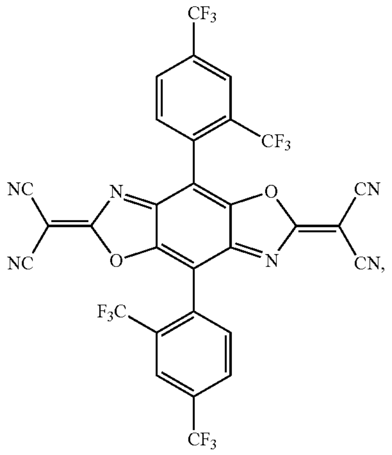

Compound RD3

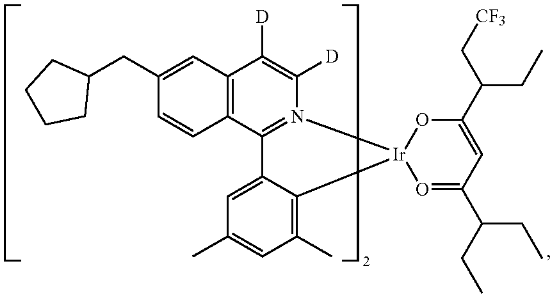

2-170

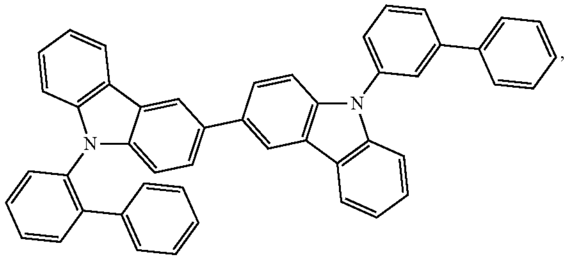

-continued 2-171

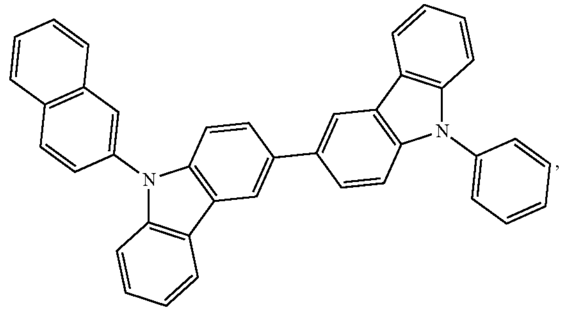

2-143

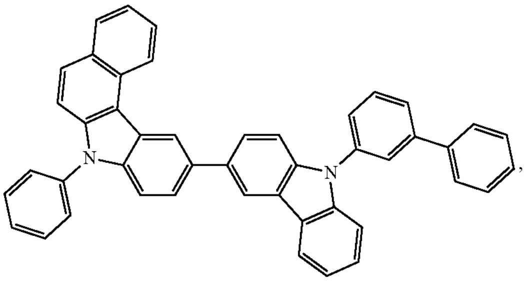

and 2-136

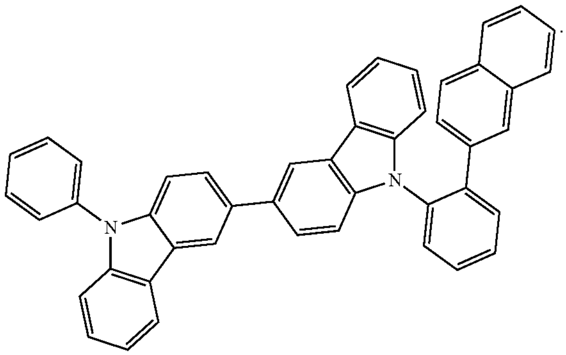

The maximum emissive wavelength ($\lambda_{max}$), current efficiency (CE) and external quantum efficiency (EQE) of devices of Device Examples 4 to 7 and Device Comparative Example 3 were measured at a constant current of 15 mA/cm$^2$; the device lifetime (LT97) data was measured at a constant current of 80 mA/cm$^2$, wherein the LT97 is the time for the brightness of the device to decay to 97% of the initial brightness. These data was recorded and shown in Table 4.

TABLE 4

Device data of Examples 4 to 7 and Comparative Example 3

| Device ID | $\lambda_{max}$ (nm) | CE [cd/A] | EQE [%] | LT97 [h] |
|---|---|---|---|---|
| Example 4 | 621 | 24.9 | 25.9 | 162 |
| Example 5 | 620 | 24.9 | 25.8 | 188 |
| Example 6 | 620 | 25.4 | 26.4 | 159 |
| Example 7 | 620 | 24.2 | 25.4 | 247 |
| Comparative Example 3 | 621 | 24.2 | 25.2 | 126 |

Discussion:

As can be seen from the data in Table 4, the maximum emission wavelengths of devices of Examples 4 to 7 and Comparative Example 3 were substantially consistent; in terms of the device efficiency, compared with the device of Comparative Example 3, the current efficiency and the EQE of devices of Examples 4 to 7 reached the same high efficiency level as that of Comparative Example 3 or were further improved, especially the current efficiency and the EQE of the device of Example 6 were further significantly improved by nearly 5% compared with the device of Comparative Example 3 whose device efficiency was already very high, which was very rare. More importantly, the device lifetimes of devices of Examples 4 to 7 were further greatly improved compared with the device of Comparative Example 3 whose lifetime was already very long, and the lifetimes of devices of Examples 4 to 7 were increased by 26% to 96%, especially the lifetime of the device of Example 7 was 121 hours longer than that of Comparative Example 3, with an increase of 96%. It can be seen that both bicarbazole containing different substituents and the second compound including fused carbazole can be used in combination with the first compound and obtain excellent device performance. As can be seen from these data, since the electroluminescent device of the present disclosure uses the first compound and the second compound in combination, the electroluminescent device of the present disclosure can significantly improve the device performance and obtain a longer device lifetime, higher current efficiency and external quantum efficiency. It shows that when the first compound and the second compound of the present disclosure are used in combination, the comprehensive performance of the device can be significantly improved.

Device Example 8

The implementation mode in Device Example 8 was the same as the implementation mode in Device Example 4, except that Compound 1-333 was replaced with Compound 1-551 as the first host in the emissive layer (EML), Compound 2-170 was replaced with Compound 2-1 as the second host and the weight ratio of Compound 1-551, Compound 2-1 and Compound RD3 was adjusted to 78.4:19.6:2.

Device Comparative Example 4

The implementation mode in Device Comparative Example 4 was the same as that in Device Comparative Example 3, except that Compound 1-333 was replaced with Compound 1-551 as the host in the emissive layer (EML).

Device Comparative Example 5

The implementation mode in Device Comparative Example 5 was the same as that in

Device Comparative Example 3, except that Compound 1-333 was replaced with Compound 2-1 as the host in the emissive layer (EML).

Detailed structures and thicknesses of layers of the devices are shown in Table 5. A layer using more than one material is obtained by doping different compounds at a weight ratio as recorded.

TABLE 5

Part of device structures in Device Example 8 and Device Comparative Example 4 to 5

| Device ID | HIL | HTL | EBL | EML | HBL | ETL |
|---|---|---|---|---|---|---|
| Example 8 | Compound HT:Compound HI-2 (97:3) (100 Å) | Compound HT (400 Å) | Compound EB (50 Å) | Compound 1-551:Compound 2-1:Compound RD3 (78.4:19.6:2) (400 Å) | Compound HB (50 Å) | Compound ET:Liq (40:60) (350 Å) |
| Example 4 | Compound HT:Compound HI-2 (97:3) (100 Å) | Compound HT (400 Å) | Compound EB (50 Å) | Compound 1-551:Compound RD3 (98:2) (400 Å) | Compound HB (50 Å) | Compound ET:Liq (40:60) (350 Å) |
| Example 5 | Compound HT:Compound HI-2 (97:3) (100 Å) | Compound HT (400 Å) | Compound EB (50 Å) | Compound 2-1:Compound RD3 (98:2) (400 Å) | Compound HB (50 Å) | Compound ET:Liq (40:60) (350 Å) |

The structure of the new material used in the device is as follows:

1-551

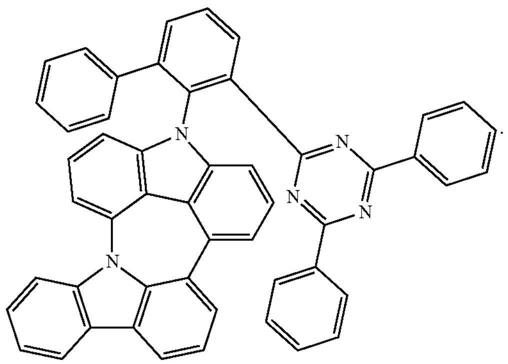

The maximum emissive wavelength ($\lambda_{max}$), drive voltage (Voltage), current efficiency (CE) and external quantum efficiency (EQE) of devices of Device Example 8 and Device Comparative Example 4 to 5 were measured at a constant current of 15 mA/cm$^2$; the device lifetime (LT97) data was measured at a constant current of 80 mA/cm$^2$, wherein the LT97 is the time for the brightness of the device to decay to 97% of the initial brightness. These data was recorded and shown in Table 6.

TABLE 6

Device data of Example 8 and Comparative Example 4 to 5

| Device ID | $\lambda_{max}$ (nm) | Voltage [V] | CE [cd/A] | EQE [%] | LT97 [h] |
|---|---|---|---|---|---|
| Example 8 | 621 | 3.4 | 23.9 | 25.3 | 154 |
| Comparative Example 4 | 623 | 3.5 | 23.3 | 25.4 | 89.9 |
| Comparative Example 5 | 618 | 5.8 | 6.1 | 5.3 | 6.5 |

Discussion:

The maximum emission wavelengths and voltage of devices of Example 8 and Comparative Example 4 were substantially consistent; in terms of the device efficiency, the EQE of the device of Example 8 can maintain the same extremely high EQE level as that of Comparative Example 4, and the current efficiency (CE) was further improved by 2.6% compared with the device of Comparative Example 4 whose current efficiency was already very high, which was very rare. More importantly, in terms of the device lifetime, the device lifetime of the device of Example 8 was significantly increased by 71.3% compared with the device of Comparative Example 4. The maximum emission wavelengths of devices of Example 8 and Comparative Example 5 were substantially consistent. More importantly, compared with Comparative Example 5, the device performance of Example 8 has been greatly improved: the voltage of Example 8 was greatly reduced by 2.4 V, the current efficiency (CE) was greatly improved by 2.9 times, and the EQE was greatly improved by 3.8 times, the device lifetime was significantly increased by 22.7 times. As can be seen from the above data, the electroluminescent device including the first compound and the second compound of the present disclosure significantly improves the device performance compared with the device using the first compound or the second compound alone and obtains a higher current efficiency, higher external quantum efficiency and longer device lifetime. It is proved again that the combination of the first compound and the second compound used by the present disclosure can significantly prolong the lifetime of the device and provide better comprehensive device performance.

To sum up, the electroluminescent device of the present disclosure greatly improves the device lifetime and has better device performance due to the combination of the first compound and the second compound used in the emissive layer, which proves that the combination of the first compound and the second compound used by the present disclosure has unique advantages and broad application prospects.

It should be understood that various embodiments described herein are merely examples and not intended to limit the scope of the present disclosure. Therefore, it is apparent to the persons skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. An electroluminescent device, comprising:

an anode, a cathode, and an organic layer disposed between the anode and the cathode, wherein the organic layer at least comprises a first compound and a second compound;

wherein the first compound has a structure of H-L-E, wherein H has a structure represented by Formula 1:

Formula 1

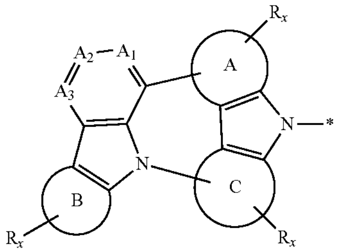

in Formula 1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 18 carbon atoms or a heterocyclic ring having 3 to 18 carbon atoms;

$R_x$ represents, at each occurrence identically or differently, mono-substitution, multiple substitutions or non-substitution;

E has a structure represented by Formula 1-a:

Formula 1-a

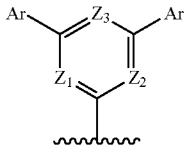

wherein in Formula 1-a, Ar is, at each occurrence identically or differently, selected from substituted or unsubstituted aryl having 6 to 30 carbon atoms, unsubstituted dibenzofuranyl, unsubstituted dibenzothienyl, unsubstituted carbazolyl, unsubstituted pyridyl, or unsubstituted pyrimidinyl; wherein when Ar is substituted aryl, it means that the aryl may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted alkylsilyl having 3 to 20 carbon atoms, unsubstituted arylsilyl group having 6 to 20 carbon atoms, unsubstituted alkylgermanyl having 3 to 20 carbon atoms, unsubstituted arylgermanyl having 6 to 20 carbon atoms, diphenylamino, unsubstituted amino having 0 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

$Z_1$ to $Z_3$ are N;

L is selected from a single bond, or substituted or unsubstituted arylene having 6 to 30 carbon atoms;

R, and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring;

the second compound has a structure represented by Formula 2:

Formula 2

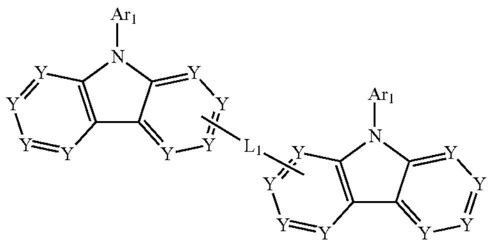

wherein,

Y is, at each occurrence identically or differently, selected from C, $CR_Y$ or N;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms or combinations thereof;

$R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino group having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_Y$ can be optionally joined to form a ring.

2. The electroluminescent device of claim 1, wherein H has a structure represented by Formula 1A:

Formula 1A

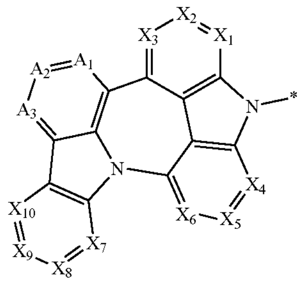

wherein $A_1$ to $A_3$ are, at each occurrence identically or differently, selected from N or CR, and $X_1$ to $X_{10}$ are, at each occurrence identically or differently, selected from N or $CR_x$;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring.

3. The electroluminescent device of claim 1, wherein at least one of R and $R_x$ is selected from deuterium, halogen, cyano, hydroxyl, sulfanyl, substituted or unsubstituted alkyl having 1 to 20 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms or combinations thereof;

adjacent substituents R and $R_x$ can be optionally joined to form a ring.

4. The electroluminescent device of claim 1, wherein H is selected from the group consisting of the following structures:

H-1

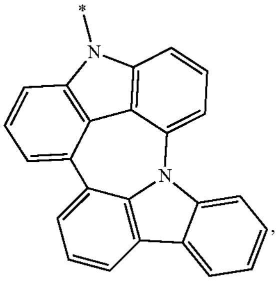

,

H-2

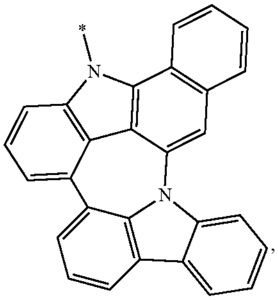

,

H-3

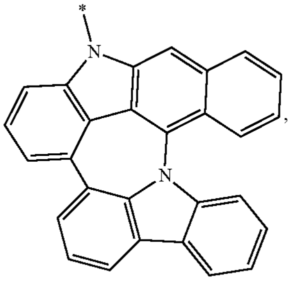

,

-continued

H-4

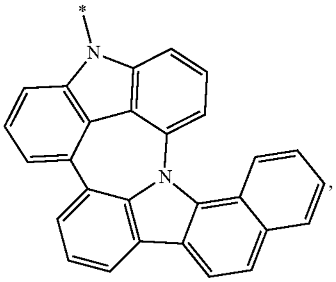

,

H-5

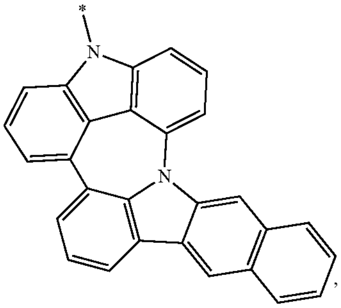

,

H-6

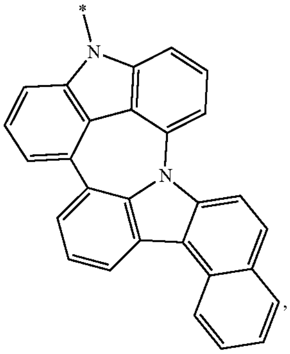

,

H-7

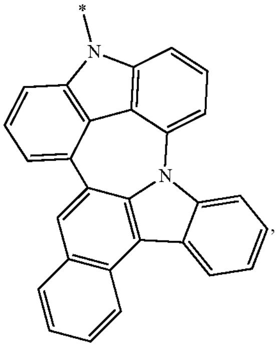

,

H-8

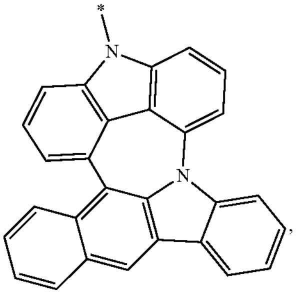

,

-continued
H-9
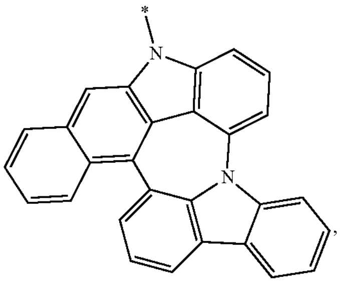
H-10
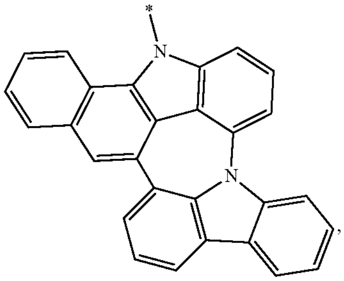
H-11
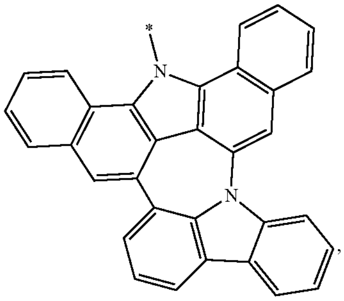
H-12
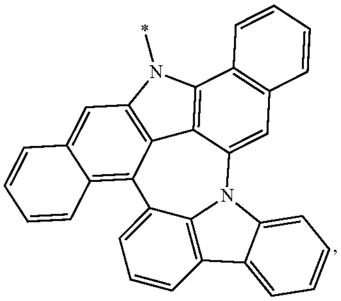
H-13
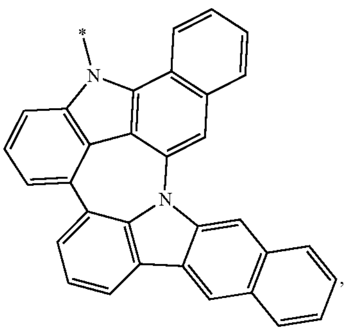
-continued
H-14
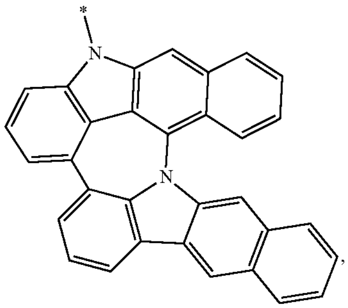
H-15
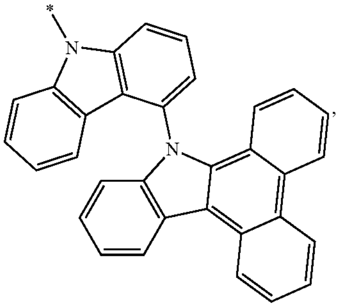
H-16
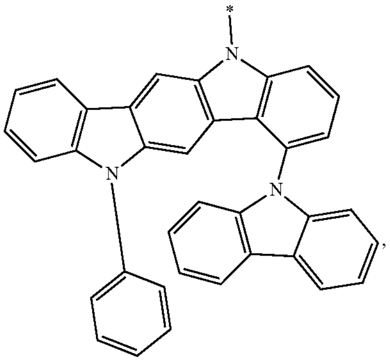
H-17
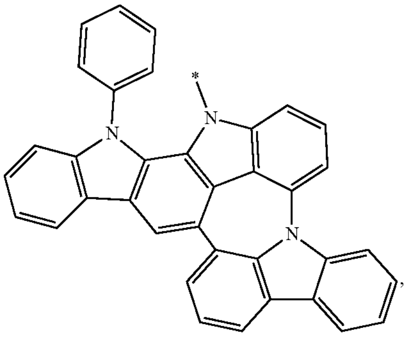
H-18
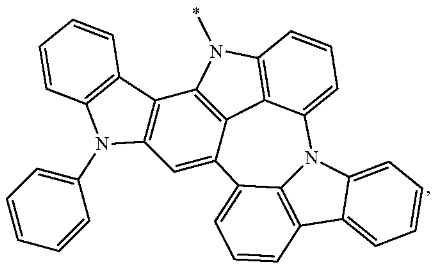

-continued
H-19
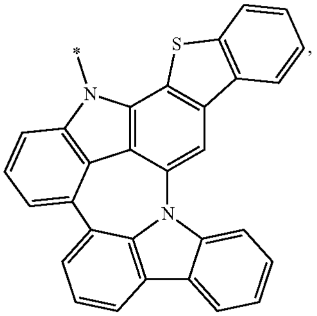
,
H-20
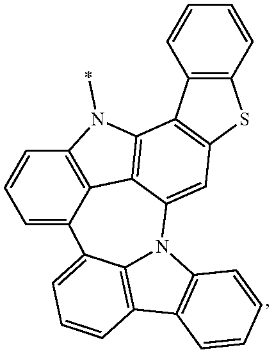
,
H-21
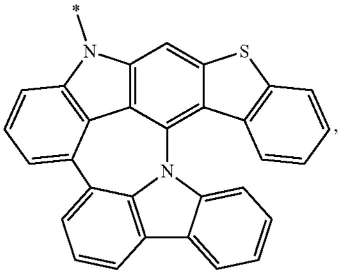
,
H-22
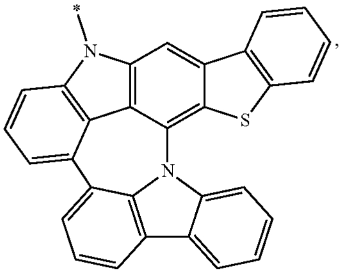
,
H-23
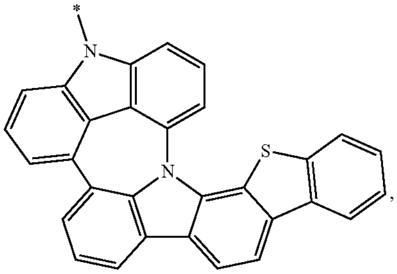
,
-continued
H-24
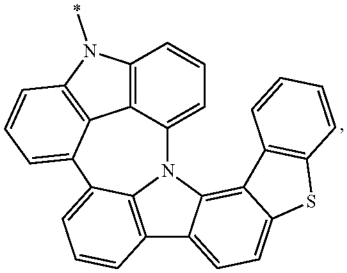
,
H-25
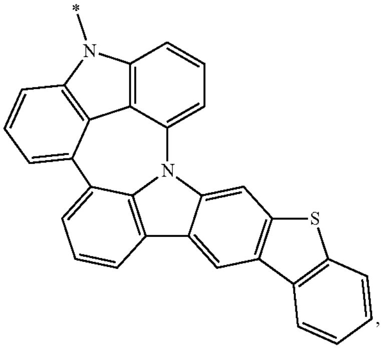
,
H-26
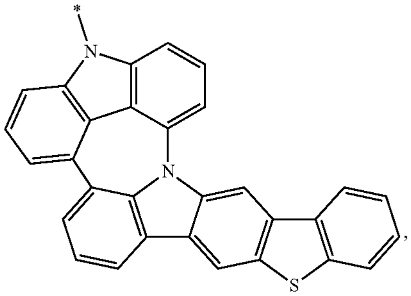
,
H-27
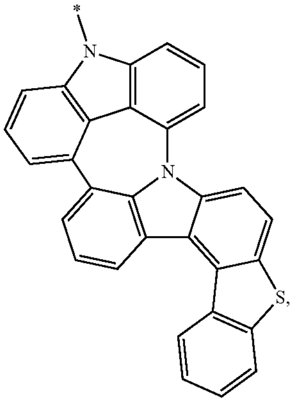
, -continued
H-28
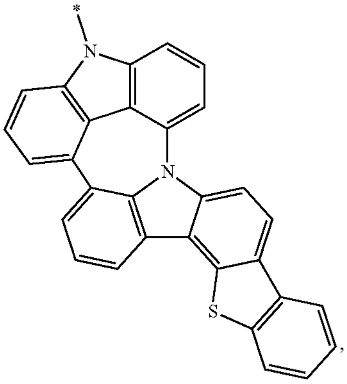
,
H-29
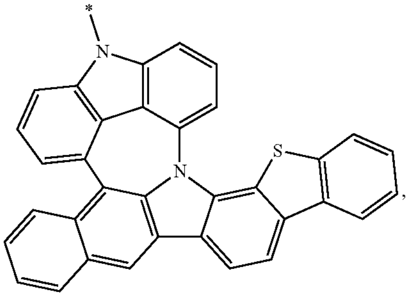
,
H-30
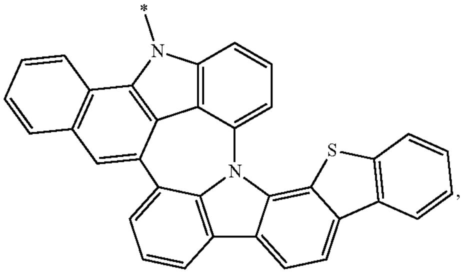
,
H-31
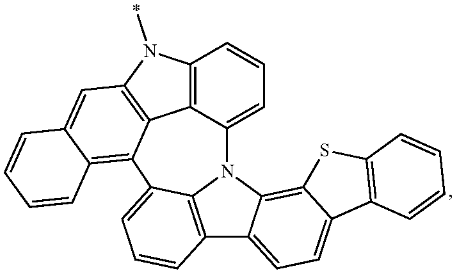
,
H-32
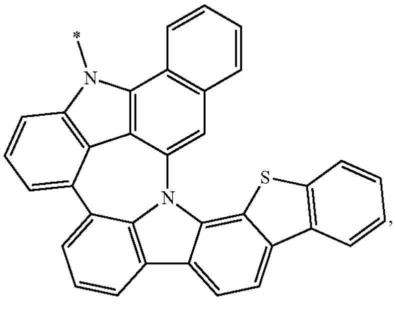
,
-continued
H-33
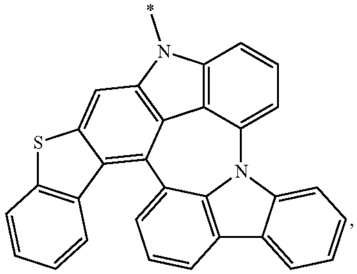
,
H-34
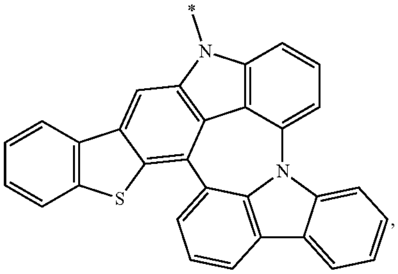
,
H-35
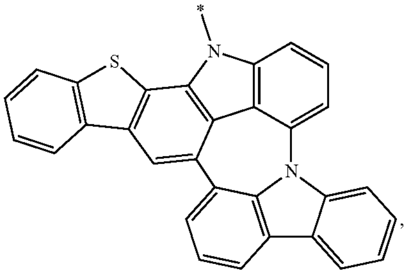
,
H-36
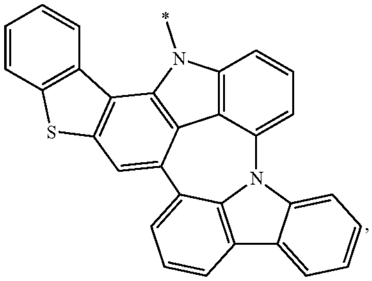
,
H-37
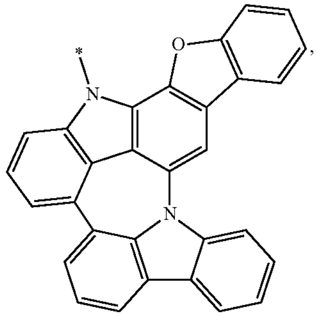
, -continued
H-38
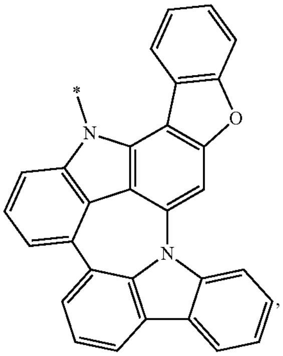
H-39
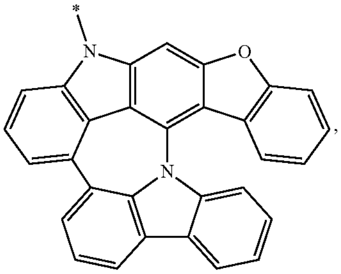
H-40
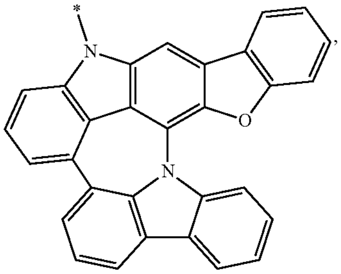
H-41
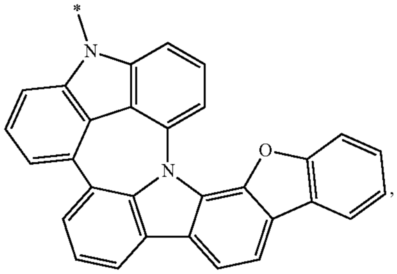
H-42
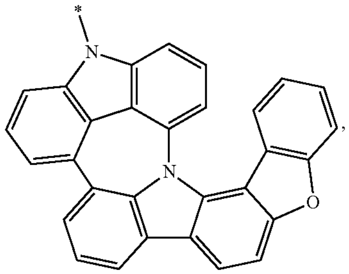
-continued
H-43
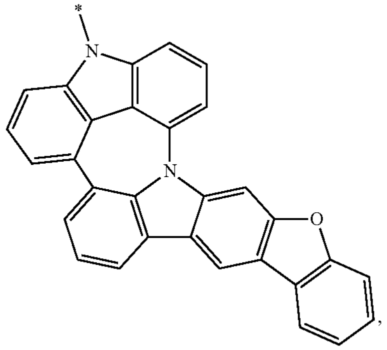
H-44
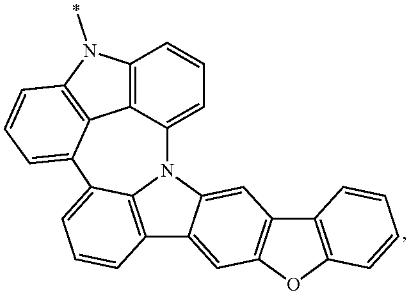
H-45
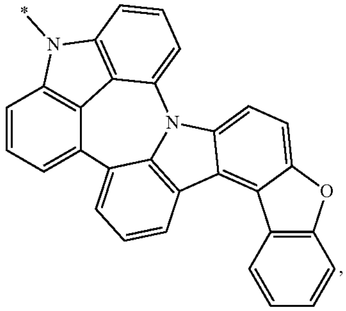
H-46
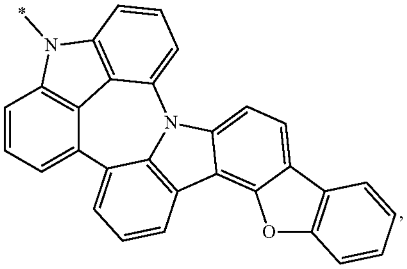
H-47
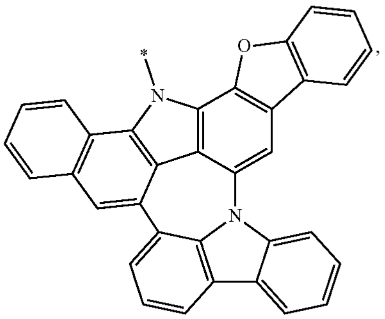

H-48
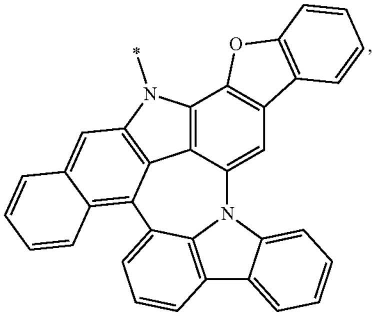
H-49
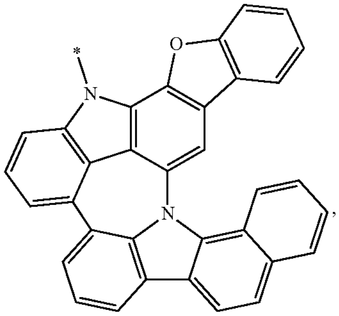
H-50
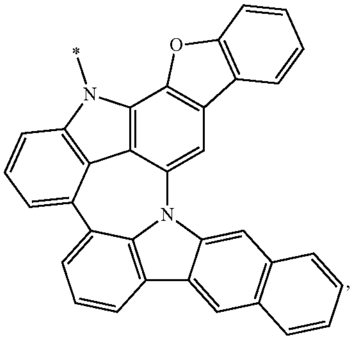
H-51
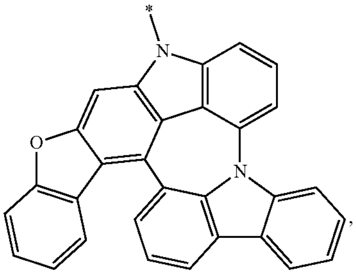
H-52
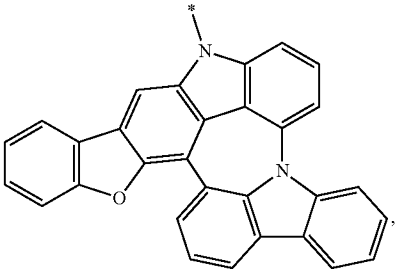
H-53
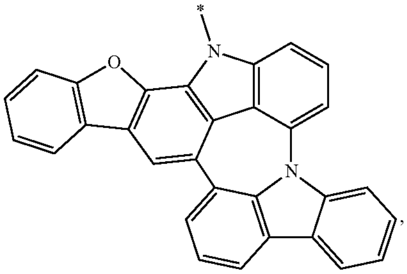
H-54
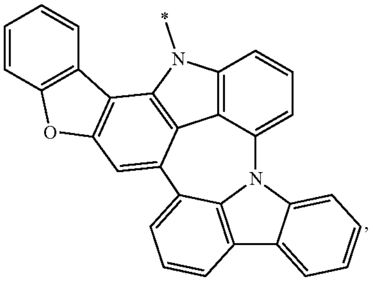
H-55
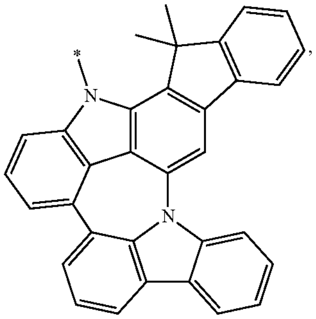
H-56
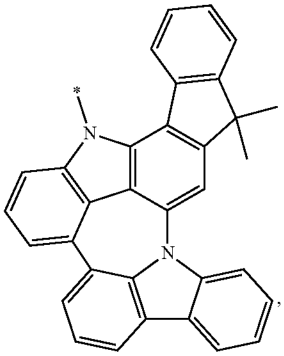
H-57
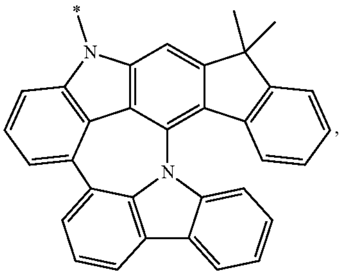

-continued
H-58
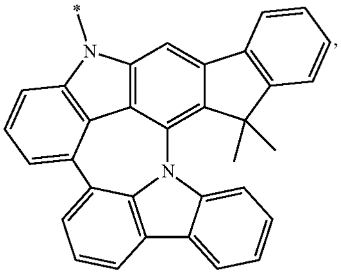
,
H-59
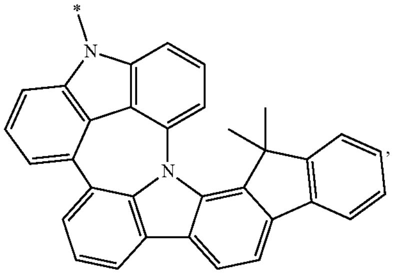
,
H-60
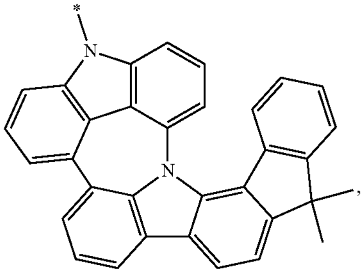
,
H-61
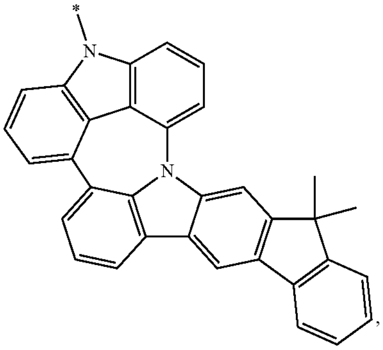
,
H-62
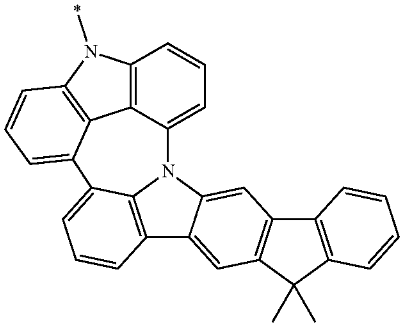
-continued
H-63
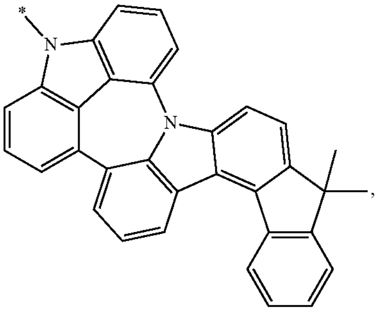
,
H-64
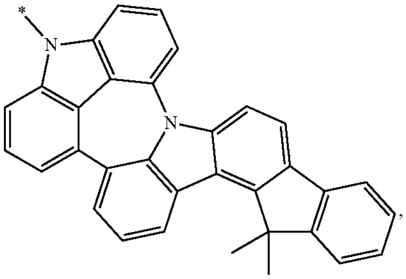
,
H-65
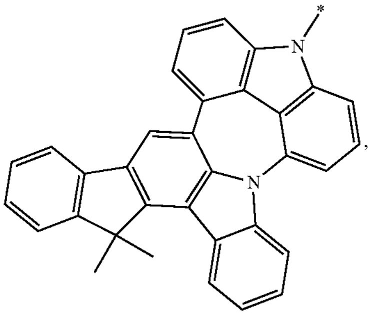
,
H-66
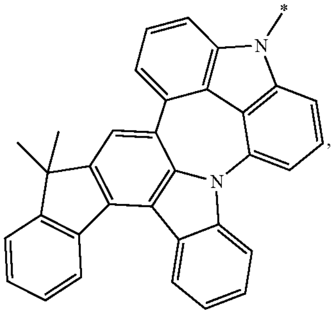
,
H-67
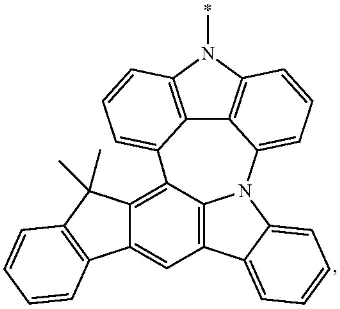
, -continued
H-68
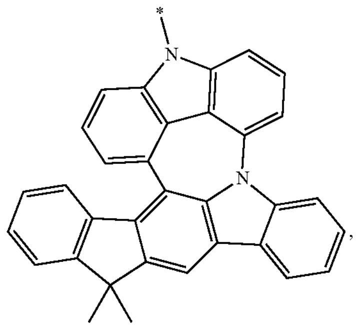
H-69
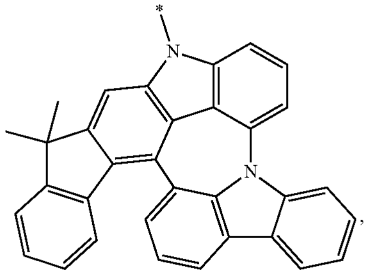
H-70
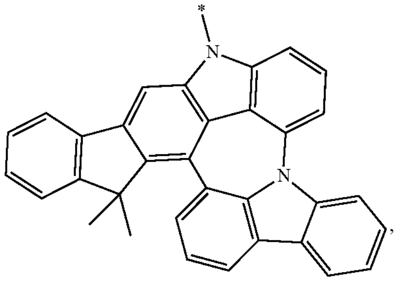
H-71
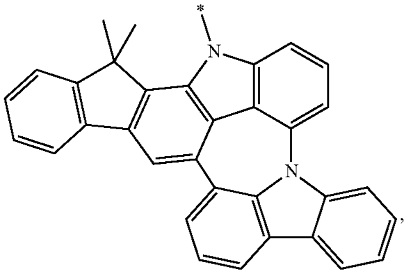
H-72
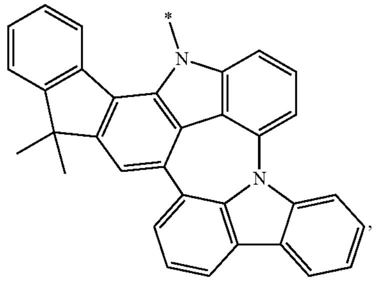
-continued
H-73
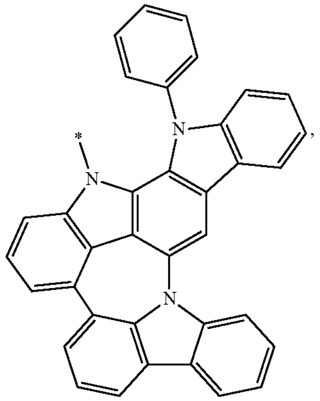
H-74
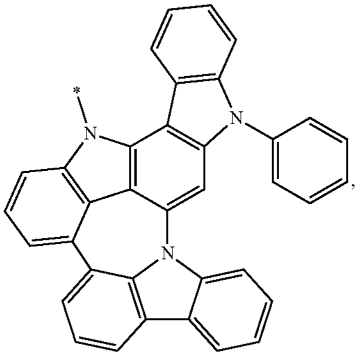
H-75
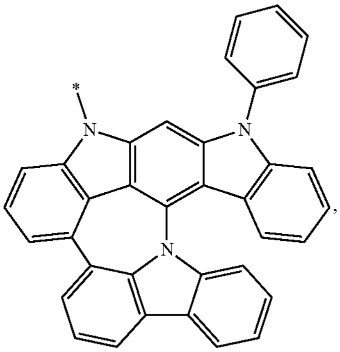
H-76
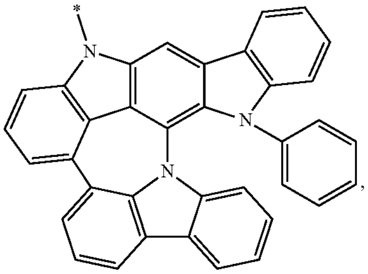

-continued
H-77
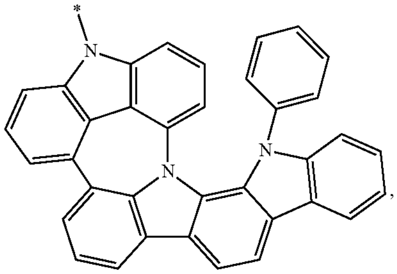,
H-78
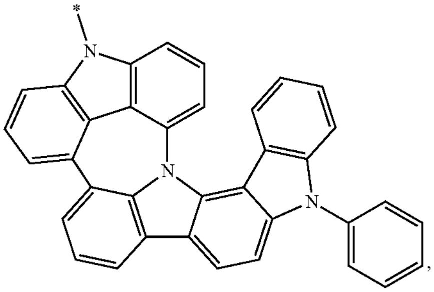,
H-79
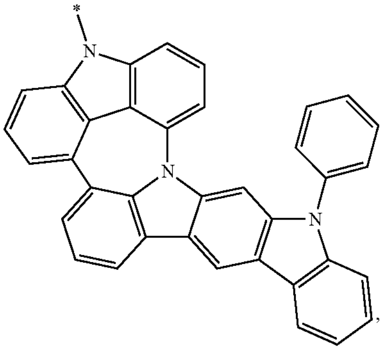,
H-80
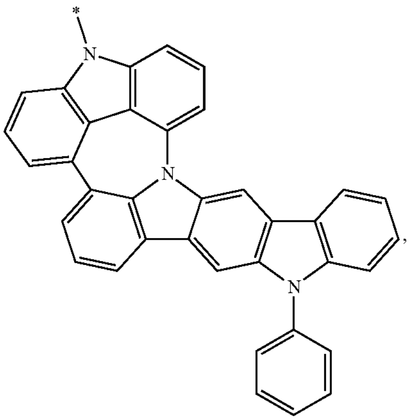,
-continued
H-81
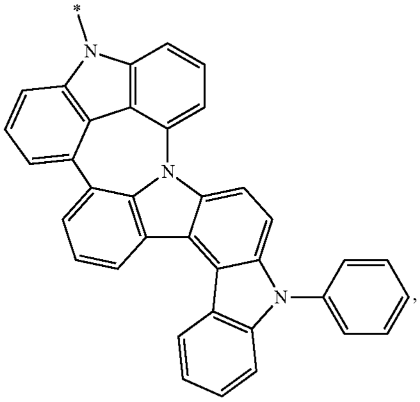,
H-82
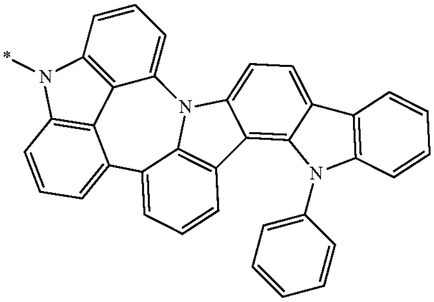
H-83
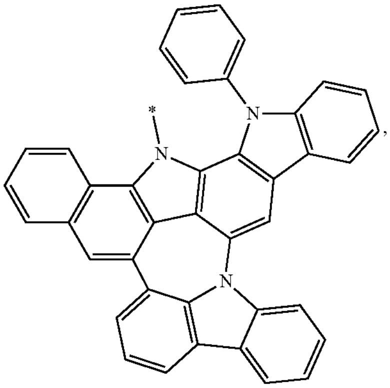,
H-84
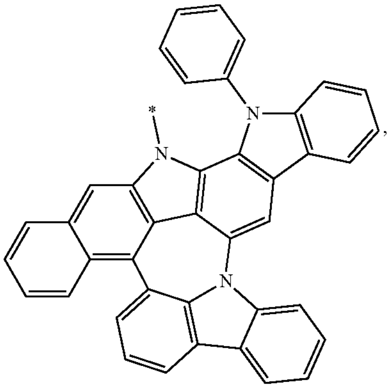

-continued
H-85
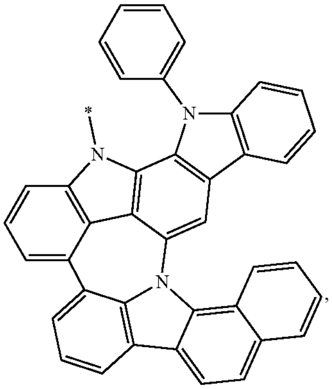
,
H-86
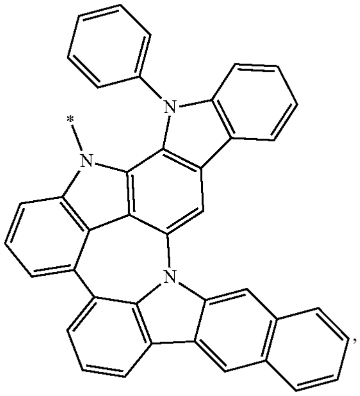
,
H-87
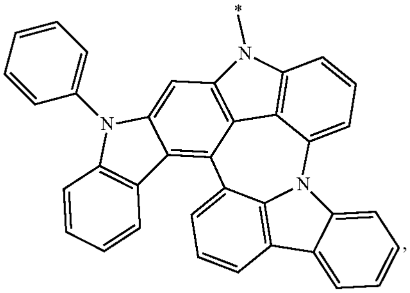
,
H-88
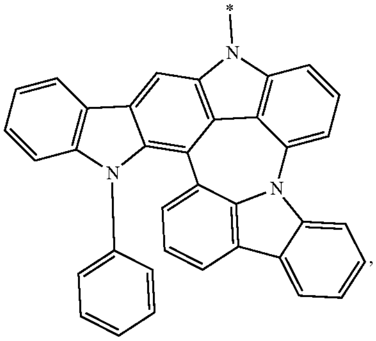
,
-continued
H-89
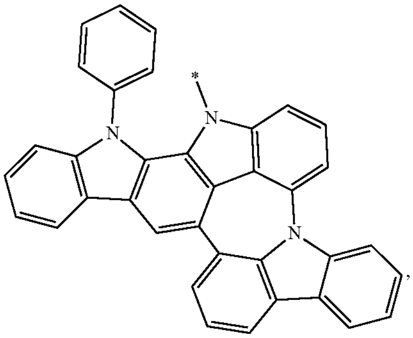
,
H-90
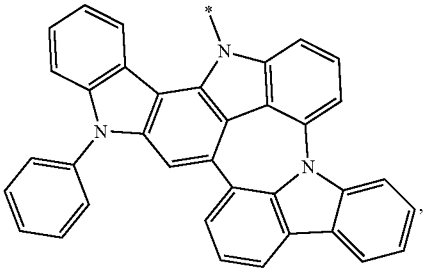
,
H-91
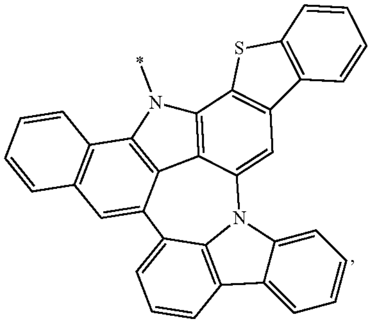
,
H-92
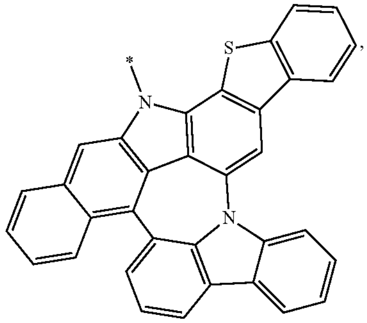
, H-93
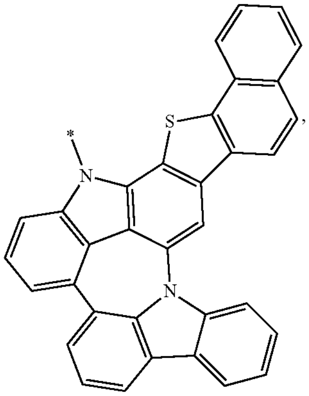
,
H-94
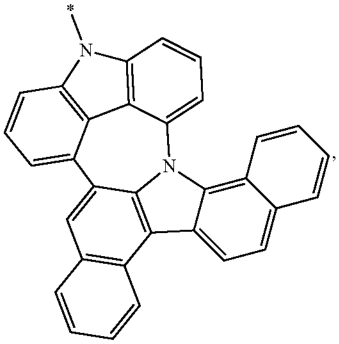
,
H-95
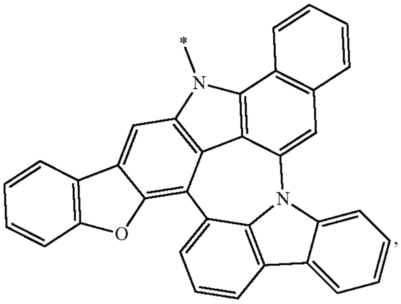
,
H-96
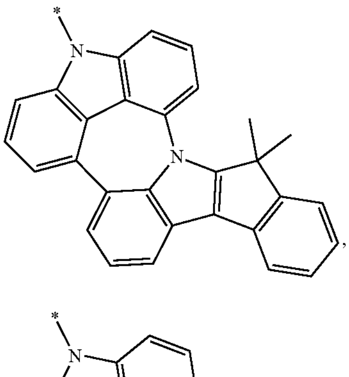
,
H-97
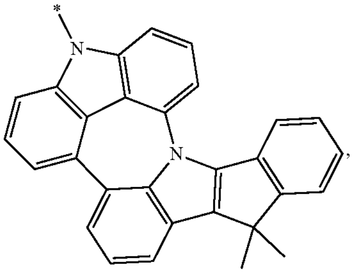
,
H-98
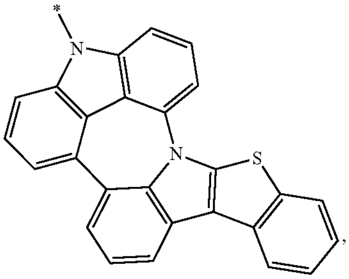
,
H-99
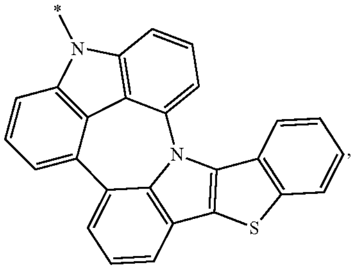
,
H-100
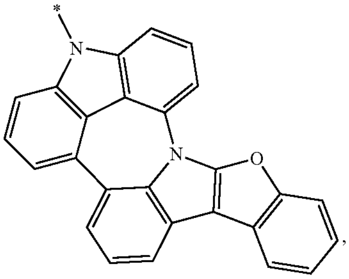
,
H-101
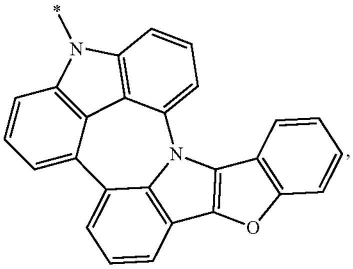
,
H-102
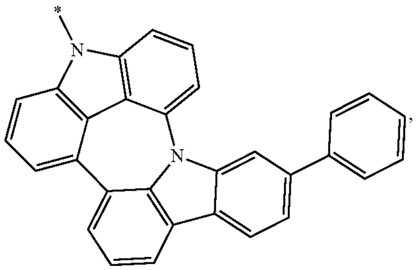
, -continued
H-103
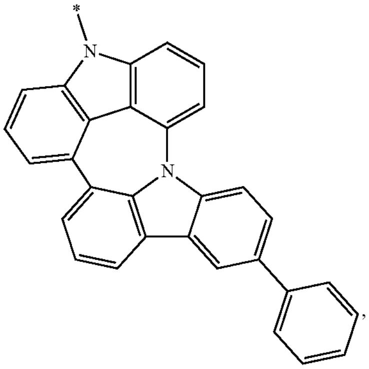
,
H-104
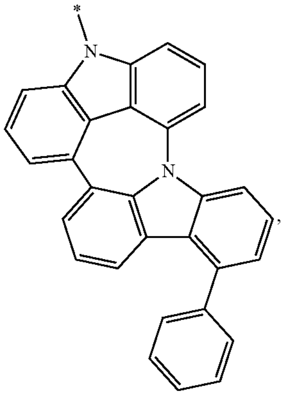
,
H-105
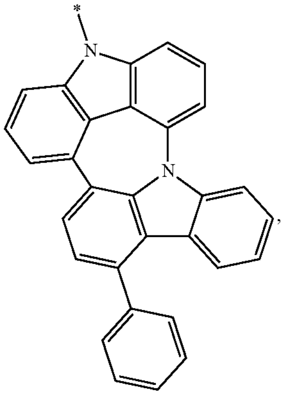
,
H-106
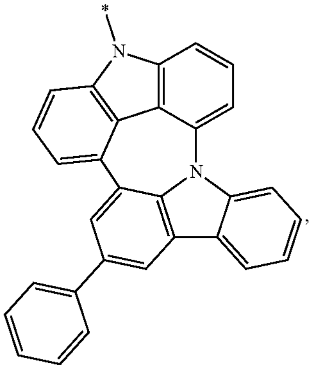
,
-continued
H-107
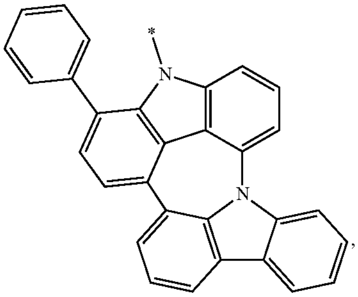
,
H-108
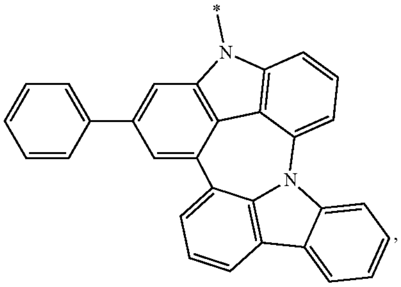
,
H-109
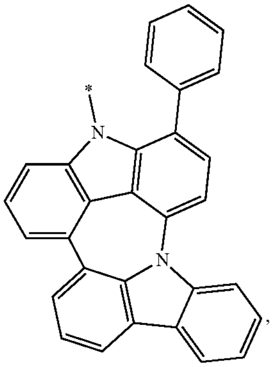
,
H-110
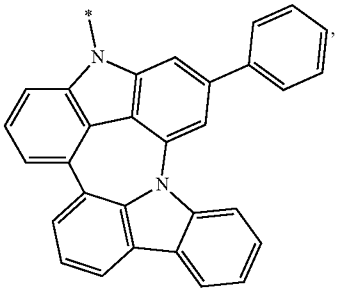
,
H-111
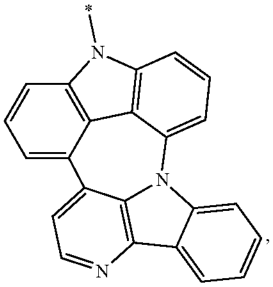
, -continued
H-112
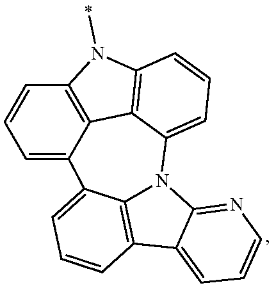
H-113
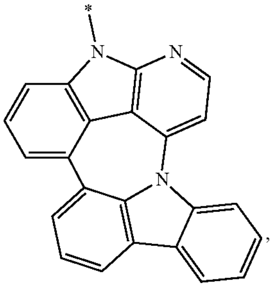
H-114
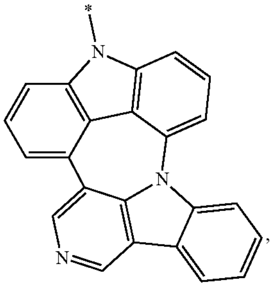
H-115
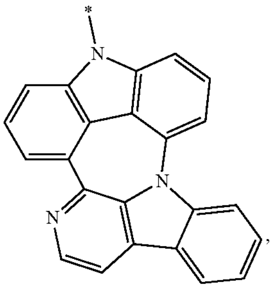
H-116
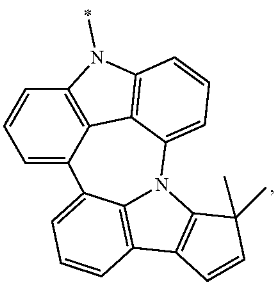
-continued
H-117
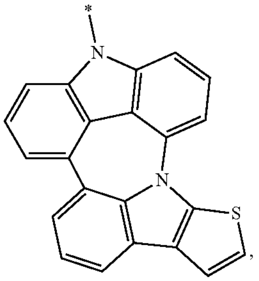
H-118
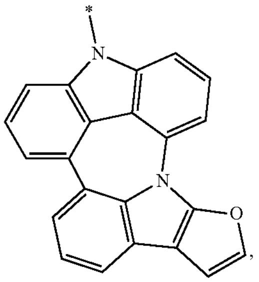
H-119
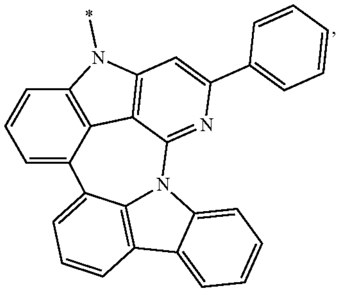
H-120
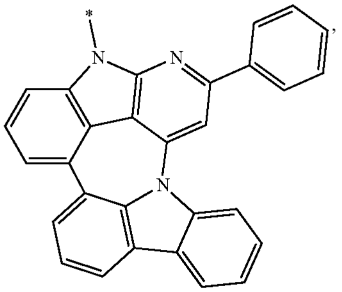
H-121
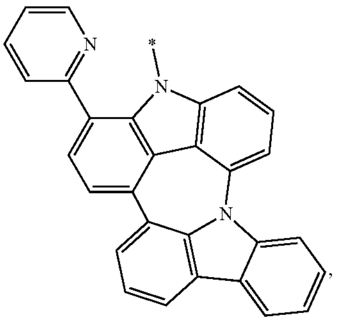

-continued
H-122
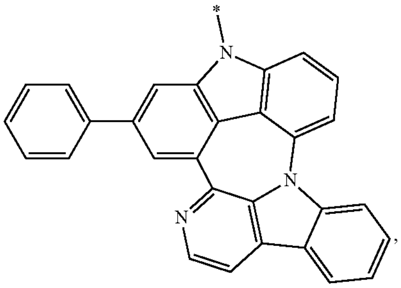
H-123
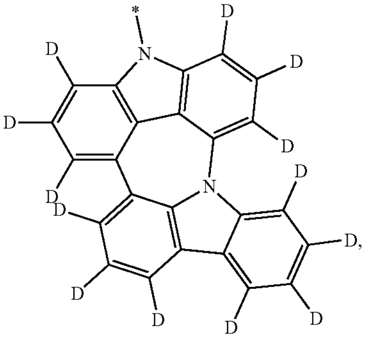
H-124
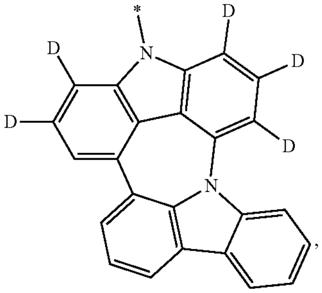
H-125
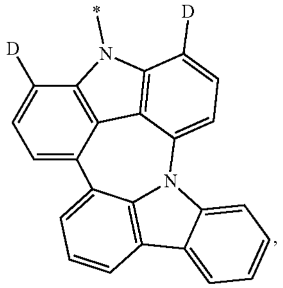
H-126
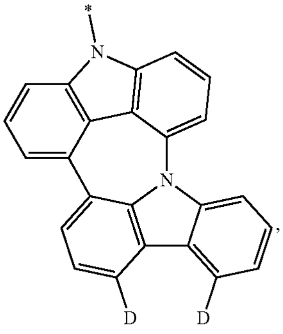
-continued
H-127
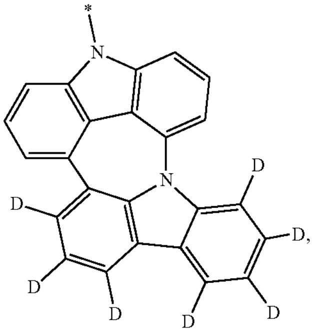
H-128
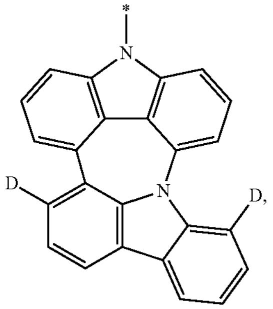
H-129
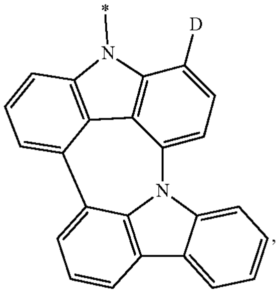
H-130
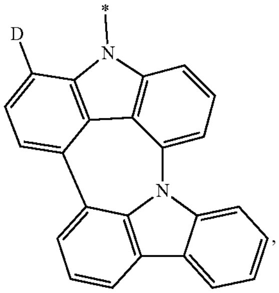
H-131
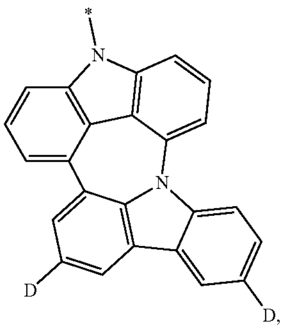

-continued

H-132

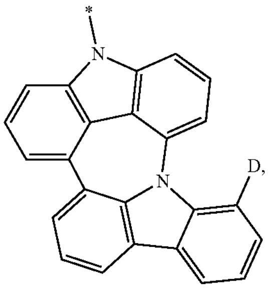

H-133

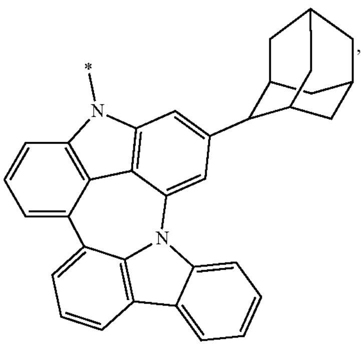

H-134

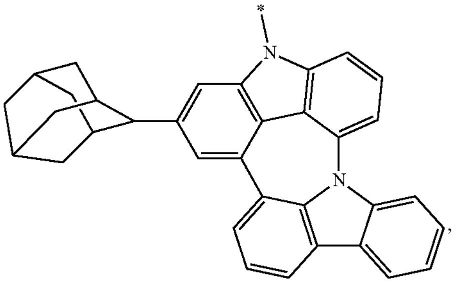

H-135

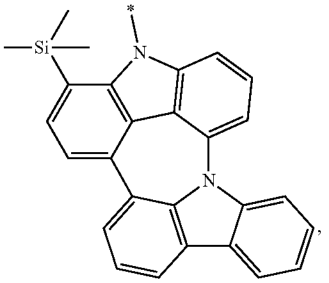

H-136

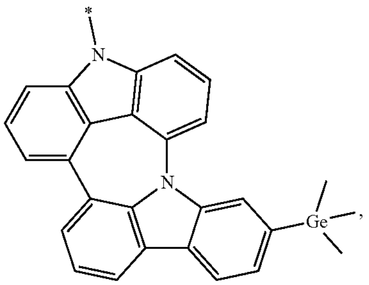

-continued

H-137

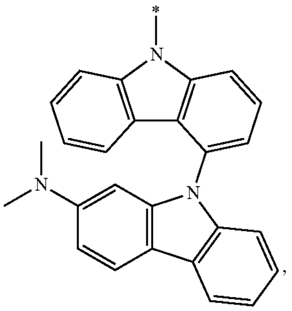

H-138

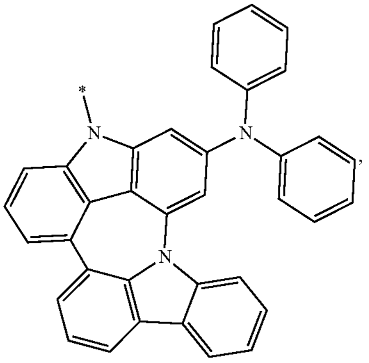

and

H-139

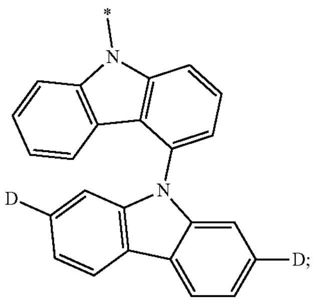

wherein "*" represents a position wherein a structure of H-1 to H-139 is joined to H;

optionally, hydrogens in the structures of H-1 to H-139 can be partially or fully substituted with deuterium.

5. The electroluminescent device of claim 1, wherein E has a structure represented by Formula 1-a:

Formula 1-a

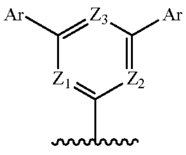

wherein $Z_1$ to $Z_3$ are N;

Ar is, at each occurrence identically or differently, selected from substituted or unsubstituted aryl having 6 to 18 carbon atoms, unsubstituted dibenzofuranyl, unsubstituted dibenzothienyl, unsubstituted carbazolyl, unsubstituted pyridyl, or unsubstituted pyrimidinyl.

6. The electroluminescent device of claim 4, wherein E is selected from the group consisting of the following structures:

E-1
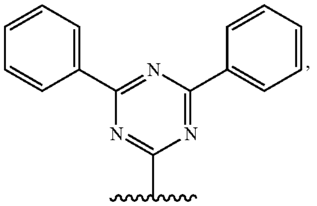
E-2
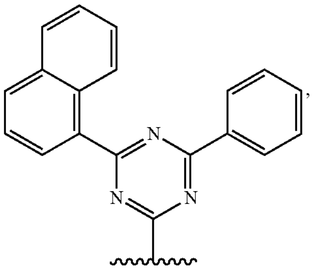
E-3
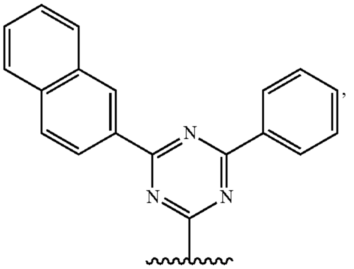
E-4
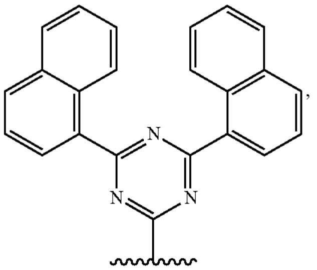
E-5
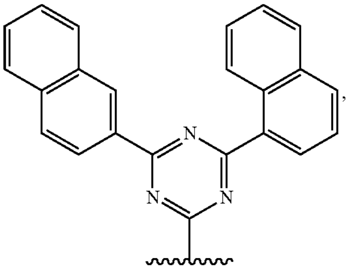
E-6
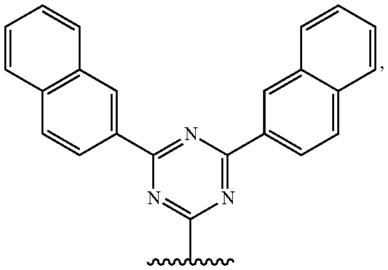
-continued
E-7
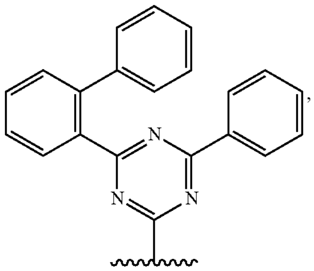
E-8
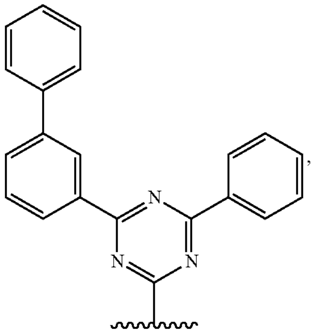
E-9
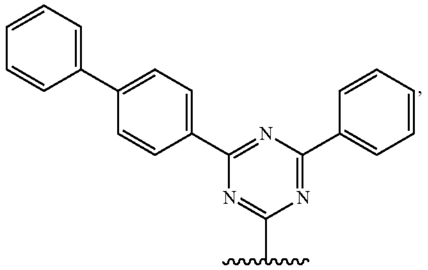
E-10
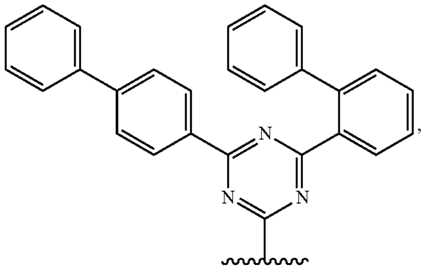
E-11
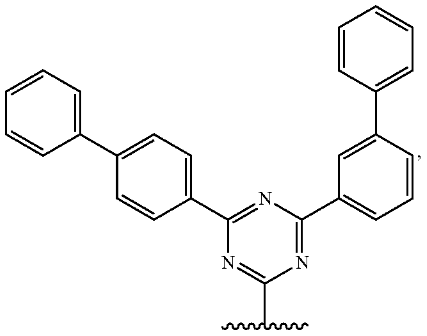

-continued
E-12
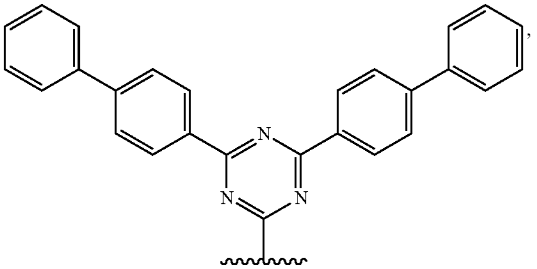
E-13
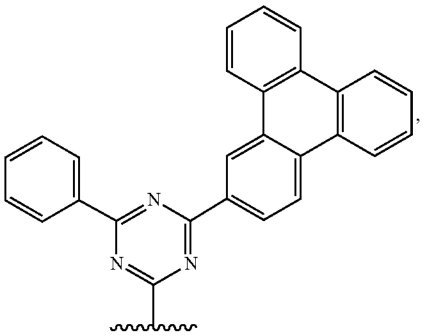
E-14
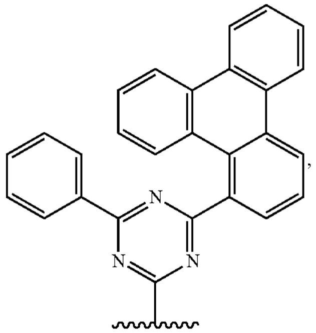
E-15
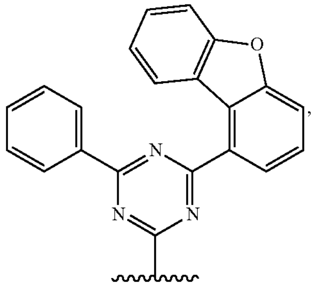
E-16
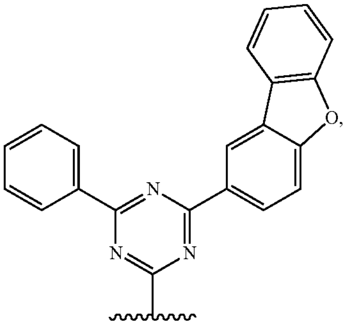
-continued
E-17
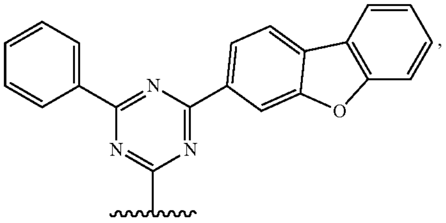
E-18
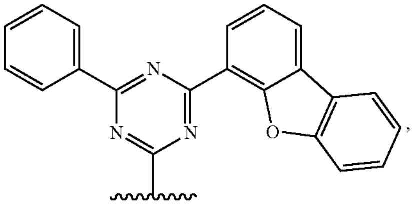
E-19
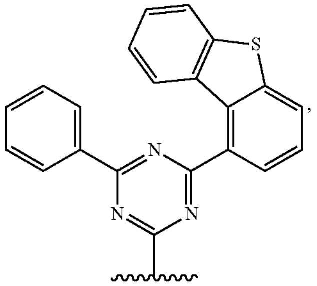
E-20
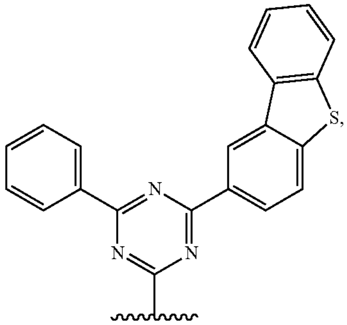
E-21
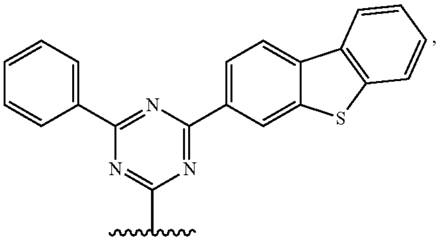
E-22
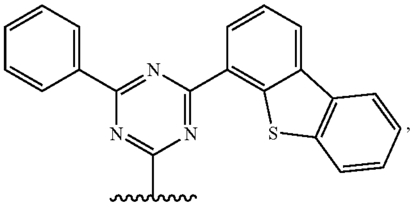

-continued
E-23
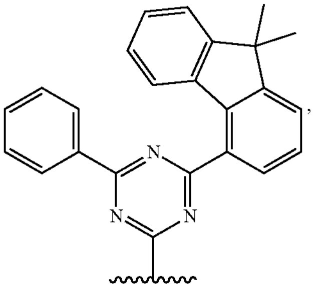
E-24
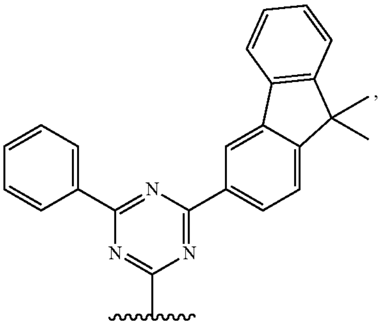
E-25
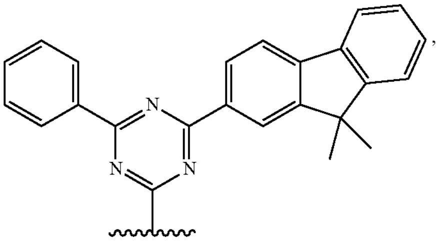
E-26
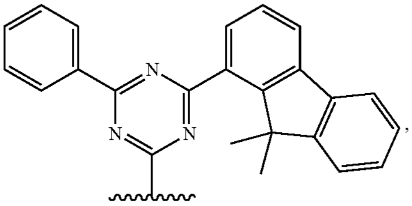
E-27
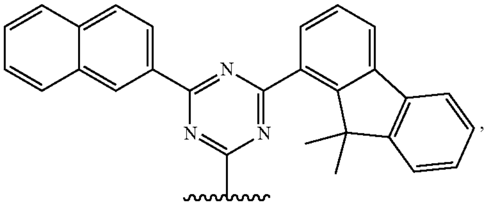
E-30
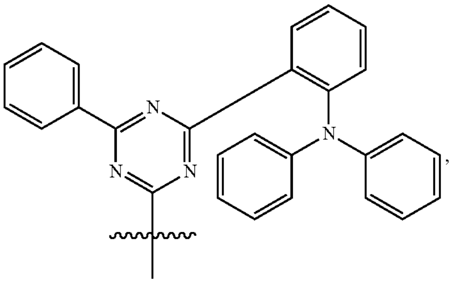
-continued
E-33
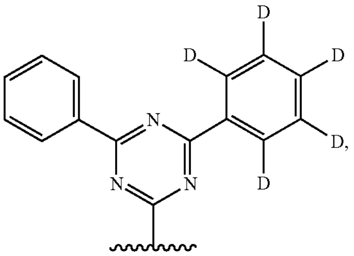
E-34
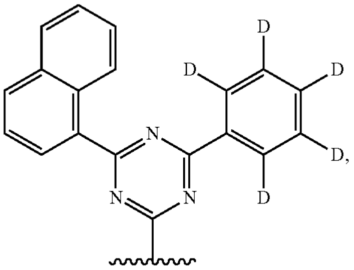
E-35
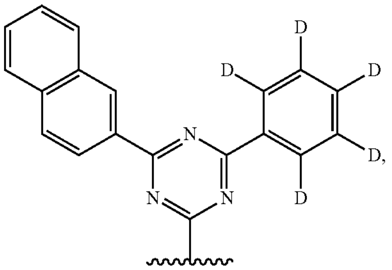
E-36
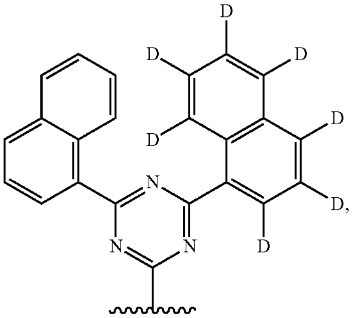
E-37
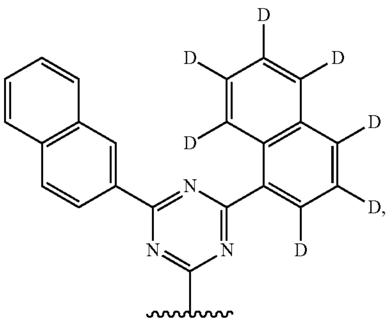

-continued
E-38
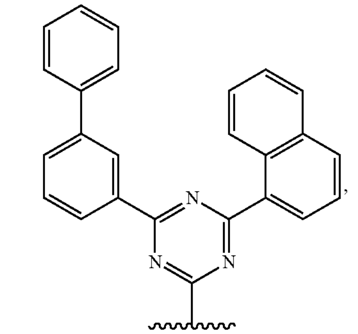
E-41
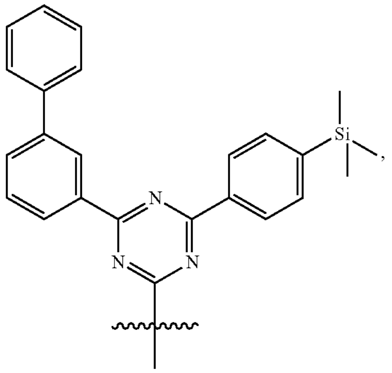
E-42
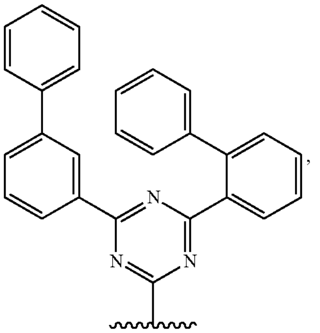
E-43
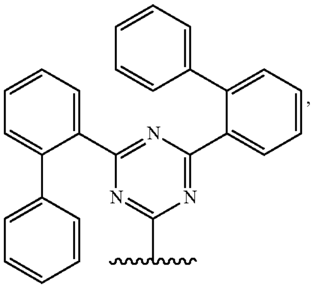
E-44
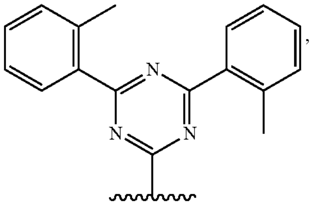
-continued
E-45
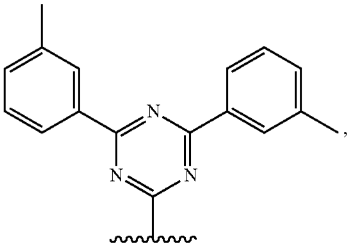
E-46
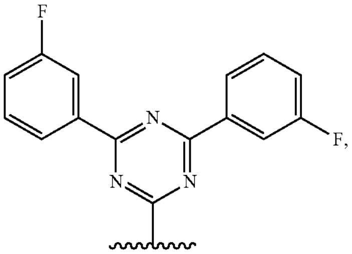
E-47
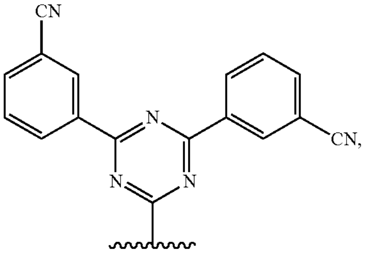
E-48
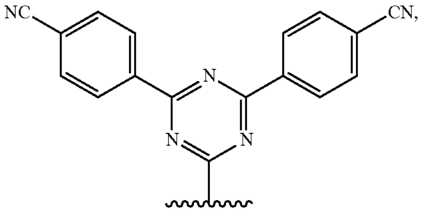
E-49
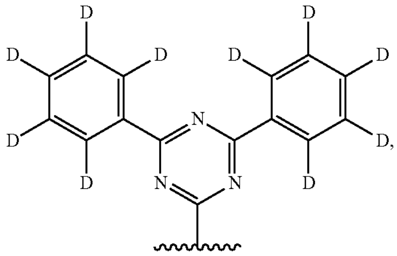
E-50
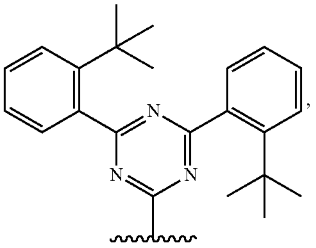

-continued
E-51
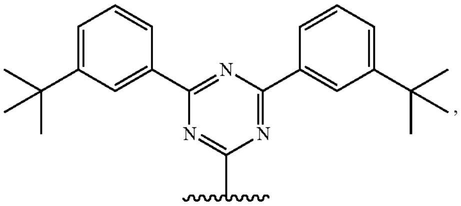
E-52
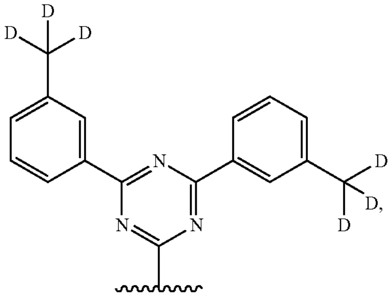
E-53
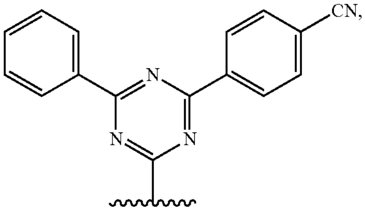
E-54
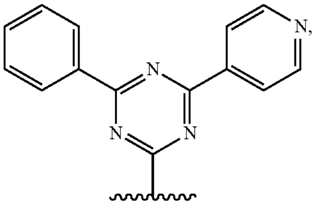
E-55
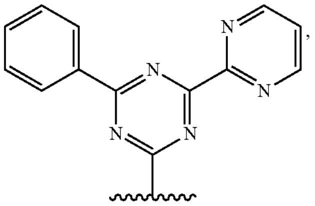
E-56
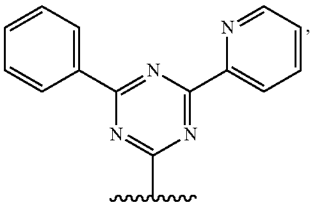
-continued
E-74
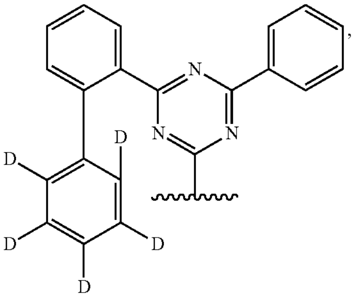
E-75
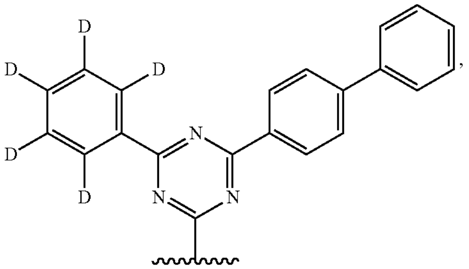
E-76
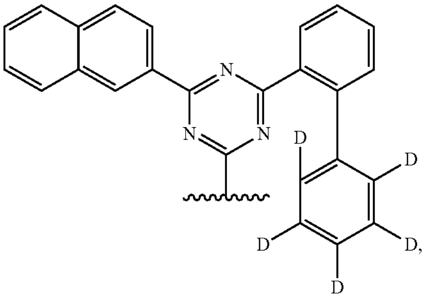
E-77
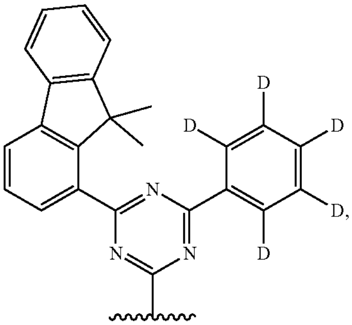
E-78
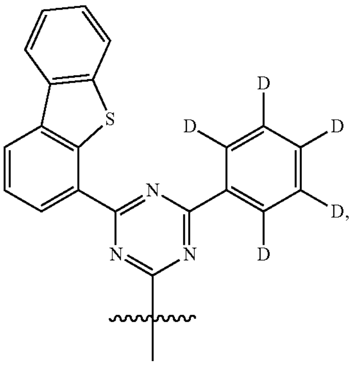

-continued
E-79
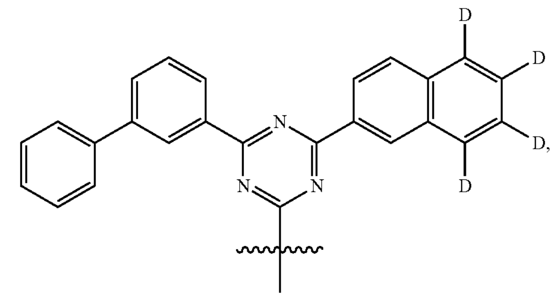
E-80
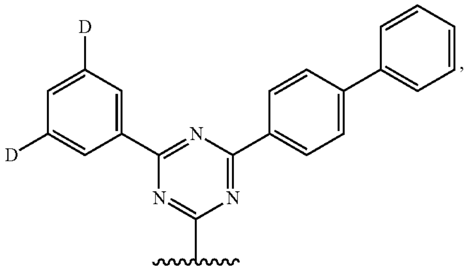
E-81
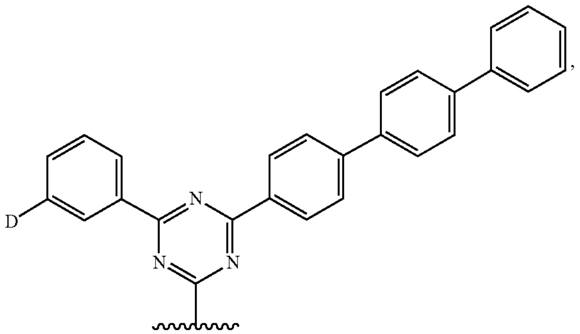
E-82
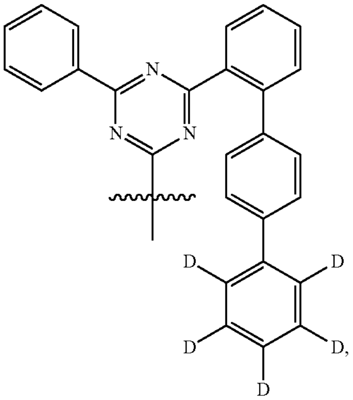
E-83
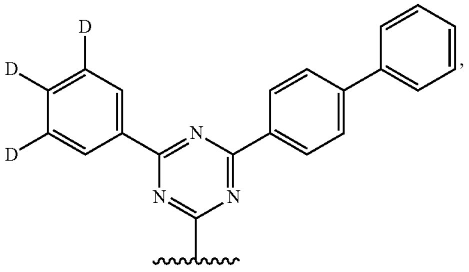
-continued
E-84
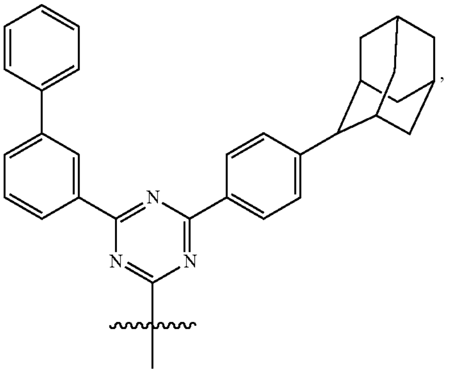
E-85
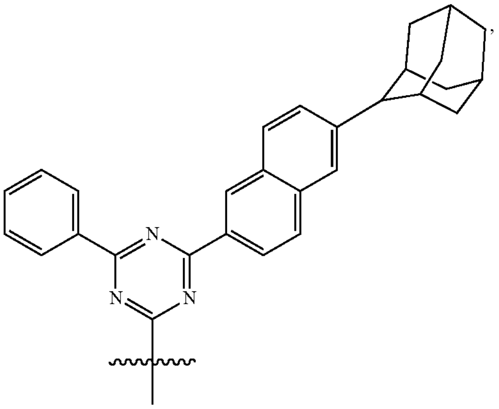
E-87
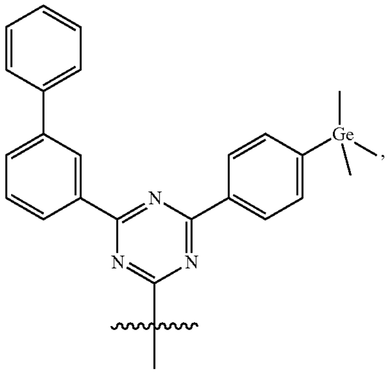
E-88
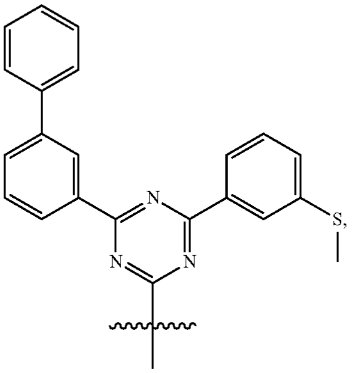

-continued

E-89

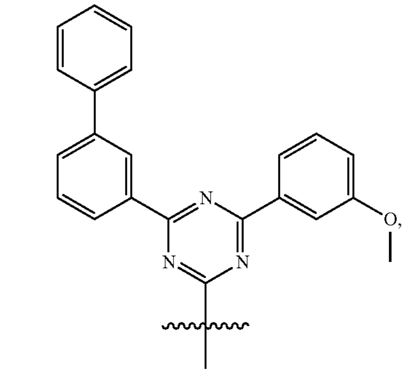

E-90

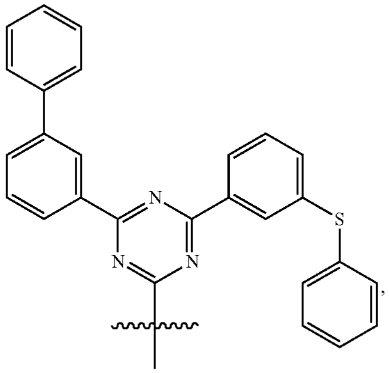

E-91

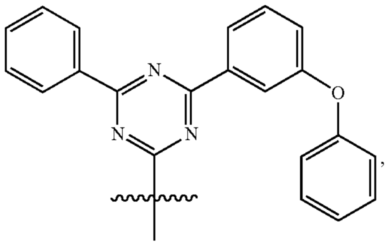

and

E-92

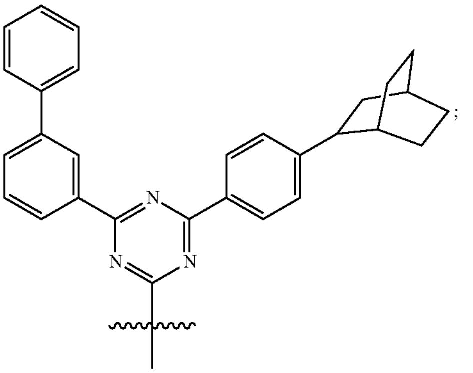

optionally, hydrogens in the structures of E-1 to E-27, E-30, E-33 to E-38, E-41 to E-56, E-74 to E-85 and E-87 to E-92 can be partially or fully substituted with deuterium.

7. The electroluminescent device of claim 1, wherein L is selected from a single bond, or substituted or unsubstituted arylene having 6 to 20 carbon atoms.

8. The electroluminescent device of claim 1, wherein the second compound has a structure represented by one of Formula 2-a to Formula 2-d:

Formula 2-a

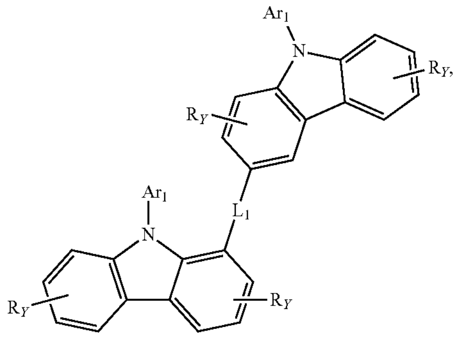

Formula 2-b

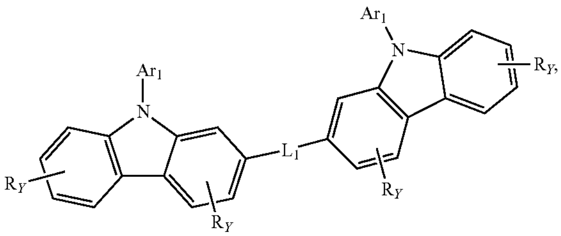

Formula 2-c

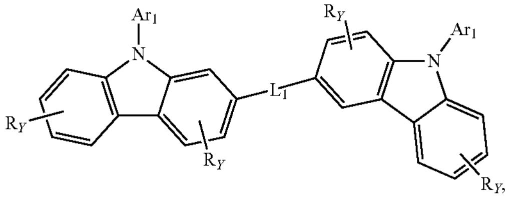

and

Formula 2-d

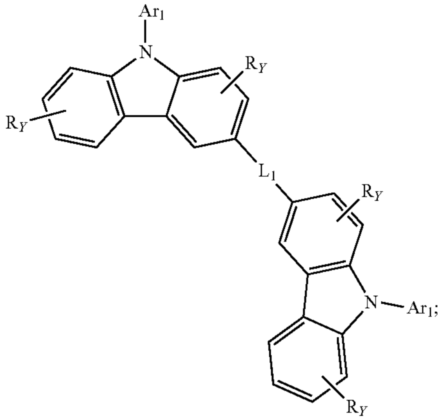

wherein $R_Y$ represents, at each occurrence identically or differently, mono-substitution, multiple substitutions or non-substitution; $R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof.

9. The electroluminescent device of claim 1, wherein $Ar_1$ is, at each occurrence identically or differently, selected from substituted or unsubstituted aryl having 6 to 25 carbon atoms, substituted or unsubstituted heteroaryl having 3 to 25 carbon atoms or combinations thereof.

10. The electroluminescent device of claim 1, wherein $L_1$ is selected from a single bond, substituted or unsubstituted arylene having 6 to 30 carbon atoms, substituted or unsubstituted heteroarylene having 3 to 30 carbon atoms or combinations thereof.

11. The electroluminescent device of claim 1, wherein the second compound is selected from the group consisting of the following structures:

2-1

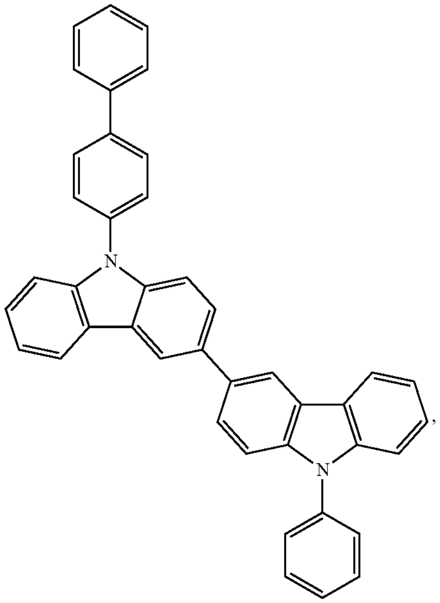

-continued 2-2

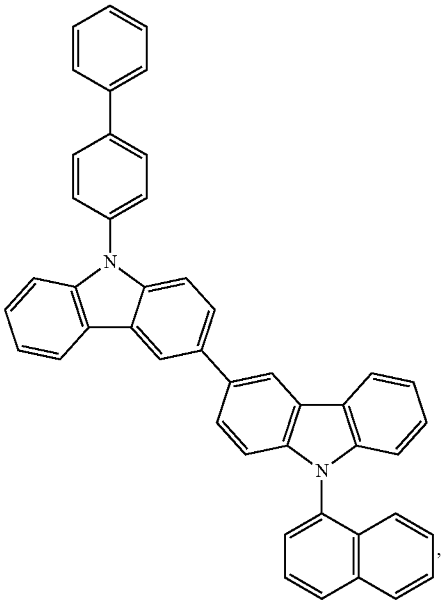

2-3

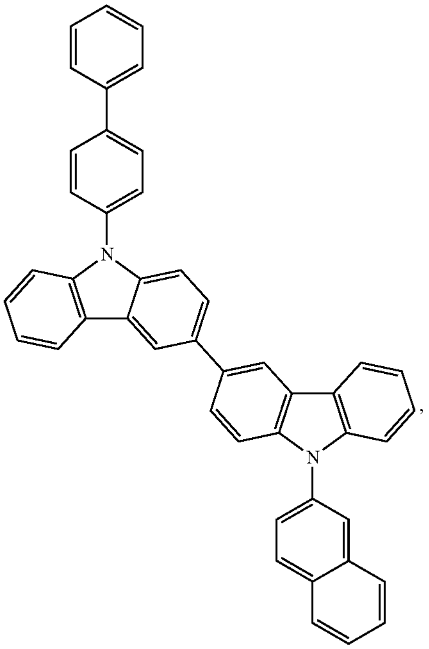

-continued
2-4
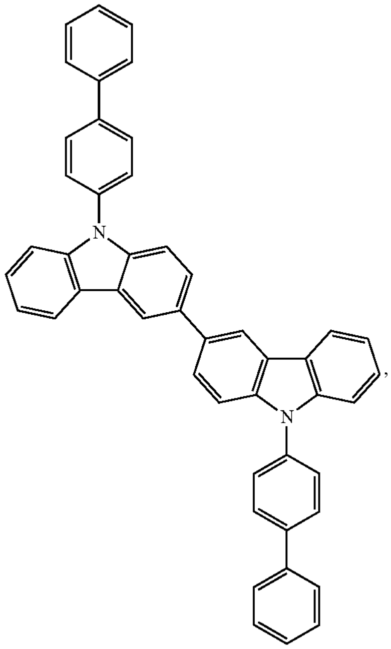
,
-continued
2-6
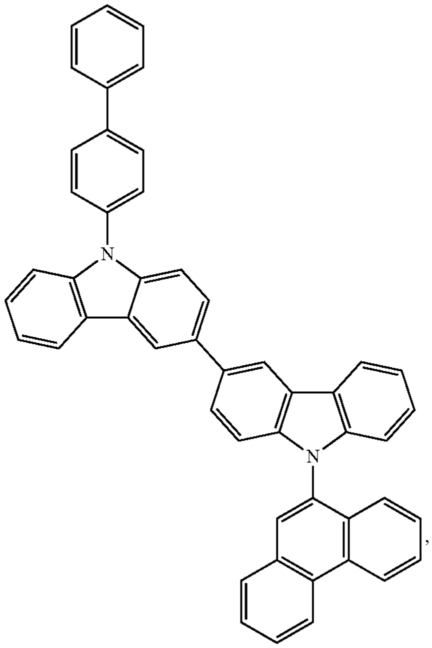
,
2-5
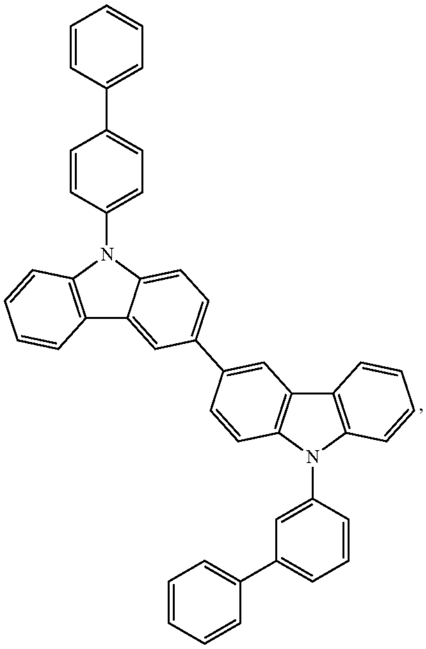
,
2-7
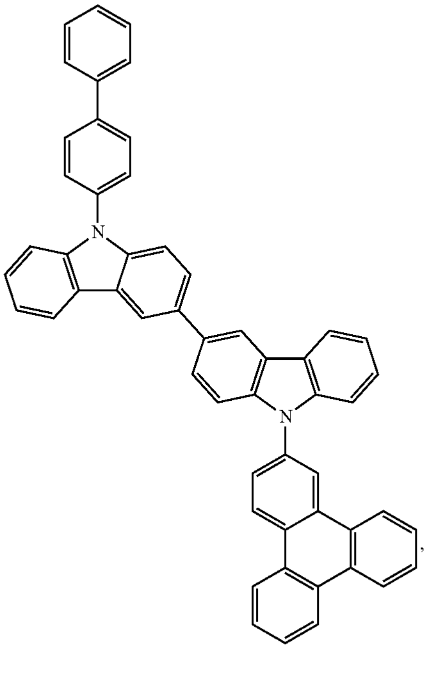
, -continued
2-8
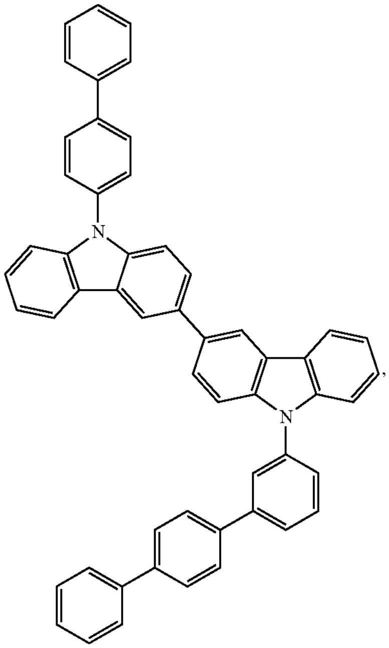
,
2-9
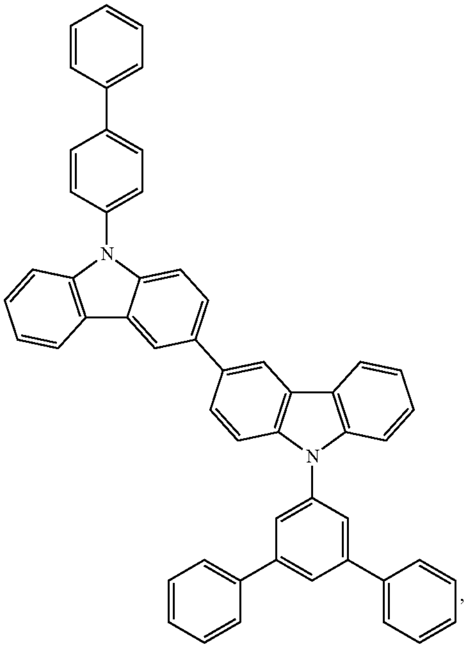
,
-continued
2-10
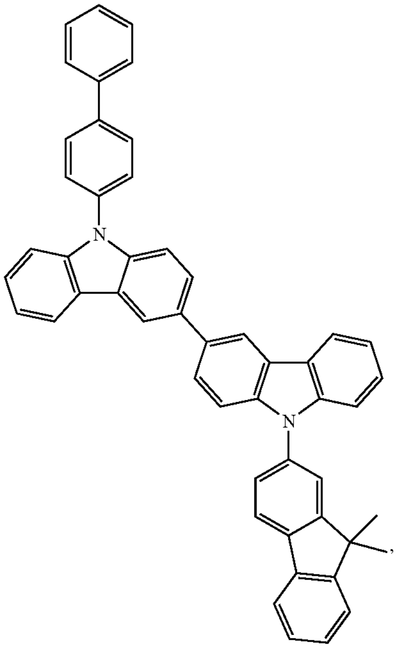
,
2-11
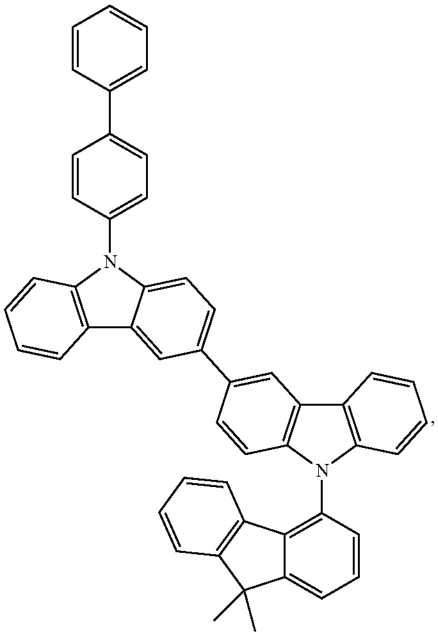
, -continued
2-12
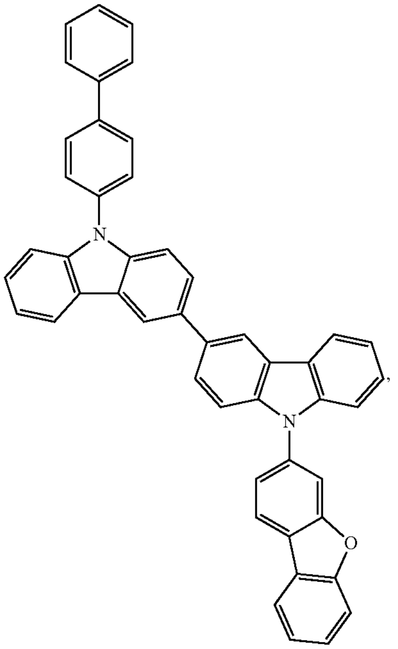
2-13
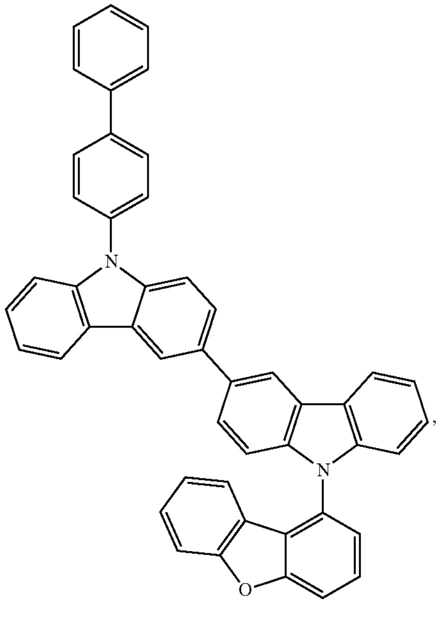
-continued
2-14
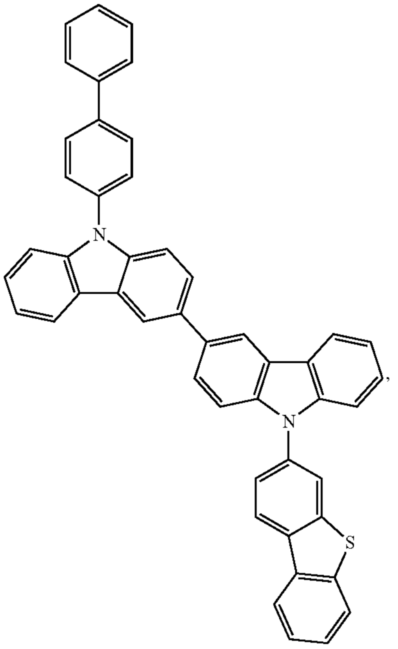
2-15
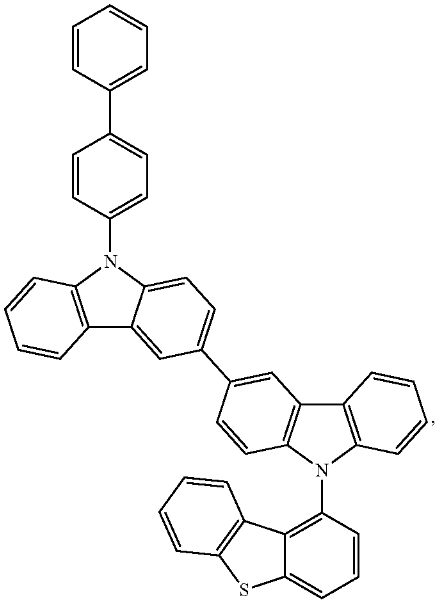

-continued
2-16
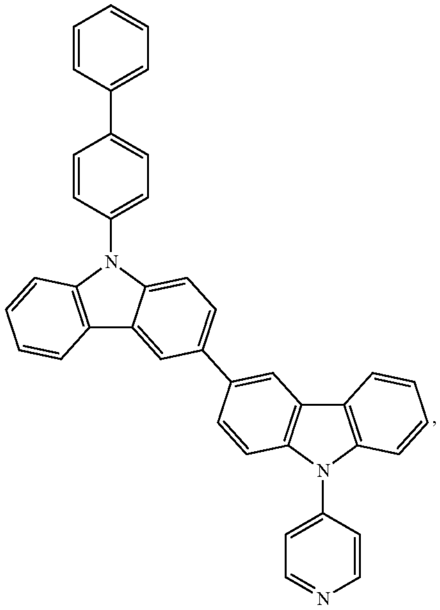
2-17
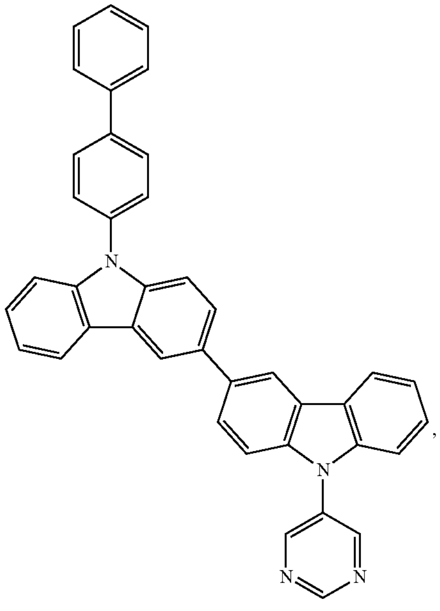
-continued
2-18
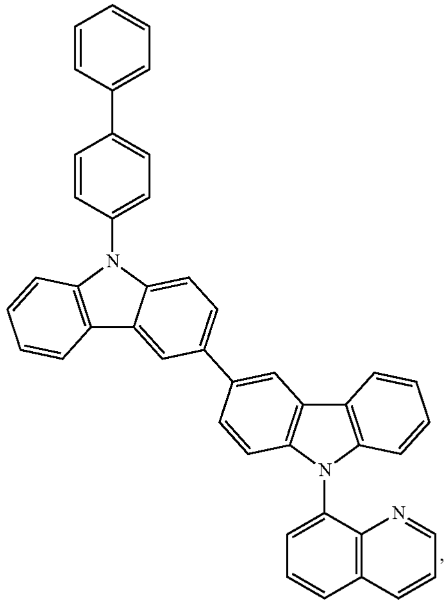
2-19
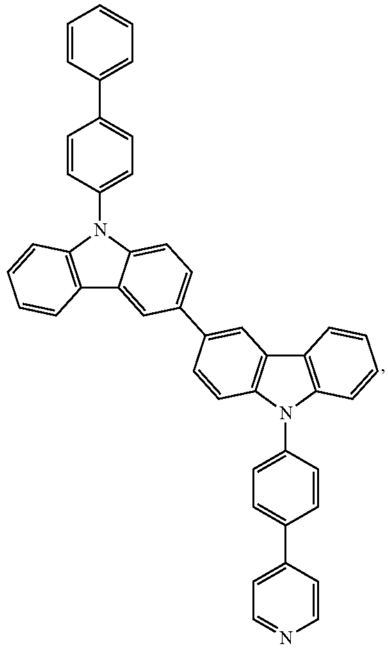

-continued
2-20
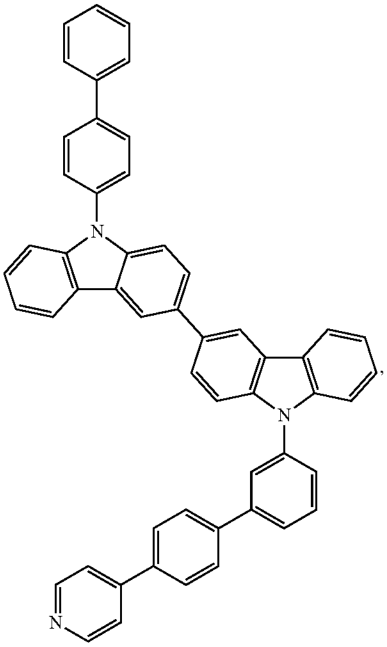
2-21
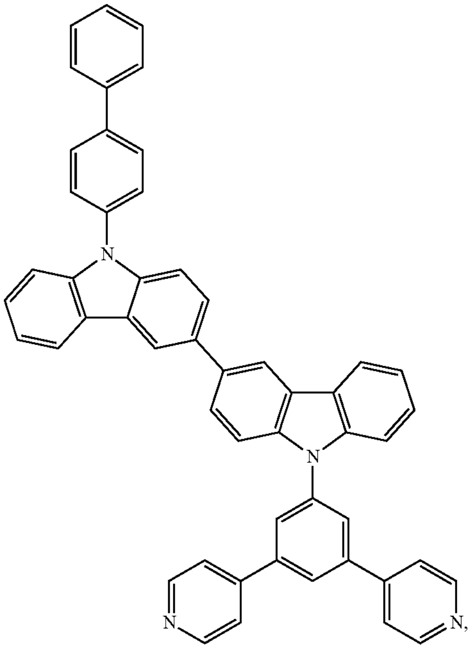
-continued
2-22
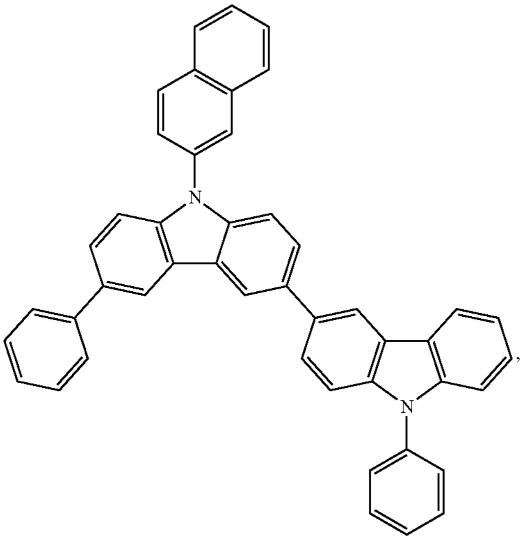
2-23
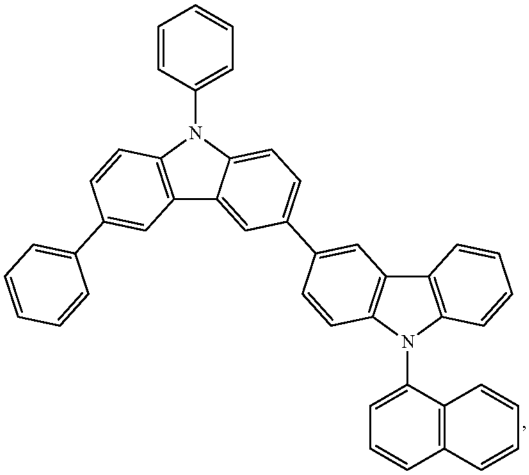
2-24
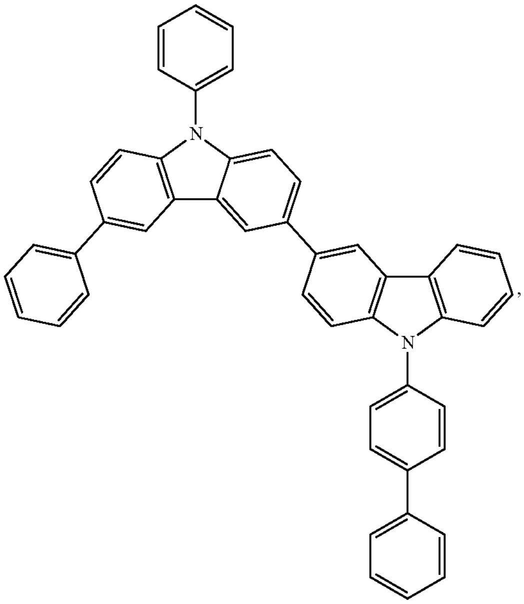

-continued
2-25
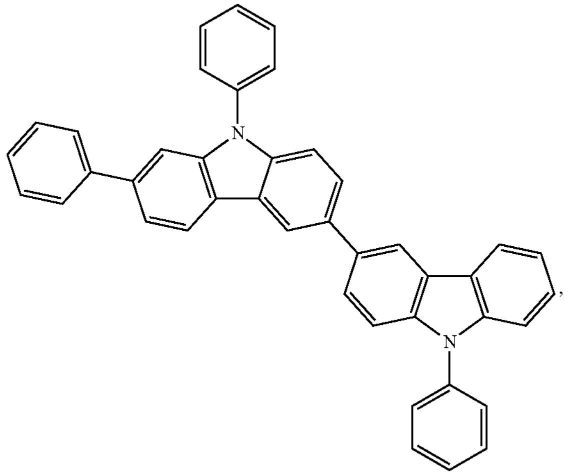
2-26
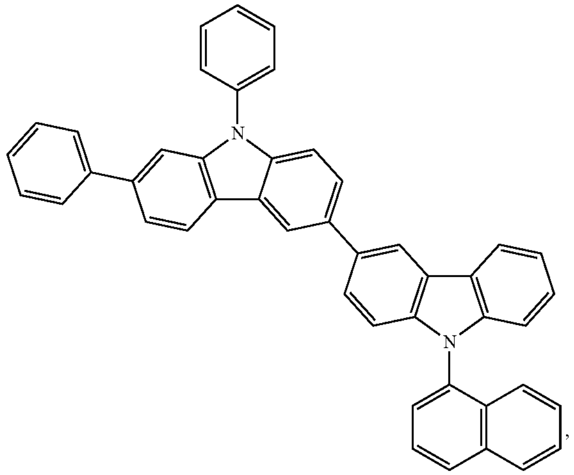
2-27
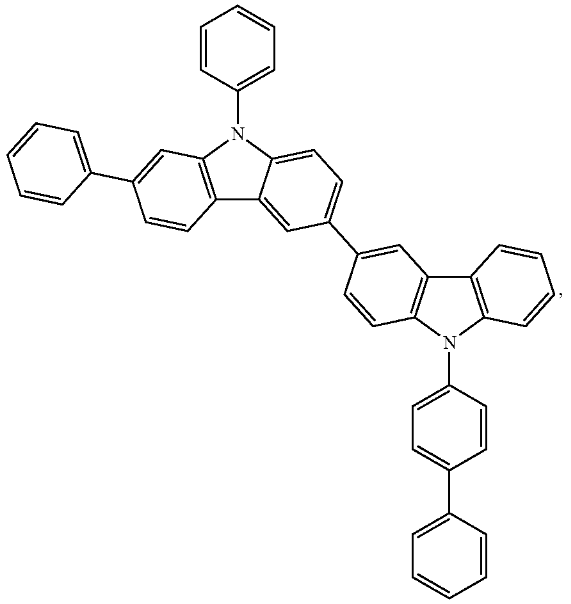
-continued
2-28
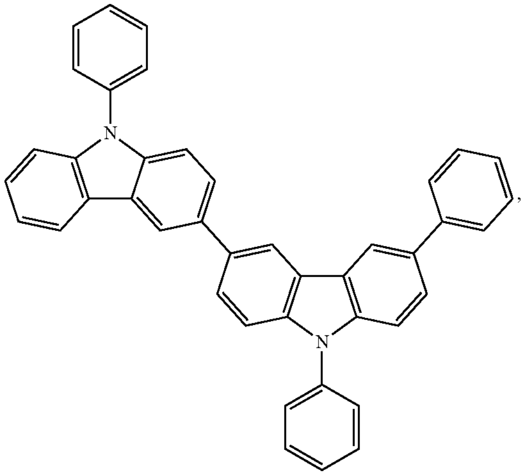
2-29
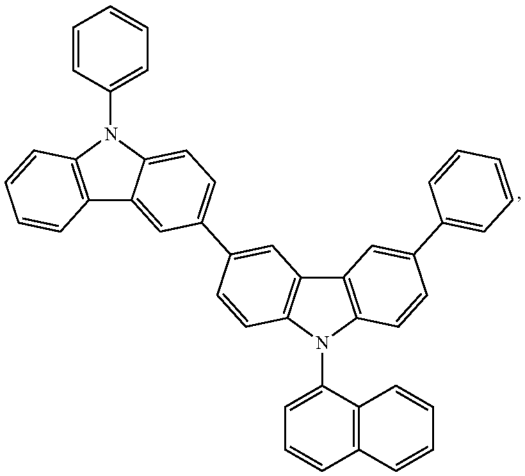
2-30
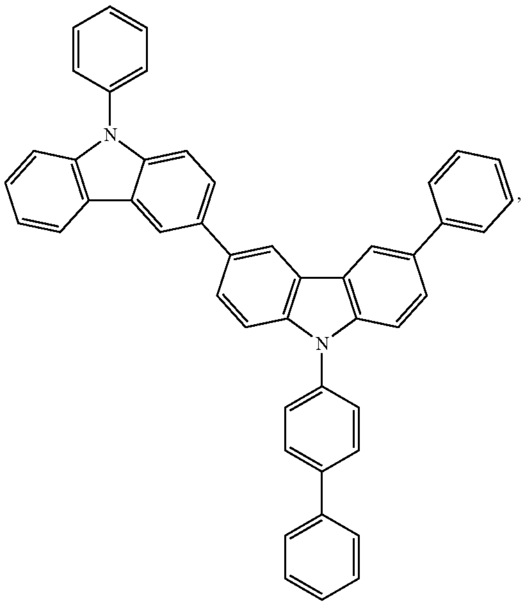

-continued
2-31
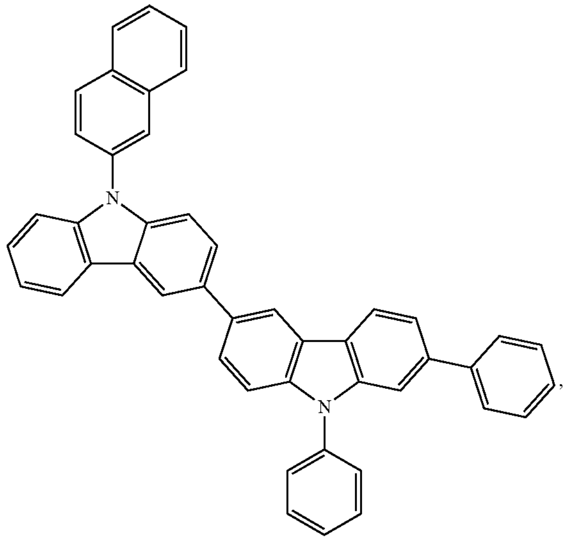
2-32
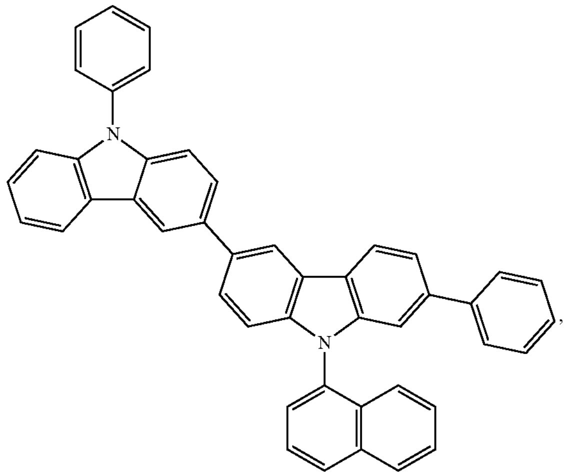
-continued
2-33
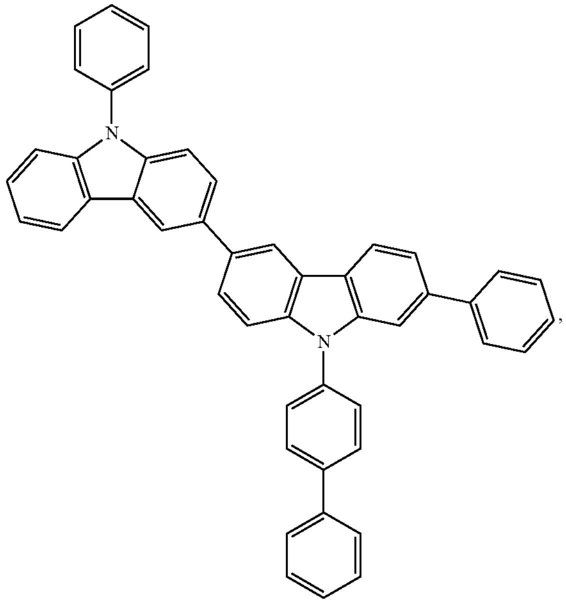
2-34
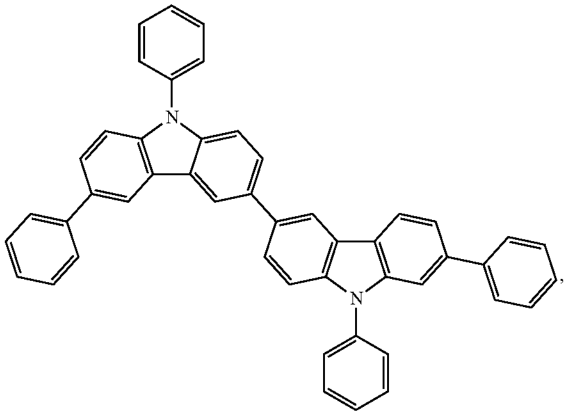
2-35
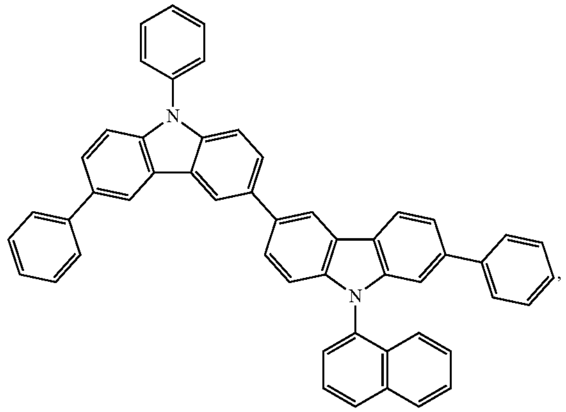

-continued
2-36
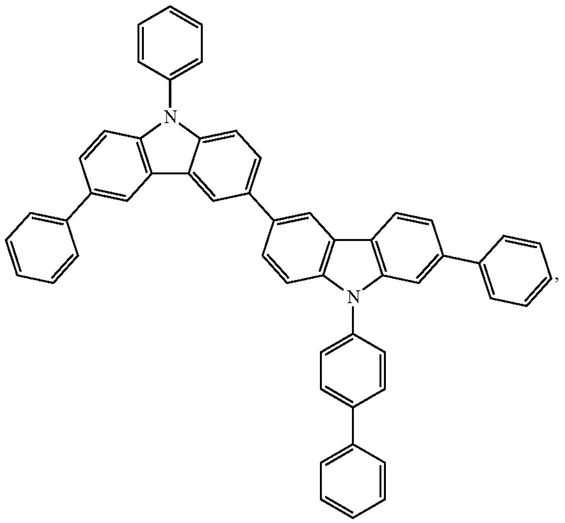
2-37
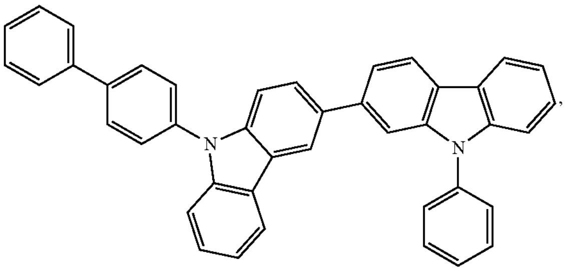
2-38
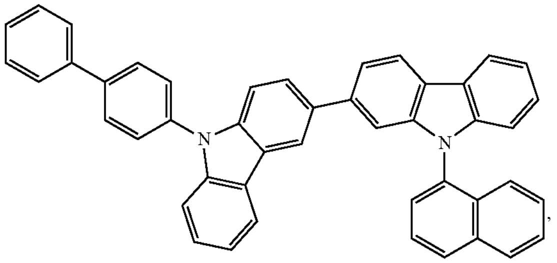
2-39
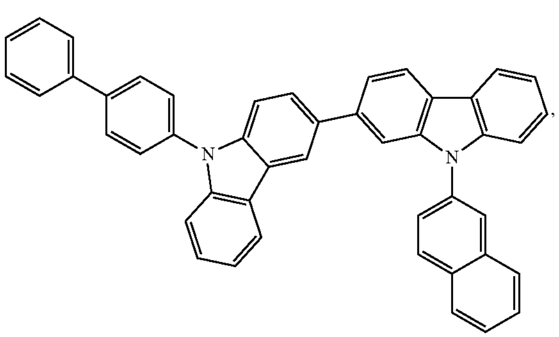
-continued
2-40
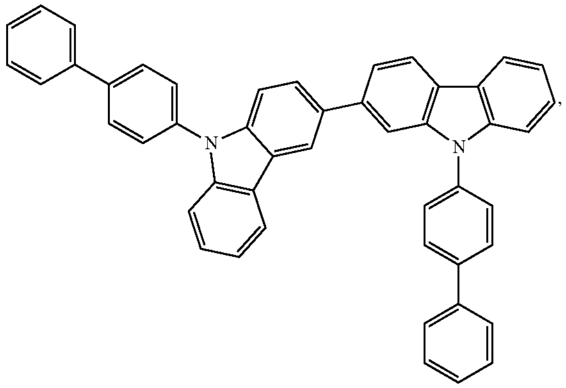
2-41
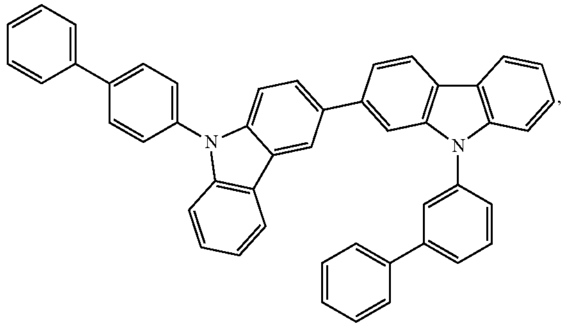
2-42
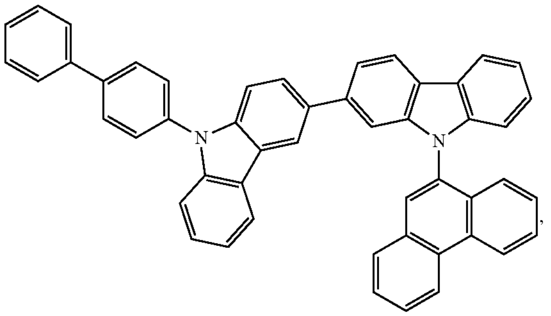
2-43
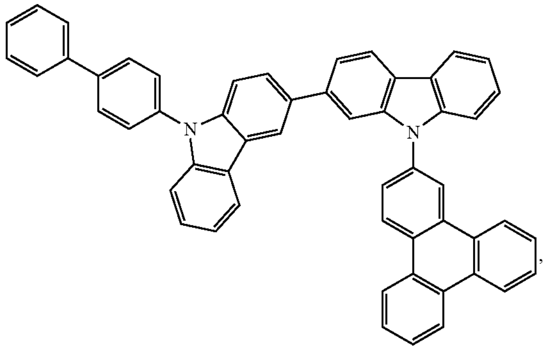

-continued
2-44
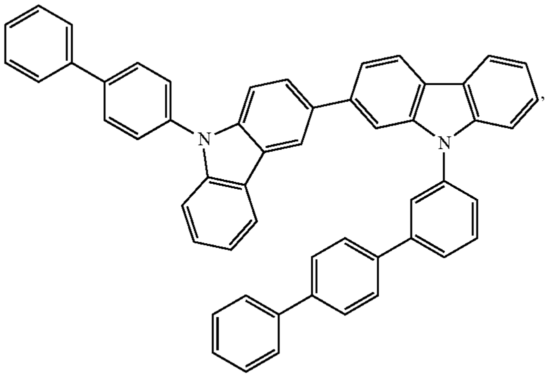
2-45
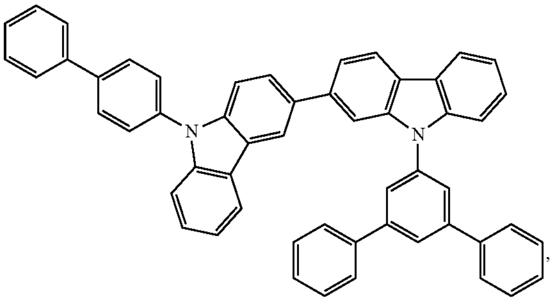
2-46
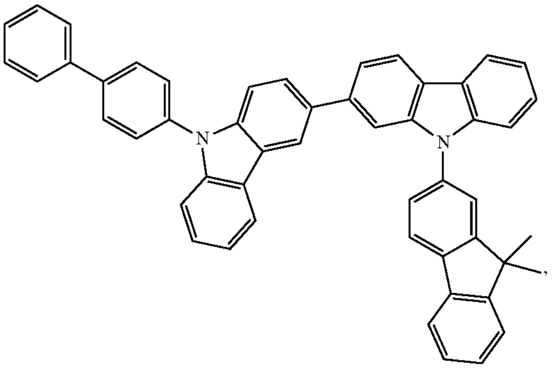
2-47
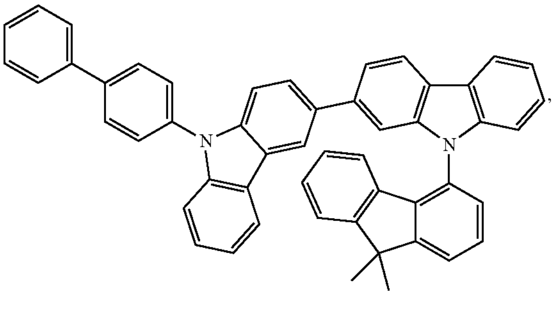
-continued
2-48
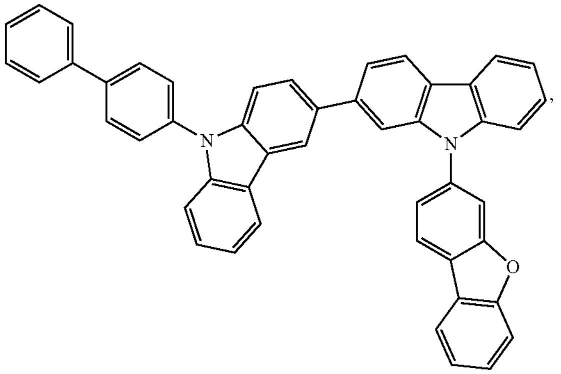
2-49
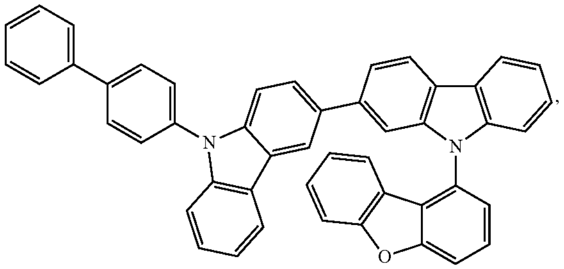
2-50
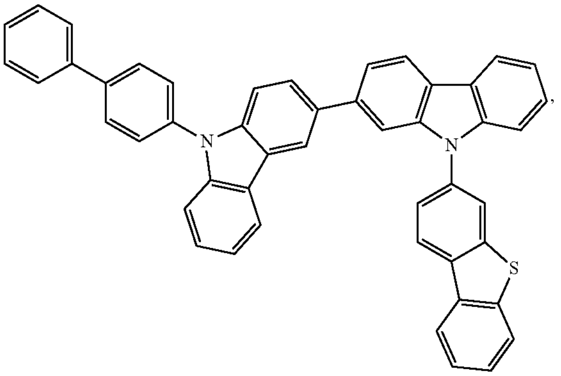
2-51
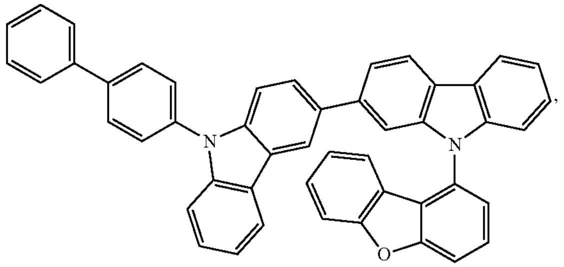

-continued
2-52
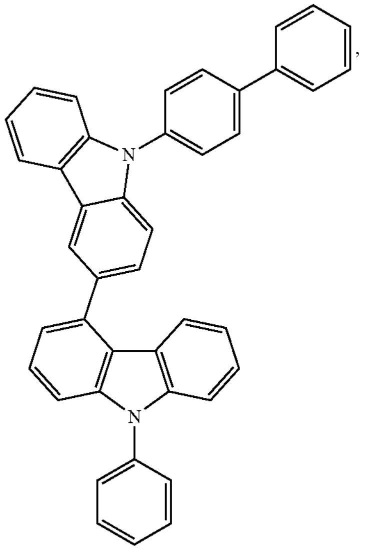
2-53
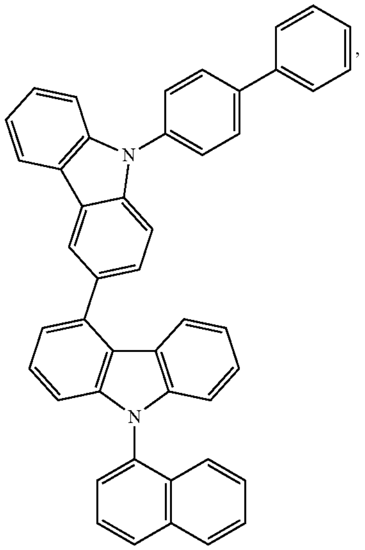
-continued
2-54
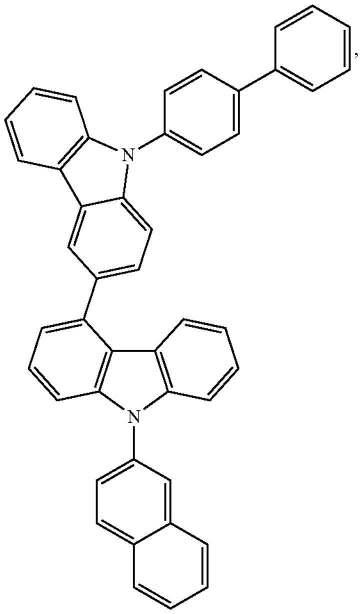
2-55
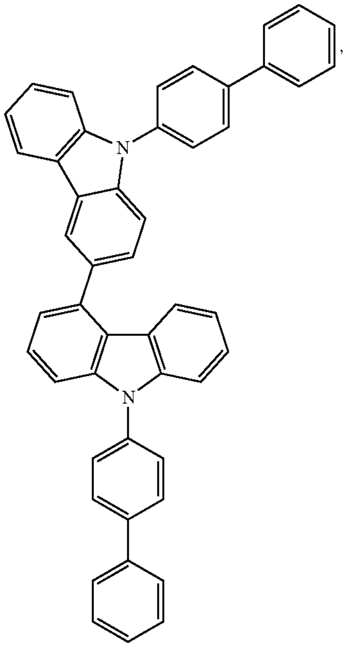

-continued
2-56
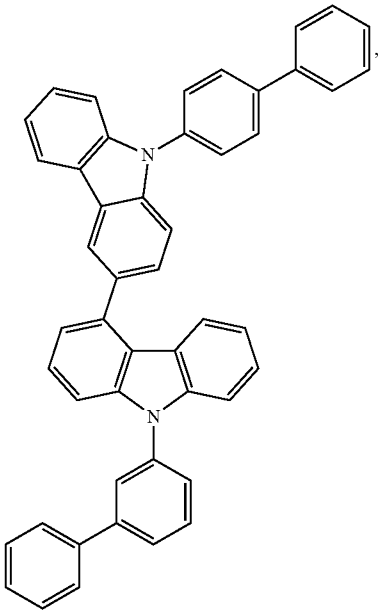
2-57
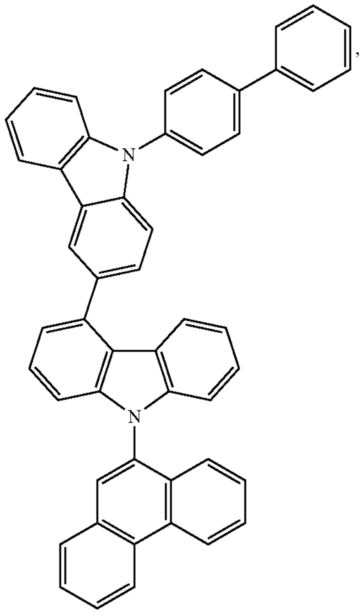
-continued
2-58
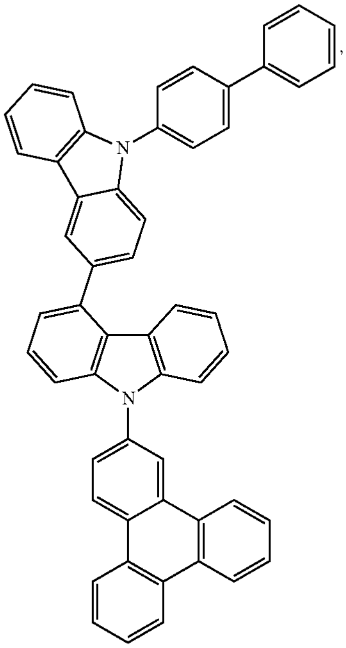
2-59
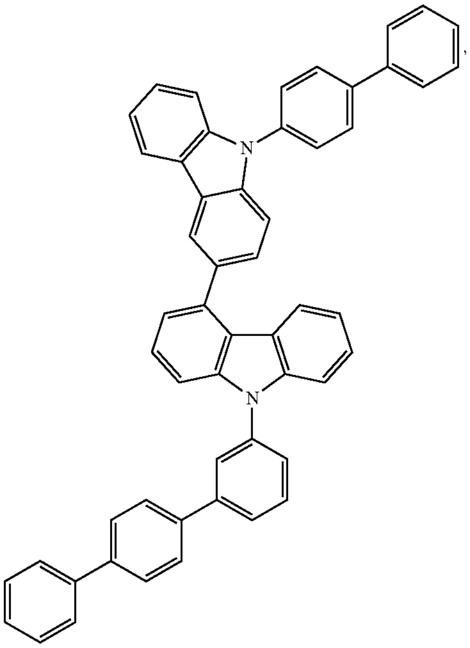

-continued
2-60
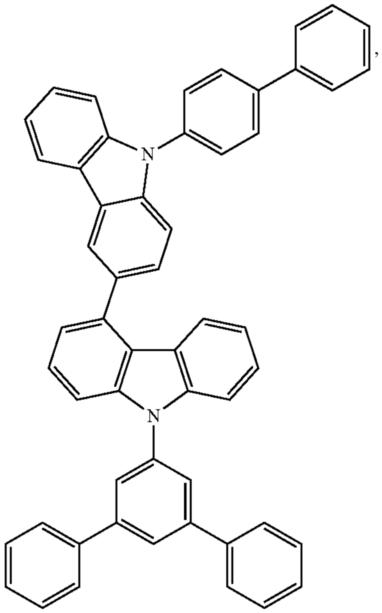
2-61
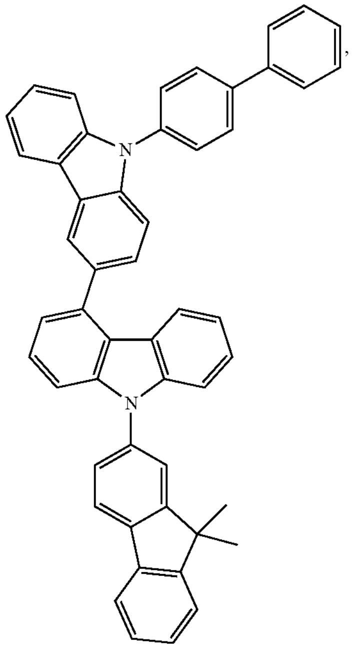
-continued
2-62
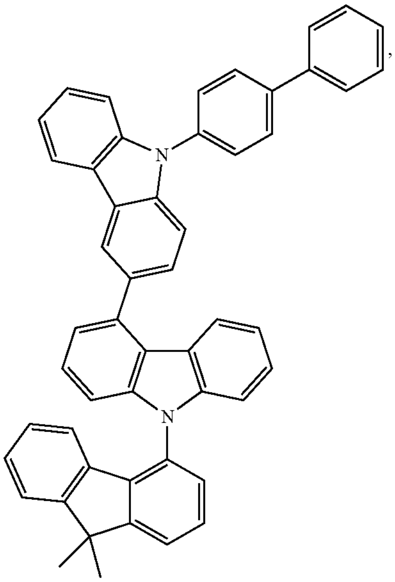
2-63
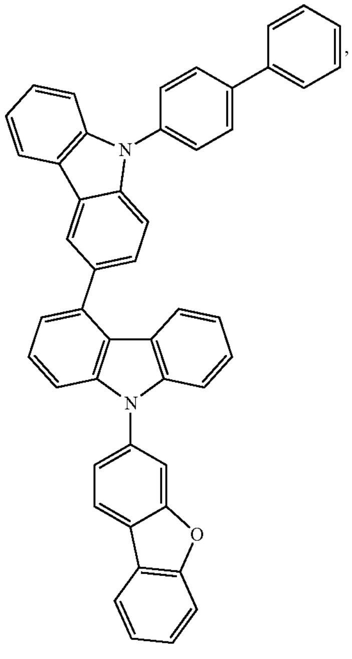

-continued
2-64
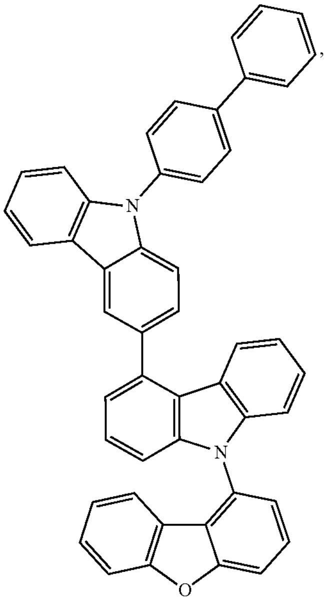
2-65
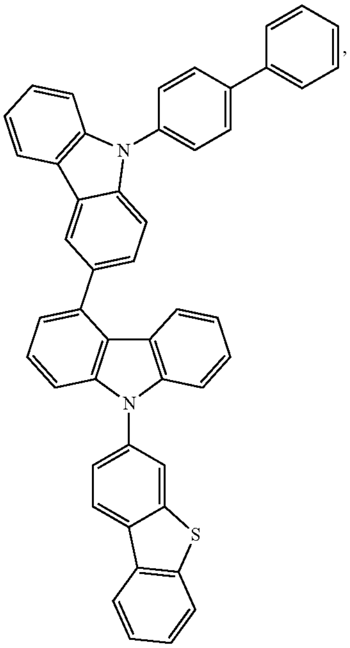
-continued
2-66
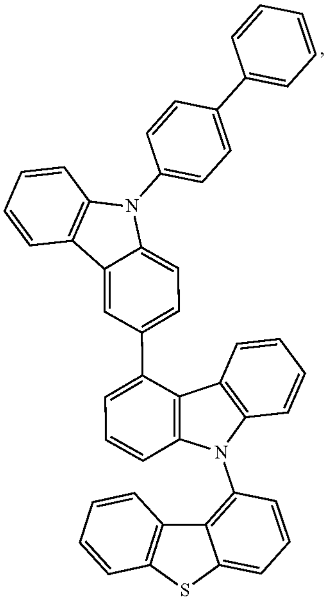
2-67
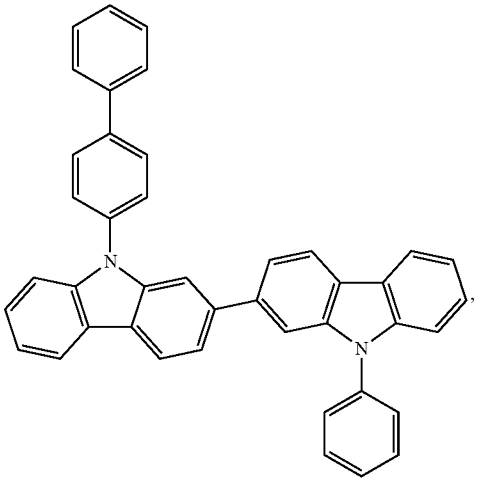
2-68
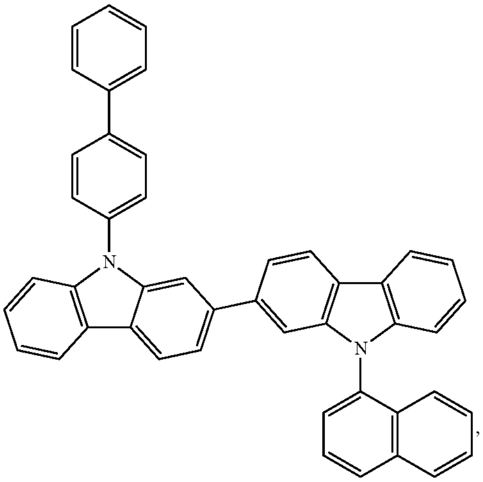

2-69
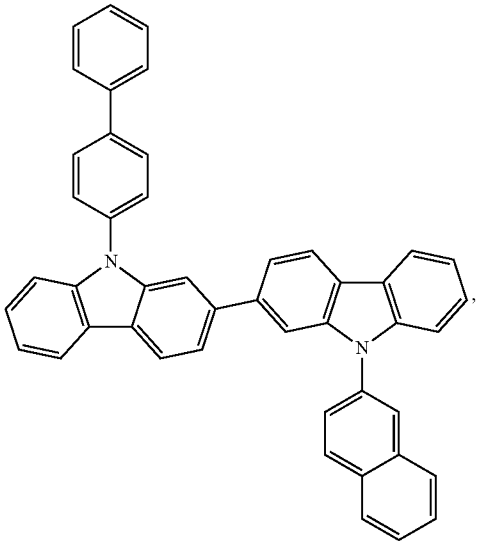
2-70
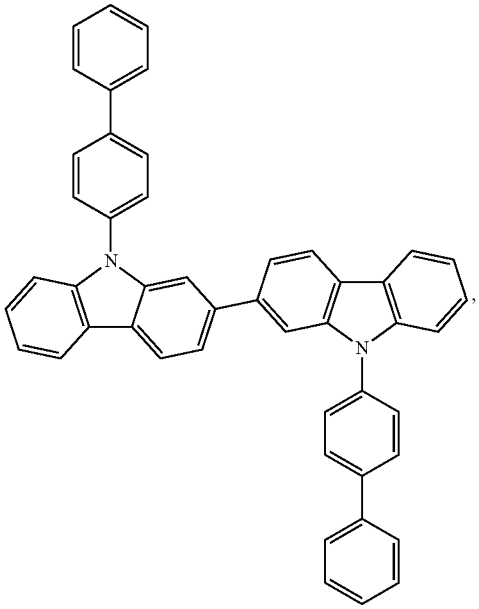
2-71
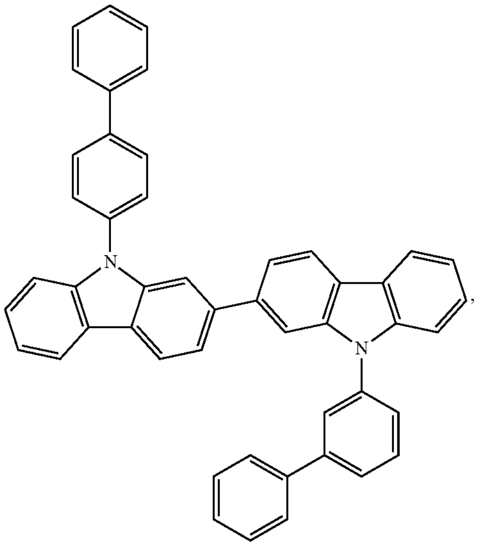
2-72
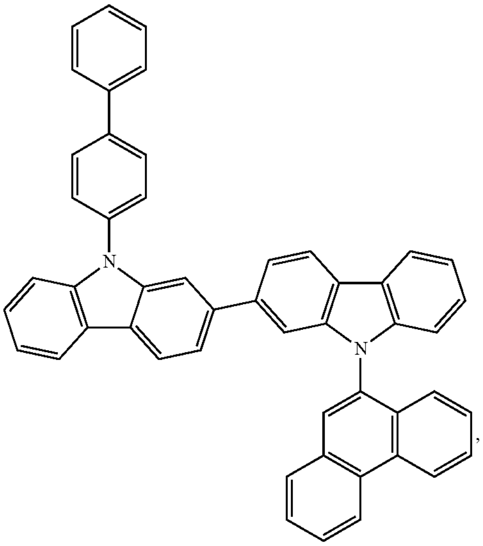

-continued
2-73
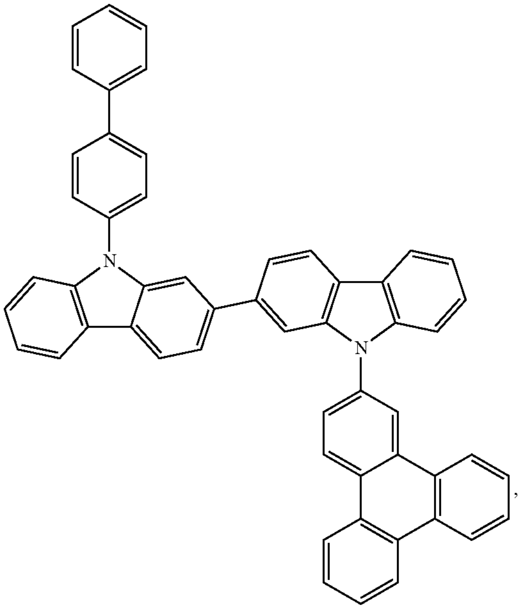
,
2-74
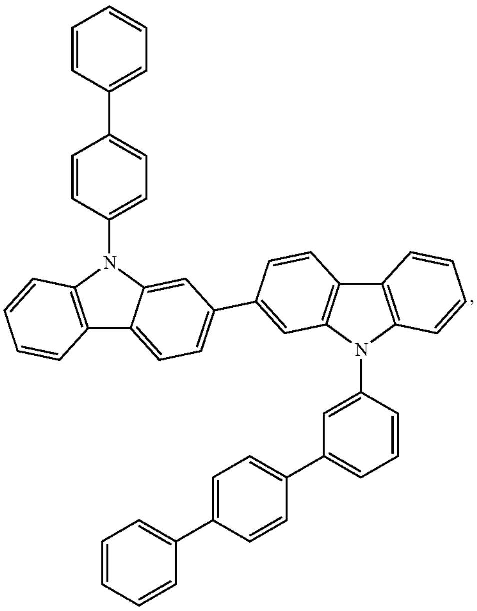
,
-continued
2-75
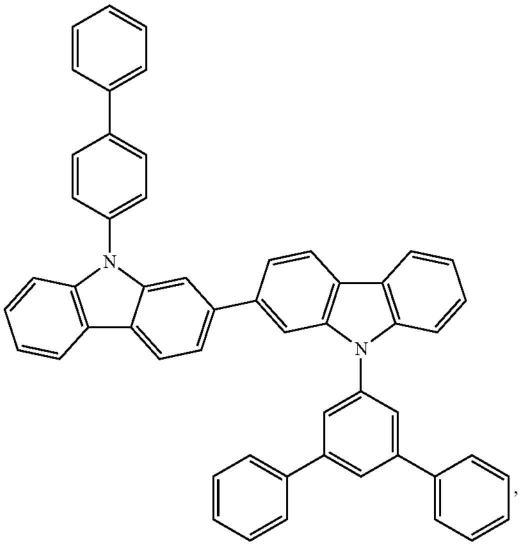
,
2-76
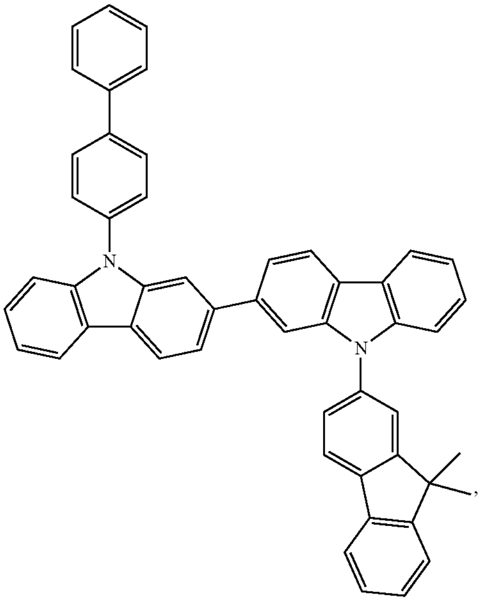
, -continued
2-77
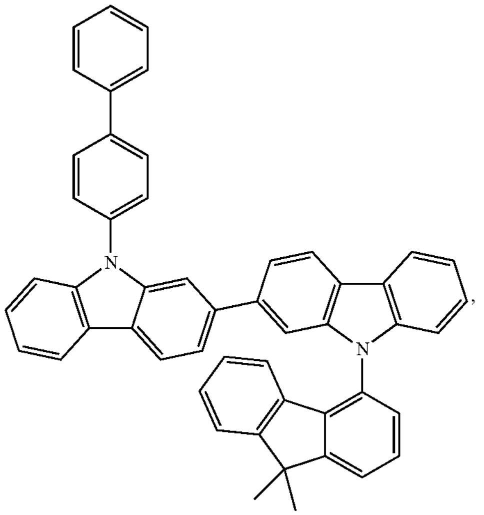
2-78
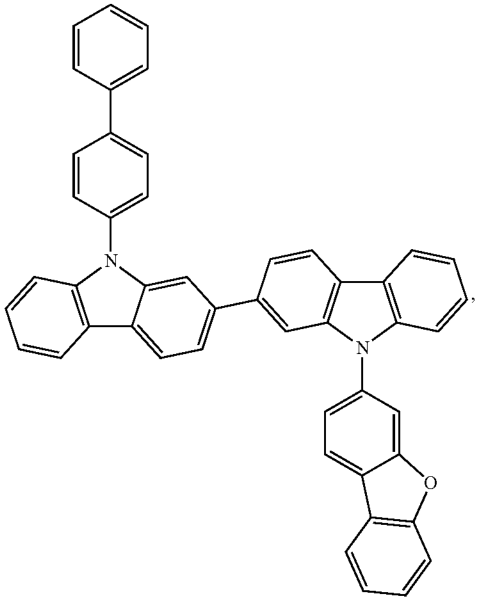
2-79
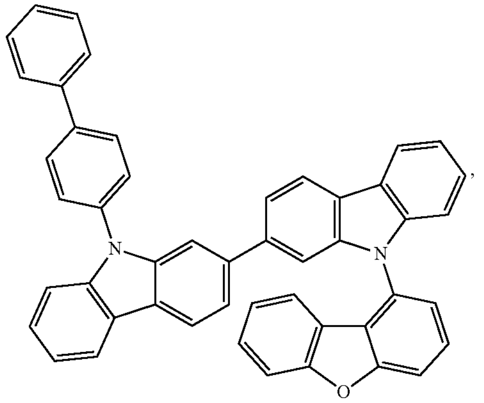
-continued
2-80
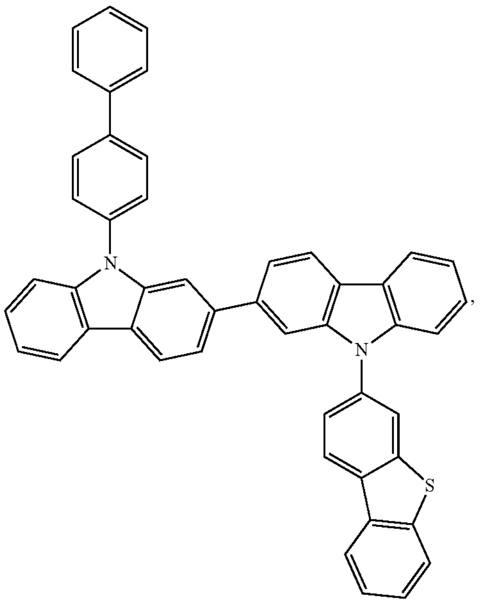
2-81
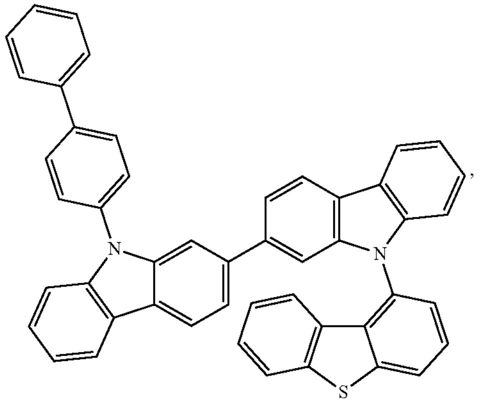
2-82
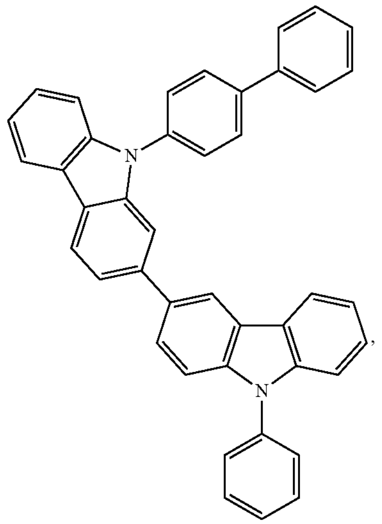

-continued
2-83
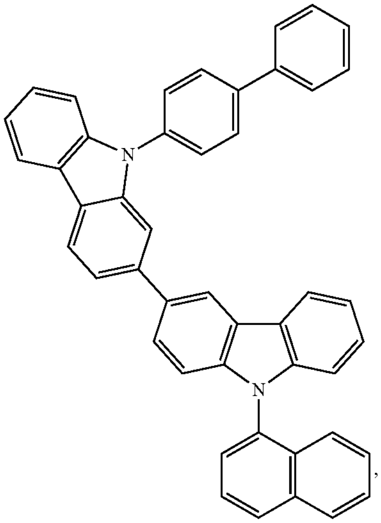,
2-84
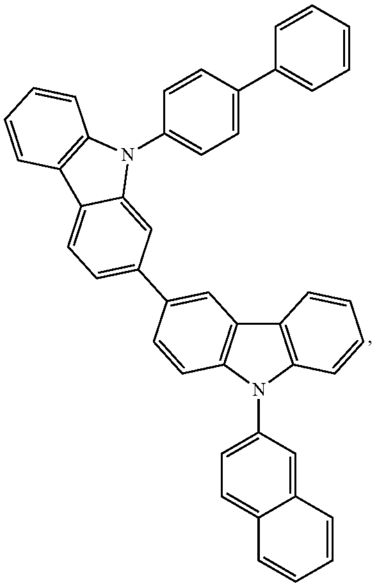,
-continued
2-85
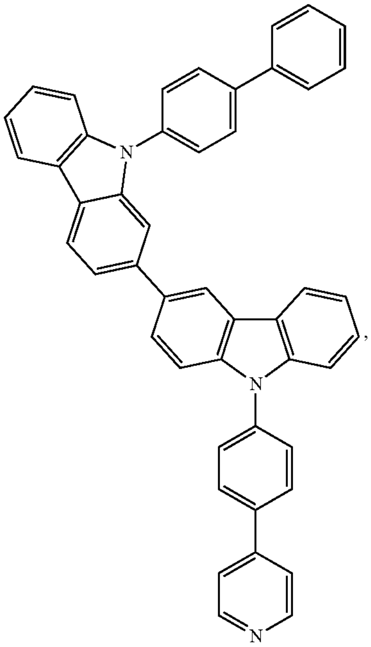,
2-86
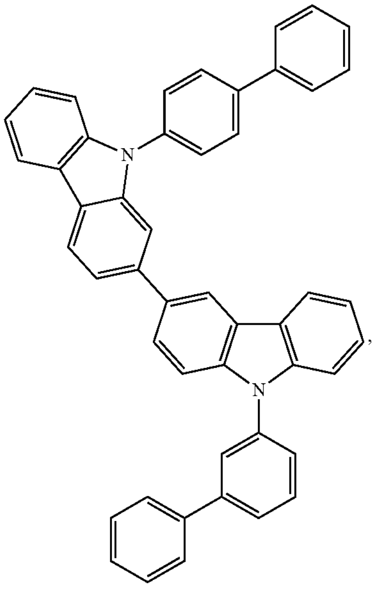, -continued
2-87
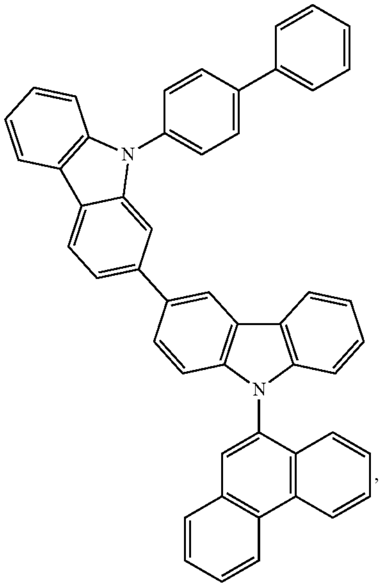
2-88
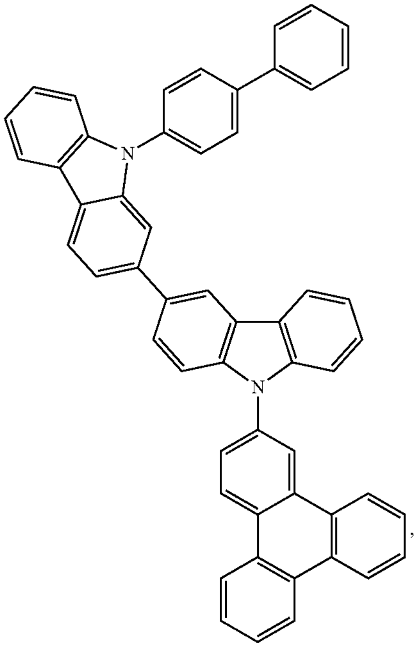
-continued
2-89
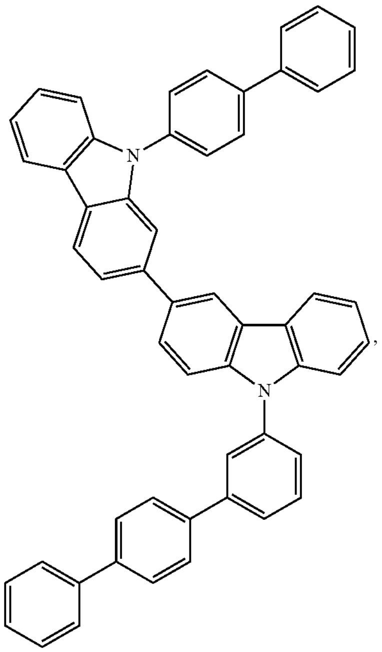
2-90
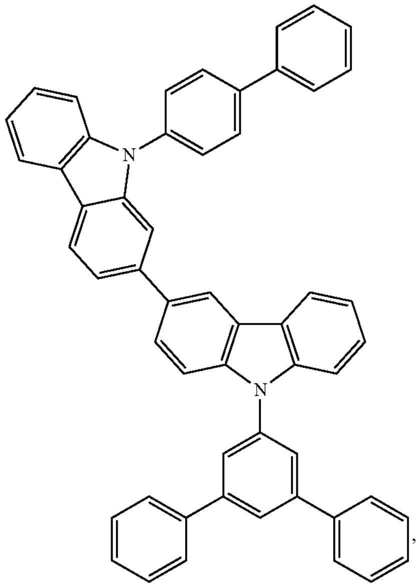

-continued
2-91
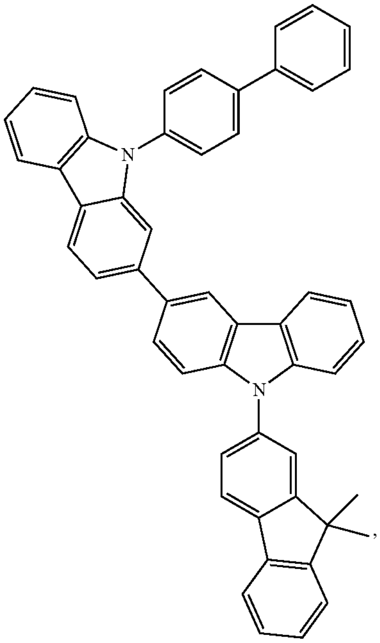
,
2-92
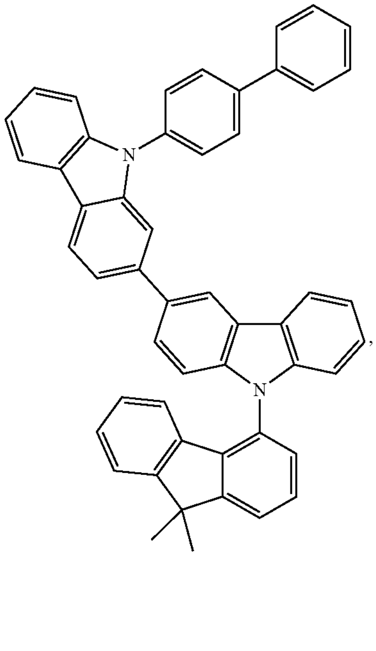
,
-continued
2-93
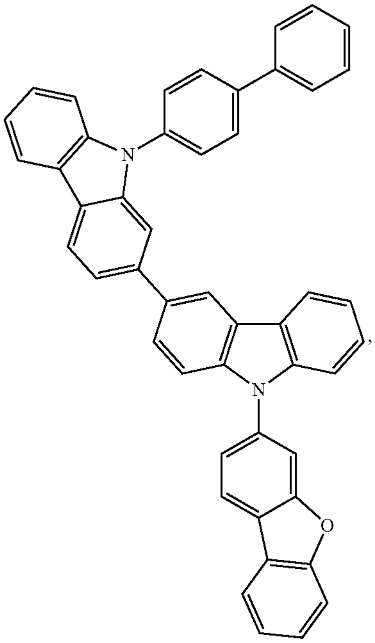
,
2-94
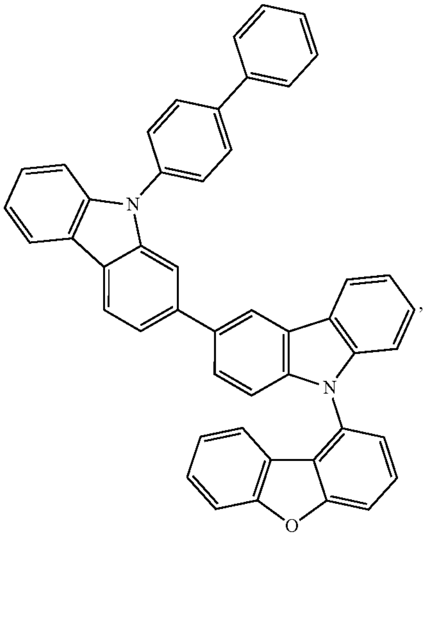
, -continued
2-95
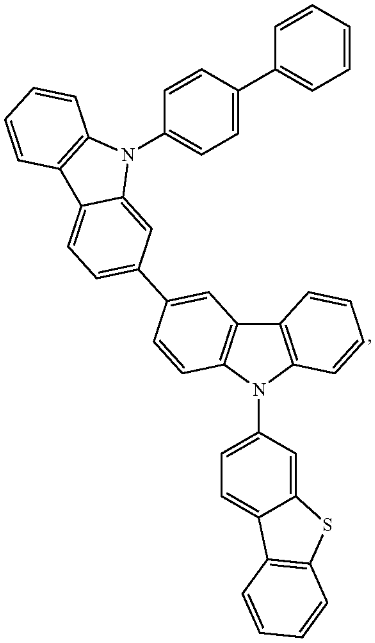
,
2-96
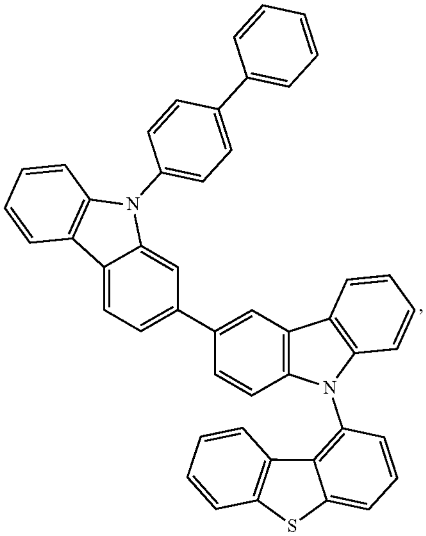
,
2-97
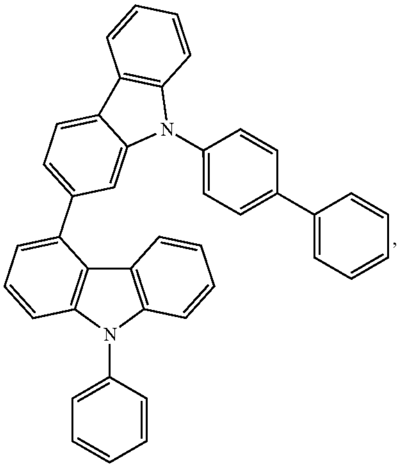
,
-continued
2-98
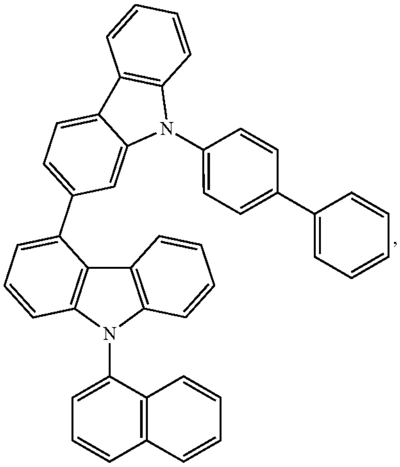
,
2-99
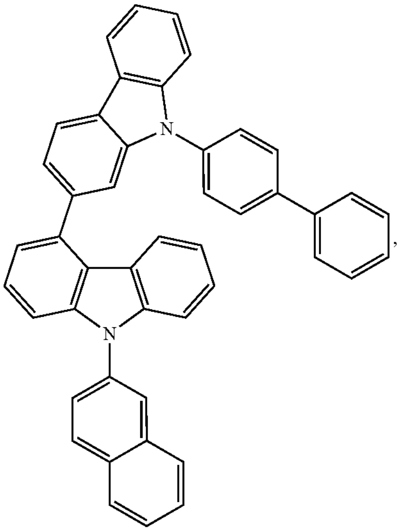
,
2-100
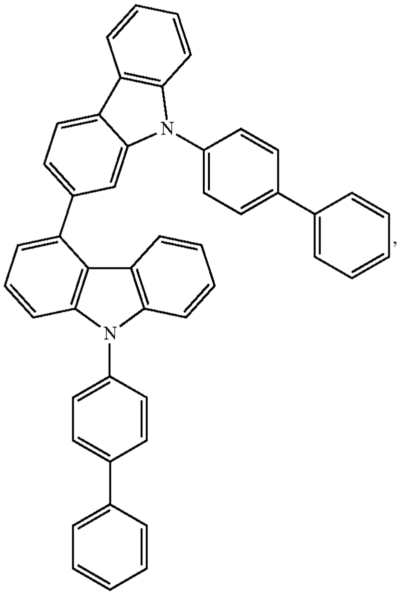
, -continued
2-101
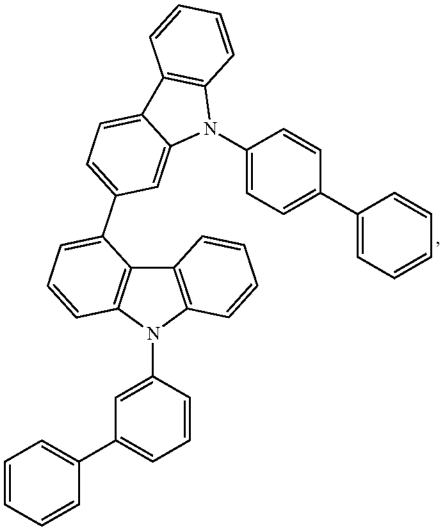
,
2-102
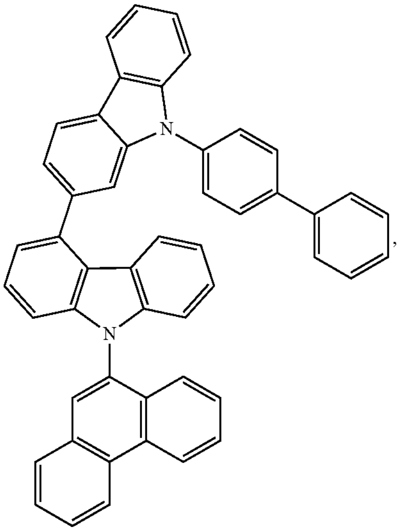
,
2-103
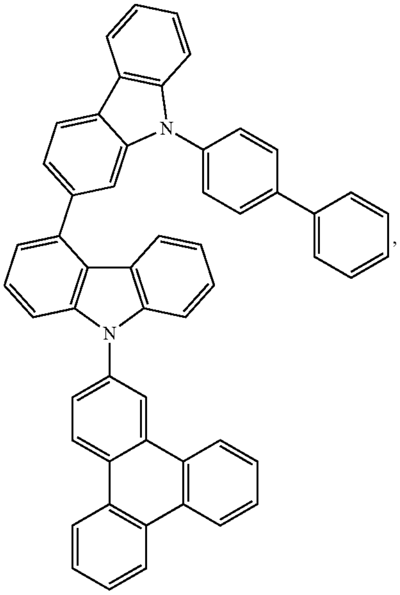
,
-continued
2-104
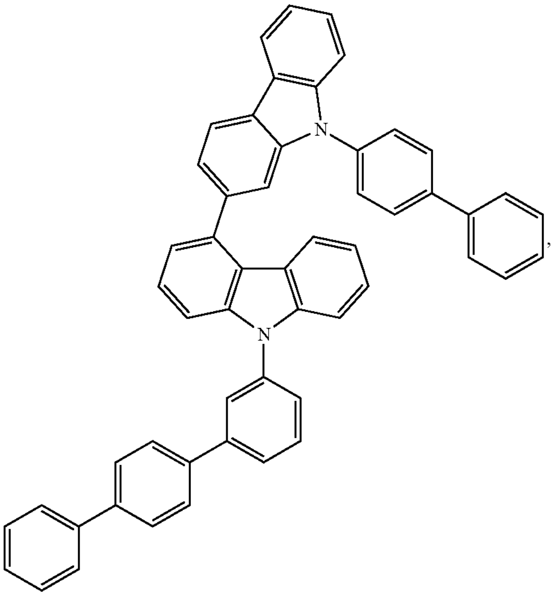
,
2-105
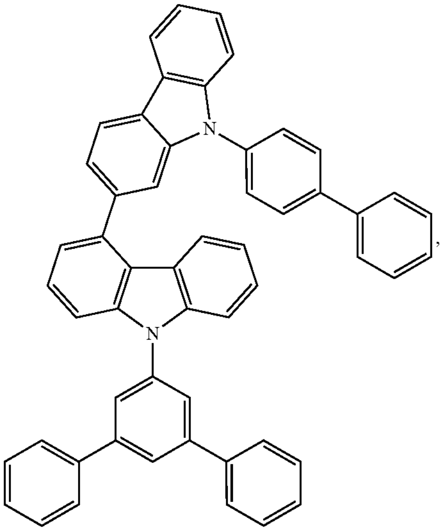
, -continued
2-106
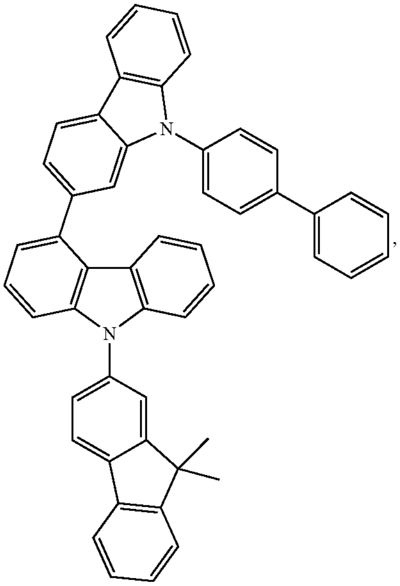
,
2-107
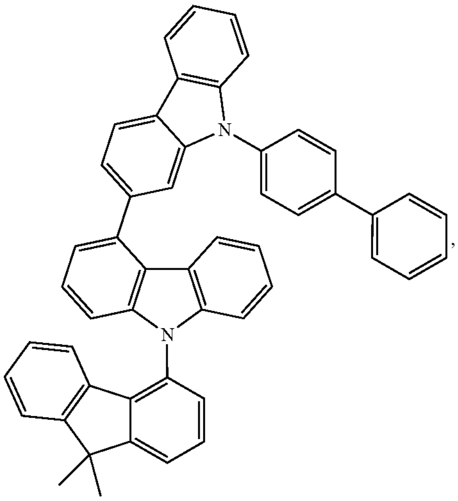
,
-continued
2-108
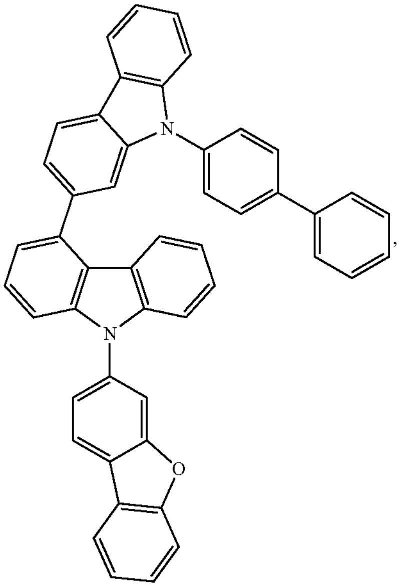
,
2-109
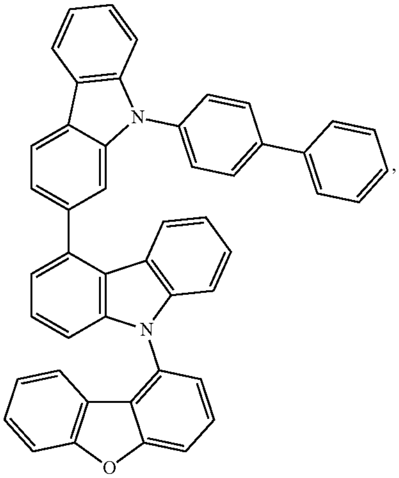
,
2-110
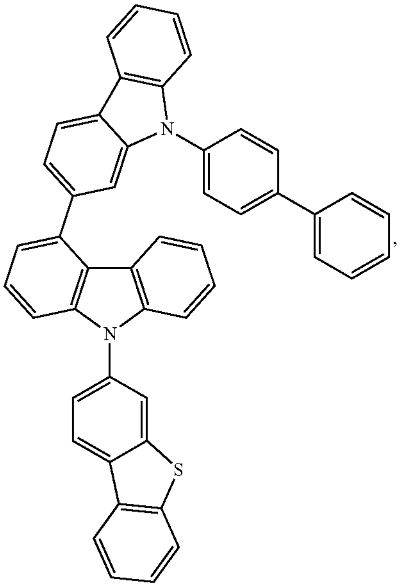
, -continued
2-111
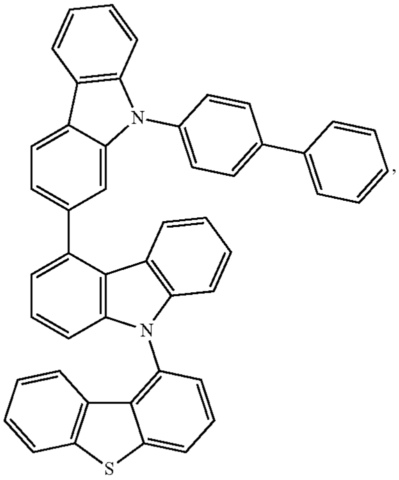
,
2-112
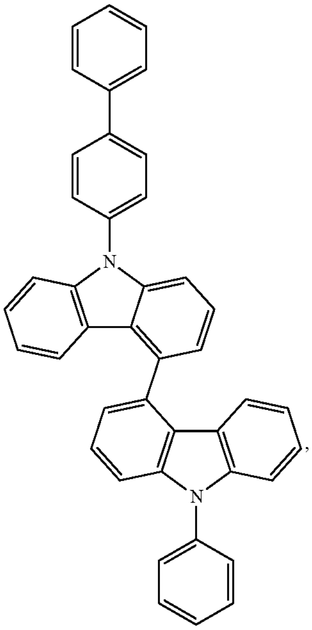
,
-continued
2-113
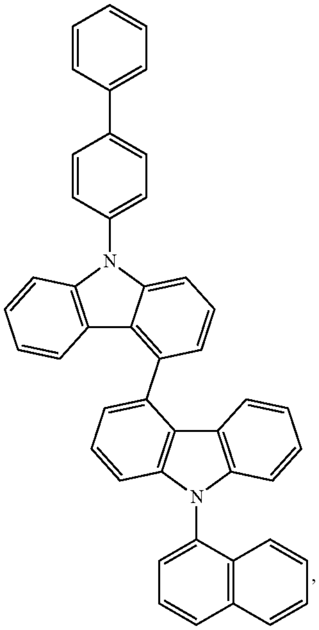
,
2-114
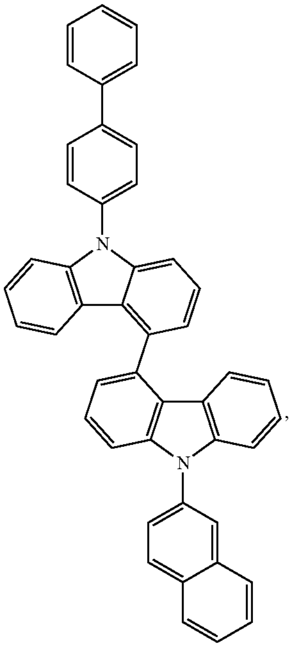
, -continued
2-115
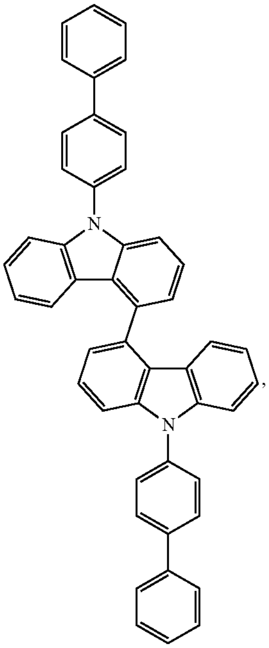
,
2-116
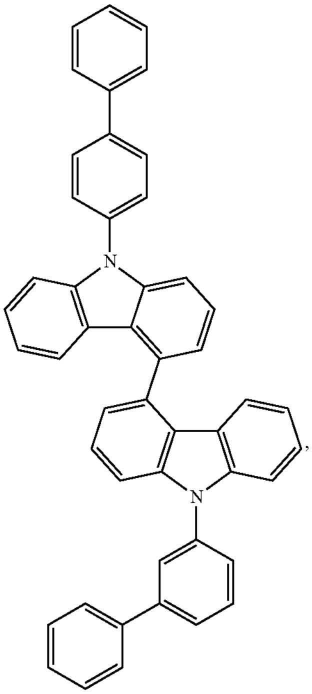
,
-continued
2-117
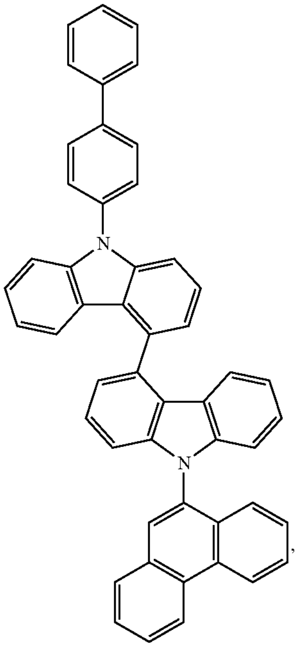
,
2-118
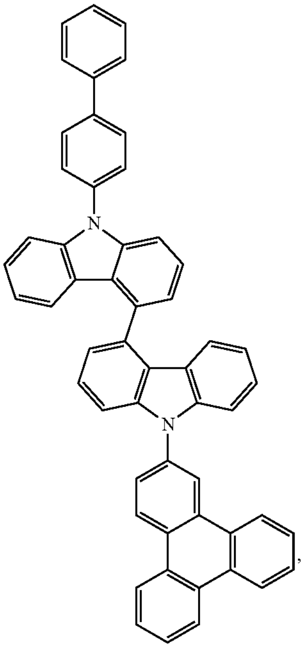
, -continued
2-119
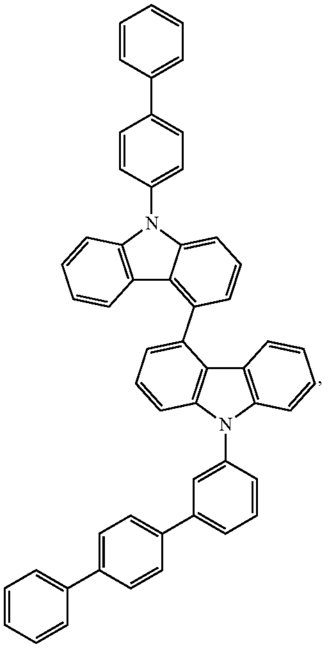
2-120
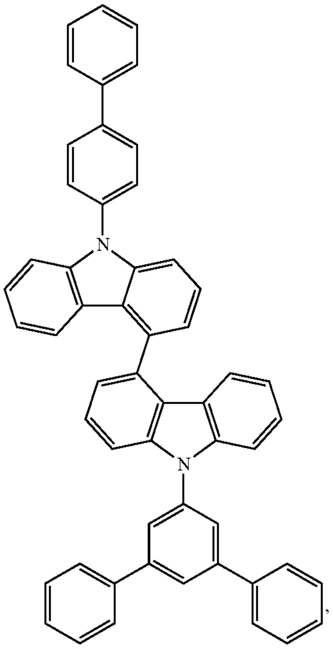
-continued
2-121
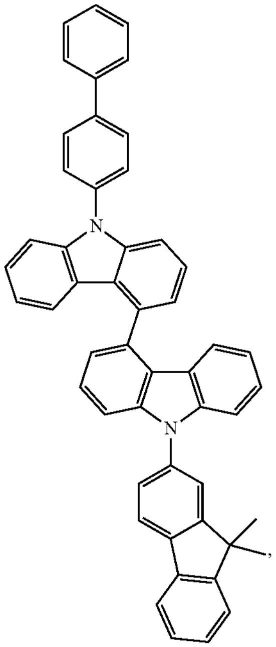
2-122
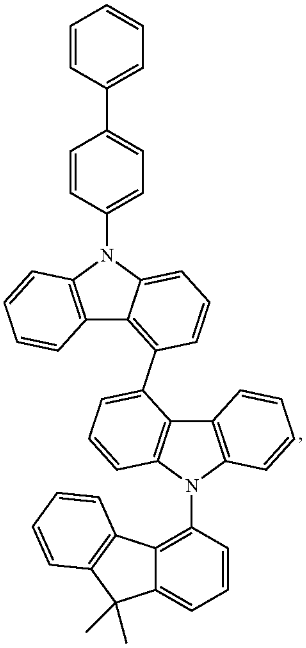

-continued
2-123
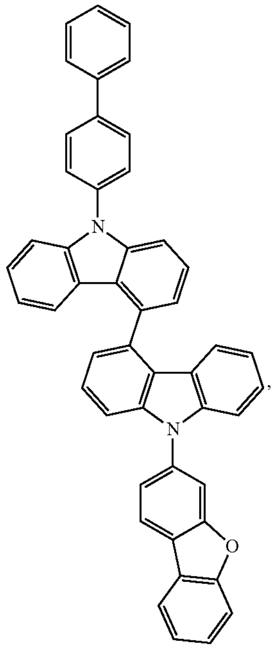
,
2-124
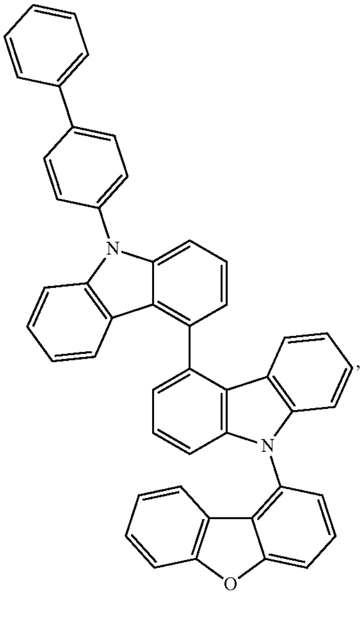
,
-continued
2-125
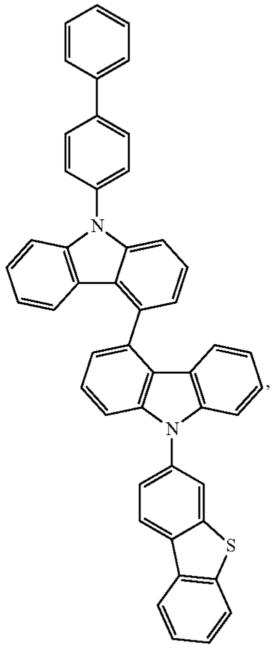
,
2-126
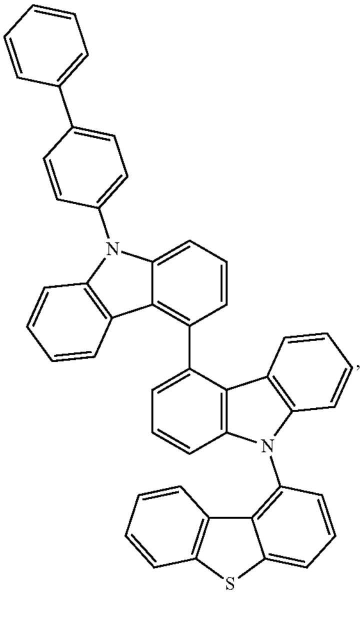
, -continued
2-127
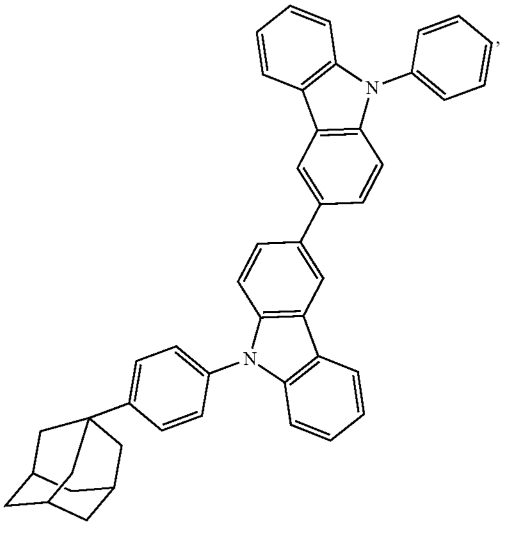
2-128
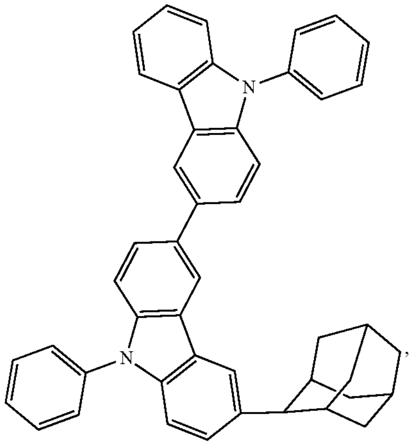
2-129
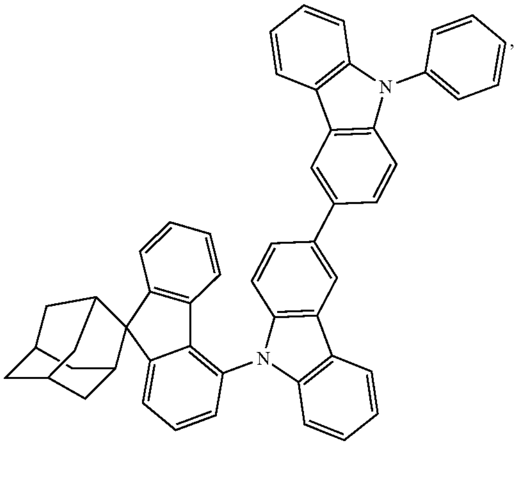
-continued
2-130
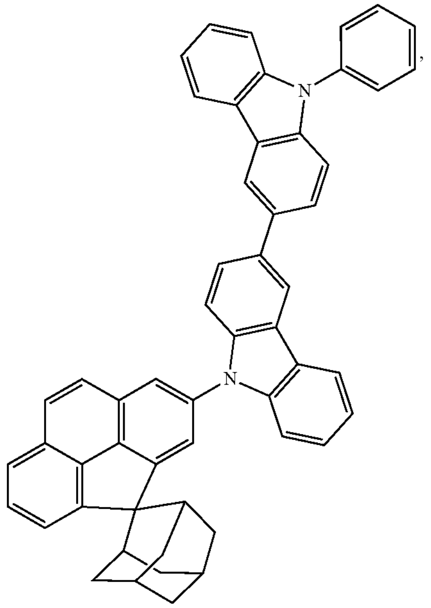
2-131
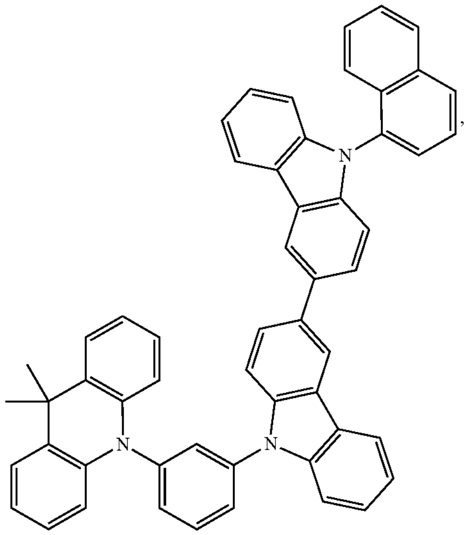
2-132
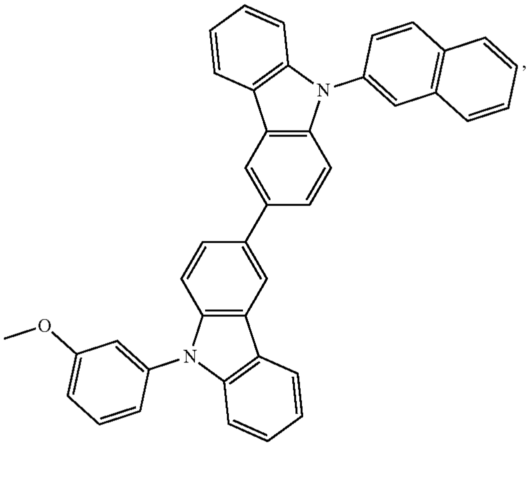

-continued 2-133

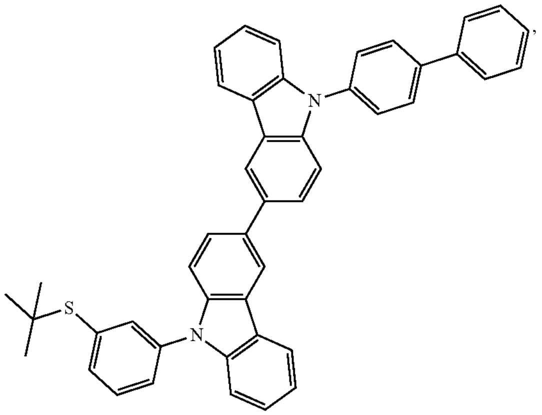

2-134

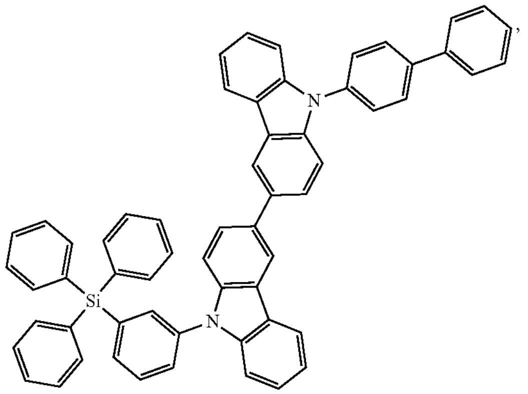

, and 2-135

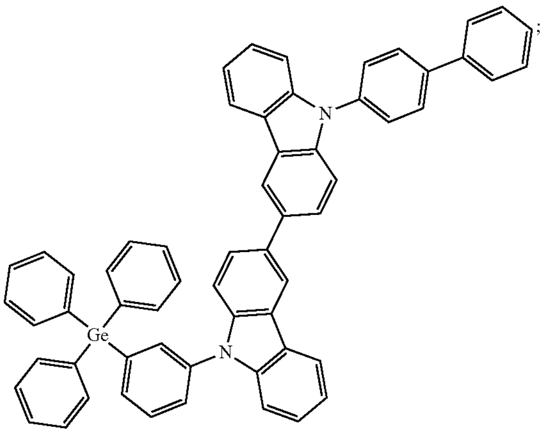

;

wherein optionally, hydrogen in Compound 2-1 to Compound 2-135 can be partially or fully substituted with deuterium.

12. The electroluminescent device of claim 1, wherein the organic layer is an emissive layer, and the first compound and the second compound are host materials.

13. The electroluminescent device of claim 12, wherein the emissive layer further includes at least one phosphorescent material.

14. The electroluminescent device of claim 13, wherein the phosphorescent material is a metal complex, and the metal complex has a general formula of $M(L_a)_m(L_b)_n(L_c)_q$;

M is selected from a metal with a relative atomic mass greater than 40;

$L_a$, $L_b$ and $L_c$ are a first ligand, a second ligand and a third ligand coordinated to M, respectively; $L_a$, $L_b$ and $L_c$ can be optionally joined to form a multidentate ligand; $L_a$, $L_b$ and $L_c$ can be identical or different; mis 1, 2 or 3; n is 0, 1 or 2; q is 0, 1 or 2; the sum of m, n and q is equal to the oxidation state of M; when m is greater than or equal to 2, multiple $L_a$ may be identical or different; when n is 2, two $L_b$ may be identical or different; when q is 2, two $L_c$ may be identical or different;

$L_a$ has a structure represented by Formula 3:

Formula 3

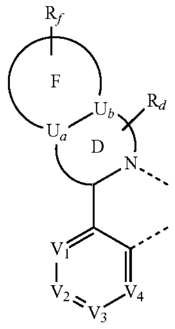

wherein, the ring D is selected from a five-membered heteroaromatic ring or a six-membered heteroaromatic ring;

the ring F is selected from a five-membered unsaturated carbocyclic ring, a benzene ring, a five-membered heteroaromatic ring or a six-membered heteroaromatic ring;

the ring D and the ring F are fused via $U_a$ and $U_b$;

$U_a$ and $U_b$ are, at each occurrence identically or differently, selected from C or N;

$R_d$ and $R_f$ represent, at each occurrence identically or differently, mono-substitution, multiple substitutions or non-substitution;

$V_1$ to $V_4$ are, at each occurrence identically or differently, selected from $CR_v$ or N;

$R_d$, $R_f$ and $R_v$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_d$, $R_f$, $R_v$ can be optionally joined to form a ring;

$L_b$ and $L_c$ are, at each occurrence identically or differently, selected from any one of the following structures:

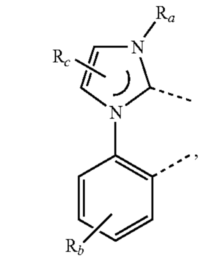
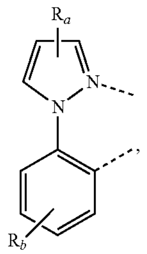
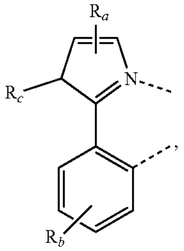
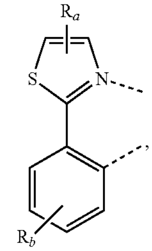
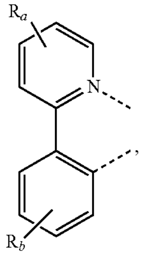
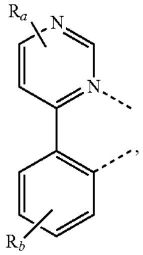
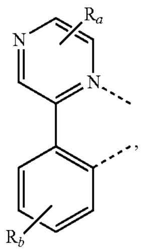
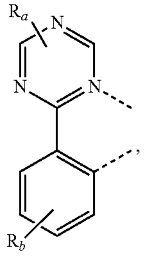
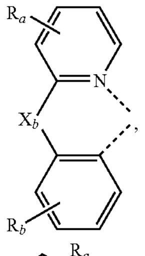
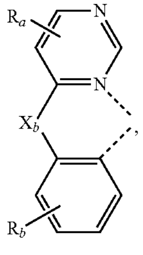
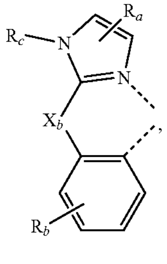
and
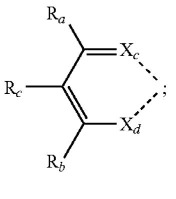

wherein, $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NRN_1$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

in structures of the ligand $L_b$ and the ligand $L_c$, adjacent substituents $R_a$, $R_b$, $R_c$, $R_{N1}$, $R_{N2}$, $R_{C1}$ and $R_{C2}$ can be optionally joined to form a ring.

15. The electroluminescent device of claim 13, wherein the phosphorescent material is a metal complex, and the metal complex has a general formula of $M(L_a)_m(L_b)_n$;

M is selected from a metal with a relative atomic mass greater than 40;

$L_a$ and $L_b$ are a first ligand and a second ligand coordinated to M, respectively; $L_a$ and $L_b$ can be optionally joined to form a multidentate ligand; m is 1, 2 or 3; n is 0, 1 or 2; the sum of m and n is equal to the oxidation state of M; when m is greater than or equal to 2, multiple $L_a$ may be identical or different; when n is 2, two $L_b$ may be identical or different;

$L_a$ has a structure represented by Formula 3:

Formula 3

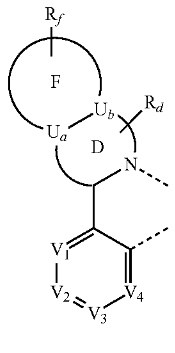

wherein, the ring D is selected from a five-membered heteroaromatic ring or a six-membered heteroaromatic ring;

the ring F is selected from a five-membered unsaturated carbocyclic ring, a benzene ring, a five-membered heteroaromatic ring or a six-membered heteroaromatic ring;

the ring D and the ring F are fused via $U_a$ and $U_b$;

$U_a$ and $U_b$ are, at each occurrence identically or differently, selected from C or N;

$R_d$ and $R_f$ represent, at each occurrence identically or differently, mono-substitution, multiple substitutions or non-substitution;

$V_1$ to $V_4$ are, at each occurrence identically or differently, selected from $CR_v$ or N;

$R_d$, $R_f$ and $R_v$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_d$, $R_f$, $R_v$ can be optionally joined to form a ring;

the ligand $L_b$ has the following structure:

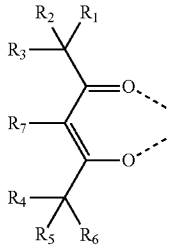

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

16. A compound composition, comprising a first compound and a second compound, wherein the first compound has a structure of H-L-E, wherein H has a structure represented by Formula 1:

Formula 1

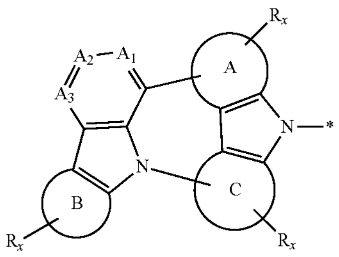

wherein in Formula 1, $A_1$, $A_2$ and $A_3$ are, at each occurrence identically or differently, selected from N or CR, and the ring A, the ring B and the ring C are, at each occurrence identically or differently, selected from a carbocyclic ring having 5 to 18 carbon atoms or a heterocyclic ring having 3 to 18 carbon atoms;

$R_x$ represents, at each occurrence identically or differently, mono-substitution, multiple substitutions or non-substitution;

E has a structure represented by Formula 1-a:

Formula 1-a

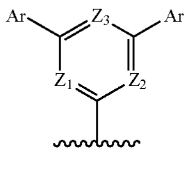

wherein in Formula 1-a, Ar is, at each occurrence identically or differently, selected from substituted or unsubstituted aryl having 6 to 30 carbon atoms, unsubstituted dibenzofuranyl, unsubstituted dibenzothienyl, unsubstituted carbazolyl, unsubstituted pyridyl, or unsubstituted pyrimidinyl; wherein when Ar is substituted aryl, it means that the aryl may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted alkylsilyl having 3 to 20 carbon atoms, unsubstituted arylsilyl group having 6 to 20 carbon atoms, unsubstituted alkylgermanyl having 3 to 20 carbon atoms, unsubstituted arylgermanyl having 6 to 20 carbon atoms, diphenylamino, unsubstituted amino having 0 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

$Z_1$ to $Z_3$ are N;

L is selected from a single bond, or substituted or unsubstituted arylene having 6 to 30 carbon atoms;

R, and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, $R_x$ can be optionally joined to form a ring;

"*" represents a position wherein H is joined to L;

the second compound has a structure represented by Formula 2:

Formula 2

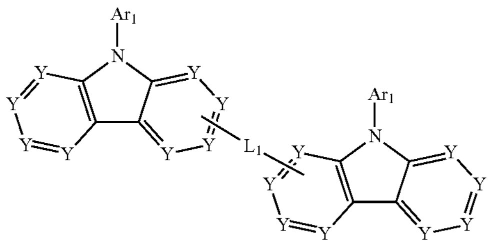

wherein,

Y is, at each occurrence identically or differently, selected from C, $CR_Y$ or N;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms or combinations thereof;

$R_Y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or combinations thereof;

adjacent substituents $R_Y$ can be optionally joined to form a ring.

17. The electroluminescent device of claim 1, wherein at least one of R and $R_x$ is selected from deuterium, fluorine, cyano, hydroxyl, sulfanyl, methyl, trideuteromethyl, vinyl, phenyl, biphenyl, naphthyl, 4-cyanophenyl, dibenzofuryl, dibenzothienyl, triphenylenyl, carbazolyl, 9-phenylcarbazolyl, 9,9-dimethylfluorenyl, pyridyl, phenylpyridyl or combinations thereof.

18. The electroluminescent device of claim 1, wherein $Z_1$ to $Z_3$ are N;

Ar is, at each occurrence identically or differently, selected from the group consisting of: phenyl, deuterated phenyl, methylphenyl, fluorophenyl, tert-butylphenyl, trideuterated methylphenyl, biphenyl, naphthyl, deuterated naphthyl, dibenzofuranyl, dibenzothienyl, 9,9-dimethylfluorenyl, carbazolyl, pyridyl, pyrimidinyl, 4-cyanophenyl, 3-cyanophenyl, triphenylenyl and combinations thereof.

19. The electroluminescent device of claim 6, wherein Lis selected from the group consisting of the following structures:

L-0
a single bond,
L-1
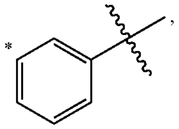
,
L-2
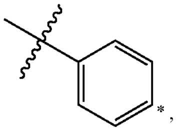
,
L-3
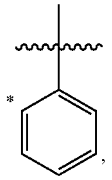
,
L-4
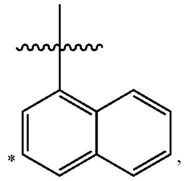
,
L-5
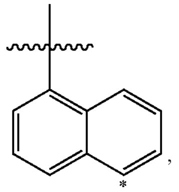
,
L-6
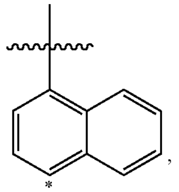
,
L-7
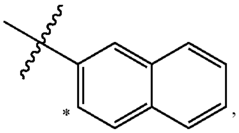
,
L-8
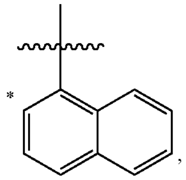
,
L-9
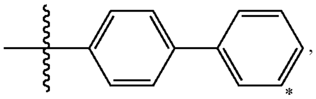
,
-continued
L-10
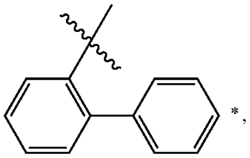
,
L-11
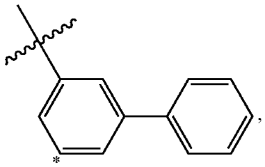
,
L-12
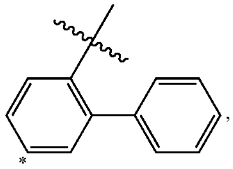
,
L-13
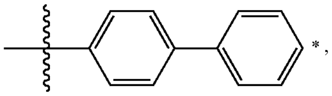
,
L-14
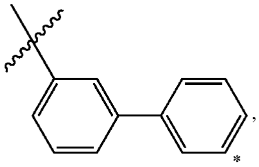
,
L-17
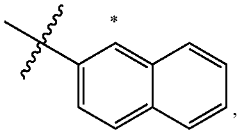
,
L-18
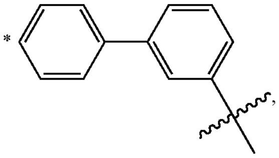
,
L-19
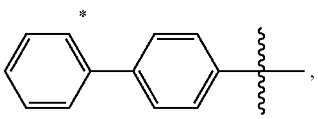
,
L-21
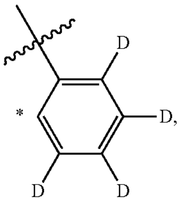
, -continued

L-22

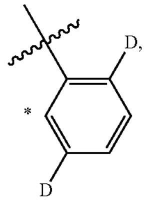

L-23

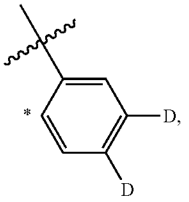

L-24

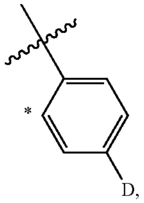

L-25

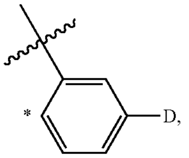

L-26

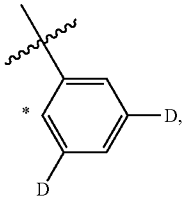

and

L-27

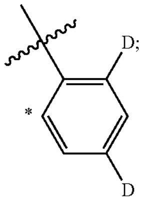

wherein

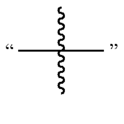

represents a position wherein a structure of L-1 to L-14, L-17 to L-19, L-21 to L-27 is joined to E, and "*" represents a position wherein a structure of L-1 to L-14, L-17 to L-19, L-21 to L-27 is joined to H;

optionally, hydrogens in the structures of L-1 to L-14, L-17 to L-19, L-21 to L-27 can be partially or fully substituted with deuterium.

20. The electroluminescent device of claim 19, wherein the first compound has the structure of H-L-E, wherein H is selected from any one of the group consisting of H-1 to H-139, L is selected from any one of the group consisting of L-0 to L-14, L-17 to L-19, and L-21 to L-27, and E is selected from any one of the group consisting of E-1 to E-27, E-30, E-33 to E-38, E-41 to E-56, E-74 to E-85 and E-87 to E-92; optionally, hydrogens in the first compound can be partially or fully substituted with deuterium.

21. The electroluminescent device of claim 20, wherein the first compound is selected from the group consisting of Compound 1-1 to Compound 1-35, Compound 1-37, Compound 1-39 to Compound 1-45, Compound 1-47 to Compound 1-54, Compound 1-56, Compound 1-58 to Compound 1-60, Compound 1-62, Compound 1-64 to Compound 1-76, Compound 1-78, Compound 1-80 to Compound 1-85, Compound 1-87, Compound 1-89 to Compound 1-95, Compound 1-97 to Compound 1-112, Compound 1-114, Compound 1-116, Compound 1-118, Compound 1-120, Compound 1-122, Compound 1-124, Compound 1-126, Compound 1-128, Compound 1-130, Compound 1-132, Compound 1-134, Compound 1-140, Compound 1-142, Compound 1-144, Compound 1-147 to Compound 1-159, Compound 1-161, Compound 1-163 to Compound 1-165, Compound 1-167, Compound 1-169 to Compound 1-181, Compound 1-183, Compound 1-185, Compound 1-187, Compound 1-189 to Compound 1-195, Compound 1-197 to Compound 1-217, Compound 1-219, Compound 1-225, Compound 1-231, Compound 1-233, Compound 1-235, Compound 1-237, Compound 1-239, Compound 1-241, Compound 1-247, Compound 1-249, Compound 1-251 to Compound 1-278, Compound 1-280, Compound 1-282, Compound 1-284, Compound 1-286, Compound 1-288, Compound 1-290, Compound 1-292, Compound 1-294, Compound 1-296, Compound 1-298, Compound 1-300, Compound 1-302, Compound 1-304, Compound 1-306, Compound 1-308, Compound 1-310, Compound 1-312 to Compound 1-386, Compound 1-388, Compound 1-390 to Compound 1-392, Compound 1-394, Compound 1-396 to Compound 1-408, Compound 1-410, Compound 1-412 to Compound 1-444, Compound 1-446, Compound 1-448, Compound 1-450, Compound 1-452, Compound 1-454, Compound 1-456, Compound 1-458, Compound 1-460, Compound 1-462, Compound 1-464, Compound 1-466, Compound 1-468, Compound 1-470, Compound 1-472, Compound 1-474, Compound 1-476, Compound 1-478 to Compound 1-522, Compound 1-524, Compound 1-526 to Compound 1-532, Compound 1-534 to Compound 1-540, Compound 1-542 to Compound 1-547, wherein Compound 1-1 to Compound 1-35, Compound 1-37, Compound 1-39 to Compound 1-45, Compound 1-47 to Compound 1-54, Compound 1-56, Compound 1-58 to Compound 1-60, Compound 1-62, Compound 1-64 to Compound 1-76, Compound 1-78, Compound 1-80 to Compound 1-85, Compound 1-87, Compound 1-89 to Compound 1-95, Compound 1-97 to Compound 1-112, Compound 1-114, Compound 1-116, Compound 1-118, Compound 1-120, Compound 1-122, Compound 1-124, Compound 1-126, Compound 1-128, Compound 1-130, Compound 1-132, Compound 1-134, Compound 1-140, Compound 1-142, Compound 1-144, Compound 1-147 to Compound 1-159, Compound 1-161, Compound 1-163 to Compound 1-165, Compound 1-167, Compound 1-169 to Compound 1-181, Compound 1-183, Compound 1-185, Compound 1-187, Compound 1-189 to Compound 1-195, Compound 1-197 to Compound 1-217, Compound 1-219, Compound 1-225, Compound 1-231, Compound 1-233, Compound 1-235, Compound 1-237, Compound 1-239, Compound 1-241, Compound 1-247, Compound 1-249, Compound 1-251 to Compound 1-278, Compound 1-280, Compound 1-282, Compound 1-284, Compound 1-286, Compound 1-288, Compound 1-290, Compound 1-292, Compound 1-294, Compound 1-296, Compound 1-298, Compound 1-300, Compound 1-302, Compound 1-304, Compound 1-306, Compound 1-308, Compound 1-310, Compound 1-312 to Compound 1-386, Compound 1-388, Compound 1-390 to Compound 1-392, Compound 1-394, Compound 1-396 to Compound 1-408, Compound 1-410, Compound 1-412 to Compound 1-444, Compound 1-446, Compound 1-448, Compound 1-450, Compound 1-452, Compound 1-454, Compound 1-456, Compound 1-458, Compound 1-460, Compound 1-462, Compound 1-464, Compound 1-466, Compound 1-468, Compound 1-470, Compound 1-472, Compound 1-474, Compound 1-476, Compound 1-478 to Compound 1-522, Compound 1-524, Compound 1-526 to Compound 1-532, Compound 1-534 to Compound 1-540, Compound 1-542 to Compound 1-547 have the structure of H-L-E, and H, L and E correspond to structures shown in the following table, respectively:

| Compound No. | H | L | E | Compound No. | H | L | E |
|---|---|---|---|---|---|---|---|
| 1-1 | H-1 | L-0 | E-1 | 1-2 | H-1 | L-23 | E-1 |
| 1-3 | H-1 | L-0 | E-2 | 1-4 | H-1 | L-24 | E-1 |
| 1-5 | H-1 | L-0 | E-3 | 1-6 | H-1 | L-25 | E-1 |
| 1-7 | H-1 | L-0 | E-4 | 1-8 | H-1 | L-26 | E-1 |
| 1-9 | H-1 | L-0 | E-5 | 1-10 | H-1 | L-27 | E-1 |
| 1-11 | H-1 | L-0 | E-6 | 1-12 | H-1 | L-2 | E-2 |
| 1-13 | H-1 | L-0 | E-7 | 1-14 | H-1 | L-4 | E-2 |
| 1-15 | H-1 | L-0 | E-8 | 1-16 | H-1 | L-5 | E-2 |
| 1-17 | H-1 | L-0 | E-9 | 1-18 | H-1 | L-6 | E-2 |
| 1-19 | H-1 | L-0 | E-10 | 1-20 | H-1 | L-7 | E-2 |
| 1-21 | H-1 | L-0 | E-11 | 1-22 | H-1 | L-8 | E-2 |
| 1-23 | H-1 | L-0 | E-12 | 1-24 | H-1 | L-9 | E-2 |
| 1-25 | H-1 | L-0 | E-13 | 1-26 | H-1 | L-10 | E-2 |
| 1-27 | H-1 | L-0 | E-14 | 1-28 | H-1 | L-11 | E-2 |
| 1-29 | H-1 | L-0 | E-15 | 1-30 | H-1 | L-12 | E-2 |
| 1-31 | H-1 | L-0 | E-16 | 1-32 | H-1 | L-13 | E-2 |
| 1-33 | H-1 | L-0 | E-17 | 1-34 | H-1 | L-14 | E-2 |
| 1-35 | H-1 | L-0 | E-18 | | | | |
| 1-37 | H-1 | L-0 | E-19 | | | | |
| 1-39 | H-1 | L-0 | E-20 | 1-40 | H-1 | L-17 | E-2 |
| 1-41 | H-1 | L-0 | E-21 | 1-42 | H-1 | L-18 | E-2 |
| 1-43 | H-1 | L-0 | E-22 | 1-44 | H-1 | L-19 | E-2 |
| 1-45 | H-1 | L-0 | E-23 | | | | |
| 1-47 | H-1 | L-0 | E-24 | 1-48 | H-1 | L-21 | E-2 |
| 1-49 | H-1 | L-0 | E-25 | 1-50 | H-1 | L-22 | E-2 |
| 1-51 | H-1 | L-0 | E-26 | 1-52 | H-1 | L-23 | E-2 |
| 1-53 | H-1 | L-0 | E-27 | 1-54 | H-1 | L-24 | E-2 |
| | | | | | H-1 | L-25 | E-2 |
| | | | | | H-1 | L-26 | E-2 |
| 1-59 | H-1 | L-0 | E-30 | 1-60 | H-1 | L-27 | E-2 |
| | | | | 1-62 | H-1 | L-2 | E-3 |
| | | | | 1-64 | H-1 | L-4 | E-3 |
| 1-65 | H-1 | L-0 | E-33 | 1-66 | H-1 | L-5 | E-3 |
| 1-67 | H-1 | L-0 | E-34 | 1-68 | H-1 | L-6 | E-3 |
| 1-69 | H-1 | L-0 | E-35 | 1-70 | H-1 | L-7 | E-3 |
| 1-71 | H-1 | L-0 | E-36 | 1-72 | H-1 | L-8 | E-3 |
| 1-73 | H-1 | L-0 | E-37 | 1-74 | H-1 | L-9 | E-3 |
| 1-75 | H-1 | L-0 | E-38 | 1-76 | H-1 | L-10 | E-3 |
| | | | | 1-78 | H-1 | L-11 | E-3 |
| | | | | 1-80 | H-1 | L-12 | E-3 |
| 1-81 | H-1 | L-0 | E-41 | 1-82 | H-1 | L-13 | E-3 |
| 1-83 | H-1 | L-0 | E-42 | 1-84 | H-1 | L-14 | E-3 |
| 1-85 | H-1 | L-0 | E-43 | | | | |
| 1-87 | H-1 | L-0 | E-44 | | | | |

-continued

| Compound No. | H | L | E | Compound No. | H | L | E |
|---|---|---|---|---|---|---|---|
| 1-89 | H-1 | L-0 | E-45 | 1-90 | H-1 | L-17 | E-3 |
| 1-91 | H-1 | L-0 | E-46 | 1-92 | H-1 | L-18 | E-3 |
| 1-93 | H-1 | L-0 | E-47 | 1-94 | H-1 | L-19 | E-3 |
| 1-95 | H-1 | L-0 | E-48 | | | | |
| 1-97 | H-1 | L-0 | E-49 | 1-98 | H-1 | L-21 | E-3 |
| 1-99 | H-1 | L-0 | E-50 | 1-100 | H-1 | L-22 | E-3 |
| 1-101 | H-1 | L-0 | E-51 | 1-102 | H-1 | L-23 | E-3 |
| 1-103 | H-1 | L-0 | E-52 | 1-104 | H-1 | L-24 | E-3 |
| 1-105 | H-1 | L-0 | E-53 | 1-106 | H-1 | L-25 | E-3 |
| 1-107 | H-1 | L-0 | E-54 | 1-108 | H-1 | L-26 | E-3 |
| 1-109 | H-1 | L-0 | E-55 | 1-110 | H-1 | L-27 | E-3 |
| 1-111 | H-1 | L-0 | E-56 | 1-112 | H-2 | L-2 | E-4 |
| | | | | 1-114 | H-3 | L-4 | E-5 |
| | | | | 1-116 | H-4 | L-5 | E-6 |
| | | | | 1-118 | H-5 | L-6 | E-7 |
| | | | | 1-120 | H-6 | L-7 | E-8 |
| | | | | 1-122 | H-7 | L-8 | E-9 |
| | | | | 1-124 | H-8 | L-9 | E-10 |
| | | | | 1-126 | H-9 | L-10 | E-11 |
| | | | | 1-128 | H-10 | L-11 | E-12 |
| | | | | 1-130 | H-11 | L-12 | E-13 |
| | | | | 1-132 | H-12 | L-13 | E-14 |
| | | | | 1-134 | H-13 | L-14 | E-15 |
| | | | | 1-140 | H-16 | L-17 | E-18 |
| | | | | 1-142 | H-17 | L-18 | E-19 |
| | | | | 1-144 | H-18 | L-19 | E-20 |
| 1-147 | H-1 | L-0 | E-74 | 1-148 | H-20 | L-21 | E-22 |
| 1-149 | H-1 | L-0 | E-75 | 1-150 | H-21 | L-22 | E-23 |
| 1-151 | H-1 | L-0 | E-76 | 1-152 | H-22 | L-23 | E-24 |
| 1-153 | H-1 | L-0 | E-77 | 1-154 | H-23 | L-24 | E-25 |
| 1-155 | H-1 | L-0 | E-78 | 1-156 | H-24 | L-25 | E-26 |
| 1-157 | H-1 | L-0 | E-79 | 1-158 | H-25 | L-26 | E-27 |
| 1-159 | H-1 | L-0 | E-80 | | | | |
| 1-161 | H-1 | L-0 | E-81 | | | | |
| 1-163 | H-1 | L-0 | E-82 | 1-164 | H-28 | L-4 | E-30 |
| 1-165 | H-1 | L-0 | E-83 | | | | |
| 1-167 | H-1 | L-1 | E-1 | | | | |
| 1-169 | H-1 | L-1 | E-2 | 1-170 | H-31 | L-7 | E-33 |
| 1-171 | H-1 | L-1 | E-3 | 1-172 | H-32 | L-8 | E-34 |
| 1-173 | H-1 | L-1 | E-4 | 1-174 | H-33 | L-9 | E-35 |
| 1-175 | H-1 | L-1 | E-5 | 1-176 | H-34 | L-10 | E-36 |
| 1-177 | H-1 | L-1 | E-6 | 1-178 | H-35 | L-11 | E-37 |
| 1-179 | H-1 | L-1 | E-7 | 1-180 | H-36 | L-12 | E-38 |
| 1-181 | H-1 | L-1 | E-8 | | | | |
| 1-183 | H-1 | L-1 | E-9 | | | | |
| 1-185 | H-1 | L-1 | E-10 | | | | |
| 1-187 | H-1 | L-1 | E-11 | | | | |
| 1-189 | H-1 | L-1 | E-12 | 1-190 | H-41 | L-17 | E-43 |
| 1-191 | H-1 | L-1 | E-13 | 1-192 | H-42 | L-18 | E-44 |
| 1-193 | H-1 | L-1 | E-14 | 1-194 | H-43 | L-19 | E-45 |
| 1-195 | H-1 | L-1 | E-15 | | | | |
| 1-197 | H-1 | L-1 | E-16 | 1-198 | H-45 | L-21 | E-47 |
| 1-199 | H-1 | L-1 | E-17 | 1-200 | H-46 | L-22 | E-48 |
| 1-201 | H-1 | L-1 | E-18 | 1-202 | H-47 | L-23 | E-49 |
| 1-203 | H-1 | L-1 | E-19 | 1-204 | H-48 | L-24 | E-50 |
| 1-205 | H-1 | L-1 | E-20 | 1-206 | H-49 | L-25 | E-51 |
| 1-207 | H-1 | L-1 | E-21 | 1-208 | H-50 | L-26 | E-52 |
| 1-209 | H-1 | L-1 | E-22 | 1-210 | H-51 | L-27 | E-53 |
| 1-211 | H-1 | L-1 | E-23 | 1-212 | H-52 | L-2 | E-54 |
| 1-213 | H-1 | L-1 | E-24 | 1-214 | H-53 | L-4 | E-55 |
| 1-215 | H-1 | L-1 | E-25 | 1-216 | H-54 | L-5 | E-56 |
| 1-217 | H-1 | L-1 | E-26 | | | | |
| 1-219 | H-1 | L-1 | E-27 | | | | |
| 1-225 | H-1 | L-1 | E-30 | | | | |
| 1-231 | H-1 | L-1 | E-33 | | | | |
| 1-233 | H-1 | L-1 | E-34 | | | | |
| 1-235 | H-1 | L-1 | E-35 | | | | |
| 1-237 | H-1 | L-1 | E-36 | | | | |
| 1-239 | H-1 | L-1 | E-37 | | | | |
| 1-241 | H-1 | L-1 | E-38 | | | | |
| 1-247 | H-1 | L-1 | E-41 | | | | |
| 1-249 | H-1 | L-1 | E-42 | | | | |
| 1-251 | H-1 | L-1 | E-43 | 1-252 | H-72 | L-23 | E-74 |
| 1-253 | H-1 | L-1 | E-44 | 1-254 | H-73 | L-24 | E-75 |
| 1-255 | H-1 | L-1 | E-45 | 1-256 | H-74 | L-25 | E-76 |
| 1-257 | H-1 | L-1 | E-46 | 1-258 | H-75 | L-26 | E-77 |

-continued

| Compound No. | H | L | E | Compound No. | H | L | E |
|---|---|---|---|---|---|---|---|
| 1-259 | H-1 | L-1 | E-47 | 1-260 | H-76 | L-27 | E-78 |
| 1-261 | H-1 | L-1 | E-48 | 1-262 | H-2 | L-3 | E-79 |
| 1-263 | H-1 | L-1 | E-49 | 1-264 | H-3 | L-3 | E-80 |
| 1-265 | H-1 | L-1 | E-50 | 1-266 | H-4 | L-3 | E-81 |
| 1-267 | H-1 | L-1 | E-51 | 1-268 | H-5 | L-3 | E-82 |
| 1-269 | H-1 | L-1 | E-52 | 1-270 | H-6 | L-3 | E-83 |
| 1-271 | H-1 | L-1 | E-53 | 1-272 | H-7 | L-3 | E-1 |
| 1-273 | H-1 | L-1 | E-54 | 1-274 | H-8 | L-3 | E-1 |
| 1-275 | H-1 | L-1 | E-55 | 1-276 | H-9 | L-3 | E-1 |
| 1-277 | H-1 | L-1 | E-56 | 1-278 | H-10 | L-3 | E-1 |
| | | | | 1-280 | H-11 | L-3 | E-1 |
| | | | | 1-282 | H-12 | L-3 | E-1 |
| | | | | 1-284 | H-13 | L-3 | E-1 |
| | | | | 1-286 | H-14 | L-3 | E-1 |
| | | | | 1-288 | H-15 | L-3 | E-1 |
| | | | | 1-290 | H-16 | L-3 | E-1 |
| | | | | 1-292 | H-17 | L-3 | E-1 |
| | | | | 1-294 | H-18 | L-3 | E-1 |
| | | | | 1-296 | H-19 | L-3 | E-1 |
| | | | | 1-298 | H-20 | L-3 | E-1 |
| | | | | 1-300 | H-21 | L-3 | E-1 |
| | | | | 1-302 | H-22 | L-3 | E-1 |
| | | | | 1-304 | H-23 | L-3 | E-1 |
| | | | | 1-306 | H-24 | L-3 | E-1 |
| | | | | 1-308 | H-25 | L-3 | E-1 |
| | | | | 1-310 | H-26 | L-3 | E-1 |
| | | | | 1-312 | H-27 | L-3 | E-1 |
| 1-313 | H-1 | L-1 | E-74 | 1-314 | H-28 | L-3 | E-1 |
| 1-315 | H-1 | L-1 | E-75 | 1-316 | H-29 | L-3 | E-1 |
| 1-317 | H-1 | L-1 | E-76 | 1-318 | H-30 | L-3 | E-1 |
| 1-319 | H-1 | L-1 | E-77 | 1-320 | H-31 | L-3 | E-1 |
| 1-321 | H-1 | L-1 | E-78 | 1-322 | H-32 | L-3 | E-1 |
| 1-323 | H-1 | L-1 | E-79 | 1-324 | H-33 | L-3 | E-1 |
| 1-325 | H-1 | L-1 | E-80 | 1-326 | H-34 | L-3 | E-1 |
| 1-327 | H-1 | L-1 | E-81 | 1-328 | H-35 | L-3 | E-1 |
| 1-329 | H-1 | L-1 | E-82 | 1-330 | H-36 | L-3 | E-1 |
| 1-331 | H-1 | L-1 | E-83 | 1-332 | H-37 | L-3 | E-1 |
| 1-333 | H-1 | L-3 | E-1 | 1-334 | H-38 | L-3 | E-1 |
| 1-335 | H-1 | L-3 | E-2 | 1-336 | H-39 | L-3 | E-1 |
| 1-337 | H-1 | L-3 | E-3 | 1-338 | H-40 | L-3 | E-1 |
| 1-339 | H-1 | L-3 | E-4 | 1-340 | H-41 | L-3 | E-1 |
| 1-341 | H-1 | L-3 | E-5 | 1-342 | H-42 | L-3 | E-1 |
| 1-343 | H-1 | L-3 | E-6 | 1-344 | H-43 | L-3 | E-1 |
| 1-345 | H-1 | L-3 | E-7 | 1-346 | H-44 | L-3 | E-1 |
| 1-347 | H-1 | L-3 | E-8 | 1-348 | H-45 | L-3 | E-1 |
| 1-349 | H-1 | L-3 | E-9 | 1-350 | H-46 | L-3 | E-1 |
| 1-351 | H-1 | L-3 | E-10 | 1-352 | H-47 | L-3 | E-1 |
| 1-353 | H-1 | L-3 | E-11 | 1-354 | H-48 | L-3 | E-1 |
| 1-355 | H-1 | L-3 | E-12 | 1-356 | H-49 | L-3 | E-1 |
| 1-357 | H-1 | L-3 | E-13 | 1-358 | H-50 | L-3 | E-1 |
| 1-359 | H-1 | L-3 | E-14 | 1-360 | H-51 | L-3 | E-1 |
| 1-361 | H-1 | L-3 | E-15 | 1-362 | H-52 | L-3 | E-1 |
| 1-363 | H-1 | L-3 | E-16 | 1-364 | H-53 | L-3 | E-1 |
| 1-365 | H-1 | L-3 | E-17 | 1-366 | H-54 | L-3 | E-1 |
| 1-367 | H-1 | L-3 | E-18 | 1-368 | H-55 | L-3 | E-1 |
| 1-369 | H-1 | L-3 | E-19 | 1-370 | H-56 | L-3 | E-1 |
| 1-371 | H-1 | L-3 | E-20 | 1-372 | H-57 | L-3 | E-1 |
| 1-373 | H-1 | L-3 | E-21 | 1-374 | H-58 | L-3 | E-1 |
| 1-375 | H-1 | L-3 | E-22 | 1-376 | H-59 | L-3 | E-1 |
| 1-377 | H-1 | L-3 | E-23 | 1-378 | H-60 | L-3 | E-1 |
| 1-379 | H-1 | L-3 | E-24 | 1-380 | H-61 | L-3 | E-1 |
| 1-381 | H-1 | L-3 | E-25 | 1-382 | H-62 | L-3 | E-1 |
| 1-383 | H-1 | L-3 | E-26 | 1-384 | H-63 | L-3 | E-1 |
| 1-385 | H-1 | L-3 | E-27 | 1-386 | H-64 | L-3 | E-1 |
| | | | | 1-388 | H-65 | L-3 | E-1 |
| | | | | 1-390 | H-66 | L-3 | E-1 |
| 1-391 | H-1 | L-3 | E-30 | 1-392 | H-67 | L-3 | E-1 |
| | | | | 1-394 | H-68 | L-3 | E-1 |
| | | | | 1-396 | H-69 | L-3 | E-1 |
| 1-397 | H-1 | L-3 | E-33 | 1-398 | H-70 | L-3 | E-1 |
| 1-399 | H-1 | L-3 | E-34 | 1-400 | H-71 | L-3 | E-1 |
| 1-401 | H-1 | L-3 | E-35 | 1-402 | H-72 | L-3 | E-1 |
| 1-403 | H-1 | L-3 | E-36 | 1-404 | H-73 | L-3 | E-1 |

-continued

| Compound No. | H | L | E | Compound No. | H | L | E |
|---|---|---|---|---|---|---|---|
| 1-405 | H-1 | L-3 | E-37 | 1-406 | H-74 | L-3 | E-1 |
| 1-407 | H-1 | L-3 | E-38 | 1-408 | H-75 | L-3 | E-1 |
| | | | | 1-410 | H-76 | L-3 | E-1 |
| | | | | 1-412 | H-77 | L-3 | E-1 |
| 1-413 | H-1 | L-3 | E-41 | 1-414 | H-78 | L-3 | E-1 |
| 1-415 | H-1 | L-3 | E-42 | 1-416 | H-79 | L-3 | E-1 |
| 1-417 | H-1 | L-3 | E-43 | 1-418 | H-80 | L-3 | E-1 |
| 1-419 | H-1 | L-3 | E-44 | 1-420 | H-81 | L-3 | E-1 |
| 1-421 | H-1 | L-3 | E-45 | 1-422 | H-82 | L-3 | E-1 |
| 1-423 | H-1 | L-3 | E-46 | 1-424 | H-83 | L-3 | E-1 |
| 1-425 | H-1 | L-3 | E-47 | 1-426 | H-84 | L-3 | E-1 |
| 1-427 | H-1 | L-3 | E-48 | 1-428 | H-85 | L-3 | E-1 |
| 1-429 | H-1 | L-3 | E-49 | 1-430 | H-86 | L-3 | E-1 |
| 1-431 | H-1 | L-3 | E-50 | 1-432 | H-87 | L-3 | E-1 |
| 1-433 | H-1 | L-3 | E-51 | 1-434 | H-88 | L-3 | E-1 |
| 1-435 | H-1 | L-3 | E-52 | 1-436 | H-89 | L-3 | E-1 |
| 1-437 | H-1 | L-3 | E-53 | 1-438 | H-90 | L-3 | E-1 |
| 1-439 | H-1 | L-3 | E-54 | 1-440 | H-91 | L-3 | E-1 |
| 1-441 | H-1 | L-3 | E-55 | 1-442 | H-92 | L-3 | E-1 |
| 1-443 | H-1 | L-3 | E-56 | 1-444 | H-93 | L-3 | E-1 |
| | | | | 1-446 | H-94 | L-3 | E-1 |
| | | | | 1-448 | H-95 | L-3 | E-1 |
| | | | | 1-450 | H-96 | L-3 | E-1 |
| | | | | 1-452 | H-97 | L-3 | E-1 |
| | | | | 1-454 | H-98 | L-3 | E-1 |
| | | | | 1-456 | H-99 | L-3 | E-1 |
| | | | | 1-458 | H-100 | L-3 | E-1 |
| | | | | 1-460 | H-101 | L-3 | E-1 |
| | | | | 1-462 | H-102 | L-3 | E-1 |
| | | | | 1-464 | H-103 | L-3 | E-1 |
| | | | | 1-466 | H-104 | L-3 | E-1 |
| | | | | 1-468 | H-105 | L-3 | E-1 |
| | | | | 1-470 | H-106 | L-3 | E-1 |
| | | | | 1-472 | H-107 | L-3 | E-1 |
| | | | | 1-474 | H-108 | L-3 | E-1 |
| | | | | 1-476 | H-109 | L-3 | E-1 |
| | | | | 1-478 | H-110 | L-3 | E-1 |
| 1-479 | H-1 | L-3 | E-74 | 1-480 | H-111 | L-3 | E-1 |
| 1-481 | H-1 | L-3 | E-75 | 1-482 | H-112 | L-3 | E-1 |
| 1-483 | H-1 | L-3 | E-76 | 1-484 | H-113 | L-3 | E-1 |
| 1-485 | H-1 | L-3 | E-77 | 1-486 | H-114 | L-3 | E-1 |
| 1-487 | H-1 | L-3 | E-78 | 1-488 | H-115 | L-3 | E-1 |
| 1-489 | H-1 | L-3 | E-79 | 1-490 | H-116 | L-3 | E-1 |
| 1-491 | H-1 | L-3 | E-80 | 1-492 | H-117 | L-3 | E-1 |
| 1-493 | H-1 | L-3 | E-81 | 1-494 | H-118 | L-3 | E-1 |
| 1-495 | H-1 | L-3 | E-82 | 1-496 | H-119 | L-3 | E-1 |
| 1-497 | H-1 | L-3 | E-83 | 1-498 | H-120 | L-3 | E-1 |
| 1-499 | H-1 | L-2 | E-1 | 1-500 | H-121 | L-3 | E-1 |
| 1-501 | H-1 | L-4 | E-1 | 1-502 | H-122 | L-3 | E-1 |
| 1-503 | H-1 | L-5 | E-1 | 1-504 | H-123 | L-3 | E-1 |
| 1-505 | H-1 | L-6 | E-1 | 1-506 | H-124 | L-3 | E-1 |
| 1-507 | H-1 | L-7 | E-1 | 1-508 | H-125 | L-3 | E-1 |
| 1-509 | H-1 | 2-8 | E-1 | 1-510 | H-126 | L-3 | E-1 |
| 1-511 | H-1 | L-9 | E-1 | 1-512 | H-127 | L-3 | E-1 |
| 1-513 | H-1 | L-10 | E-1 | 1-514 | H-128 | L-3 | E-1 |
| 1-515 | H-1 | L-11 | E-1 | 1-516 | H-129 | L-3 | E-1 |
| 1-517 | H-1 | L-12 | E-1 | 1-518 | H-130 | L-3 | E-1 |
| 1-519 | H-1 | L-13 | E-1 | 1-520 | H-131 | L-3 | E-1 |
| 1-521 | H-1 | L-14 | E-1 | 1-522 | H-132 | L-3 | E-1 |
| | | | | 1-524 | H-133 | L-3 | E-1 |
| | | | | 1-526 | H-134 | L-3 | E-1 |
| 1-527 | H-1 | L-17 | E-1 | 1-528 | H-135 | L-3 | E-1 |
| 1-529 | H-1 | L-18 | E-1 | 1-530 | H-136 | L-3 | E-1 |
| 1-531 | H-1 | L-19 | E-1 | 1-532 | H-137 | L-3 | E-1 |
| | | | | 1-534 | H-138 | L-3 | E-1 |
| 1-535 | H-1 | L-21 | E-1 | 1-536 | H-139 | L-3 | E-1 |
| 1-537 | H-1 | L-22 | E-1 | 1-538 | H-139 | L-4 | E-7 |
| 1-539 | H-1 | L-0 | E-84 | 1-540 | H-1 | L-0 | E-85 |
| | | | | 1-542 | H-1 | L-0 | E-87 |
| 1-543 | H-1 | L-0 | E-88 | 1-544 | H-1 | L-0 | E-89 |
| 1-545 | H-1 | L-0 | E-90 | 1-546 | H-1 | L-0 | E-91 |
| 1-547 | H-1 | L-0 | E-92 | | | | |

wherein, optionally, hydrogens in Compound 1-1 to Compound 1-35, Compound 1-37, Compound 1-39 to Compound 1-45, Compound 1-47 to Compound 1-54, Compound 1-56, Compound 1-58 to Compound 1-60, Compound 1-62, Compound 1-64 to Compound 1-76, Compound 1-78, Compound 1-80 to Compound 1-85, Compound 1-87, Compound 1-89 to Compound 1-95, Compound 1-97 to Compound 1-112, Compound 1-114, Compound 1-116, Compound 1-118, Compound 1-120, Compound 1-122, Compound 1-124, Compound 1-126, Compound 1-128, Compound 1-130, Compound 1-132, Compound 1-134, Compound 1-140, Compound 1-142, Compound 1-144, Compound 1-147 to Compound 1-159, Compound 1-161, Compound 1-163 to Compound 1-165, Compound 1-167, Compound 1-169 to Compound 1-181, Compound 1-183, Compound 1-185, Compound 1-187, Compound 1-189 to Compound 1-195, Compound 1-197 to Compound 1-217, Compound 1-219, Compound 1-225, Compound 1-231, Compound 1-233, Compound 1-235, Compound 1-237, Compound 1-239, Compound 1-241, Compound 1-247, Compound 1-249, Compound 1-251 to Compound 1-278, Compound 1-280, Compound 1-282, Compound 1-284, Compound 1-286, Compound 1-288, Compound 1-290, Compound 1-292, Compound 1-294, Compound 1-296, Compound 1-298, Compound 1-300, Compound 1-302, Compound 1-304, Compound 1-306, Compound 1-308, Compound 1-310, Compound 1-312 to Compound 1-386, Compound 1-388, Compound 1-390 to Compound 1-392, Compound 1-394, Compound 1-396 to Compound 1-408, Compound 1-410, Compound 1-412 to Compound 1-444, Compound 1-446, Compound 1-448, Compound 1-450, Compound 1-452, Compound 1-454, Compound 1-456, Compound 1-458, Compound 1-460, Compound 1-462, Compound 1-464, Compound 1-466, Compound 1-468, Compound 1-470, Compound 1-472, Compound 1-474, Compound 1-476, Compound 1-478 to Compound 1-522, Compound 1-524, Compound 1-526 to Compound 1-532, Compound 1-534 to Compound 1-540, Compound 1-542 to Compound 1-547 can be partially or completely substituted with deuterium.

22. The electroluminescent device of claim 8, wherein $R_{Y'}$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heterocyclyl having 3 to 20 carbon atoms, substituted or unsubstituted aryl having 6 to 20 carbon atoms, substituted or unsubstituted heteroaryl having 3 to 20 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a cyano group, an isocyano group, a hydroxyl group, a sulfanyl group, a sulfinyl group, a sulfonyl group, a phosphino group and combinations thereof;

adjacent substituents $R_{Y'}$ can be optionally joined to form a ring.

23. The electroluminescent device of claim 1, wherein $Ar_1$ is, at each occurrence identically or differently, selected from phenyl, fluorophenyl, naphthyl, biphenyl, benzothienyl, dibenzothienyl, benzofuryl, dibenzofuryl, dibenzoselenophenyl, carbazolyl, 9,9-dimethylfluorenyl, 9,9-spirobifluorenyl, cyanophenyl or combinations thereof.

24. The electroluminescent device of claim 1, wherein $Ar_1$ is, at each occurrence identically or differently, selected from the group consisting of the following structures:

Ar-1

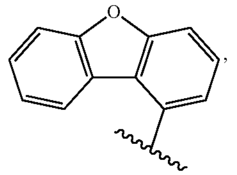

Ar-2

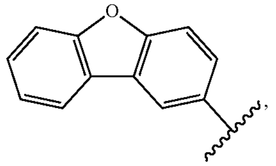

Ar-3

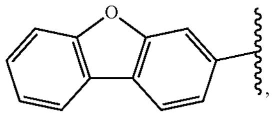

Ar-4

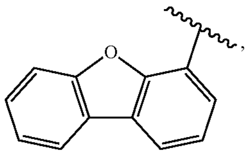

Ar-5

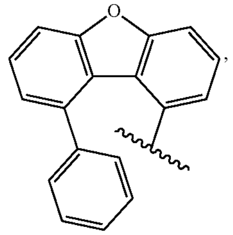

Ar-6

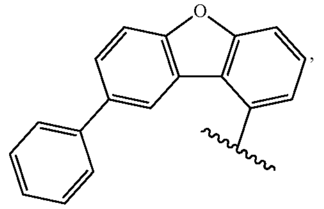

Ar-7

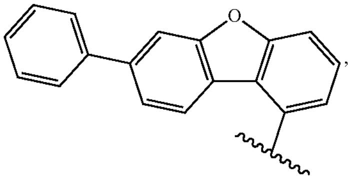

-continued
Ar-8
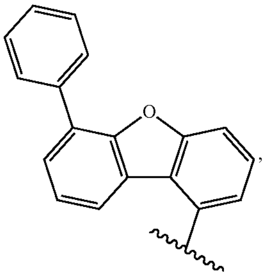
Ar-9
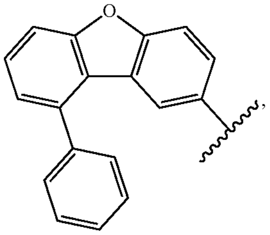
Ar-10
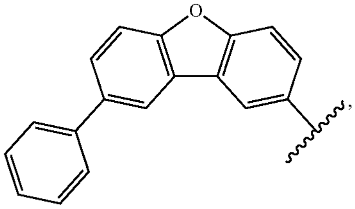
Ar-11
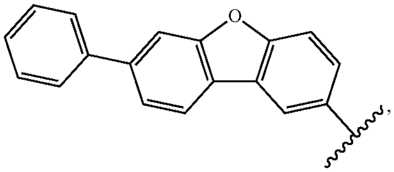
Ar-12
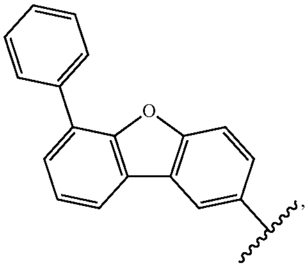
Ar-13
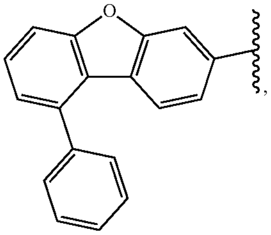
-continued
Ar-14
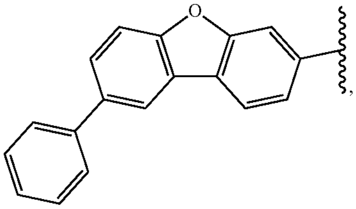
Ar-15
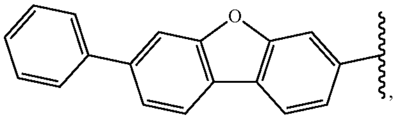
Ar-16
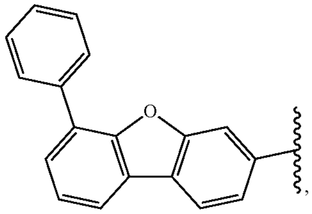
Ar-17
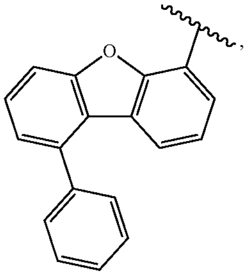
Ar-18
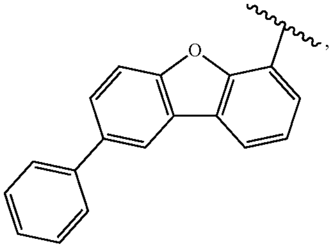
Ar-19
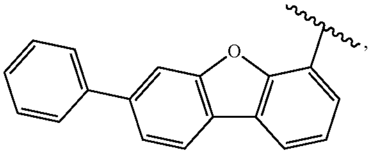
Ar-20
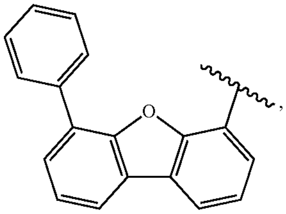

-continued
Ar-21
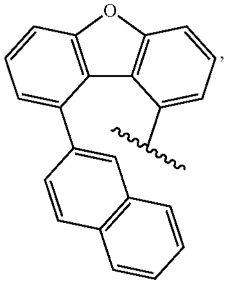
Ar-22
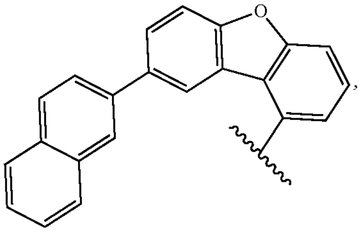
Ar-23
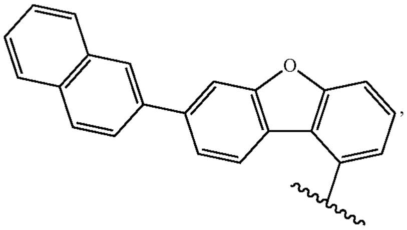
Ar-24
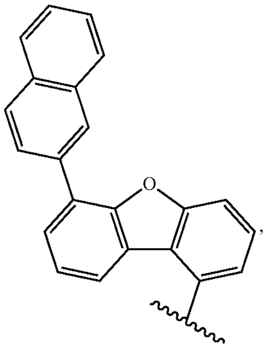
Ar-25
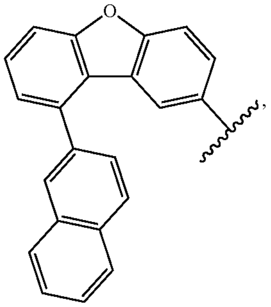
-continued
Ar-26
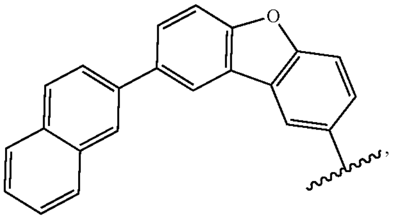
Ar-27
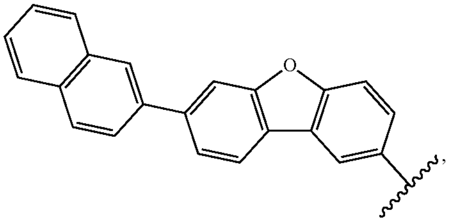
Ar-28
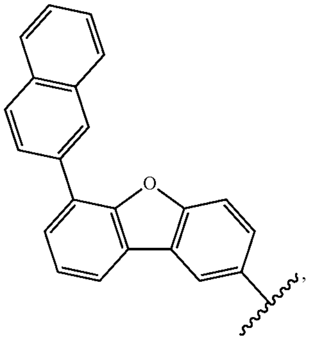
Ar-29
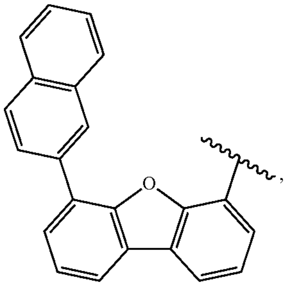
Ar-30
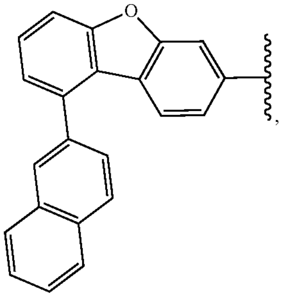

-continued
Ar-31
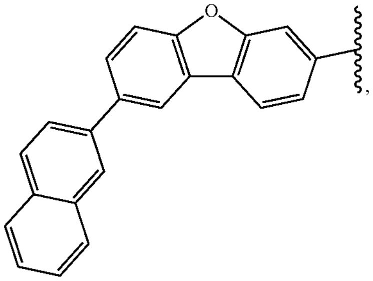
Ar-32
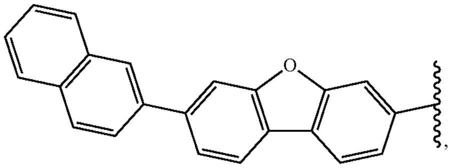
Ar-33
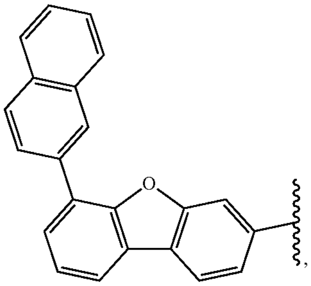
Ar-34
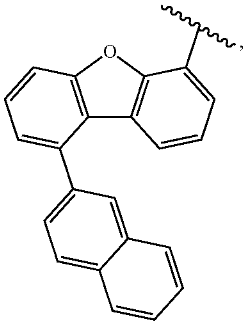
Ar-35
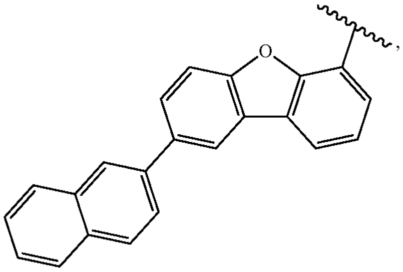
Ar-36
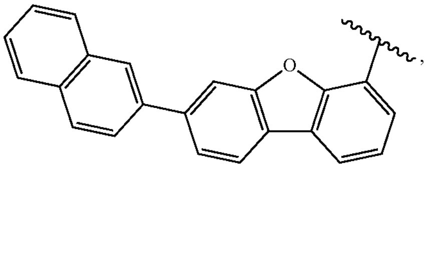
-continued
Ar-37
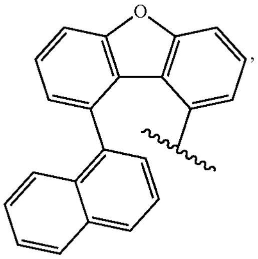
Ar-38
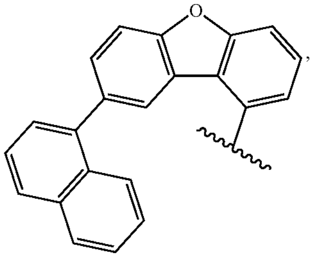
Ar-39
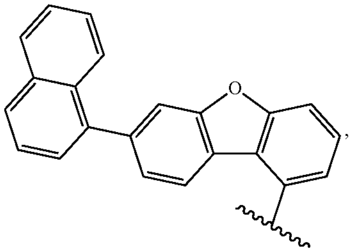
Ar-40
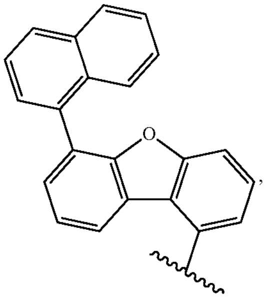
Ar-41
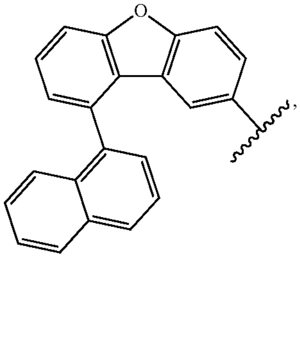

-continued
Ar-42
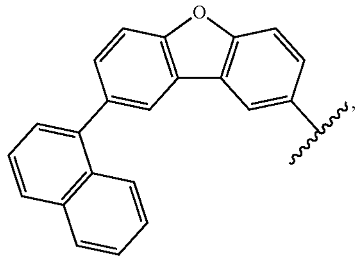
Ar-43
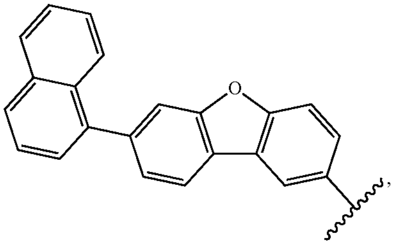
Ar-44
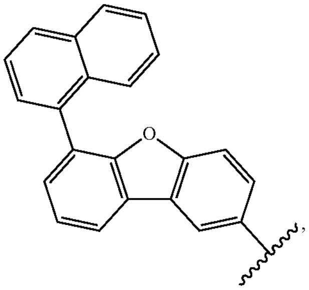
Ar-45
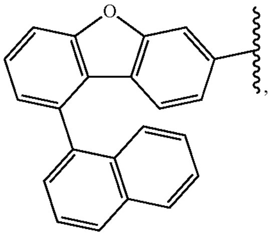
Ar-46
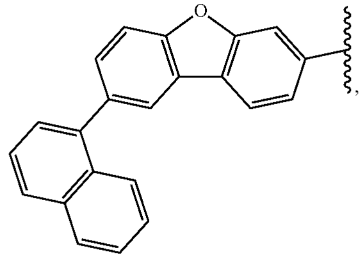
Ar-47
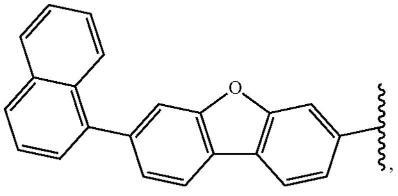
-continued
Ar-48
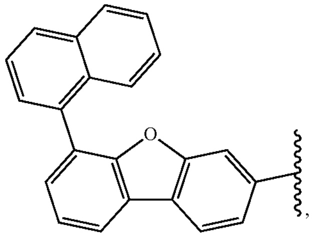
Ar-49
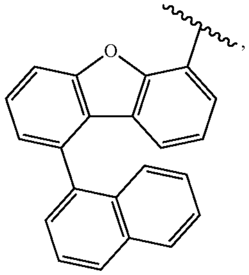
Ar-50
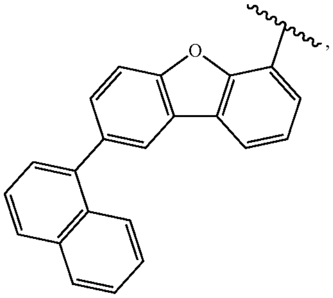
Ar-51
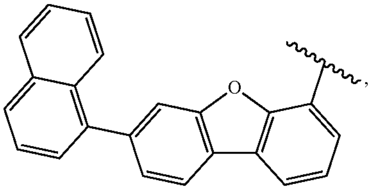
Ar-52
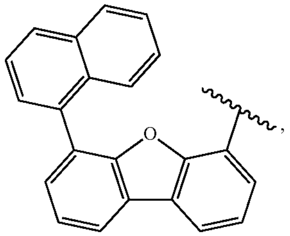
Ar-53
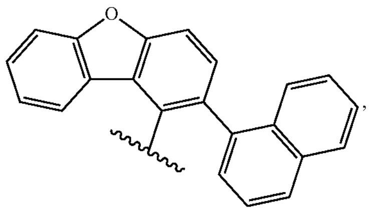

-continued
Ar-54
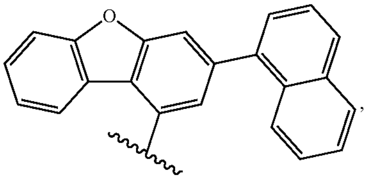
Ar-55
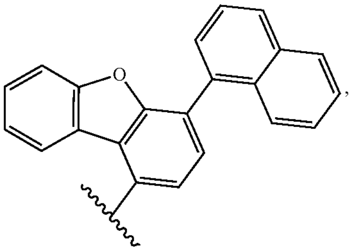
Ar-56
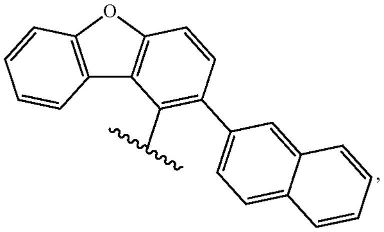
Ar-57
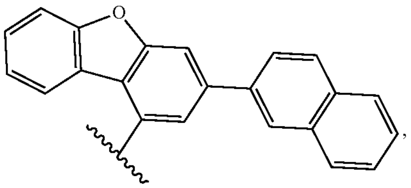
Ar-58
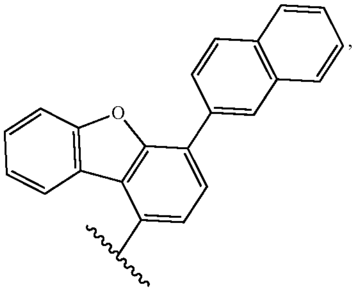
Ar-59
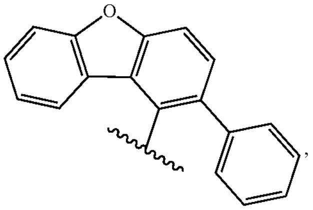
Ar-60
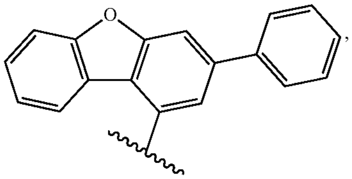
-continued
Ar-61
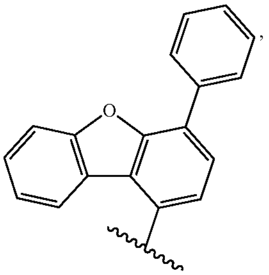
Ar-62
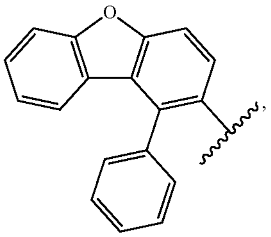
Ar-63
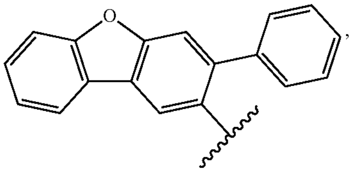
Ar-64
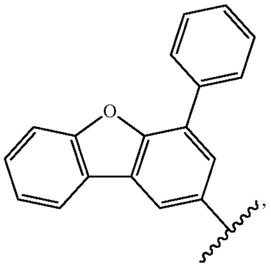
Ar-65
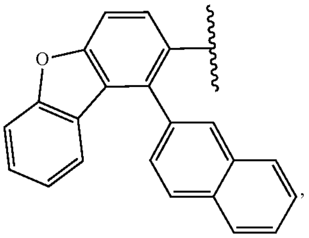
Ar-66
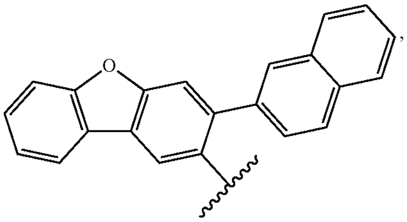

Ar-67
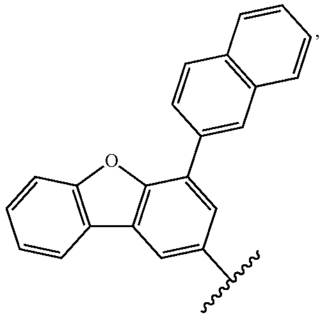
Ar-68
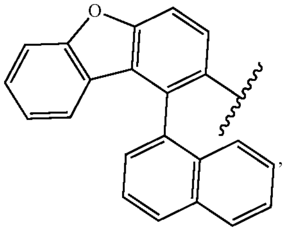
Ar-69
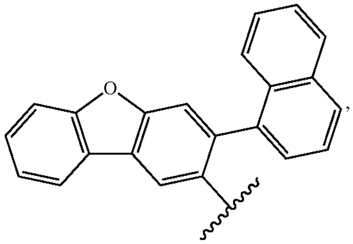
Ar-70
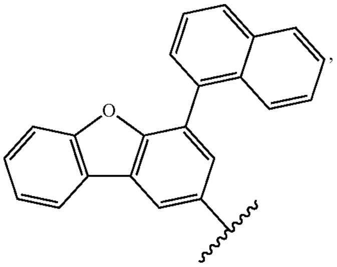
Ar-71
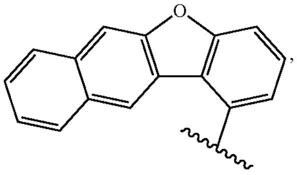
Ar-72
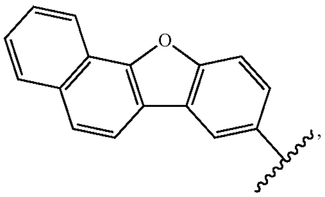
Ar-73
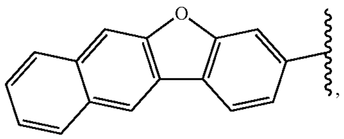
Ar-74
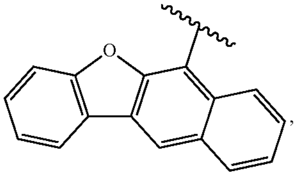
Ar-75
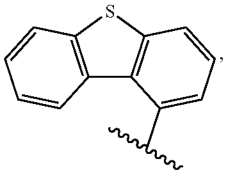
Ar-76
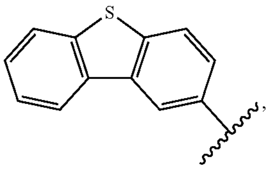
Ar-77
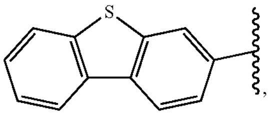
Ar-78
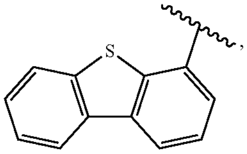
Ar-79
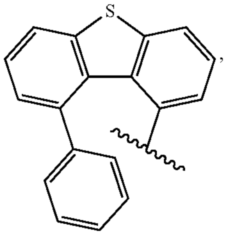
Ar-80
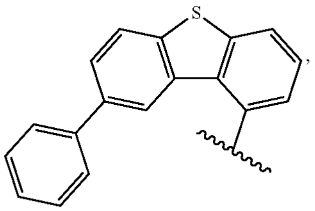
Ar-81
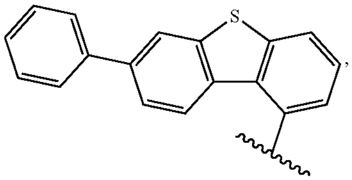

-continued
Ar-82
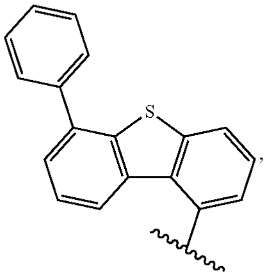
Ar-83
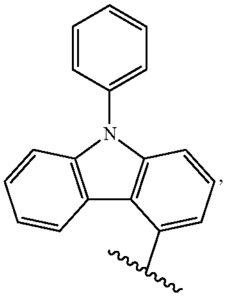
Ar-84
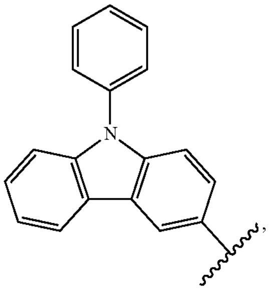
Ar-85
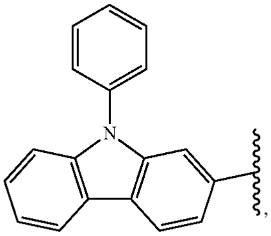
Ar-86
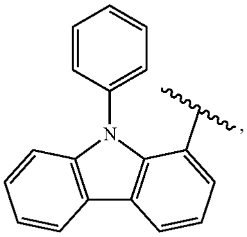
Ar-87
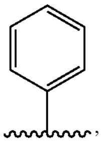
-continued
Ar-88
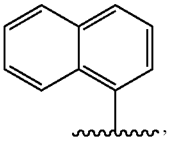
Ar-89
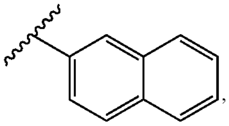
Ar-90
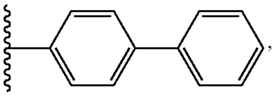
Ar-91
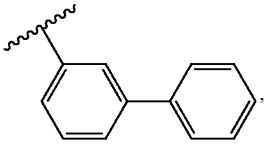
Ar-92
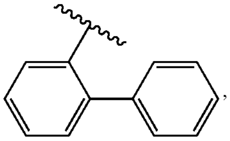
Ar-93
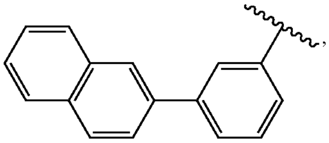
Ar-94
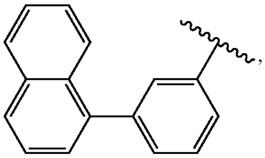
Ar-95
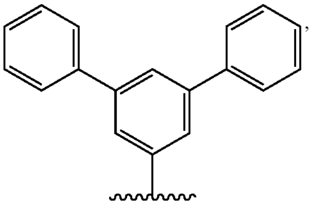
Ar-96
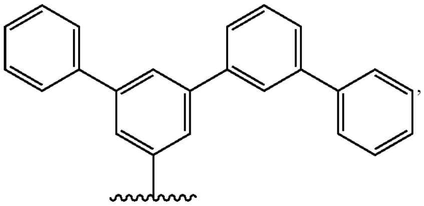

-continued
Ar-97
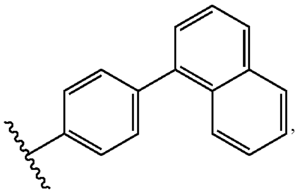
Ar-98
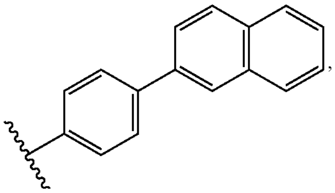
Ar-99
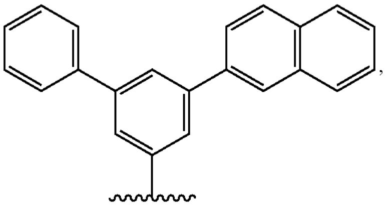
Ar-100
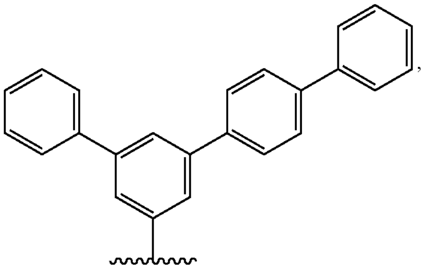
Ar-101
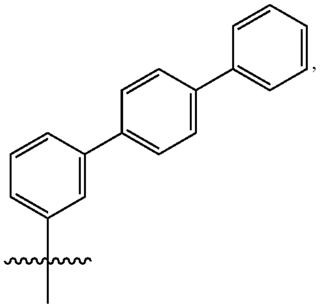
Ar-102
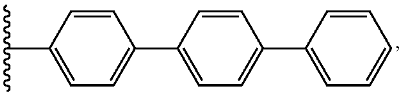
Ar-103
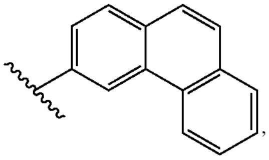
-continued
Ar-104
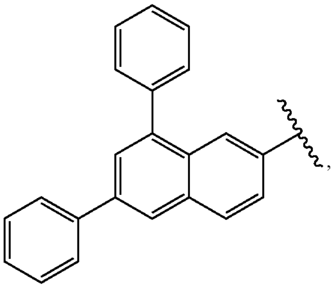
Ar-105
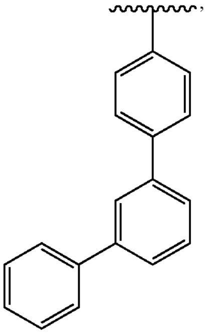
Ar-106
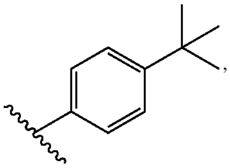
Ar-107
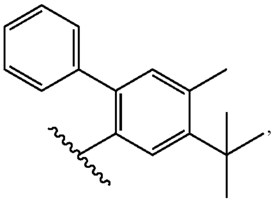
Ar-108
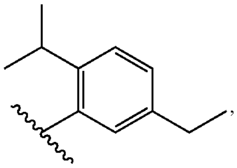
Ar-109
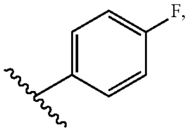
Ar-110
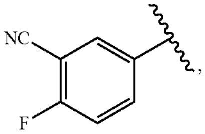

-continued
Ar-111
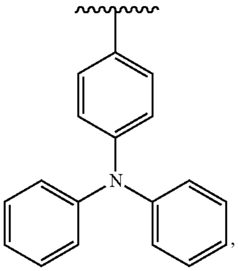
Ar-112
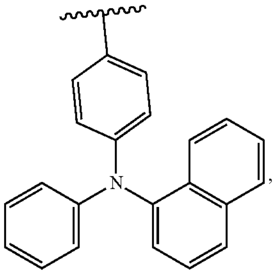
Ar-113
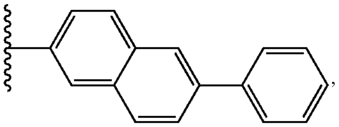
Ar-114
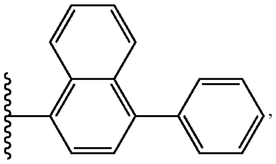
Ar-115
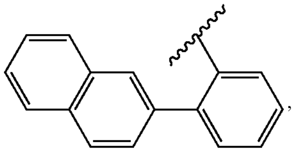
Ar-116
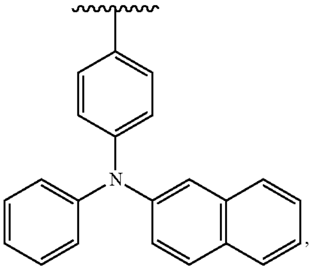
-continued
Ar-117
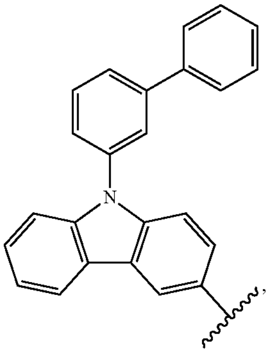
Ar-118
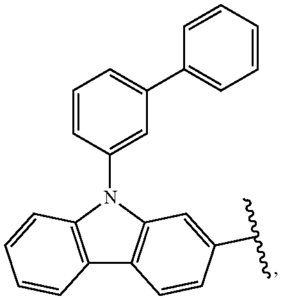
Ar-119
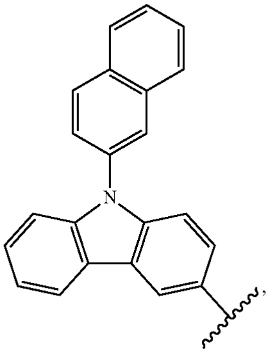
Ar-120
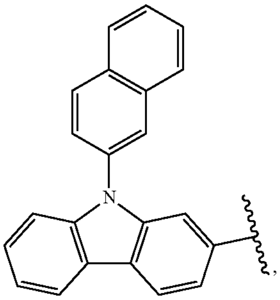
Ar-121
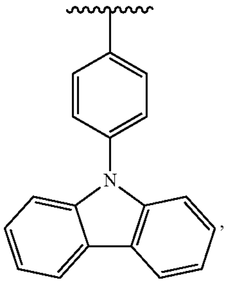

-continued

Ar-122

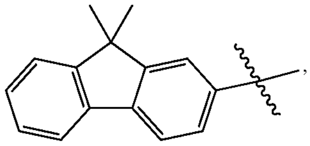

Ar-123

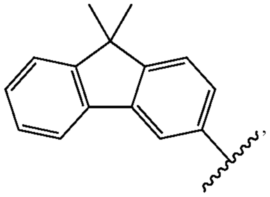

Ar-124

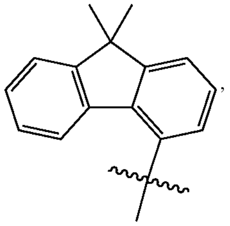

Ar-125

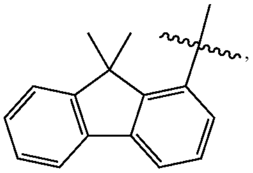

Ar-126

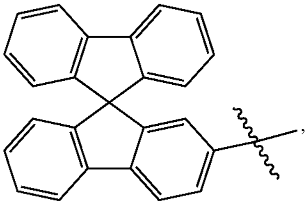

Ar-127

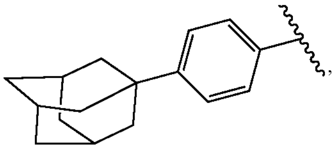

Ar-128

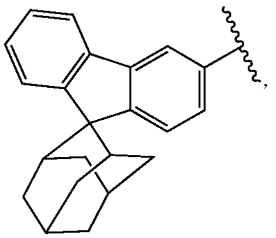

-continued

Ar-129

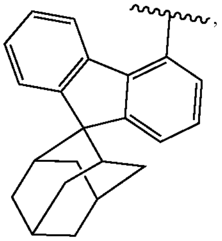

Ar-130

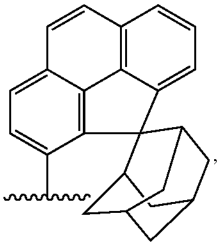

Ar-131

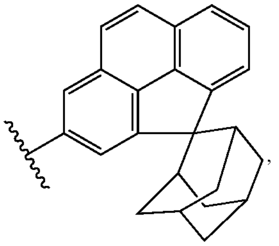

and

Ar-132

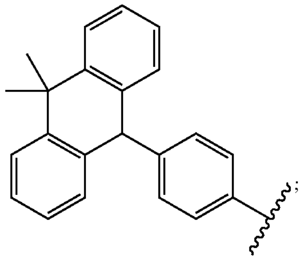

optionally, hydrogen in structures of Ar-1 to Ar-132 can be partially or completely substituted with deuterium.

25. The electroluminescent device of claim 1, wherein $L_1$ is selected from a single bond, substituted or unsubstituted arylene having 6 to 20 carbon atoms, substituted or unsubstituted heteroarylene having 3 to 20 carbon atoms or combinations thereof.

26. The electroluminescent device of claim 1, wherein $L_1$ is selected from the group consisting of the following structures:

L-0 a single bond,

L-1

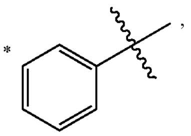

-continued
L-2
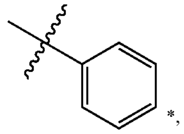
L-3
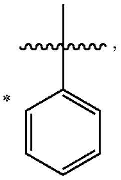
L-4
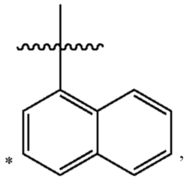
L-5
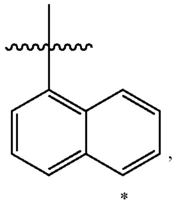
L-6
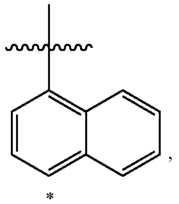
L-7
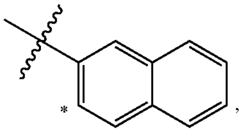
L-8
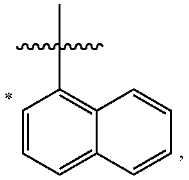
L-9
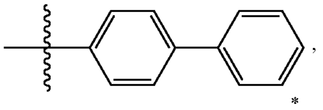
L-10
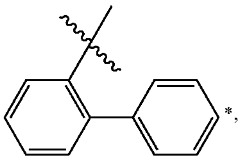
-continued
L-11
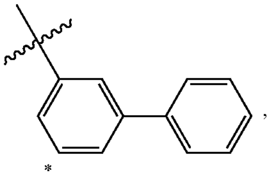
L-12
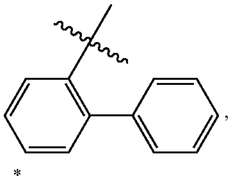
L-13
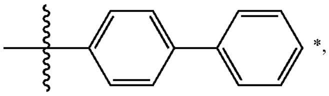
L-14
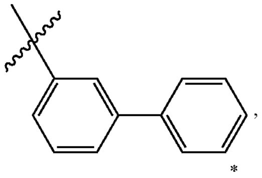
L-15
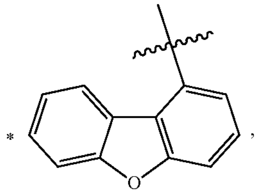
L-16
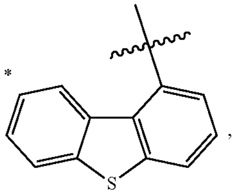
L-17
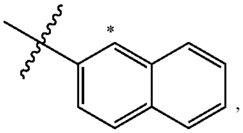
L-18
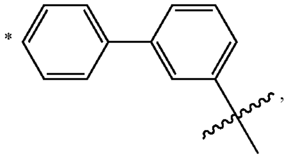
L-19
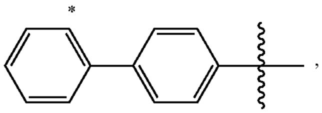

-continued

L-20

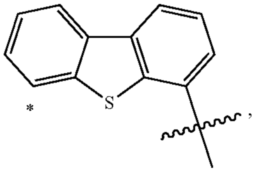

L-21

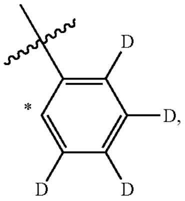

L-22

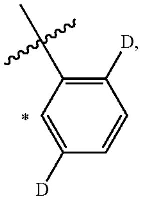

L-23

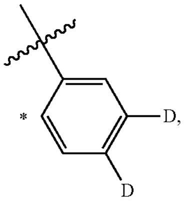

L-24

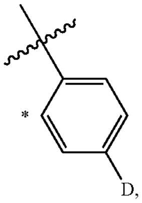

L-25

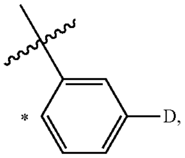

-continued

L-26

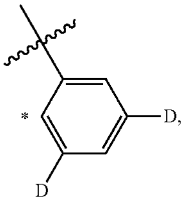

and

L-27

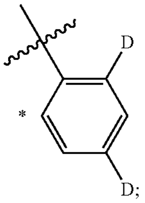

optionally, hydrogens in the structures of L-1 to L-27 can be partially or fully substituted with deuterium.

27. The electroluminescent device of claim 15, wherein at least one or two of $R_1$ to $R_3$ is (are) selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof; and/or at least one or two of $R_4$ to $R_6$ is (are) selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof.

28. The electroluminescent device of claim 27, wherein at least two of $R_1$ to $R_3$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof; and/or at least two of $R_4$ to $R_6$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof.

* * * * *